US011591519B2

(12) United States Patent
Inui et al.

(10) Patent No.: US 11,591,519 B2
(45) Date of Patent: Feb. 28, 2023

(54) POLYMERIZABLE LIQUID CRYSTAL COMPOSITION AND RETARDATION PLATE

(71) Applicant: Sumitomo Chemical Company, Limited, Tokyo (JP)

(72) Inventors: Naoko Inui, Osaka (JP); Nobuyuki Hatanaka, Osaka (JP); Tatsuaki Kasai, Nishio (JP); Hikari Dezaki, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 65 days.

(21) Appl. No.: 16/620,226

(22) PCT Filed: May 17, 2018

(86) PCT No.: PCT/JP2018/019087

§ 371 (c)(1),
(2) Date: Dec. 6, 2019

(87) PCT Pub. No.: WO2018/225474

PCT Pub. Date: Dec. 13, 2018

(65) Prior Publication Data

US 2020/0165519 A1 May 28, 2020

(30) Foreign Application Priority Data

Jun. 9, 2017 (JP) ............................ JP2017-114517

(51) Int. Cl.

| | |
|---|---|
| ***C09K 19/38*** | (2006.01) |
| ***G02B 5/30*** | (2006.01) |
| ***H01L 51/00*** | (2006.01) |
| ***H01L 51/52*** | (2006.01) |
| *C09K 19/04* | (2006.01) |

(52) U.S. Cl.

CPC ........ *C09K 19/3861* (2013.01); *G02B 5/3016* (2013.01); *H01L 51/0076* (2013.01); *H01L 51/5281* (2013.01); *C09K 2019/0448* (2013.01); *C09K 2323/00* (2020.08); *C09K 2323/03* (2020.08); *C09K 2323/031* (2020.08)

(58) Field of Classification Search

CPC ............ C09K 19/3851; C09K 19/3823; C09K 19/3491; C09K 19/3497; C09K 19/54; C09K 2323/00; C09K 2323/03; C09K 2323/031; C09K 2323/035; G02B 5/3016; G02F 1/13363; G02F 1/133528

USPC ........ 428/1.1, 1.3, 1.31, 1.33; 349/194, 117; 252/299.01

See application file for complete search history.

(56) References Cited

U.S. PATENT DOCUMENTS

| | | | | |
|---|---|---|---|---|
| 2015/0042941 | A1 | 2/2015 | Hatanaka | |
| 2015/0042943 | A1 | 2/2015 | Hatanaka | |
| 2015/0042944 | A1 | 2/2015 | Hatanaka et al. | |
| 2015/0043071 | A1 | 2/2015 | Hatanaka et al. | |
| 2015/0049291 | A1 | 2/2015 | Hatanaka et al. | |
| 2016/0124131 | A1* | 5/2016 | Kobayashi | G02B 5/3016 428/141 |
| 2019/0025490 | A1 | 1/2019 | Takasaki et al. | |
| 2020/0031971 | A1 | 1/2020 | Sakamoto et al. | |

FOREIGN PATENT DOCUMENTS

| | | | |
|---|---|---|---|
| JP | 2011207765 | A | 10/2011 |
| JP | 2012214801 | A | 11/2012 |
| JP | 2015163935 | A | 9/2015 |
| JP | 6146526 | B1 | 6/2017 |
| WO | 2017038266 | A1 | 3/2017 |

OTHER PUBLICATIONS

International Preliminary Report on Patentability dated Dec. 10, 2019 in International Application No. PCT/JP2018/019087.
International Search Report dated Aug. 14, 2018 in International Application No. PCT/JP2018/019087.

* cited by examiner

*Primary Examiner* — Ruiyun Zhang
(74) *Attorney, Agent, or Firm* — Panitch Schwarze Belisario & Nadel LLP

(57) ABSTRACT

A polymerizable liquid crystal composition containing two polymerizable liquid crystal compounds (A) and (B) is provided. A polymer of compound (A) exhibits a reverse wavelength dispersion property and the phase difference value [R(A,3000,450)] at a wavelength of 450 nm measured after irradiation in an oriented state with ultraviolet ray at 3000 $mJ/cm^2$ varies in a positive sense relative to the phase difference value [R(A,500,450)] at a wavelength of 450 nm measured after irradiation in an oriented state with ultraviolet ray at 500 $mJ/cm^2$. A polymer of compound (B) exhibits a reverse wavelength dispersion property and the phase difference value [R(B,3000,450)] at a wavelength of 450 nm measured after irradiation in an oriented state with ultraviolet ray at 3000 $mJ/cm^2$ varies in a negative sense relative to the phase difference value [R(B,500,450)] at a wavelength of 450 nm measured after irradiation in an oriented state with ultraviolet ray at 500 $mJ/cm^2$.

12 Claims, No Drawings

POLYMERIZABLE LIQUID CRYSTAL COMPOSITION AND RETARDATION PLATE

CROSS-REFERENCE TO RELATED APPLICATIONS

This application is a Section 371 of International Application No. PCT/JP2018/019087, filed May 17, 2018, which was published in the Japanese language on Dec. 13, 2018 under International Publication No. WO 2018/225474 A1, which claims priority under 35 U.S.C. § 119(b) to Japanese Application No. 2017-114517, filed Jun. 9, 2017, the disclosures of which are incorporated herein by reference in their entirety.

TECHNICAL FIELD

The present invention relates to a polymerizable liquid crystal composition, a retardation plate composed of a polymer in an alignment state of the polymerizable liquid crystal composition, an elliptically polarizing plate including the retardation plate, and an organic EL display device.

BACKGROUND ART

As a retardation plate used for a flat panel display (FPD), a retardation plate exhibiting reverse wavelength dispersibility is known (Patent Document 1). In particular, in recent years, thinning of flat panel displays has been demanded, and a retardation plate composed of a liquid crystal cured layer formed by curing a polymerizable liquid crystal compound in an alignment state by ultraviolet irradiation has been developed (Patent Document 2).

PRIOR ART DOCUMENTS

Patent Documents

Patent Document 1: JP-A-2012-214801
Patent Document 2: JP-A-2015-163935

SUMMARY OF THE INVENTION

Problem to be Solved by the Invention

In recent years, the flat panel displays has been getting to be used widely, for example, for in-vehicle image display devices such as car navigation devices and back monitors. Along with this, a retardation plate that hardly changes in performance even under harsh conditions has been demanded. In order to obtain such a retardation plate that hardly changes in performance, preferably curing is sufficiently performed by irradiation with sufficient ultraviolet rays.

However, a polymerizable liquid crystal compound exhibiting reverse wavelength dispersibility generally has a maximum absorption in an ultraviolet region. When the polymerizable liquid crystal compound is irradiated with high-intensity ultraviolet rays in order to increase the polymerization rate of the polymerizable liquid crystal compound, the optical characteristics may change, and optical performance of the obtained retardation plate may not always be satisfactory.

An object of the present invention is to provide a polymerizable liquid crystal composition that hardly changes in optical performance even when irradiated with high-intensity ultraviolet rays and that can be highly polymerized, and a retardation plate that includes a liquid crystal cured layer composed of a polymer of the polymerizable liquid crystal composition, has high optical performance, and hardly changes in performance even under a severe environment.

Means for Solving the Problems

The present invention provides the following preferred embodiments [1] to [14].

[1] A polymerizable liquid crystal composition containing two or more types of polymerizable liquid crystal compounds, at least one type of the polymerizable liquid crystal compounds is a polymerizable liquid crystal compound (A) in which a polymer of the polymerizable liquid crystal compound exhibits reverse wavelength dispersibility in an alignment state, and with respect to a retardation value [R(A, 500, 450)] at a wavelength of 450 nm measured after irradiation of the polymerizable liquid crystal compound in the alignment state with ultraviolet rays of 500 mJ/cm$^2$, a retardation value [R(A, 3000, 450)] at a wavelength of 450 nm measured after irradiation with ultraviolet rays of 3000 mJ/cm$^2$ changes in a positive direction, and at least one type of the polymerizable liquid crystal compounds is a polymerizable liquid crystal compound (B) in which a polymer of the polymerizable liquid crystal compound exhibits the reverse wavelength dispersibility in an alignment state, and with respect to a retardation value [R(B, 500, 450)] at a wavelength of 450 nm measured after irradiation of the polymerizable liquid crystal compound in the alignment state with ultraviolet rays of 500 mJ/cm$^2$, a retardation value [R(B, 3000, 450)] at a wavelength of 450 nm measured after irradiation with ultraviolet rays of 3000 mJ/cm$^2$ changes in a negative direction.

[2] The polymerizable liquid crystal composition according to [1], in which the polymerizable liquid crystal compound (A) is a compound represented by formula (1):

[Chemical Formula 1]

$$P^{1a}—E^{1a}—(B^{1a}—G^{1a})_{ka}—L^{1a}—Ar^{a}—L^{2a}—(G^{2a}—B^{2a})_{la}—E^{2a}—P^{2a} \quad (1)$$

[wherein $Ar^a$ is a divalent aromatic group optionally having a substituent, $L^{1a}$, $L^{2a}$, $B^{1a}$ and $B^{2a}$ are each independently a single bond or a divalent linking group, an alkylene group having 1 to 4 carbon atoms, —COO—, —OCO—, —O—, —S—, —ROR—, —RCOOR—, —ROCOR—, ROC═OOR—, —N═N—, —CR'═CR'—, or —C≡C—, (here, each R independently represents a single bond or an alkylene group having 1 to 4 carbon atoms, and each R' independently represents an alkyl group having 1 to 4 carbon atoms or a hydrogen atom), $G^{1a}$ and $G^{2a}$ each independently represent a divalent aromatic group or a divalent alicyclic hydrocarbon group, a hydrogen atom contained in the alicyclic hydrocarbon group is optionally substituted with a halogen atom, an alkyl group having 1 to 4 carbon atoms, a fluoroalkyl group having 1 to 4 carbon atoms, an alkoxy group having 1 to 4 carbon atoms, a cyano group or a nitro group, and a carbon atom constituting the divalent aromatic group or divalent alicyclic hydrocarbon group is optionally substituted with an oxygen atom, a sulfur atom or a nitrogen atom, $E^{1a}$ and $E^{2a}$ each independently represent an alkanediyl group having 1 to 17 carbon atoms, provided that a hydrogen atom contained in the alkanediyl group is optionally substituted with a halogen atom, and —$CH_2$— contained in the alkanediyl group is optionally substituted with —O—, —S—, or —Si—, $P^{1a}$ and $P^{2a}$ each independently represent a hydrogen atom or a polymerizable group (provided that at least one of $P^{1a}$ and $P^{2a}$ is a polymerizable group), and ka and la each independently represent an integer of 0 to 3 and satisfy a relation of $1 \leq k^a + l^a$, (here, when $2 \leq k^a + l^a$, $B^{1a}$ and $B^{2a}$ are optionally the same or different from each other, and $G^{1a}$ and $G^{2a}$ are optionally the same or different from each other)], the polymerizable liquid crystal compound (B) is a compound represented by formula (2):

[Chemical Formula 2]

$$P^{1b}—E^{1b}—(B^{1b}—G^{1b})_{k^b}—L^{1b}—Ar^{b}—L^{2b}—(G^{2b}—B^{2b})_{l^b}—E^{2b}—P^{2b} \quad (2)$$

[wherein $Ar^b$ is a divalent aromatic group optionally having a substituent, and $L^{1b}$, $L^{2b}$, $B^{1b}$, $B^{2b}$, $G^{1b}$, $G^{2b}$, $E^{1b}$, $E^{2b}$, $P^{1b}$, $P^{2b}$, $k^b$ and $l^b$ each represent the same meaning as $L^{1a}$, $L^{2a}$, $B^{1a}$, $B^{2a}$, $G^{1a}$, $G^{2a}$, $E^{1a}$, $E^{2a}$, $P^{1a}$, $P^{2a}$, $k^a$ and $l^a$ in the above formula (1)], and the divalent aromatic group represented by $Ar^a$ in the formula (1) and the divalent aromatic group represented by $Ar^b$ in the formula (2) have different structures.

[3] The polymerizable liquid crystal composition according to [2], in which $Ar^a$ and $Ar^b$ in the formulas (1) and (2) are each a divalent aromatic group which optionally has a substituent, and which has an aromatic heterocyclic ring containing at least two heteroatoms selected from the group consisting of a nitrogen atom, an oxygen atom and a sulfur atom.

[4] The polymerizable liquid crystal composition according to [2] or [3], in which $Ar^a$ and $Ar^b$ in the formulas (1) and (2) are each an aromatic group in which a number $N^\pi$ of $\pi$ electrons is from 12 to 22, each have an aromatic heterocyclic ring containing at least two heteroatoms selected from the group consisting of a nitrogen atom, an oxygen atoms and a sulfur atom, and are sterically arranged in a direction substantially perpendicular to a molecular orientation direction.

[5] The polymerizable liquid crystal composition according to any one of [2] to [4], wherein in the formula (1), $L^{1a}=L^{2a}$, $G^{1a}=G^{2a}$, $B^{1a}=B^{2a}$, $E^{1d}=E^{2a}$, $P^{1a}=P^{2a}$, and $k^a=l^a$, and in the formula (2), $L^{1b}=L^{2b}$, $G^{1b}=G^{2b}$, $B^{1b}=B^{2b}$, $E^{1b}=E^{2b}$, $P^{1b}=P^{2b}$, and $k^b=l^b$.

[6] The polymerizable liquid crystal composition according to any one of [2] to [5], in which an aromatic group represented by $Ar^a$ in the formula (1) includes a nitrogen atom, a sulfur atom, an oxygen atom, a carbon atom and a hydrogen atom, and an aromatic group represented by $Ar^b$ in the formula (2) includes of a nitrogen atom, a sulfur atom, a carbon atom and a hydrogen atom.

[7] The polymerizable liquid crystal composition according to any one of [1] to [6], in which the polymerizable liquid crystal composition contains the polymerizable liquid crystal compound (A) in an amount of 5 to 80 mole with respect to 100 mole of the polymerizable liquid crystal compound (B).

[8] A retardation plate containing a liquid crystal cured layer containing monomer units derived from two or more types of polymerizable liquid crystal compounds, at least one type of the polymerizable liquid crystal compounds is a polymerizable liquid crystal compound (A) in which a polymer of the polymerizable liquid crystal compound exhibits reverse wavelength dispersibility in an alignment state, and with respect to a retardation value [R(A, 500, 450)] at a wavelength of 450 nm measured after irradiation of the polymerizable liquid crystal compound in an alignment state with ultraviolet rays of 500 $mJ/cm^2$, a retardation value [R(A, 3000, 450)] at a wavelength of 450 nm measured after irradiation with ultraviolet rays of 3000 $mJ/cm^2$ changes in a positive direction, and at least one type of the polymerizable liquid crystal compounds is a polymerizable liquid crystal compound (B) in which a polymer of the polymerizable liquid crystal compound exhibits the reverse wavelength dispersibility in an alignment state, and with respect to a retardation value [R(B, 500, 450)] at a wavelength of 450 nm measured after irradiation of the polymerizable liquid crystal compound in an alignment state with ultraviolet rays of 500 $mJ/cm^2$, a retardation value [R(B, 3000, 450)] at a wavelength of 450 nm measured after irradiation with ultraviolet rays of 3000 $mJ/cm^2$ changes in a negative direction.

[9] The retardation plate according to [7], in which the liquid crystal cured layer containing monomer units derived from the two or more types of polymerizable liquid crystal compounds includes a polymer of the polymerizable liquid crystal composition according to any one of [1] to [6], said polymer being in an alignment state.

[10] The retardation plate according to [8] or [9], in which a three-dimensional refractive index ellipsoid formed by the liquid crystal cured layer has uniaxiality.

[11] The retardation plate according to any one of [8] to [10], in which the three-dimensional refractive index ellipsoid formed by the liquid crystal cured layer has uniaxiality, and when a main refractive index in an axial direction is ne and a refractive index in an arbitrary direction in a plane perpendicular to the main refractive index is no, a direction of ne is a direction parallel or perpendicular to a plane of the liquid crystal cured layer.

[12] The retardation plate according to any one of [8] to [11], in which the three-dimensional refractive index ellipsoid formed by the liquid crystal cured layer has uniaxiality; when the main refractive index in the axial direction is ne and the refractive index in an arbitrary direction in the plane perpendicular to the main refractive index is no, the direction of ne is the direction parallel or perpendicular to the plane of the liquid crystal cured layer; and the retardation plate has optical characteristics represented by formulas (I) and (II):

$$Re(450)/Re(550) \leq 1.00 \quad (I)$$

$$1.00 \leq Re(650)/Re(550) \quad (II)$$

[wherein Re(λ) represents a retardation value at a wavelength λ, and is represented by Re=(ne(λ)−no(λ))×d, and d represents the thickness of the liquid crystal cured layer.]

[13] An elliptically polarizing plate constituted of the retardation plate according to any one of [8] to [11] and a polarizing plate.

[14] An organic EL display device including the elliptically polarizing plate according to [13].

Effect of the Invention

The present invention can provide a polymerizable liquid crystal composition that hardly changes in optical performance even when irradiated with high-intensity ultraviolet rays and that can be highly polymerized, and a retardation plate that includes a liquid crystal cured layer composed of a polymer of the polymerizable liquid crystal composition, has high optical performance, and hardly changes in performance even under a severe environment.

MODE FOR CARRYING OUT THE INVENTION

Hereinafter, embodiments of the present invention will be described in detail. The scope of the present invention is not limited to the embodiment described herein, and various modifications can be made without departing from the spirit of the present invention.

<Polymerizable Liquid Crystal Composition>

The polymerizable liquid crystal composition of the present invention contains two or more types of polymerizable liquid crystal compounds. At least one type of the polymerizable liquid crystal compounds contained in the polymerizable liquid crystal composition of the present invention is a polymerizable liquid crystal compound (A) in which a polymer of the polymerizable liquid crystal compound exhibits reverse wavelength dispersibility in an alignment state, and with respect to a retardation value [R(A, 500, 450)] at a wavelength of 450 nm measured after irradiation with ultraviolet rays of 500 mJ/cm$^2$ in a state where the polymerizable liquid crystal compound is aligned alone, a retardation value [R(A, 3000, 450)] (hereinafter also referred to as "ΔRe (450)") at a wavelength of 450 nm measured after irradiation with ultraviolet rays of 3000 mJ/cm$^2$ in the state where the polymerizable liquid crystal compound is aligned alone changes in a positive direction. At least one type of the polymerizable liquid crystal compounds contained in the polymerizable liquid crystal composition of the present invention is a polymerizable liquid crystal compound (B) in which a polymer of the polymerizable liquid crystal compound exhibits reverse wavelength dispersibility in an alignment state, and with respect to a retardation value [R(A, 500, 450)] at a wavelength of 450 nm measured after irradiation with ultraviolet rays of 500 mJ/cm$^2$ in a state where the polymerizable liquid crystal compound is aligned alone, a retardation value [R(A, 3000, 450)] at a wavelength of 450 nm measured after irradiation with ultraviolet rays of 3000 mJ/cm$^2$ in the state where the polymerizable liquid crystal compound is aligned alone changes in a negative direction.

In the present invention, the polymerizable liquid crystal compounds (A) and (B) both have reverse wavelength dispersibility in a polymer obtained by polymerizing a target polymerizable liquid crystal compound in a state of being aligned alone. The reverse wavelength dispersibility is an optical characteristic that an in-plane retardation value in a short wavelength is larger than an in-plane retardation value in a long wavelength. In the present invention, the polymerizable liquid crystal compound exhibiting reverse wavelength dispersibility specifically means a compound in which a polymer of the polymerizable liquid crystal compound satisfies the following formula in an alignment state:

$$Re(450)<Re(550)<Re(650)$$

[Re(λ) represents a front retardation of a retardation plate at a wavelength λ].

Furthermore, in the polymerizable liquid crystal compound exhibiting reverse wavelength dispersibility in the present invention, the polymer in the alignment state of the polymerizable liquid crystal compound preferably satisfies the following formulas (I) and (II):

$$Re(450)/Re(550) \leq 1.00 \quad (I)$$

$$1.00 \leq Re(650)/Re(550) \quad (II)$$

[wherein, Re(λ) represents the same meaning as described above.]

"Changes in a positive direction" in the present invention means that with respect to the retardation value [R(A, 500, 450)] at a wavelength of 450 nm measured after irradiation with ultraviolet rays of 500 mJ/cm$^2$ in a state where a target polymerizable liquid crystal compound is aligned alone, the retardation value [R(A, 3000, 450)] at a wavelength of 450 nm measured after irradiation with ultraviolet rays of 3000 mJ/cm$^2$ in the state where the polymerizable liquid crystal compound is aligned alone increases. Conversely, the retardation value "changes in a negative direction" means that the retardation value [R(A, 3000, 450)] is smaller than the retardation value [R(A, 500, 450)]. In the present invention, when the change in ΔRe (450) is 1.5 nm or less, preferably 1 nm or less, more preferably 0.5 nm or less in absolute value, the polymerizable liquid crystal compound is regarded as a compound having a property of unchanging the retardation value under the above-described specific ultraviolet irradiation conditions.

In the present invention, the retardation value [R(A, 500, 450)] of the polymerizable liquid crystal compound is a value obtained by applying a solution, containing the polymerizable liquid crystal compound to which a predetermined amount of a polymerization initiator and a solvent are added, onto an alignment film and then measuring an in-plane retardation value of the liquid crystal cured layer, obtained by irradiating ultraviolet rays having a wavelength of 365 nm so that the integrated light quantity at a wavelength of 365 nm is 500 mJ/cm$^2$, with respect to light having a wavelength of 450 nm. The retardation value [R(A, 3000, 450)] of the polymerizable liquid crystal compound is a value obtained by measuring an in-plane retardation value of the liquid crystal cured layer with respect to light having a wavelength of 450 nm obtained after further irradiating the liquid crystal cured layer in which the retardation value [R(A, 500, 450)] has been measured with ultraviolet rays having a wavelength of 365 nm so that the integrated light quantity at a wavelength of 365 nm is 2500 mJ/cm$^2$ (that is, the integrated light quantity at the time of irradiation at a wavelength of 365 nm is 3000 mJ/cm$^2$ in total with the ultraviolet rays irradiated during preparation of the liquid crystal cured layer). More specifically, the retardation value is measured by the method described in the examples below.

In the case of a polymerizable liquid crystal compound, particularly a polymerizable liquid crystal compound exhibiting reverse wavelength dispersibility having a maximum absorption in an ultraviolet region having a wavelength of 250 to 400 nm, its optical characteristics may change upon irradiation with ultraviolet rays. Whether ΔRe (450) changes in the positive or negative direction when the polymerizable liquid crystal compound is irradiated with ultraviolet rays under the above specific conditions is different depending on, for example, the type and molecular structure of the polymerizable liquid crystal compound. The present invention focuses on the above-described unique optical characteristics of individual polymerizable liquid crystal compounds. Presumably, when the polymerizable liquid crystal composition contains a polymerizable liquid crystal compound in which ΔRe (450) changes in the positive direction by irradiation with ultraviolet rays and a polymerizable liquid crystal compound in which ΔRe (450) changes in the negative direction, changes in optical characteristics in individual polymerizable liquid crystal compounds at the time of ultraviolet irradiation are offset to suppress the changes in optical characteristics as a polymerizable liquid crystal composition at the time of ultraviolet irradiation.

In the polymerizable liquid crystal composition of the present invention, a blending ratio of the polymerizable liquid crystal compound (A) and the polymerizable liquid crystal compound (B) can be appropriately determined so as to cancel an in-plane retardation change in a positive direction and an in-plane retardation change in a negative direction, based on the above-described optical characteristics exhibited by the individual polymerizable liquid crystal compounds to be used, that is, the value of ΔRe (450) obtained when the polymerizable liquid crystal compound is irradiated with ultraviolet rays under the above specific conditions. For example, in a polymerizable liquid crystal composition containing the polymerizable liquid crystal compound (A) having a ΔRe (450) of +8 nm and the polymerizable liquid crystal compound (B) having a ΔRe (450) of −2 nm as the same amount of polymerizable liquid crystal compounds, when the polymerizable liquid crystal compound (A) and the polymerizable liquid crystal compound (B) are contained at 2:8, the value of ΔRe (450) is canceled theoretically (close to 0 nm). Therefore, the present invention can give a polymerizable liquid crystal composition that hardly changes optical characteristics even when high-intensity ultraviolet rays are irradiated, and a polymerizable liquid crystal composition that can be highly polymerized, by determining, in consideration of the individual ΔRe (450) values of the polymerizable liquid crystal compounds (A) and (B), the blending ratio of the polymerizable liquid crystal compound (A) and the polymerizable liquid crystal compound (B) such that with respect to a retardation value at a wavelength of 450 nm measured after irradiation with ultraviolet rays of 500 mJ/cm$^2$ in a state where a polymerizable liquid crystal composition containing the polymerizable liquid crystal compounds (A) and (B) is aligned, a difference (value of ΔRe (450)) from a retardation value at a wavelength of 450 nm measured after irradiation with ultraviolet rays of 3000 mJ/cm$^2$ in a state where the relevant polymerizable liquid crystal composition is aligned is close to 0 nm, preferably, the difference is in a range of −1.5 to 1.5 nm or −1 to 1 nm.

In one embodiment of the present invention, since it is possible to effectively suppress the change in optical characteristics of the polymerizable liquid crystal composition during ultraviolet irradiation, the polymerizable liquid crystal composition of the present invention preferably contains the polymerizable liquid crystal compound (A) in an amount of preferably 5 to 80 mole, more preferably 7.5 to 75 mole, further preferably 10 to 70 mole with respect to 100 mole of the polymerizable liquid crystal compound (B).

In the present invention, the polymerizable liquid crystal compound (A) and the polymerizable liquid crystal compound (B) contained in the polymerizable liquid crystal composition can be used without particular limitation as long as a polymer in an alignment state exhibits the reverse wavelength dispersibility and the retardation value [R(A, 3000, 450)] changes in the positive direction or the negative direction with respect to the retardation value [R(A, 500, 450)]. The polymerizable liquid crystal compound (A) and the polymerizable liquid crystal compound (B) preferably have structures similar to each other because they are compatible with each other and a uniform polymerizable liquid crystal composition is easily obtained. In the polymerizable liquid crystal composition of the present invention, each of the polymerizable liquid crystal compounds (A) and (B) may be used alone or in combination of two or more.

The polymerizable liquid crystal compound (A) and the polymerizable liquid crystal compound (B) are each preferably a polymerizable liquid crystal compound having a rod-like molecular shape from the viewpoint of expressing reverse wavelength dispersibility. The polymerizable liquid crystal compound having a rod-like molecular shape refers to a liquid crystal compound having a rotational axis in the major axis direction of the molecule and may be a nematic liquid crystal phase or a smectic liquid crystal phase.

In the present invention, the polymerizable liquid crystal compound (A) is a polymerizable liquid crystal compound that has light absorption with respect to light in an ultraviolet region with a wavelength of 250 nm to 400 nm and in which with respect to the retardation value [R(A, 500, 450)] at a wavelength of 450 nm measured after irradiation of the polymerizable liquid crystal compound in the alignment state with ultraviolet rays of 500 mJ/cm$^2$, the retardation value [R(A, 3000, 450)] at a wavelength of 450 nm measured after irradiation with ultraviolet rays of 3000 mJ/cm$^2$ changes in the positive direction. The polymerizable liquid crystal compound (A) is preferably a compound represented by the following formula (1):

[Chemical Formula 3]

$$P^{1a}—E^{1a}—(B^{1a}—G^{1a})_{k^a}—L^{1a}—Ar^{a}—L^{2a}—(G^{2a}—B^{2a})_{l^a}—E^{2a}—P^{2a} \quad (1)$$

When the polymerizable liquid crystal compound (A) is a compound having a structure represented by the above formula (1), the reverse wavelength dispersibility is exhibited, and uniform polarization conversion can be performed in a wide wavelength range. When the compound is used for a display device, a polymerizable liquid crystal composition capable of imparting good display characteristics can be obtained.

In formula (1), $Ar^a$ is a divalent aromatic group which may have a substituent.

$L^{1a}$, $L^{2a}$, $B^{1a}$ and $B^{23}$ are each independently a single bond or a divalent linking group, and an alkylene group having 1 to 4 carbon atoms, —COO—, —OCO—, —O—, —S—, —ROR—, —RCOOR—, —ROCOR—, ROC═OOR—, —N═N—, —CR'═CR'—, or —C≡C—. Here, each R independently represents a single bond or an alkylene group having 1 to 4 carbon atoms, and each R' independently represents an alkyl group having 1 to 4 carbon atoms or a hydrogen atom.

$G^{1a}$ and $G^{2a}$ each independently represent a divalent aromatic group or a divalent alicyclic hydrocarbon group. A hydrogen atom contained in the alicyclic hydrocarbon group may be substituted with a halogen atom, an alkyl group having 1 to 4 carbon atoms, a fluoroalkyl group having 1 to 4 carbon atoms, an alkoxy group having 1 to 4 carbon atoms, a cyano group or a nitro group. A carbon atom constituting the divalent aromatic group or divalent alicyclic hydrocarbon group may be substituted with an oxygen atom, a sulfur atom or a nitrogen atom.

$E^{1a}$ and $E^{2a}$ each independently represent an alkanediyl group having 1 to 17 carbon atoms. Here, a hydrogen atom contained in the alkanediyl group may be substituted with a halogen atom, and —$CH_2$— contained in the alkanediyl group may be substituted with —O—, —S—, or —Si—.

$P^{1a}$ and $P^{2a}$ each independently represent a hydrogen atom or a polymerizable group, and at least one of $P^{1a}$ and $P^2$ is a polymerizable group.

$k^a$ and $l^a$ each independently represent an integer of 0 to 3 and satisfy a relation of $1 \le k^a + l^a$. Here, when $2 \le k^a + l^3$, $B^{1a}$ and $B^{2a}$ may be the same or different from each other, and $G^{1a}$ and $G^{2a}$ may be the same or different from each other.

$L^{1a}$ and $L^{2a}$ are each independently preferably a single bond, an alkylene group having 1 to 4 carbon atoms, —O—, —S—, —ROR—, —RCOOR—, —ROCOR—, or ROC═OOR—, —N═N—, —CR'═CR'—, or —C≡C—. Here, each R independently represents a single bond or an alkylene group having 1 to 4 carbon atoms, and each R' independently represents an alkyl group having 1 to 4 carbon atoms or a hydrogen atom. $L^{1a}$ and $L^{2a}$ are each independently more preferably a single bond, —OR"—, —$CH_2$—, —$CH_2CH_2$—, —COOR"—, or —OCOR"—. Here, R" each independently represents a single bond, —$CH_2$—, or —$CH_2CH_2$—. $L^{1a}$ and $L^{2a}$ are each independently more preferably a single bond, —O—, —$CH_2CH_2$—, —COO—, —$COOCH_2CH_2$—, or —OCO—. In formula (1), $L^{1a}$ and $L^{2a}$ may be the same or different from each other, but $L^{1a}$ and $L^{2a}$ are preferably the same from the viewpoint of facilitating production of the polymerizable liquid crystal compound and suppressing the production cost. $L^{1a}$ and $L^{2a}$ being identical to each other means that the structures of $L^a$ and $L^{2a}$ are the same when viewed from $Ar^a$. Hereinafter, the same applies to the relationships between $B^{1a}$ and $B^{2a}$, $G^{1a}$ and $G^{2a}$, $E^{1a}$ and $E^{2a}$, and $P^{1a}$ and $P^{2a}$.

$B^{1a}$ and $B^{2a}$ are each independently preferably a single bond, an alkylene group having 1 to 4 carbon atoms, —O—, —S—, —ROR—, —RCOOR—, —ROCOR—, or ROC═OOR—. Here, R represents each independently a single bond, or an alkylene group having 1 to 4 carbon atoms. $B^{1a}$ and $B^{2a}$ are each independently more preferably a single bond, —OR"—, —$CH_2$—, —$CH_2CH_2$—, —COOR"—, or —OCOR"—.

Here, R" each independently represents a single bond, —$CH_2$—, or —$CH_2CH_2$—. $B^{1a}$ and $B^{2a}$ are each independently more preferably a single bond, —O—, —$CH_2CH_2$—, —COO—, —$COOCH_2CH_2$—, —OCO— or —$OCOCH_2CH_2$—. In formula (1), $B^{1a}$ and $B^{2a}$ may be the same or different from each other, but $B^{1a}$ and $B^{2a}$ are preferably the same from the viewpoint of facilitating production of the polymerizable liquid crystal compound and suppressing the production cost.

$G^{1a}$ and $G^{2a}$ are each independently preferably a 1,4-phenylenediyl group which may be substituted with at least one substituent selected from the group consisting of a halogen atom and an alkyl group having 1 to 4 carbon atoms or a 1,4-cyclohexanediyl group which may be substituted with at least one substituent selected from the group consisting of a halogen atom and an alkyl group having 1 to 4 carbon atoms, more preferably 1,4-phenylenediyl group substituted with a methyl group, an unsubstituted 1,4-phenylenediyl group or an unsubstituted 1,4-trans-cyclohexanediyl group, particularly preferably an unsubstituted 1,4-phenylenediyl group or an unsubstituted 1,4-trans-cyclohexanediyl group. In formula (1), $G^{1a}$ and $G^{2a}$ may be the same or different from each other, but $G^{1a}$ and $G^{2a}$ are preferably the same from the viewpoint of facilitating production of the polymerizable liquid crystal compound and suppressing the production cost. When there are a plurality of $G^{1a}$ and $G^{2a}$, at least one of them is preferably a divalent alicyclic hydrocarbon group. At least one of $G^{1a}$ and $G^{2a}$ bonded to $L^{1a}$ or $L^{2a}$ is more preferably a divalent alicyclic hydrocarbon group, and particularly, since good liquid crystallinity is exhibited, both $G^{1a}$ and $G^{2a}$ bonded to $L^{1a}$ or $L^{2a}$ are further preferably 1,4-trans-cyclohexanediyl group.

$E^{1a}$ and $E^{2a}$ are each independently preferably an alkanediyl group having 1 to 17 carbon atoms, and more preferably an alkanediyl group having 4 to 12 carbon atoms. In formula (1), $E^{1a}$ and $E^{2a}$ may be the same or different from each other, but $E^{1a}$ and $E^{2a}$ are preferably the same from the viewpoint of facilitating production of the polymerizable liquid crystal compound and suppressing the production cost.

$k^a$ and $l^a$ are preferably in a range of $2 \le k^a + l^a \le 6$ from the viewpoint of expressing the reverse wavelength dispersibility, preferably $k^a + l^a = 4$, and more preferably $k^a = 2$ and $l^a = 2$ for a symmetrical structure.

Examples of the polymerizable group represented by $P^{1a}$ or $P^{2a}$ include an epoxy group, a vinyl group, a vinyloxy group, a 1-chlorovinyl group, an isopropenyl group, a 4-vinylphenyl group, an acryloyloxy group, a methacryloyloxy group, an oxiranyl group, and an oxetanyl group. Among them, an acryloyloxy group, a methacryloyloxy group, a vinyloxy group, an oxiranyl group, and an oxetanyl group are preferable, and an acryloyloxy group is more preferable. In formula (1), $P^{1a}$ and $P^{2a}$ may be the same or different from each other, but $E^{1a}$ and $E^{2a}$ are preferably the same from the viewpoint of facilitating production of the polymerizable liquid crystal compound and suppressing the production cost.

From the viewpoint of facilitating production of the polymerizable liquid crystal compound and suppressing the production cost, it is more preferable that $L^{1a} = L^{2a}$, $G^{1a} = G^{2a}$, $B^{1a} = B^{2a}$, $E^{1a} = E^{2a}$, $P^{1a} = P^{2a}$, and $k^a = l^a$.

$Ar^a$ is a divalent aromatic group which may have a substituent. In the present invention, the aromatic group is a group having a planar cyclic structure, and the number of n electrons of the ring structure is [4n+2] (n represents an integer) according to the Hückel rule. When a ring structure is formed by including heteroatoms such as —N═ and —S—, the aromatic group satisfies the Hückel's rule, including a non-covalent electron pair on these heteroatoms, and includes those having aromaticity.

An aromatic group which may have a substituent represented by $Ar^a$ preferably has an aromatic hydrocarbon ring which may have a substituent or an aromatic heterocyclic ring which may have a substituent.

Examples of the aromatic hydrocarbon ring include a benzene ring, a naphthalene ring, and an anthracene ring, and examples include a benzene ring and a naphthalene ring. Examples of the aromatic heterocycle include furan ring, benzofuran ring, pyrrole ring, indole ring, thiophene ring, benzothiophene ring, pyridine ring, pyrazine ring, pyrimidine ring, triazole ring, triazine ring, pyrroline ring, imidazole ring, pyrazole ring, thiazole ring, benzothiazole ring, thienothiazole ring, oxazole ring, benzoxazole ring, and phenanthrolin ring. When $Ar^a$ contains a nitrogen atom, the nitrogen atom preferably has n electrons.

Among them, $Ar^a$ preferably has an aromatic heterocyclic ring containing at least two heteroatoms selected from the group consisting of nitrogen atoms, oxygen atoms and sulfur atoms, more preferably has a thiazole ring or a benzothiazole ring, and further preferably has a benzothiazole ring. When $Ar^a$ has an aromatic heterocyclic ring containing at least two heteroatoms selected from the group consisting of nitrogen atom, oxygen atom and sulfur atom, the aromatic heterocyclic ring may be directly bonded to $L^{1a}$ and $L^{2b}$ in formula (1) to form a divalent aromatic group or may be contained as a substituent of a divalent aromatic group directly bonded to $L^{*a}$ and $L^{2b}$, and the entire $Ar^a$ group including the aromatic heterocyclic ring is preferably sterically arranged in a direction substantially perpendicular to the molecular orientation direction.

In formula (1), a total number $N^{\pi}$ of $\pi$ electrons contained in the divalent aromatic group represented by $Ar^a$ is preferably 12 or more, more preferably 16 or more. Moreover, the total number $N^{\pi}$ is preferably 22 or less, more preferably 20 or less.

Examples of the aromatic group represented by $A^a$ include groups represented by the following formulas (Ar-1) to (Ar-22).

[Chemical Formula 4]

(Ar-1)

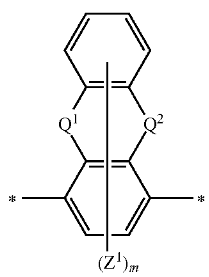

(Ar-2)

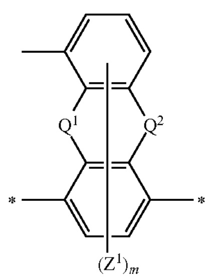

(Ar-3)

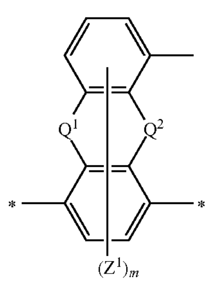

(Ar-4)

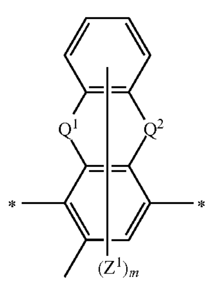

(Ar-5)

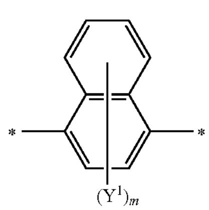

-continued (Ar-6)

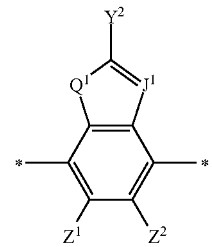

(Ar-7)

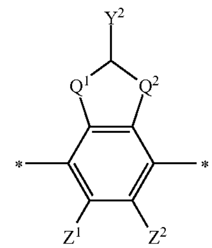

(Ar-8)

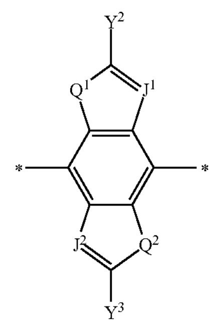

(Ar-9)

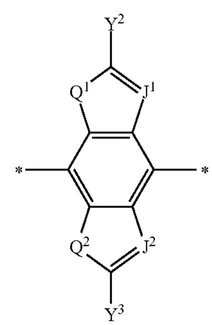

(Ar-10)

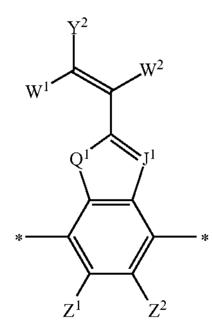

-continued
(Ar-11)
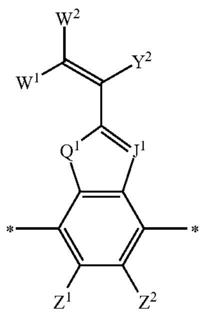
(Ar-12)
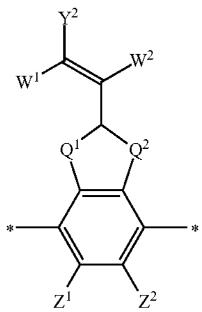
(Ar-13)
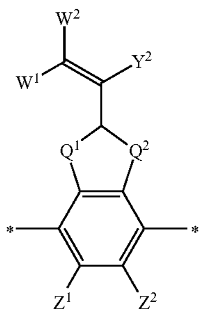
(Ar-14)
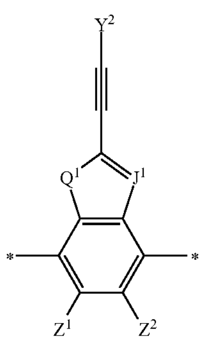
(Ar-15)
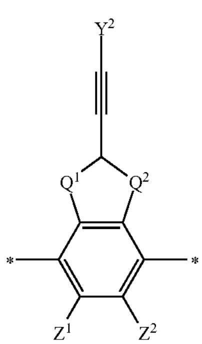
-continued
(Ar-16)
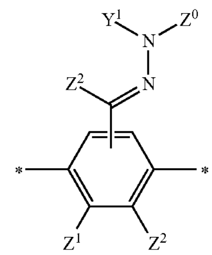
(Ar-17)
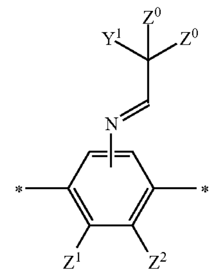
(Ar-18)
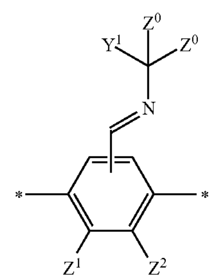
(Ar-19)
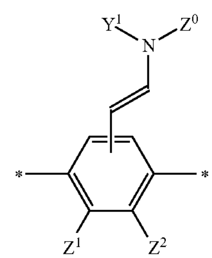
(Ar-20)
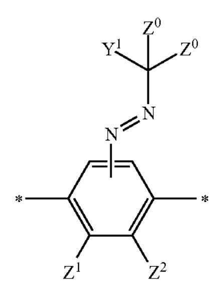
(Ar-21)
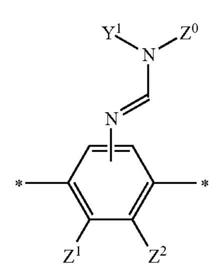

-continued (Ar-22)

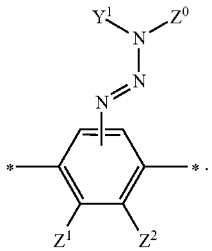

In formulas (Ar-1) to (Ar-22), * represents a linking site, and $Z^0$, $Z^1$, and $Z^2$ each independently represent a hydrogen atom, a halogen atom, an alkyl group having 1 to 12 carbon atoms, a cyano group, a nitro group, an alkylsulfinyl group having 1 to 12 carbon atoms, an alkylsulfonyl group having 1 to 12 carbon atoms, a carboxyl group, a fluoroalkyl group having 1 to 12 carbon atoms, an alkoxy group having 1 to 6 carbon atoms, an alkylthio group having 1 to 12 carbon atoms, an N-alkylamino group having 1 to 12 carbon atoms, an N,N-dialkylamino group having 2 to 12 carbon atoms, an N-alkylsulfamoyl group having 1 to 12 carbon atoms, and an N,N-dialkylsulfamoyl group having 2 to 12 carbon atoms.

$Q^1$ and $Q^2$ each independently represent —$CR^{2'}R^{3'}$—, —S—, —NH—, —$NR^{2'}$—, —CO— or —O—, and $R^{2'}$ and $R^{3'}$ each independently represent a hydrogen atom or an alkyl group having 1 to 4 carbon atoms.

$J^1$ and $J^2$ each independently represent a carbon atom or a nitrogen atom.

$Y^1$, $Y^2$ and $Y^3$ each independently represent an optionally substituted aromatic hydrocarbon group or aromatic heterocyclic group.

$W^1$ and $W^2$ each independently represent a hydrogen atom, a cyano group, a methyl group or a halogen atom, and m represents an integer of 0 to 6.

Examples of the aromatic hydrocarbon group in $Y^1$, $Y^2$ and $Y^3$ include aromatic hydrocarbon groups having 6 to 20 carbon atoms such as a phenyl group, a naphthyl group, an anthryl group, a phenanthryl group, and a biphenyl group. The phenyl group and the naphthyl group are preferable, and the phenyl group is more preferable. Example of aromatic heterocyclic groups include aromatic heterocyclic groups having 4 to 20 carbon atoms having at least one heteroatom such as a nitrogen atom, oxygen atom, sulfur atom, or the like, that is, furyl group, pyrrolyl group, thienyl group, pyridinyl group, thiazoryl group, benzothiazolyl group, etc., preferred among these being furyl group, pyrrolyl group, thienyl group, pyridinyl group, and thiazoryl group.

$Y^1$, $Y^2$ and $Y^3$ may each independently represent an optionally substituted polycyclic aromatic hydrocarbon group or polycyclic aromatic heterocyclic group. The polycyclic aromatic hydrocarbon group refers to a condensed polycyclic aromatic hydrocarbon group or a group derived from an aggregate of aromatic rings. The polycyclic aromatic heterocyclic group refers to a condensed polycyclic aromatic heterocyclic group or a group derived from an aggregate of aromatic rings.

$Z^0$, $Z^1$, and $Z^2$ are each independently preferably a hydrogen atom, a halogen atom, an alkyl group having 1 to 12 carbon atoms, a cyano group, a nitro group, or an alkoxy group having 1 to 12 carbon atoms, $Z^0$ is more preferably a hydrogen atom, an alkyl group having 1 to 12 carbon atoms, and a cyano group, and $Z^1$ and $Z^2$ are more preferably a hydrogen atom, a fluorine atom, a chlorine atom, a methyl group, and a cyano group.

$Q^1$ and $Q^2$ are preferably —NH—, —S—, —$NR^{2'}$—, and —O—, and $R^{2'}$ is preferably a hydrogen atom. Among them, —S—, —O—, and —NH— are particularly preferable.

In formulas (Ar-16) to (Ar-22), $Y^1$ may form an aromatic heterocyclic group together with a nitrogen atom to which $Y^1$ is bonded and $Z^0$. Examples of the aromatic heterocyclic group include those described above as the aromatic heterocyclic ring which Ar may have, and examples include pyrrole ring, imidazole ring, pyrroline ring, pyridine ring, pyrazine ring, pyrimidine ring, indole ring, quinoline ring, isoquinoline ring, purine ring, and pyrrolidine ring. The aromatic heterocyclic group may have a substituent. $Y^1$ may be the above-described optionally substituted polycyclic aromatic hydrocarbon group or polycyclic aromatic heterocyclic group together with the nitrogen atom to which $Y^1$ is bonded and $Z^0$. Examples include a benzofuran ring, a benzothiazole ring, and a benzoxazole ring.

Among formulas (Ar-1) to (Ar-22), formula (Ar-6) and formula (Ar-7) are preferable from the viewpoint of molecular stability. Among these, a divalent aromatic group represented by the following formula (1-1-A) is more preferable.

[Chemical Formula 5]

(1-1-A)

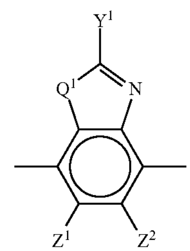

[wherein $Q^1$, $Y^1$, $Z^1$ and $Z^2$ have the same meaning as described above.]

Examples of the divalent aromatic group represented by the above formula (1-1-A) include aromatic groups represented by the following formulas (1-1-1) to (1-1-18).

[Chemical Formula 6]

(1-1-1)

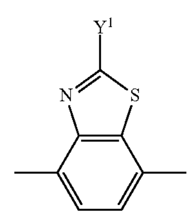

(1-1-2)

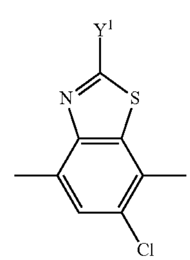

-continued
(1-1-3)
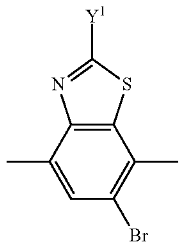
(1-1-4)
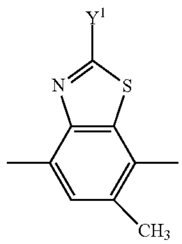
[Chemical Formula 7]
(1-1-5)
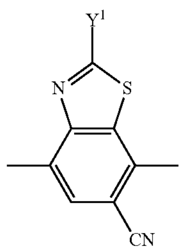
(1-1-6)
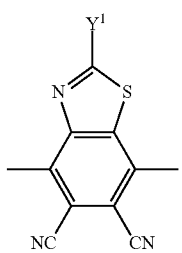
(1-1-7)
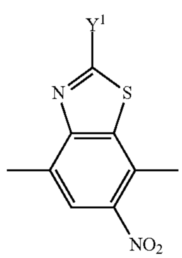
(1-1-8)
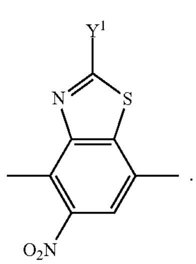
-continued
[Chemical Formula 8]
(1-1-9)
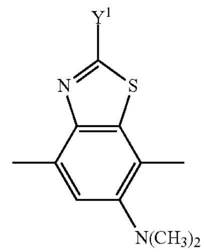
(1-1-10)
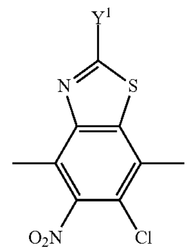
(1-1-11)
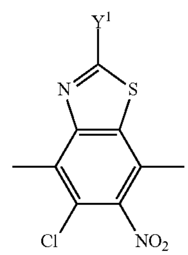
[Chemical Formula 9]
(1-1-12)
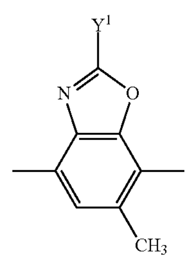
(1-1-13)
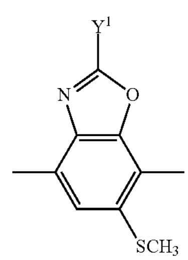
(1-1-14)
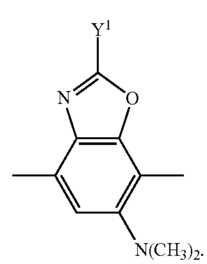

-continued

[Chemical Formula 10]

(1-1-15)

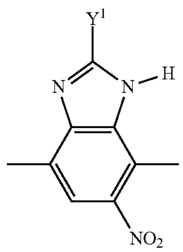

(1-1-16)

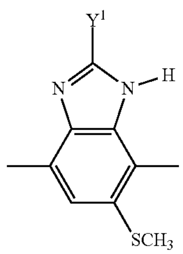

(1-1-17)

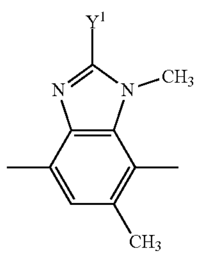

(1-1-18)

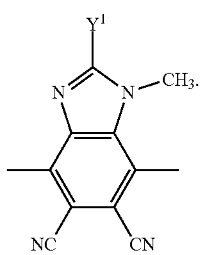

$Y^1$ is an optionally substituted polycyclic aromatic hydrocarbon group or polycyclic aromatic heterocyclic group. "Polycyclic aromatic hydrocarbon group" means an aromatic hydrocarbon group having at least two aromatic rings, and examples include a condensed aromatic hydrocarbon group formed by condensation of two or more aromatic rings and an aromatic hydrocarbon group formed by bonding of two or more aromatic rings. Polycyclic aromatic heterocyclic group" means an aromatic heterocyclic group having at least one heteroaromatic ring and having at least one ring selected from the group consisting of an aromatic ring and a heteroaromatic ring, and examples include an aromatic heterocyclic group formed by condensation of one or more aromatic heterocycles and one or more rings selected from the group consisting of aromatic rings and heteroaromatic rings, and an aromatic heterocyclic group formed by bonding of at least one heteroaromatic rings and at least one ring selected from the group consisting of aromatic rings and heteroaromatic rings.

The polycyclic aromatic hydrocarbon group and the polycyclic aromatic heterocyclic group may be unsubstituted or may have a substituent. Examples of the substituent include a halogen atom, an alkyl group having 1 to 6 carbon atoms, a cyano group, a nitro group, a nitroso group, an alkylsulfinyl group having 1 to 6 carbon atoms, an alkylsulfonyl group having 1 to 6 carbon atoms, a carboxy group, a fluoroalkyl group having 1 to 6 carbon atoms, an alkoxy group having 1 to 6 carbon atoms, an alkylsulfanyl group having 1 to 6 carbon atoms, an N-alkylamino group having 1 to 4 carbon atoms, an N,N-dialkylamino group having 2 to 8 carbon atoms, a sulfamoyl group, an N-alkylsulfamoyl group having 1 to 6 carbon atoms, and an N,N-dialkylsulfamoyl group having 2 to 12 carbon atoms.

$Y^1$ is, for example, preferably any group represented by the following formulas ($Y^1$-1) to ($Y^1$-7), and more preferably any group represented by formula ($Y^1$-1) or formula ($Y^1$-4).

[Chemical Formula 11]

($Y^1$-1)

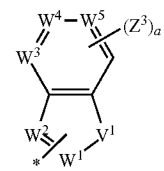

($Y^1$-2)

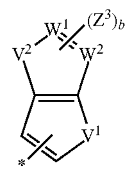

($Y^1$-3)

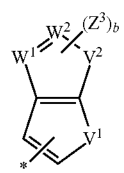

($Y^1$-4)

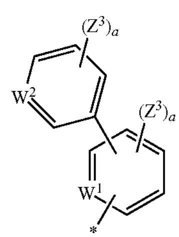

($Y^1$-5)

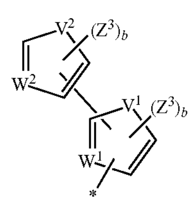

($Y^1$-6)

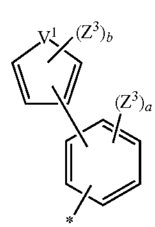

-continued (Y$^1$-7)

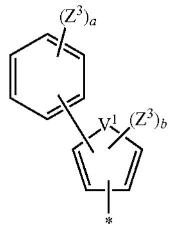

In formulas (Y$^1$-1) to (Y$^1$-7), * represents a linking site, and Z$^3$ each independently represents a halogen atom, an alkyl group having 1 to 6 carbon atoms, a cyano group, a nitro group, a nitroxide group, a sulfone group, a sulfoxide group, a carboxyl group, a fluoroalkyl group having 1 to 6 carbon atoms, an alkoxy group having 1 to 6 carbon atoms, a thioalkyl group having 1 to 6 carbon atoms, an N,N-dialkylamino group having 2 to 8 carbon atoms or an N-alkylamino group having 1 to 4 carbon atoms.

V$^1$ and V$^2$ each independently represent —CO—, —S—, —NR$^8$—, —O—, —Se— or —SO$^2$—.

W$^1$ to W$^5$ each independently represent —C═ or —N═.

However, at least one of V$^1$, V$^2$ and W$^1$ to W$^5$ represents a group containing S, N, O or Se.

R$^8$ represents a hydrogen atom or an alkyl group having 1 to 4 carbon atoms.

a each independently represents an integer of 0 to 3.

b each independently represents an integer of 0 to 2.

Any group represented by formulas (Y$^1$-1) to (Y$^1$-7) is preferably any group represented by the following formulas (Y$^2$-1) to (Y$^2$-16), more preferably any group represented by the following formulas (Y$^3$-1) to formula (Y3-6), particularly preferably groups represented by formulas (Y$^3$-1) or formula (Y$^1$-3). * represents a linking site.

[Chemical Formula 12]

(Y$^2$-1)

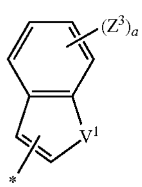

(Y$^2$-2)

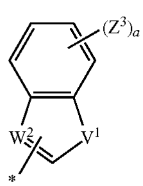

(Y$^2$-3)

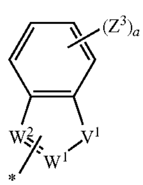

-continued (Y$^2$-4)

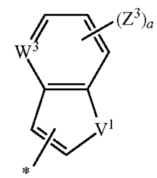

(Y$^2$-5)

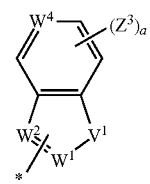

(Y$^2$-6)

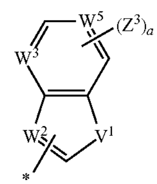

(Y$^2$-7)

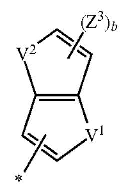

(Y$^2$-8)

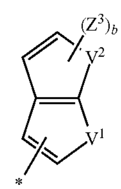

(Y$^2$-9)

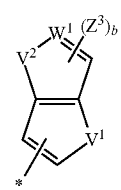

(Y$^2$-10)

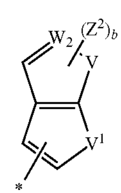

-continued
(Y$^2$-11)
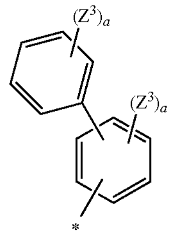
(Y$^2$-12)
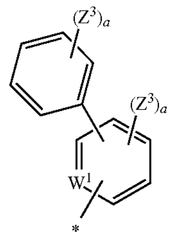
(Y$^2$-13)
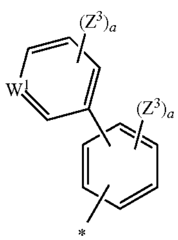
(Y$^2$-14)
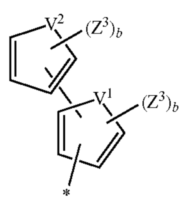
(Y$^2$-15)
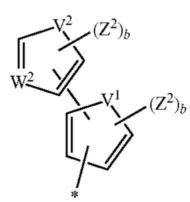
(Y$^2$-16)
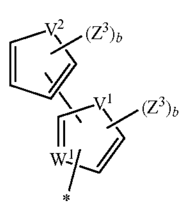
In the formula (Y$^2$-1) to (Y$^2$-16), $Z^3$, a, b, $V^1$, $V^2$, and $W^1$ to $W^5$ represent the same meaning as described above.
[Chemical Formula 13]
(Y$^3$-1)
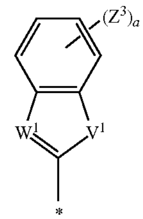
(Y$^3$-2)
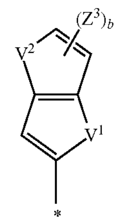
(Y$^3$-3)
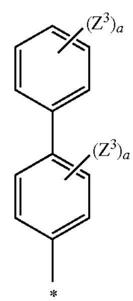
(Y$^3$-4)
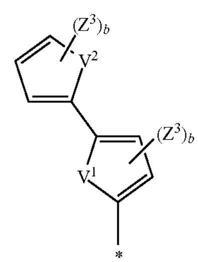
(Y$^3$-5)
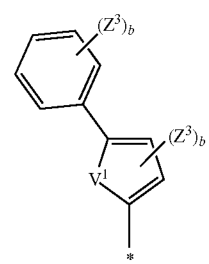

-continued ($Y^3$-6)

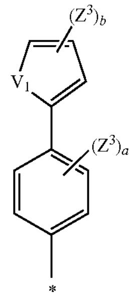

In the formulas ($Y^3$-1) to ($Y^3$-6), $Z^3$, a, b, $V^1$, $V^2$, and $W^1$ represent the same meaning as described above.

Examples of $Z^3$ include a halogen atom, an alkyl group having 1 to 6 carbon atoms, a cyano group, a nitro group, an alkylsulfinyl group having 1 to 6 carbon atoms, an alkylsulfonyl group having 1 to 6 carbon atoms, a carboxyl group, a fluoroalkyl group having 1 to 6 carbon atoms, an alkoxy group having 1 to 6 carbon atoms, an alkylthio group having 1 to 6 carbon atoms, an N-alkylamino group having 1 to 6 carbon atoms, an N,N-dialkylamino group having 2 to 12 carbon atoms, an N-alkylsulfamoyl group having 1 to 6 carbon atoms, and an N,N-dialkylsulfamoyl group having 2 to 12 carbon atoms. Among them, halogen atom, a methyl group, an ethyl group, an isopropyl group, a sec-butyl group, a cyano group, a nitro group, a sulfone group, a nitroxoxide group, a carboxyl group, a trifluoromethyl group, a methoxy group, a thiomethyl group, an N,N-dimethyl amino group and an N-methylamino group are preferable, a halogen atom, a methyl group, an ethyl group, an isopropyl group, a sec-butyl group, a cyano group, a nitro group and a trifluoromethyl group are more preferable, and a methyl group, an ethyl group and an isopropyl group, a sec-butyl group, a pentyl group, and a hexyl group are particularly preferable.

Examples of a halogen atom, an alkyl group having 1 to 6 carbon atoms, an alkylsulfinyl group having 1 to 6 carbon atoms, an alkylsulfonyl group having 1 to 6 carbon atoms, a fluoroalkyl group having 1 to 6 carbon atoms, an alkoxy group having 1 to 6 carbon atoms, an alkylthio group having 1 to 6 carbon atoms, an N-alkylamino group having 1 to 6 carbon atoms, an N,N-dialkylamino group having 2 to 12 carbon atoms, an N-alkylsulfamoyl group having 1 to 6 carbon atoms, and an N,N-dialkylsulfamoyl group having 2 to 12 carbon atoms include those mentioned above.

$V^1$ and $V^2$ are preferably each independently —S—, —NR$^8$— or —O—.

$W^1$ to $W^5$ are preferably each independently —C═ or —N═.

At least one of $V^1$, $V^2$ and $W^1$ to $W^5$ preferably represents a group containing S, N, or O.

a is preferably 0 or 1. b is preferably 0.

Specific examples of $Y^1$ include groups represented by the following formulas (ar-1) to (ar-840). * represents a linking site, Me represents a methyl group, and Et represents an ethyl group.

[Chemical Formula 14]

(ar-001)

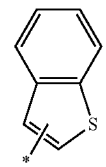

(ar-002)

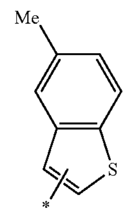

(ar-003)

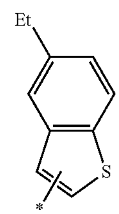

(ar-004)

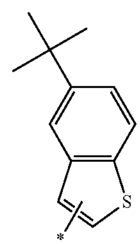

(ar-005)

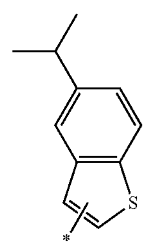

(ar-006)

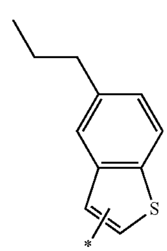

(ar-007)

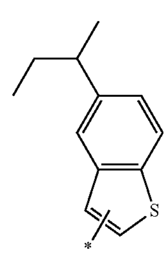

-continued
[Chemical Formula 15]
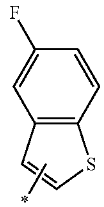
(ar-008)
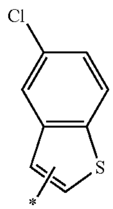
(ar-009)
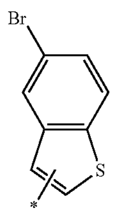
(ar-010)
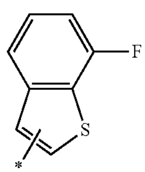
(ar-011)
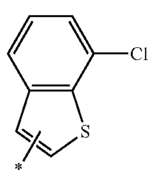
(ar-012)
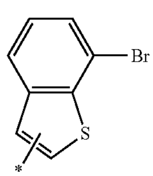
(ar-013)
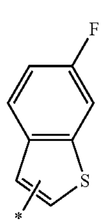
(ar-014)
-continued
[Chemical Formula 16]
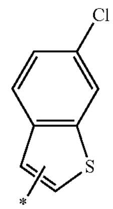
(ar-015)
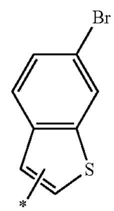
(ar-016)
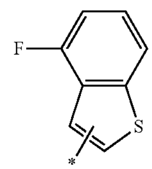
(ar-017)
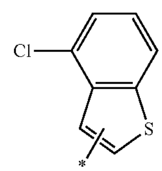
(ar-018)
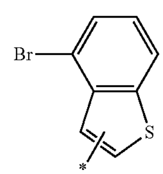
(ar-019)
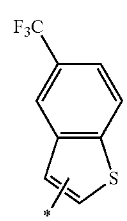
(ar-020)
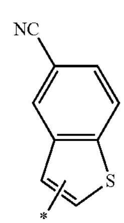
(ar-021)

-continued
[Chemical Formula 17]
(ar-022)
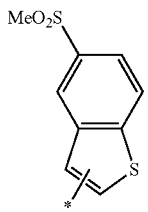
(ar-023)
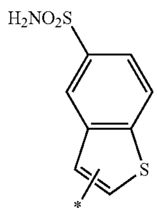
(ar-024)
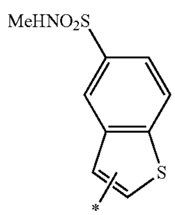
(ar-025)
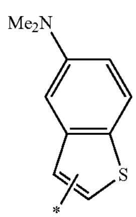
(ar-026)
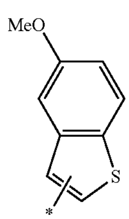
(ar-027)
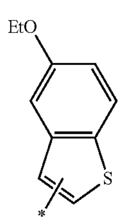
(ar-028)
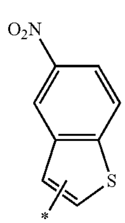
-continued
[Chemical Formula 18]
(ar-029)
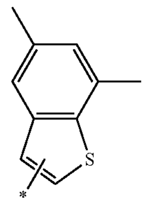
(ar-030)
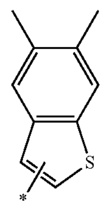
(ar-031)
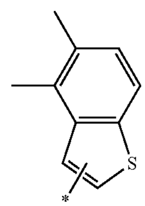
(ar-032)
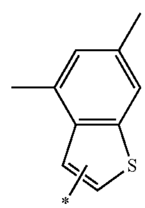
(ar-033)
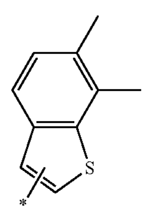
(ar-034)
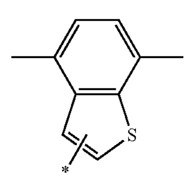
(ar-035)
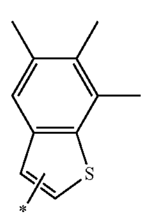

-continued
[Chemical Formula 19]
(ar-036)
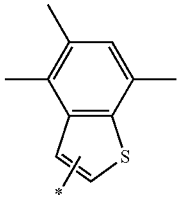
(ar-037)
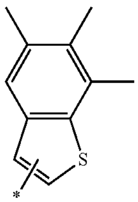
(ar-038)
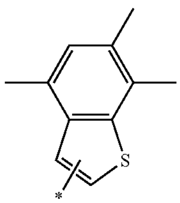
(ar-039)
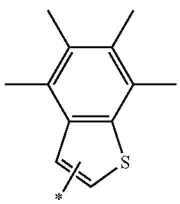
(ar-040)
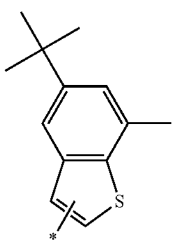
(ar-041)
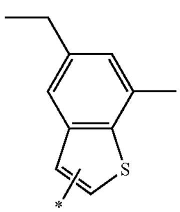
(ar-042)
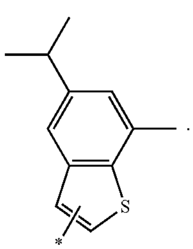
-continued
[Chemical Formula 20]
(ar-043)
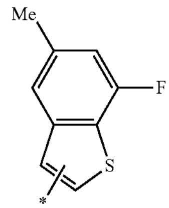
(ar-044)
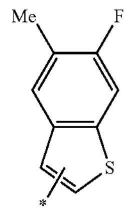
(ar-045)
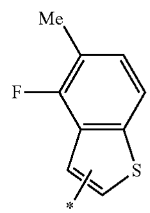
(ar-046)
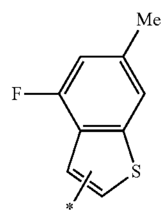
(ar-047)
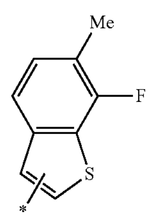
(ar-048)
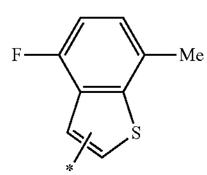
(ar-049)
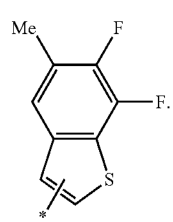

-continued
[Chemical Formula 21]
(ar-050)
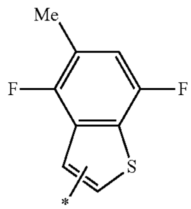
(ar-051)
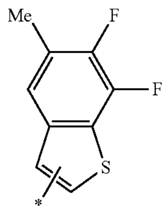
(ar-052)
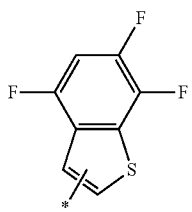
(ar-053)
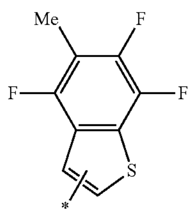
(ar-054)
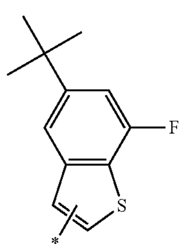
(ar-055)
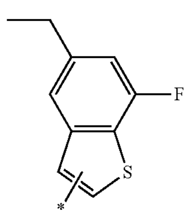
(ar-056)
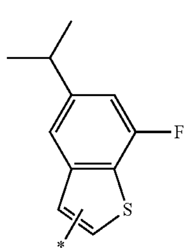
-continued
[Chemical Formula 22]
(ar-057)
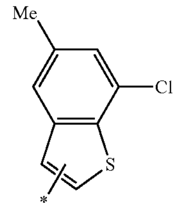
(ar-058)
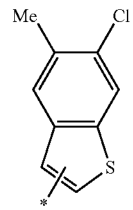
(ar-059)
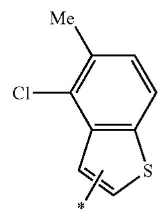
(ar-060)
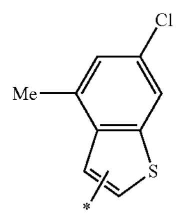
(ar-061)
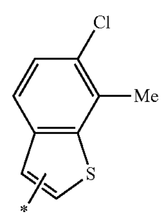
(ar-062)
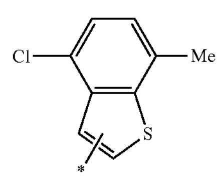
(ar-063)
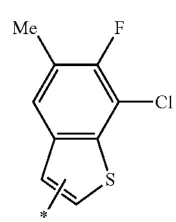

-continued
[Chemical Formula 23]
(ar-064)
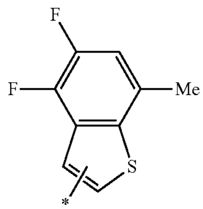
(ar-065)
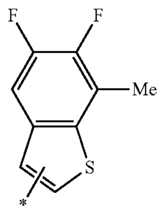
(ar-066)
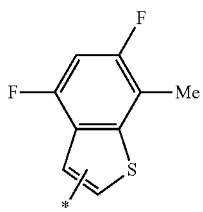
(ar-067)
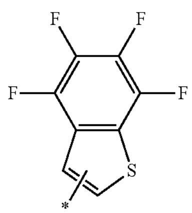
(ar-068)
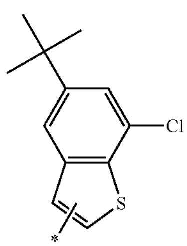
(ar-069)
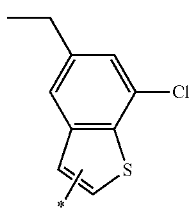
(ar-070)
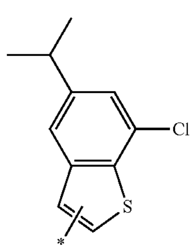
-continued
[Chemical Formula 24]
(ar-071)
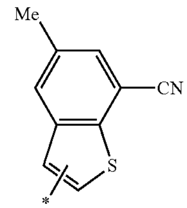
(ar-072)
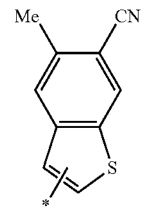
(ar-073)
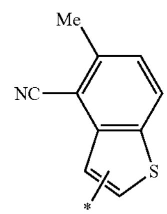
(ar-074)
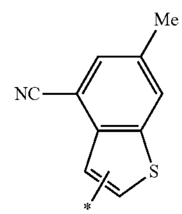
(ar-075)
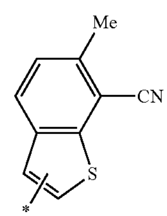
(ar-076)
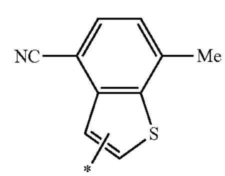
(ar-077)
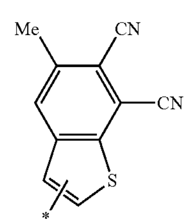

[Chemical Formula 25]
(ar-078)
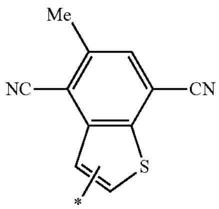
(ar-079)
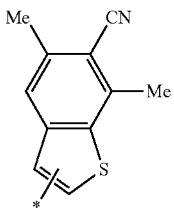
(ar-080)
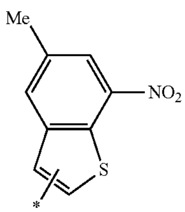
(ar-081)
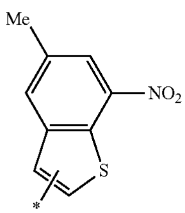
(ar-082)
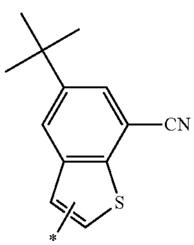
(ar-083)
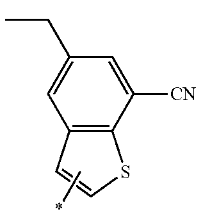
(ar-084)
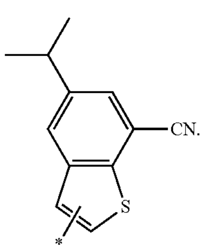
[Chemical Formula 26]
(ar-085)
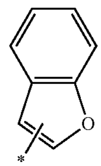
(ar-086)
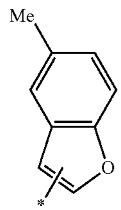
(ar-087)
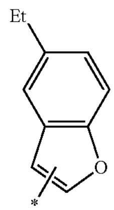
(ar-088)
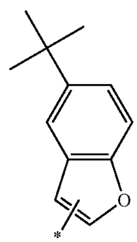
(ar-089)
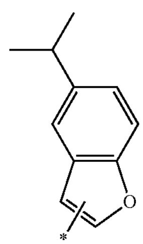
(ar-090)
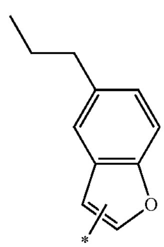
(ar-091)
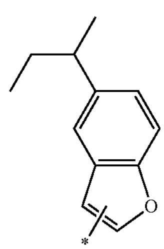

-continued
[Chemical Formula 27]
(ar-092)
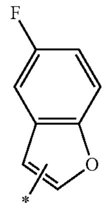
(ar-093)
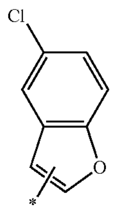
(ar-094)
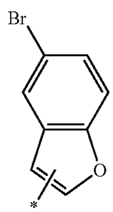
(ar-095)
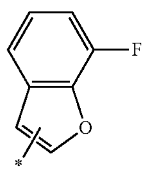
(ar-096)
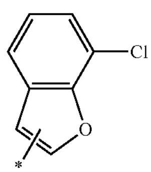
(ar-097)
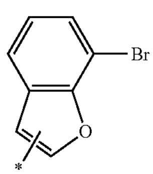
(ar-098)
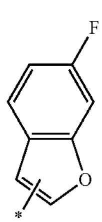
-continued
[Chemical Formula 28]
(ar-099)
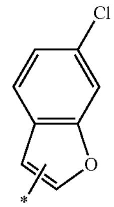
(ar-100)
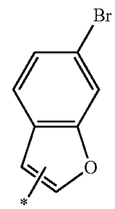
(ar-101)
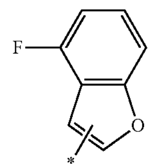
(ar-102)
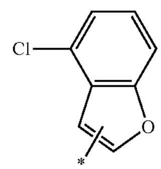
(ar-103)
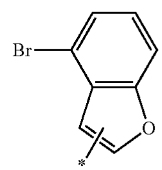
(ar-104)
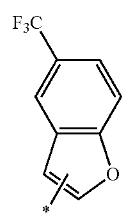
(ar-105)
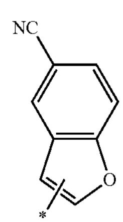

-continued
[Chemical Formula 29]
(ar-106)
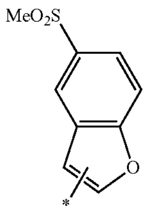
(ar-107)
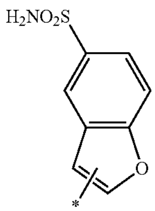
(ar-108)
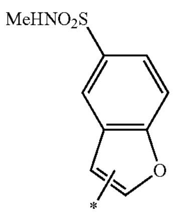
(ar-109)
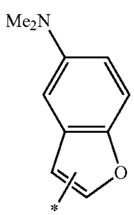
(ar-110)
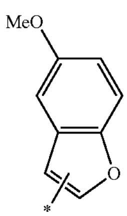
(ar-111)
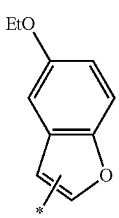
(ar-112)
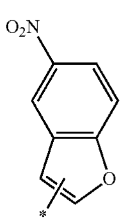
-continued
[Chemical Formula 30]
(ar-113)
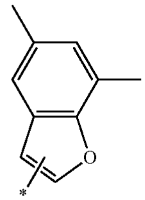
(ar-114)
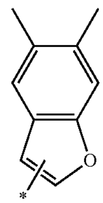
(ar-115)
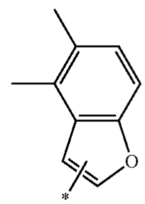
(ar-116)
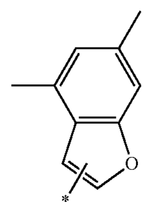
(ar-117)
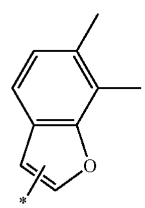
(ar-118)
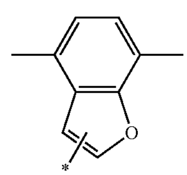
(ar-119)
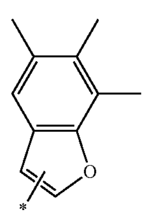

-continued
[Chemical Formula 31]
(ar-120)
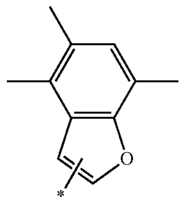
(ar-121)
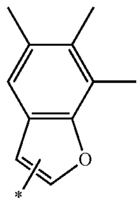
(ar-122)
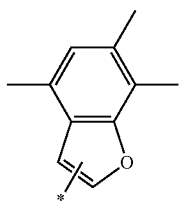
(ar-123)
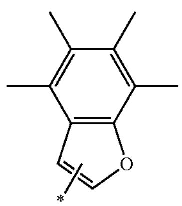
(ar-124)
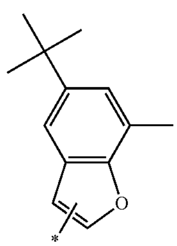
(ar-125)
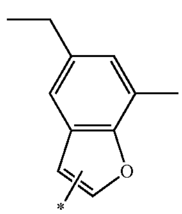
(ar-126)
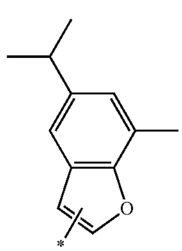
-continued
[Chemical Formula 32]
(ar-127)
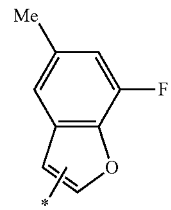
(ar-128)
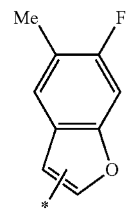
(ar-129)
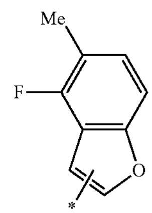
(ar-130)
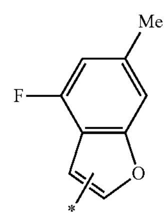
(ar-131)
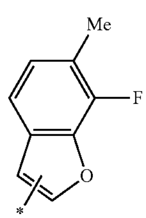
(ar-132)
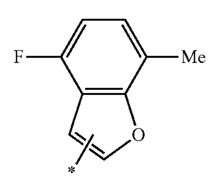
(ar-133)
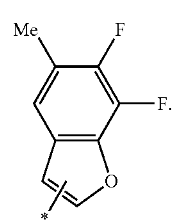

-continued
[Chemical Formula 33]
(ar-134)
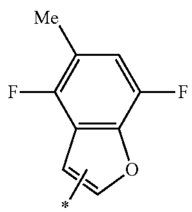
(ar-135)
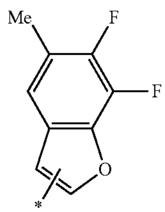
(ar-136)
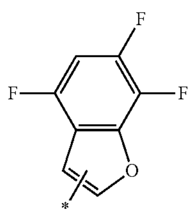
(ar-137)
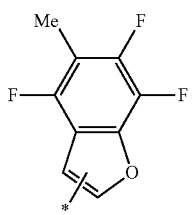
(ar-138)
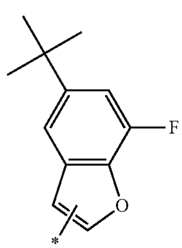
(ar-139)
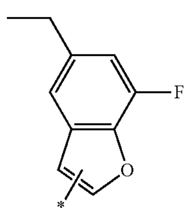
(ar-140)
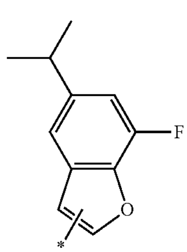
-continued
[Chemical Formula 34]
(ar-141)
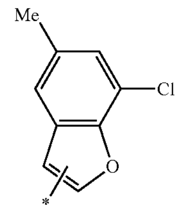
(ar-142)
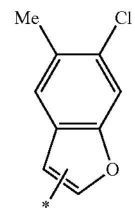
(ar-143)
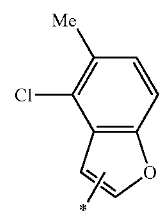
(ar-144)
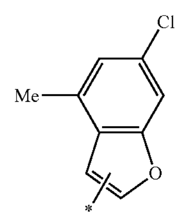
(ar-145)
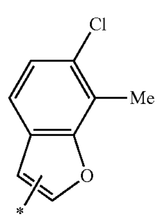
(ar-146)
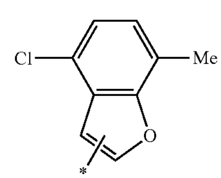
(ar-147)
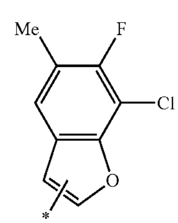

-continued
[Chemical Formula 35]
(ar-148)
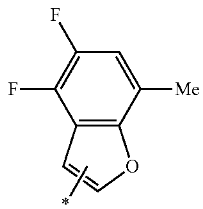
(ar-149)
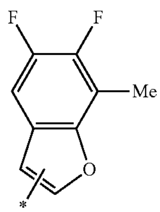
(ar-150)
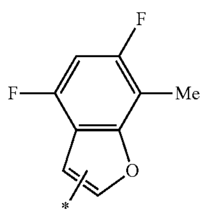
(ar-151)
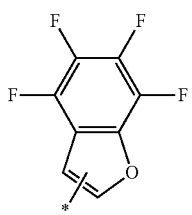
(ar-152)
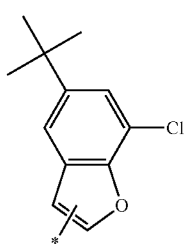
(ar-153)
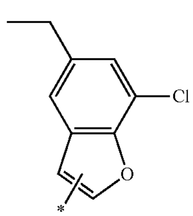
(ar-154)
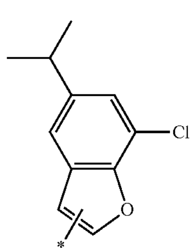
-continued
[Chemical Formula 36]
(ar-155)
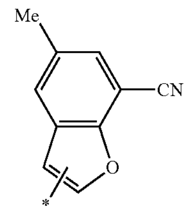
(ar-156)
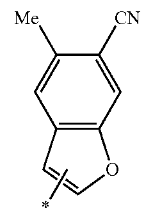
(ar-157)
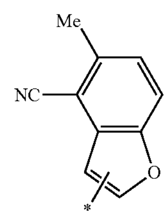
(ar-158)
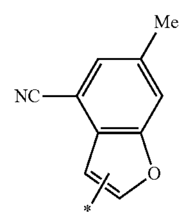
(ar-159)
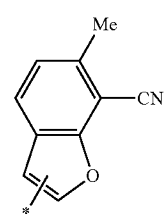
(ar-160)
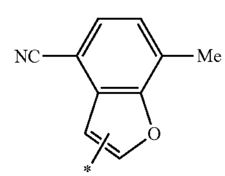
(ar-161)
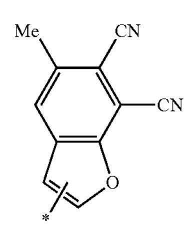

-continued
[Chemical Formula 37]
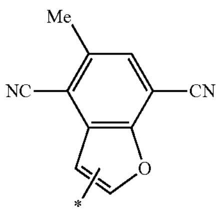
(ar-162)
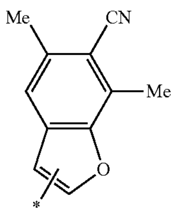
(ar-163)
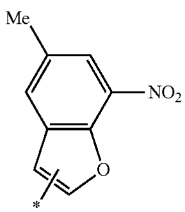
(ar-164)
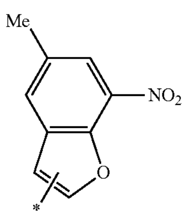
(ar-165)
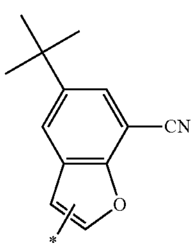
(ar-166)
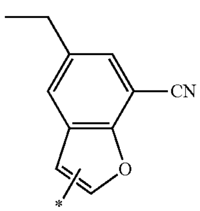
(ar-167)
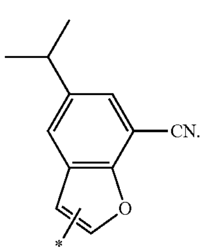
(ar-168)
-continued
[Chemical Formula 38]
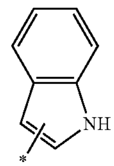
(ar-169)
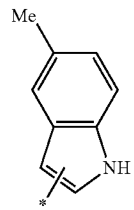
(ar-170)
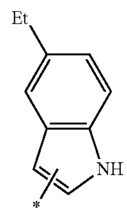
(ar-171)
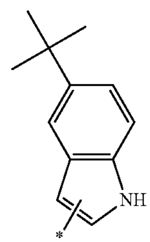
(ar-172)
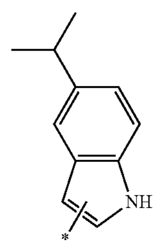
(ar-173)
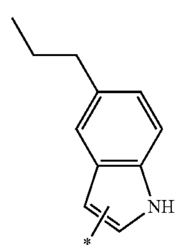
(ar-174)
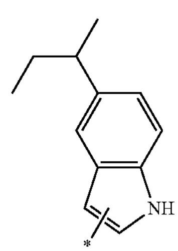
(ar-175)

-continued
[Chemical Formula 39]
(ar-176)
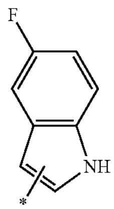
(ar-177)
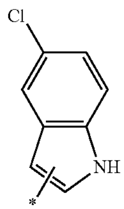
(ar-178)
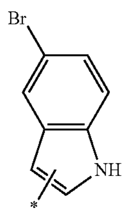
(ar-179)
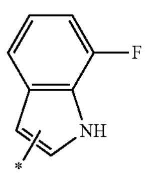
(ar-180)
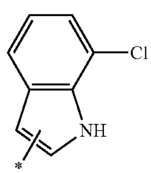
(ar-181)
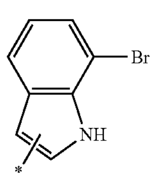
(ar-182)
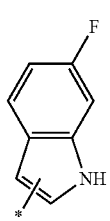
-continued
[Chemical Formula 40]
(ar-183)
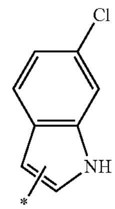
(ar-184)
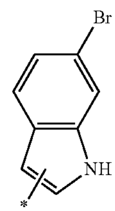
(ar-185)
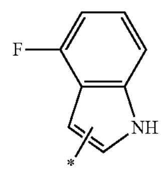
(ar-186)
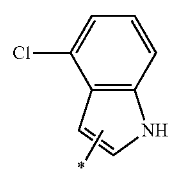
(ar-187)
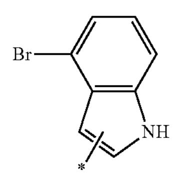
(ar-188)
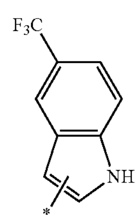
(ar-189)
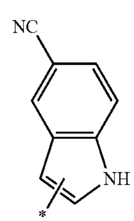

-continued
[Chemical Formula 41]
(ar-190)
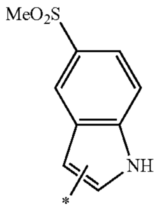
(ar-191)
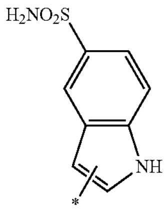
(ar-192)
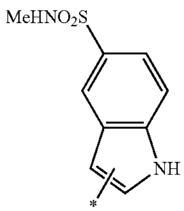
(ar-193)
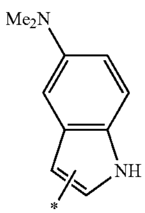
(ar-194)
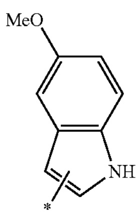
(ar-195)
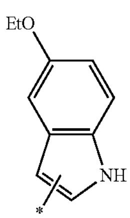
(ar-196)
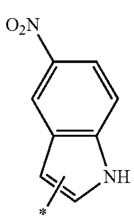
-continued
[Chemical Formula 42]
(ar-197)
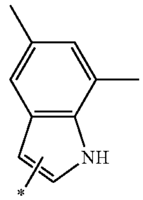
(ar-198)
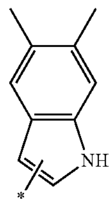
(ar-199)
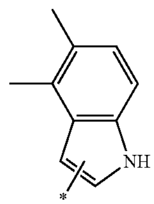
(ar-200)
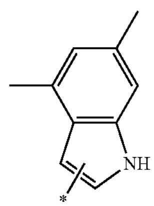
(ar-201)
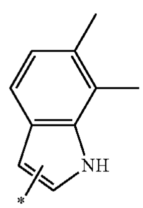
(ar-202)
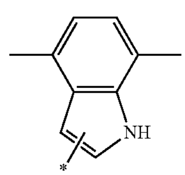
(ar-203)
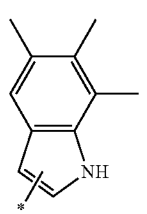

-continued
[Chemical Formula 43]
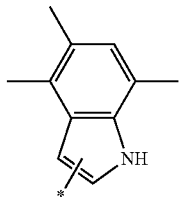
(ar-204)
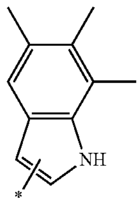
(ar-205)
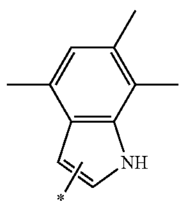
(ar-206)
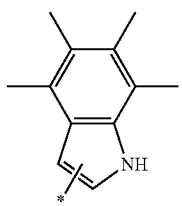
(ar-207)
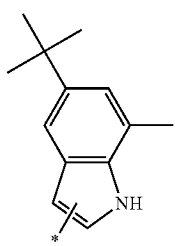
(ar-208)
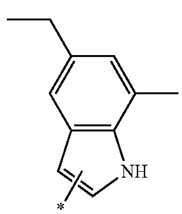
(ar-209)
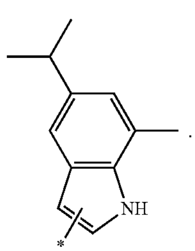
(ar-210)
-continued
[Chemical Formula 44]
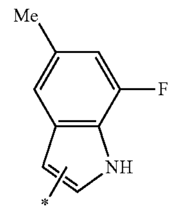
(ar-211)
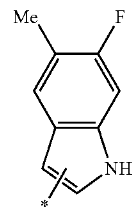
(ar-212)
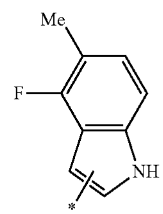
(ar-213)
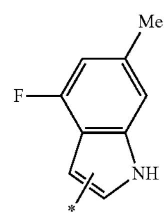
(ar-214)
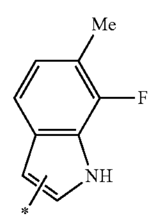
(ar-215)
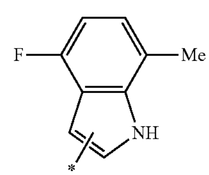
(ar-216)
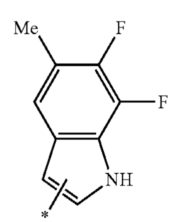
(ar-217)

-continued
[Chemical Formula 45]
(ar-218)
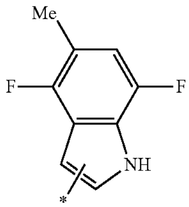
(ar-219)
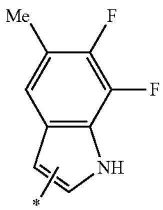
(ar-220)
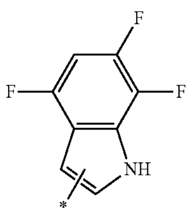
(ar-221)
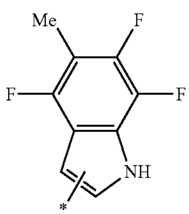
(ar-222)
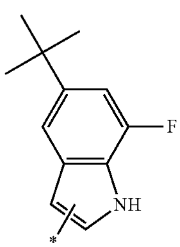
(ar-223)
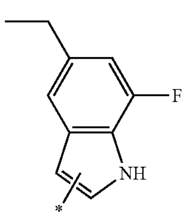
-continued
(ar-224)
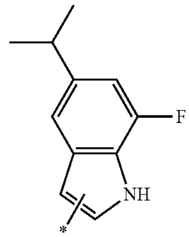
[Chemical Formula 46]
(ar-225)
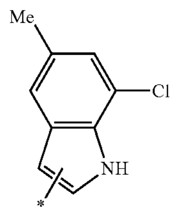
(ar-226)
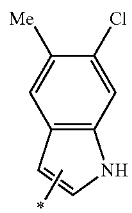
(ar-227)
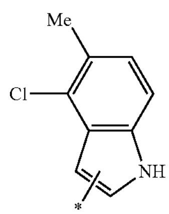
(ar-228)
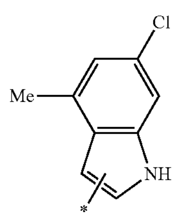
(ar-229)
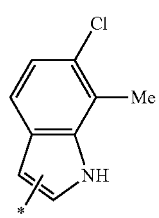
(ar-230)
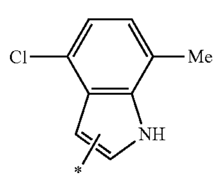

-continued
(ar-231)
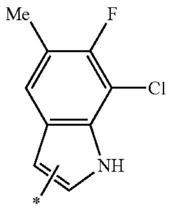
[Chemical Formula 47]
(ar-232)
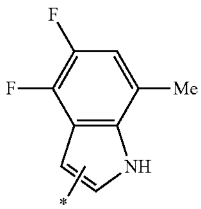
(ar-233)
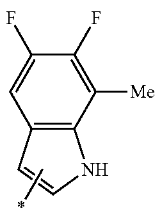
(ar-234)
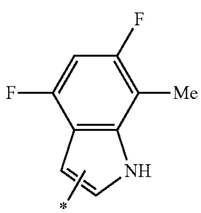
(ar-235)
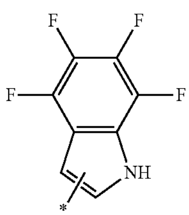
(ar-236)
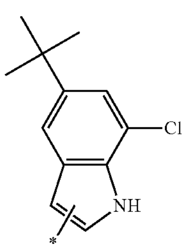
(ar-237)
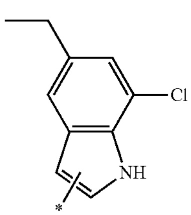
-continued
(ar-238)
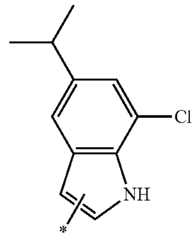
[Chemical Formula 48]
(ar-239)
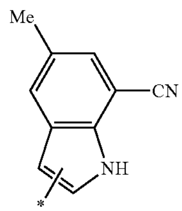
(ar-240)
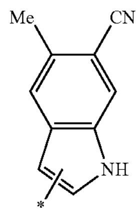
(ar-241)
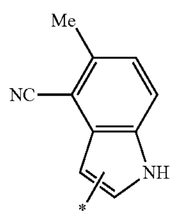
(ar-242)
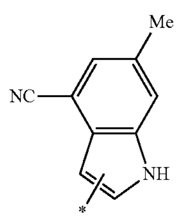
(ar-243)
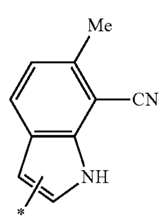
(ar-244)
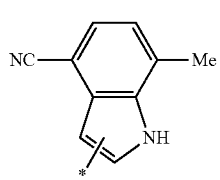

(ar-245)
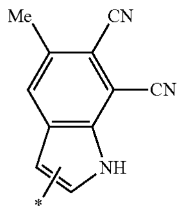
[Chemical Formula 49]
(ar-246)
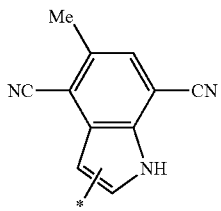
(ar-247)
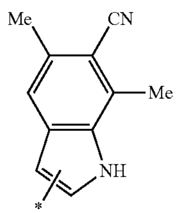
(ar-248)
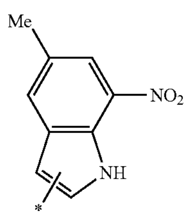
(ar-249)
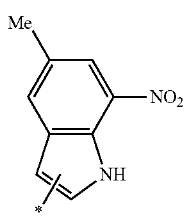
(ar-250)
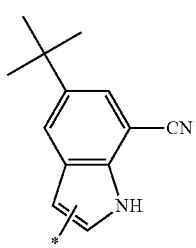
(ar-251)
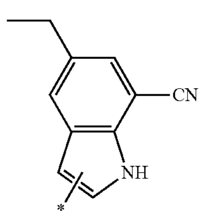
(ar-252)
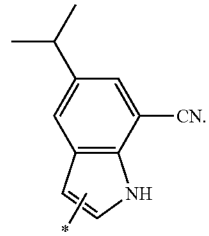
[Chemical Formula 50]
(ar-253)
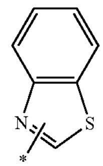
(ar-254)
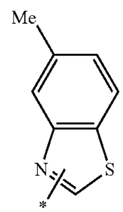
(ar-255)
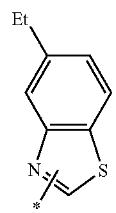
(ar-256)
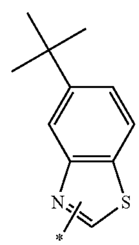
(ar-257)
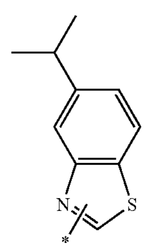
(ar-258)
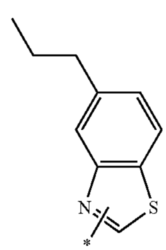

-continued
(ar-259)
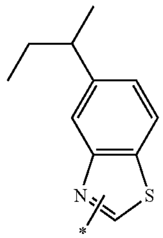
[Chemical Formula 51]
(ar-260)
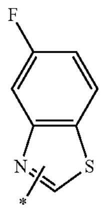
(ar-261)
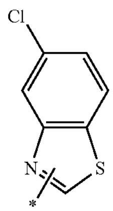
(ar-262)
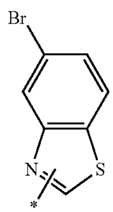
(ar-263)
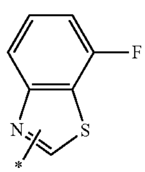
(ar-264)
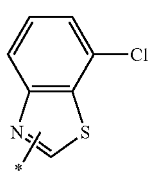
(ar-265)
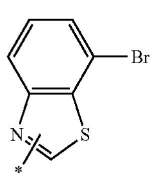
-continued
(ar-266)
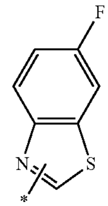
[Chemical Formula 52]
(ar-267)
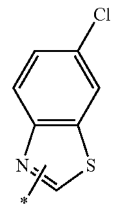
(ar-268)
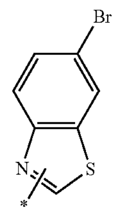
(ar-269)
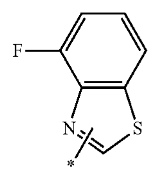
(ar-270)
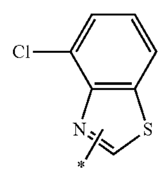
(ar-271)
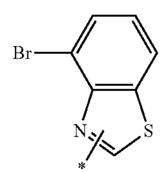
(ar-272)
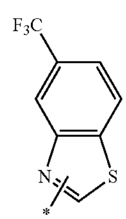
(ar-273)
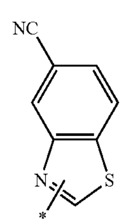

-continued
[Chemical Formula 53]
(ar-274)
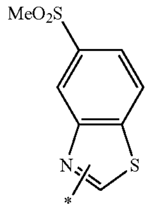
(ar-275)
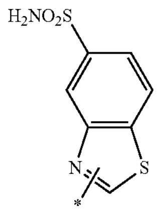
(ar-276)
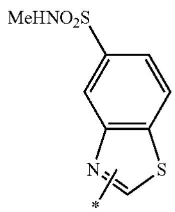
(ar-277)
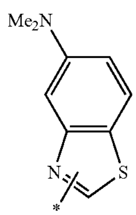
(ar-278)
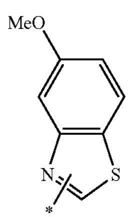
(ar-279)
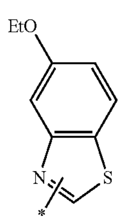
-continued
(ar-280)
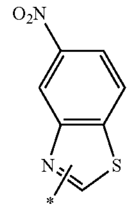
[Chemical Formula 54]
(ar-281)
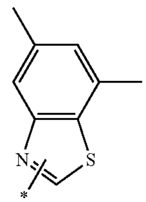
(ar-282)
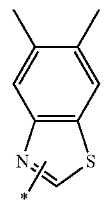
(ar-283)
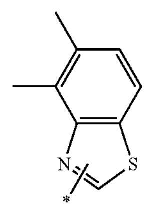
(ar-284)
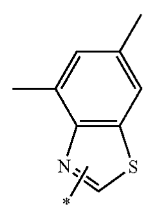
(ar-285)
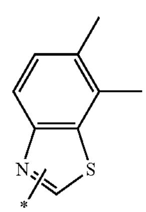
(ar-286)
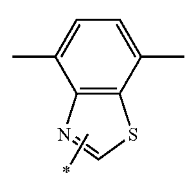

-continued
(ar-287)
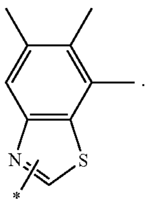
[Chemical Formula 55]
(ar-288)
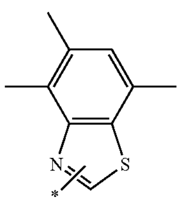
(ar-289)
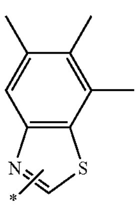
(ar-290)
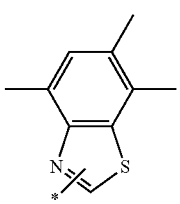
(ar-291)
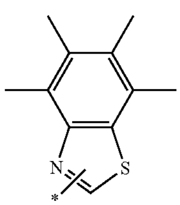
(ar-292)
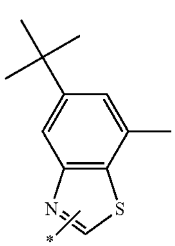
(ar-293)
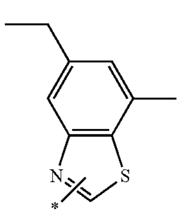
-continued
(ar-294)
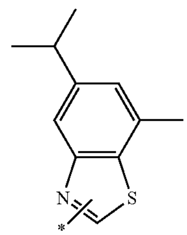
[Chemical Formula 56]
(ar-295)
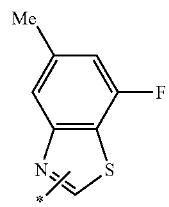
(ar-296)
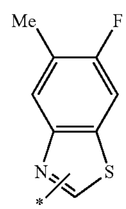
(ar-297)
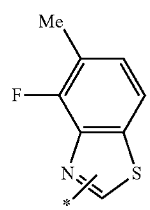
(ar-298)
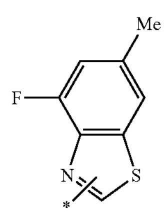
(ar-299)
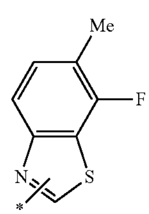
(ar-300)
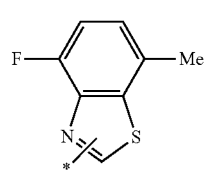

-continued
(ar-301)
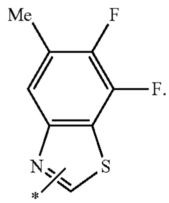
[Chemical Formula 57]
(ar-302)
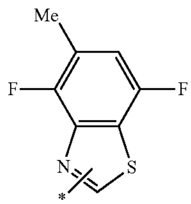
(ar-303)
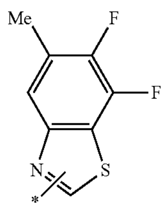
(ar-304)
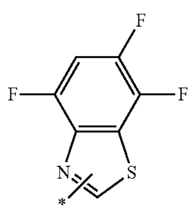
(ar-305)
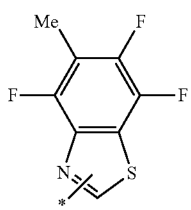
(ar-306)
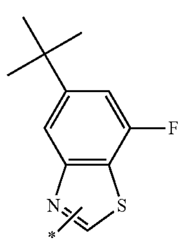
(ar-307)
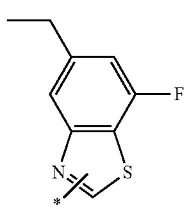
-continued
(ar-308)
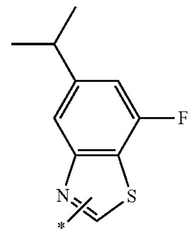
[Chemical Formula 58]
(ar-309)
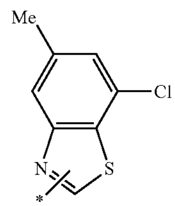
(ar-310)
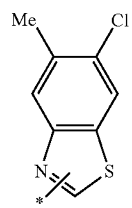
(ar-311)
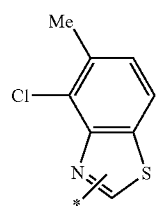
(ar-312)
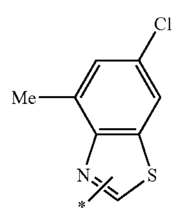
(ar-313)
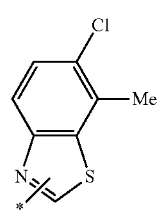
(ar-314)
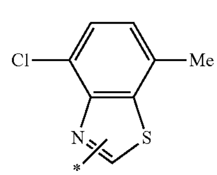

-continued
(ar-315)
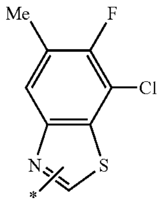
[Chemical Formula 59]
(ar-316)
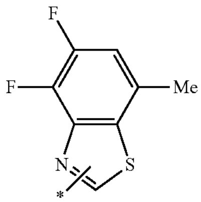
(ar-317)
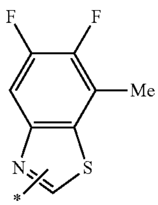
(ar-318)
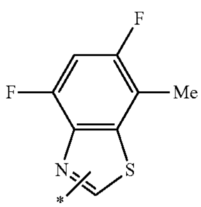
(ar-319)
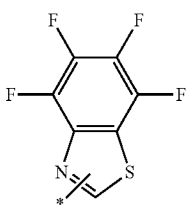
(ar-320)
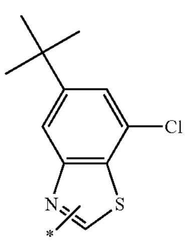
(ar-321)
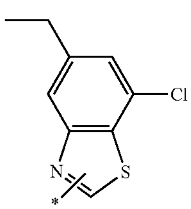
-continued
(ar-322)
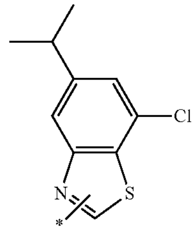
[Chemical Formula 60]
(ar-323)
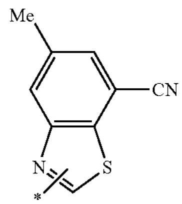
(ar-324)
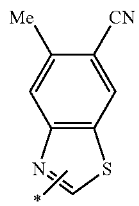
(ar-325)
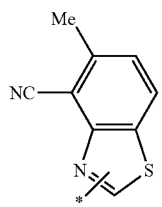
(ar-326)
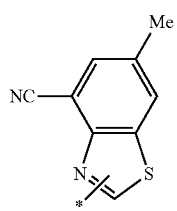
(ar-327)
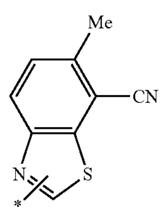
(ar-328)
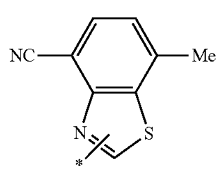

-continued
(ar-329)
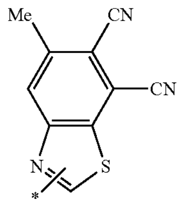
[Chemical Formula 61]
(ar-330)
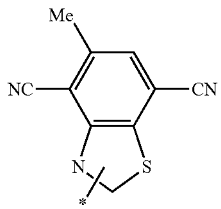
(ar-331)
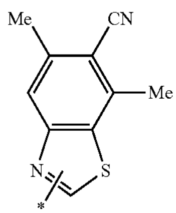
(ar-332)
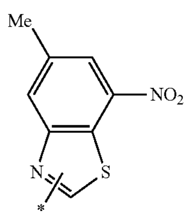
(ar-333)
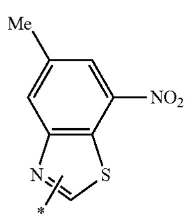
(ar-334)
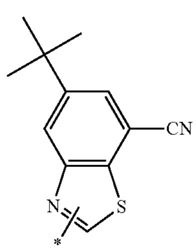
(ar-335)
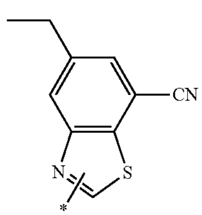
-continued
(ar-336)
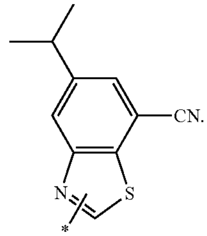
[Chemical Formula 62]
(ar-337)
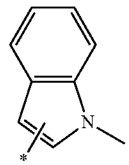
(ar-338)
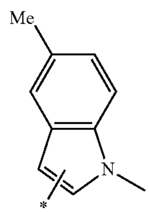
(ar-339)
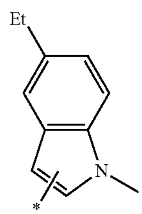
(ar-340)
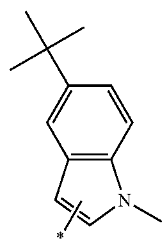
(ar-341)
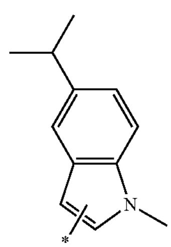
(ar-342)
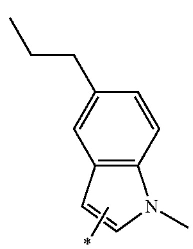

-continued
(ar-343)
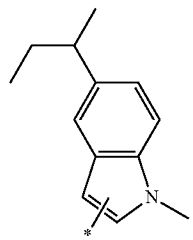
[Chemical Formula 63]
(ar-344)
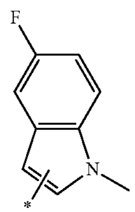
(ar-345)
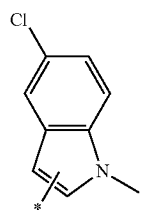
(ar-346)
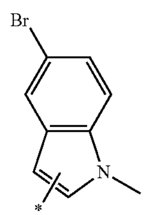
(ar-347)
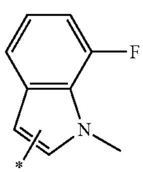
(ar-348)
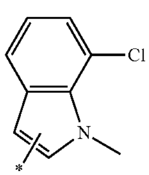
(ar-349)
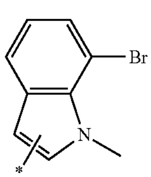
-continued
(ar-350)
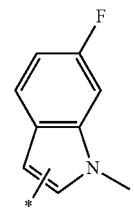
[Chemical Formula 64]
(ar-351)
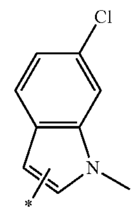
(ar-352)
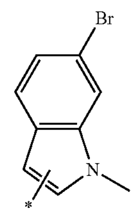
(ar-353)
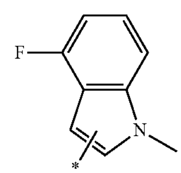
(ar-354)
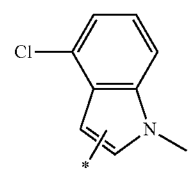
(ar-355)
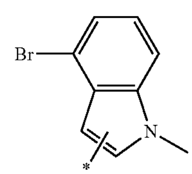
(ar-356)
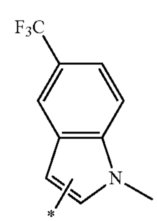
(ar-357)
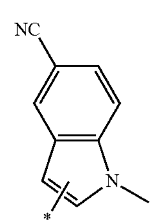

-continued
[Chemical Formula 65]
(ar-358)
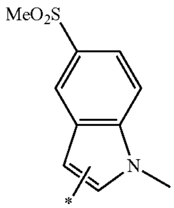
(ar-359)
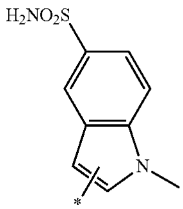
(ar-360)
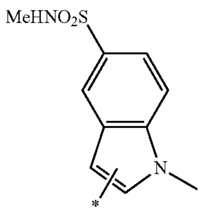
(ar-361)
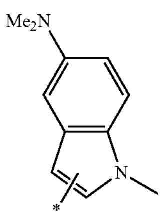
(ar-362)
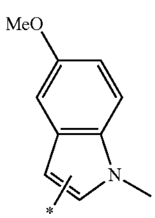
(ar-363)
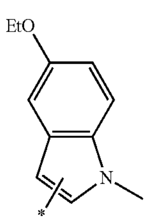
-continued
(ar-364)
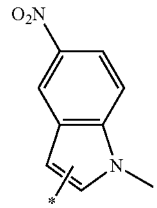
[Chemical Formula 66]
(ar-365)
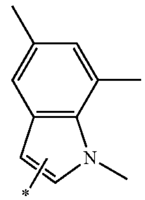
(ar-366)
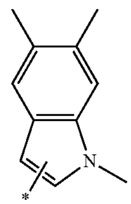
(ar-367)
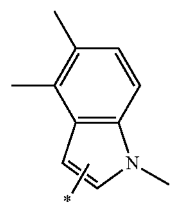
(ar-368)
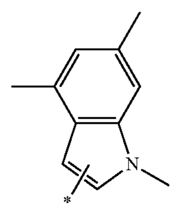
(ar-369)
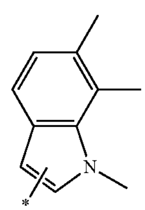
(ar-370)
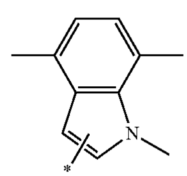

-continued
(ar-371)
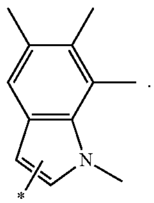
[Chemical Formula 67]
(ar-372)
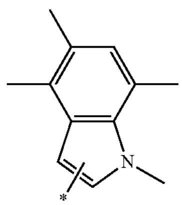
(ar-373)
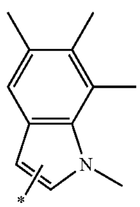
(ar-374)
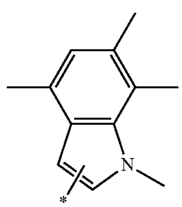
(ar-375)
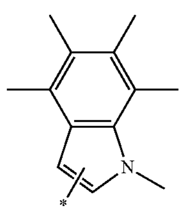
(ar-376)
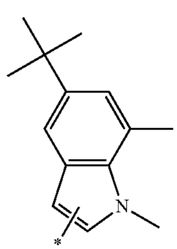
(ar-377)
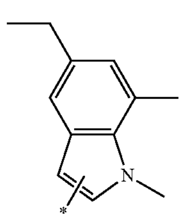
-continued
(ar-378)
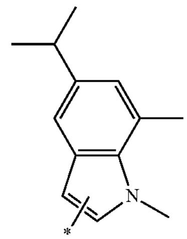
[Chemical Formula 68]
(ar-379)
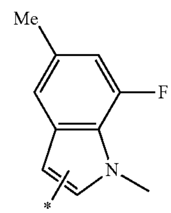
(ar-380)
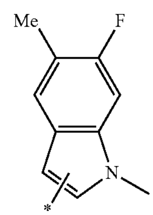
(ar-381)
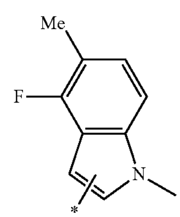
(ar-382)
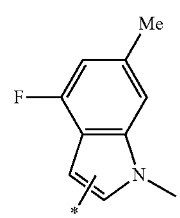
(ar-383)
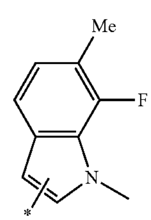
(ar-384)
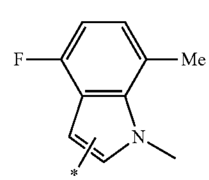

-continued
(ar-385)
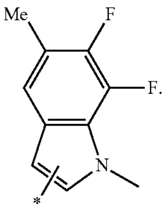
[Chemical Formula 69]
(ar-386)
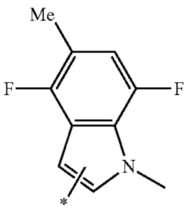
(ar-387)
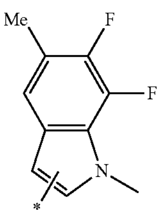
(ar-388)
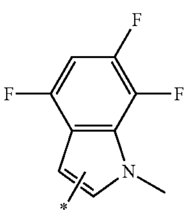
(ar-389)
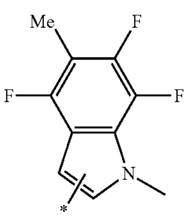
(ar-390)
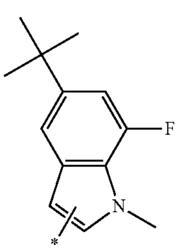
(ar-391)
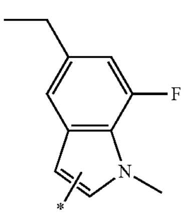
-continued
(ar-392)
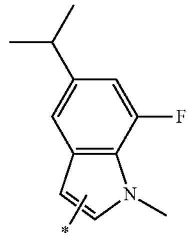
[Chemical Formula 70]
(ar-393)
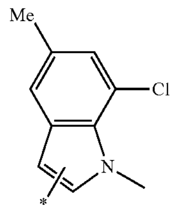
(ar-394)
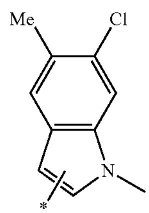
(ar-395)
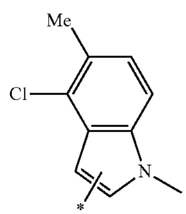
(ar-396)
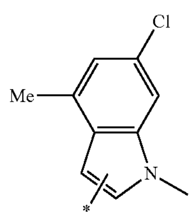
(ar-397)
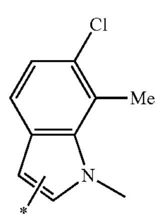
(ar-398)
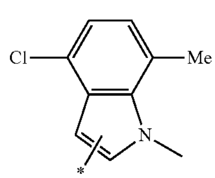

(ar-399)
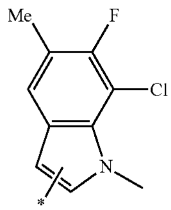
[Chemical Formula 71]
(ar-400)
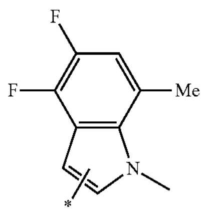
(ar-401)
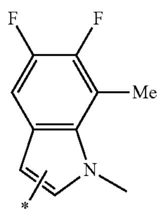
(ar-402)
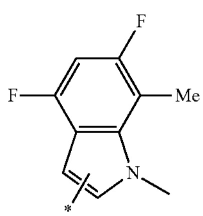
(ar-403)
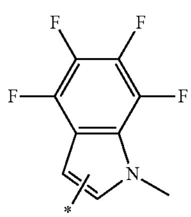
(ar-404)
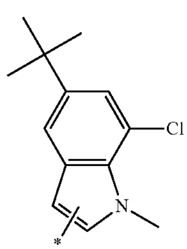
(ar-405)
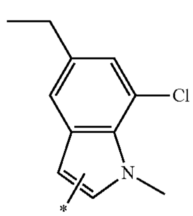
(ar-406)
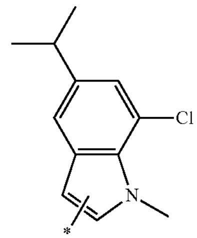
[Chemical Formula 72]
(ar-407)
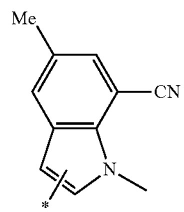
(ar-408)
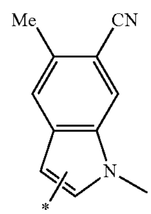
(ar-409)
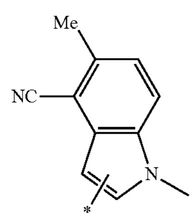
(ar-410)
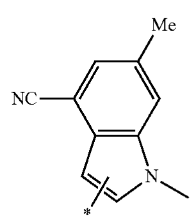
(ar-411)
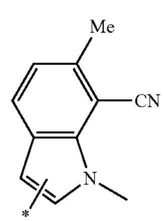
(ar-412)
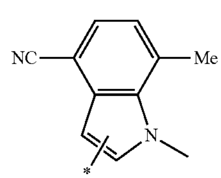

-continued
(ar-413)
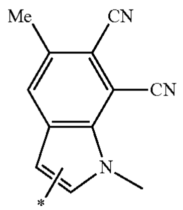
[Chemical Formula 73]
(ar-414)
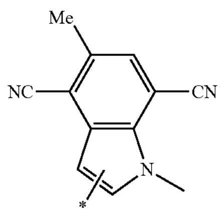
(ar-415)
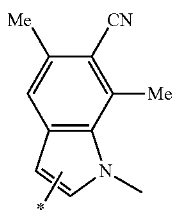
(ar-416)
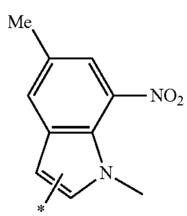
(ar-417)
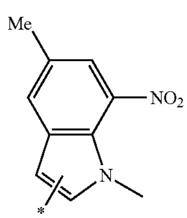
(ar-418)
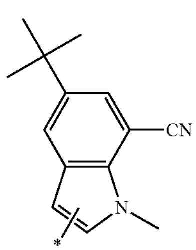
(ar-419)
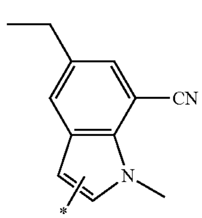
-continued
(ar-420)
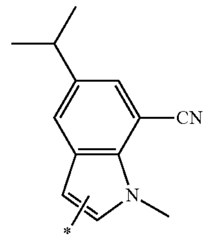
[Chemical Formula 74]
(ar-421)
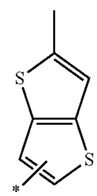
(ar-422)
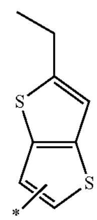
(ar-423)
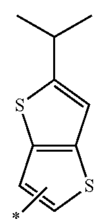
(ar-424)
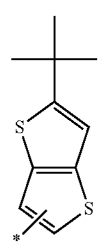
(ar-425)
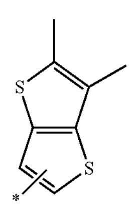
(ar-426)
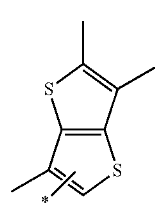

-continued
(ar-427)
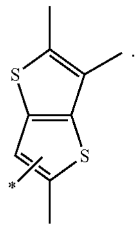
[Chemical Formula 75]
(ar-428)
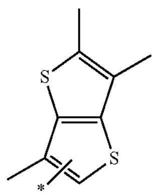
(ar-429)
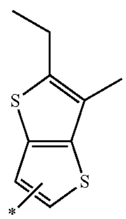
(ar-430)
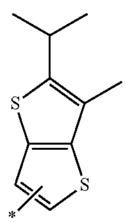
(ar-431)
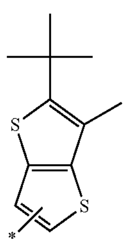
(ar-432)
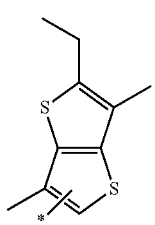
(ar-433)
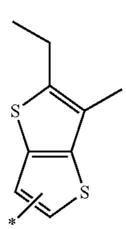
-continued
(ar-434)
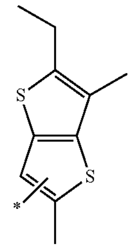
[Chemical Formula 76]
(ar-435)
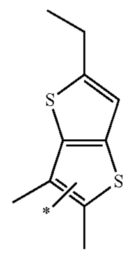
(ar-436)
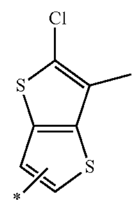
(ar-437)
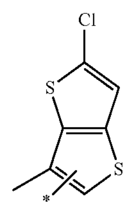
(ar-438)
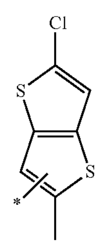
(ar-439)
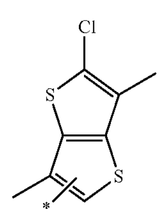

-continued
(ar-440)
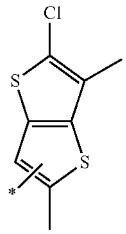
(ar-441)
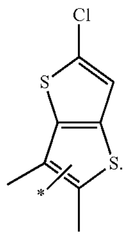
[Chemical Formula 77]
(ar-442)
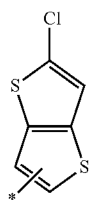
(ar-443)
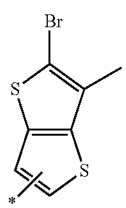
(ar-444)
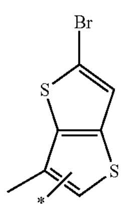
(ar-445)
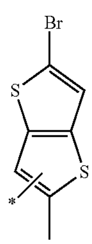
(ar-446)
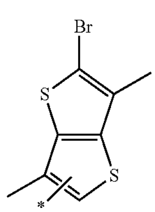
-continued
(ar-447)
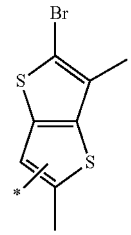
(ar-448)
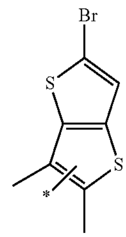
[Chemical Formula 78]
(ar-449)
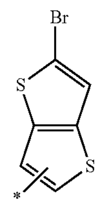
(ar-450)
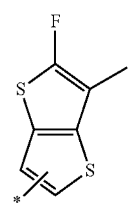
(ar-451)
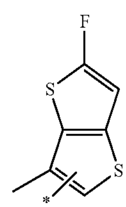
(ar-452)
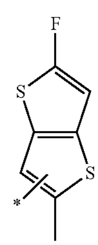
(ar-453)
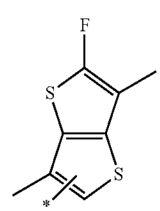

-continued
(ar-454)
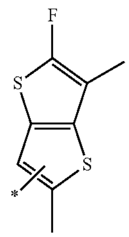
(ar-455)
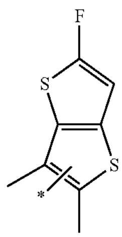
[Chemical Formula 79]
(ar-456)
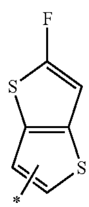
(ar-457)
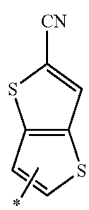
(ar-458)
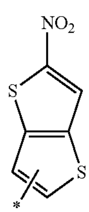
(ar-459)
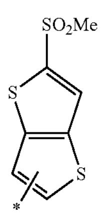
(ar-460)
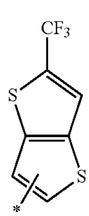
-continued
(ar-461)
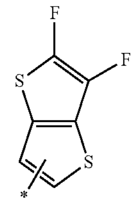
(ar-462)
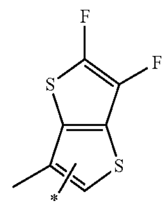
[Chemical Formula 80]
(ar-463)
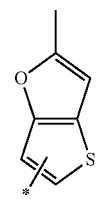
(ar-464)
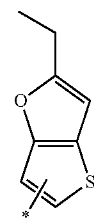
(ar-465)
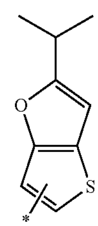
(ar-466)
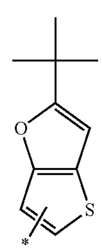
(ar-467)
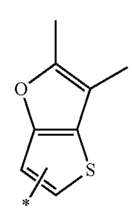

-continued
(ar-468)
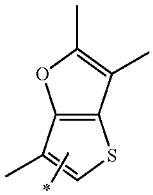
(ar-469)
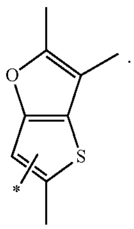
[Chemical Formula 81]
(ar-470)
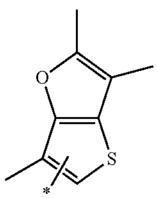
(ar-471)
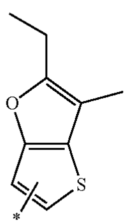
(ar-472)
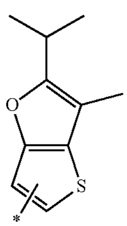
(ar-473)
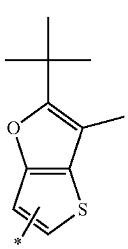
(ar-474)
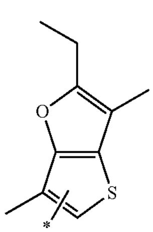
-continued
(ar-475)
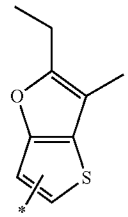
(ar-476)
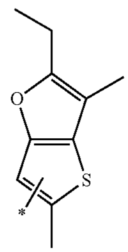
[Chemical Formula 82]
(ar-477)
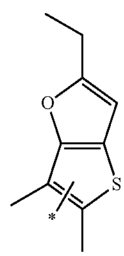
(ar-478)
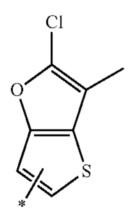
(ar-479)
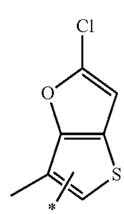
(ar-480)
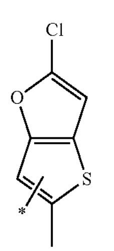

(ar-481)
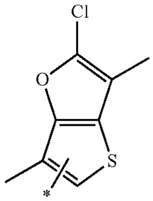
(ar-482)
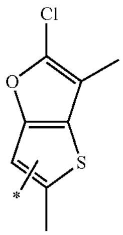
(ar-483)
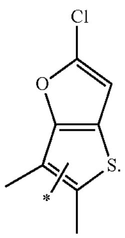
[Chemical Formula 83]
(ar-484)
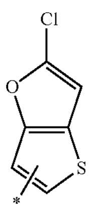
(ar-485)
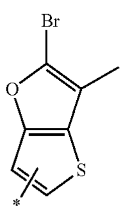
(ar-486)
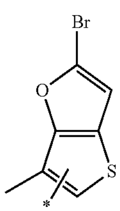
(ar-487)
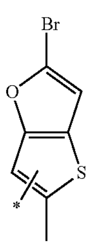
(ar-488)
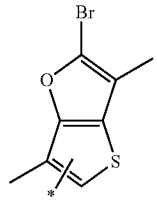
(ar-489)
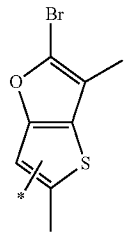
(ar-490)
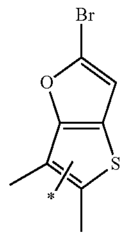
[Chemical Formula 84]
(ar-491)
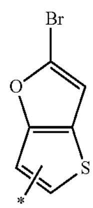
(ar-492)
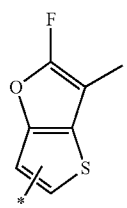
(ar-493)
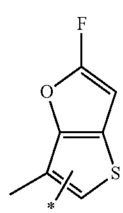
(ar-494)
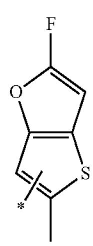

-continued
(ar-495)
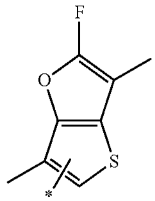
(ar-496)
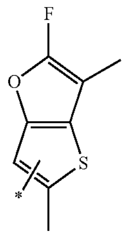
(ar-497)
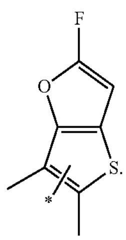
[Chemical Formula 85]
(ar-498)
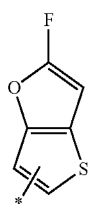
(ar-499)
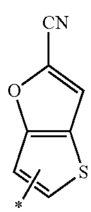
(ar-500)
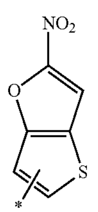
(ar-501)
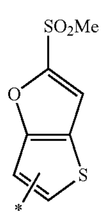
-continued
(ar-502)
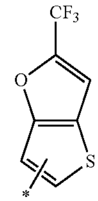
(ar-503)
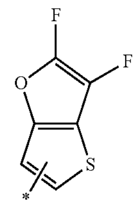
(ar-504)
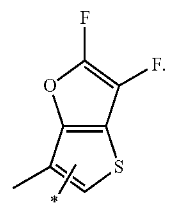
[Chemical Formula 86]
(ar-505)
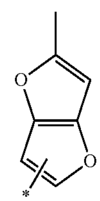
(ar-506)
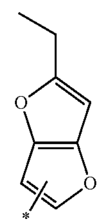
(ar-507)
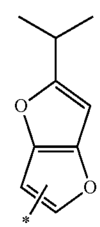
(ar-508)
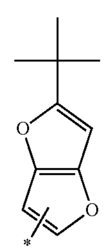

-continued
(ar-509)
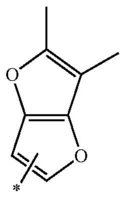
(ar-510)
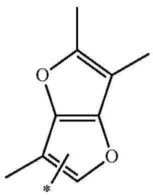
(ar-511)
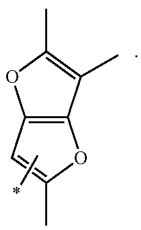
[Chemical Formula 87]
(ar-512)
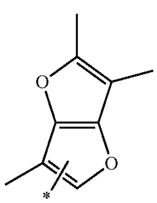
(ar-513)
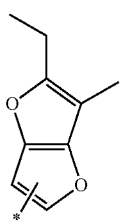
(ar-514)
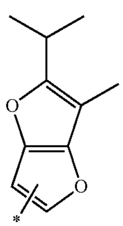
(ar-515)
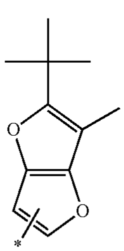
-continued
(ar-516)
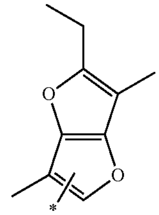
(ar-517)
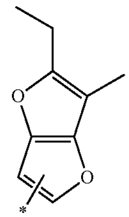
(ar-518)
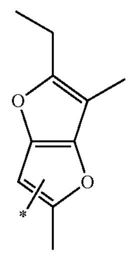
[Chemical Formula 88]
(ar-519)
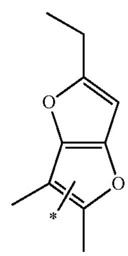
(ar-520)
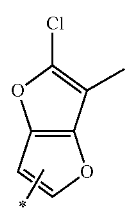
(ar-521)
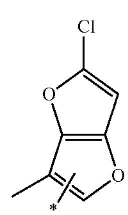

(ar-522)
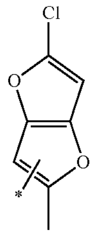
(ar-523)
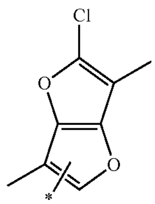
(ar-524)
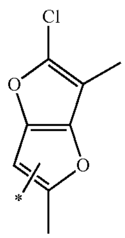
(ar-525)
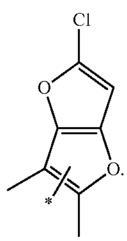
[Chemical Formula 89]
(ar-526)
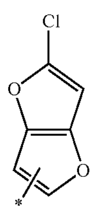
(ar-527)
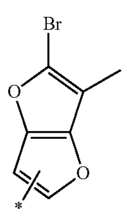
(ar-528)
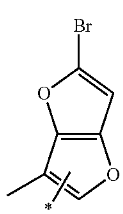
(ar-529)
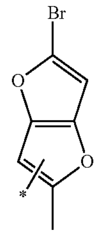
(ar-530)
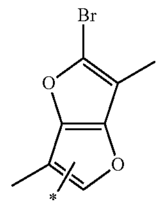
(ar-531)
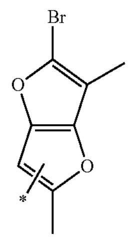
(ar-532)
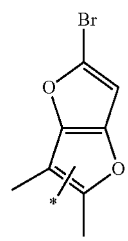
[Chemical Formula 90]
(ar-533)
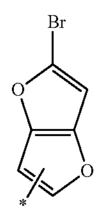
(ar-534)
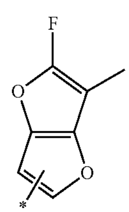
(ar-535)
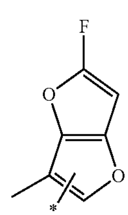

-continued
(ar-536)
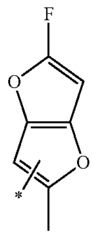
(ar-537)
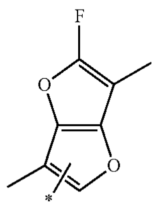
(ar-538)
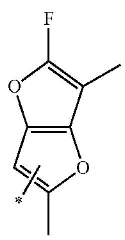
(ar-539)
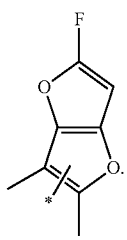
[Chemical Formula 91]
(ar-540)
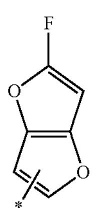
(ar-541)
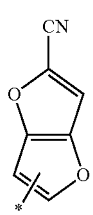
(ar-542)
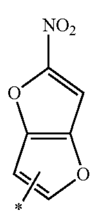
-continued
(ar-543)
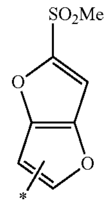
(ar-544)
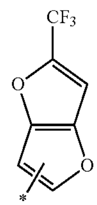
(ar-545)
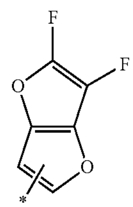
(ar-546)
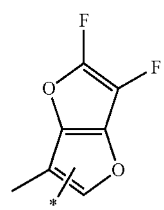
[Chemical Formula 92]
(ar-547)
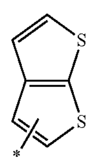
(ar-548)
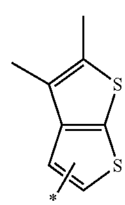
(ar-549)
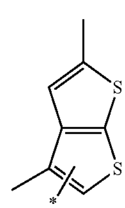

-continued
(ar-550)
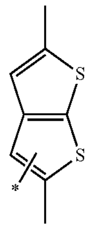
(ar-551)
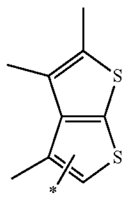
(ar-552)
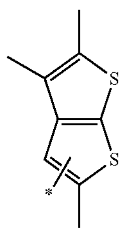
(ar-553)
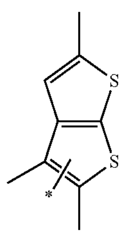
[Chemical Formula 93]
(ar-554)
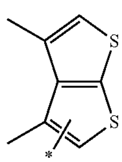
(ar-555)
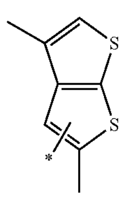
(ar-556)
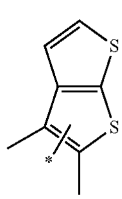
-continued
(ar-557)
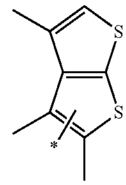
(ar-558)
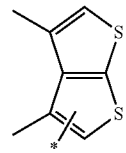
(ar-559)
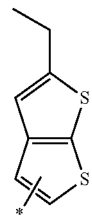
(ar-560)
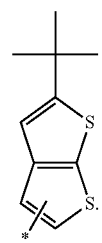
[Chemical Formula 94]
(ar-561)
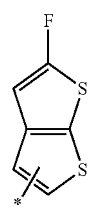
(ar-562)
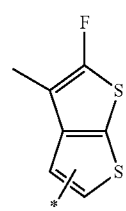
(ar-563)
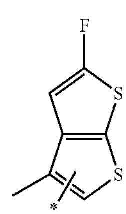

-continued
(ar-564)
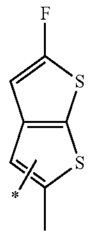
(ar-565)
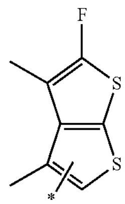
(ar-566)
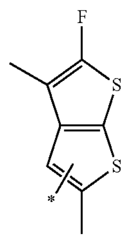
(ar-567)
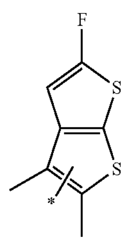
[Chemical Formula 95]
(ar-568)
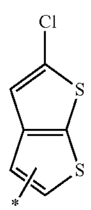
(ar-569)
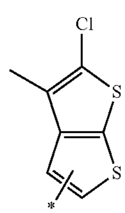
(ar-570)
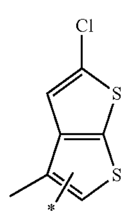
-continued
(ar-571)
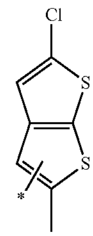
(ar-572)
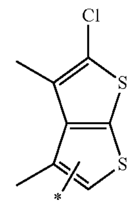
(ar-573)
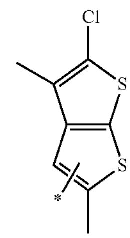
(ar-574)
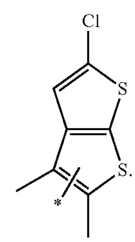
[Chemical Formula 96]
(ar-575)
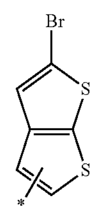
(ar-576)
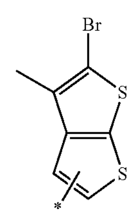
(ar-577)
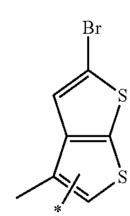

-continued
(ar-578)
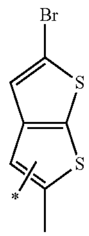
(ar-579)
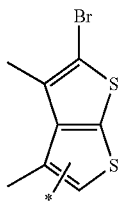
(ar-580)
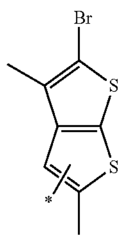
(ar-581)
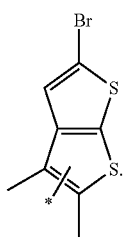
[Chemical Formula 97]
(ar-582)
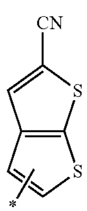
(ar-583)
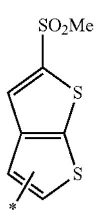
(ar-584)
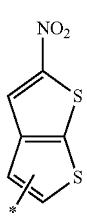
-continued
(ar-585)
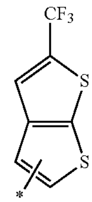
(ar-586)
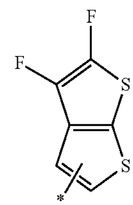
(ar-587)
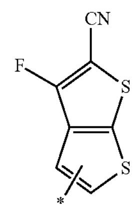
(ar-588)
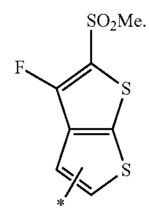
[Chemical Formula 98]
(ar-589)
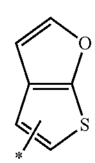
(ar-590)
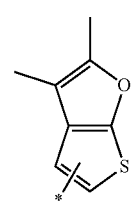
(ar-591)
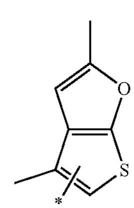

-continued
(ar-592)
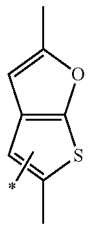
(ar-593)
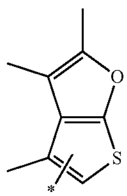
(ar-594)
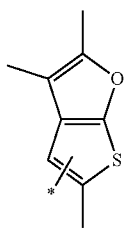
(ar-595)
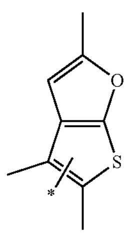
[Chemical Formula 99]
(ar-596)
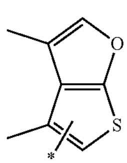
(ar-597)
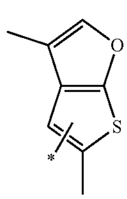
(ar-598)
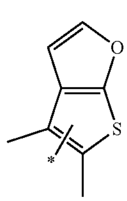
-continued
(ar-599)
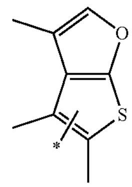
(ar-600)
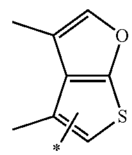
(ar-601)
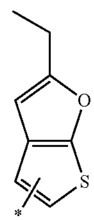
(ar-602)
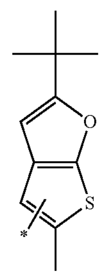
[Chemical Formula 100]
(ar-603)
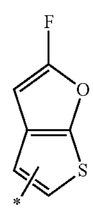
(ar-604)
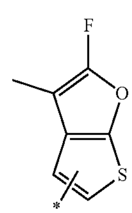
(ar-605)
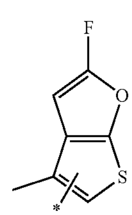

-continued
(ar-606)
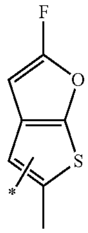
(ar-607)
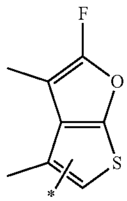
(ar-608)
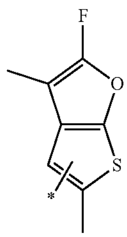
(ar-609)
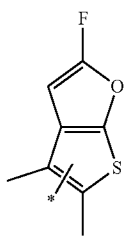
[Chemical Formula 101]
(ar-610)
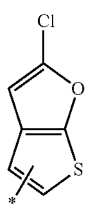
(ar-611)
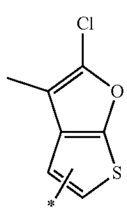
(ar-612)
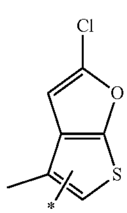
-continued
(ar-613)
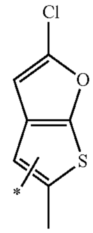
(ar-614)
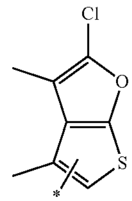
(ar-615)
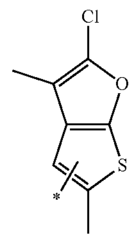
(ar-616)
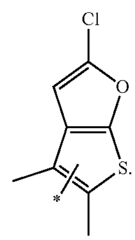
[Chemical Formula 102]
(ar-617)
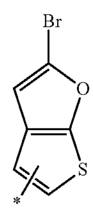
(ar-618)
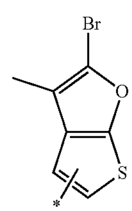
(ar-619)
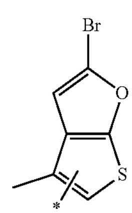

-continued
(ar-620)
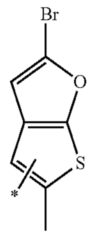
(ar-621)
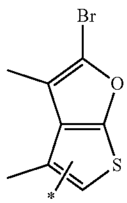
(ar-622)
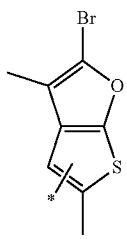
(ar-623)
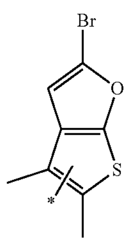
[Chemical Formula 103]
(ar-624)
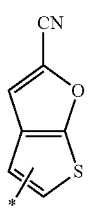
(ar-625)
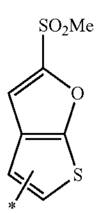
(ar-626)
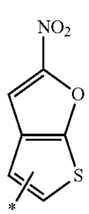
-continued
(ar-627)
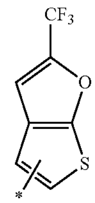
(ar-628)
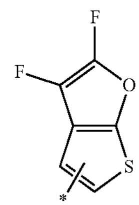
(ar-629)
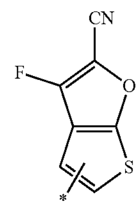
(ar-630)
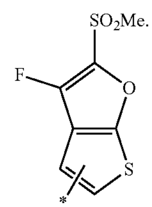
[Chemical Formula 104]
(ar-631)
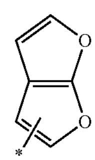
(ar-632)
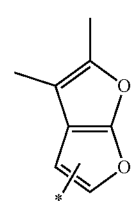
(ar-633)
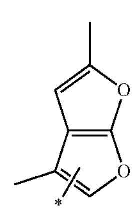

-continued
(ar-634)
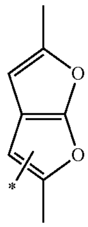
(ar-635)
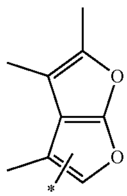
(ar-636)
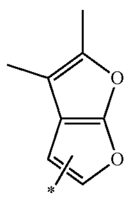
(ar-637)
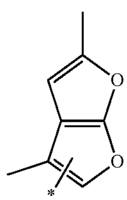
[Chemical Formula 105]
(ar-638)
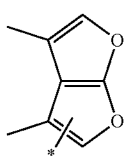
(ar-639)
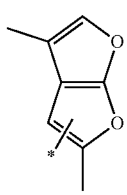
(ar-640)
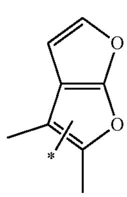
(ar-641)
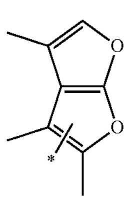
-continued
(ar-642)
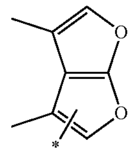
(ar-643)
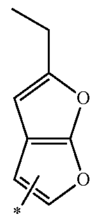
(ar-644)
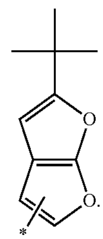
[Chemical Formula 106]
(ar-645)
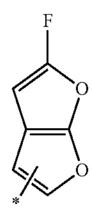
(ar-646)
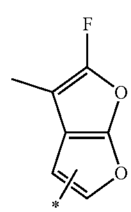
(ar-647)
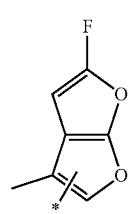
(ar-648)
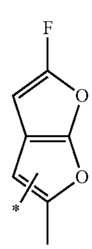

-continued
(ar-649)
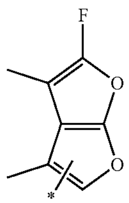
(ar-650)
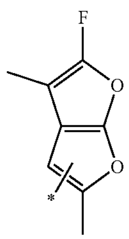
(ar-651)
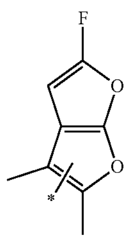
[Chemical Formula 107]
(ar-652)
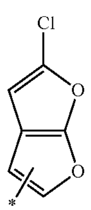
(ar-653)
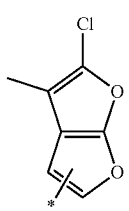
(ar-654)
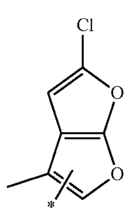
(ar-655)
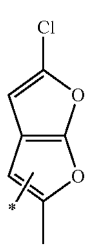
-continued
(ar-656)
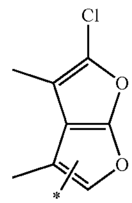
(ar-657)
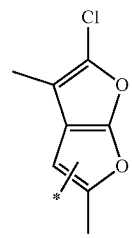
(ar-658)
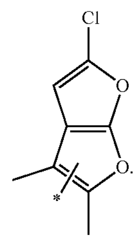
[Chemical Formula 108]
(ar-659)
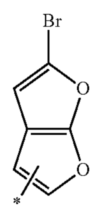
(ar-660)
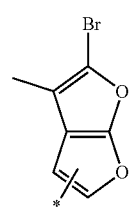
(ar-661)
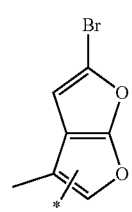
(ar-662)
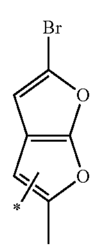

-continued
(ar-663)
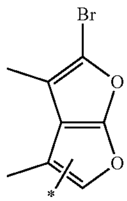
(ar-664)
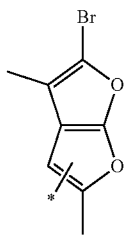
(ar-665)
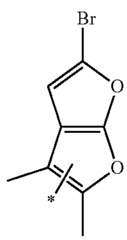
[Chemical Formula 109]
(ar-666)
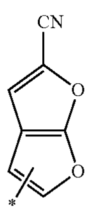
(ar-667)
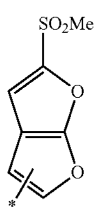
(ar-668)
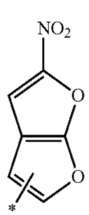
(ar-669)
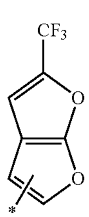
-continued
(ar-670)
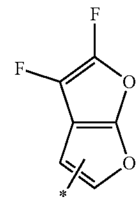
(ar-671)
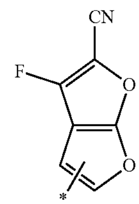
(ar-672)
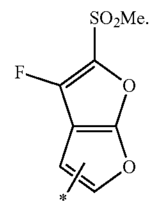
[Chemical Formula 110]
(ar-673)
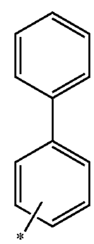
(ar-674)
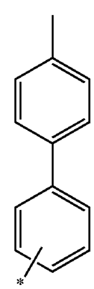
(ar-675)
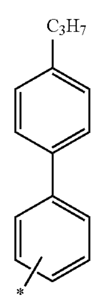

-continued
(ar-676)
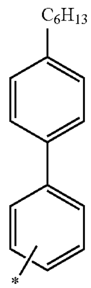
(ar-677)
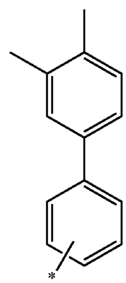
(ar-678)
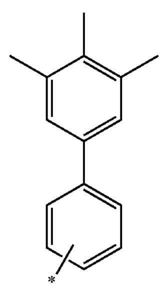
(ar-679)
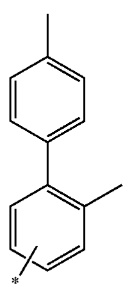
[Chemical Formula 111]
(ar-680)
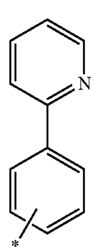
-continued
(ar-681)
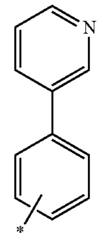
(ar-682)
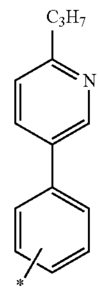
(ar-683)
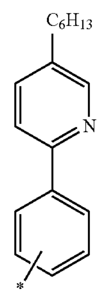
(ar-684)
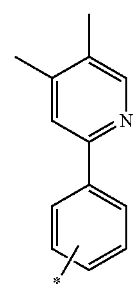
(ar-685)
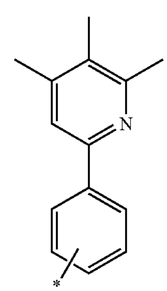

-continued
(ar-686)
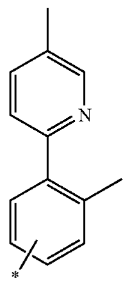
[Chemical Formula 112]
(ar-687)
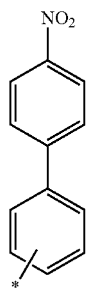
(ar-688)
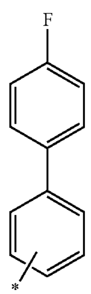
(ar-689)
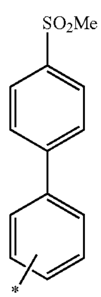
(ar-690)
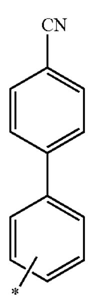
-continued
(ar-691)
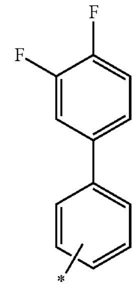
(ar-692)
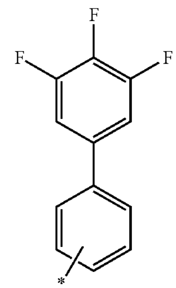
(ar-693)
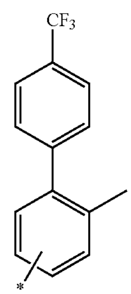
[Chemical Formula 113]
(ar-694)
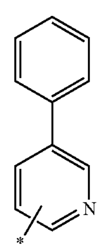
(ar-695)
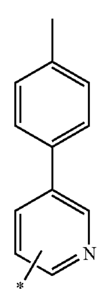

-continued
(ar-696)
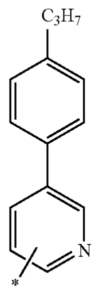
(ar-697)
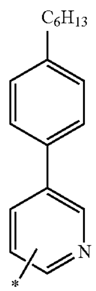
(ar-698)
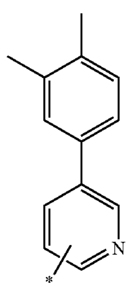
(ar-699)
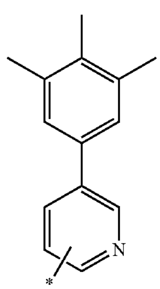
(ar-700)
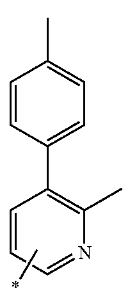
-continued
[Chemical Formula 114]
(ar-701)
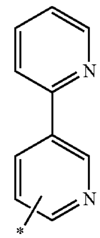
(ar-702)
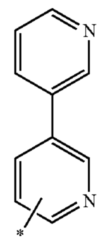
(ar-703)
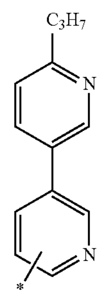
(ar-704)
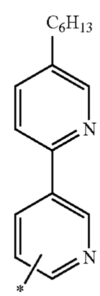
(ar-705)
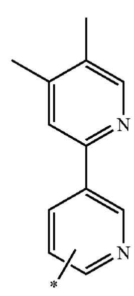

(ar-706)
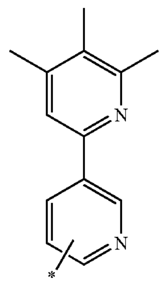
(ar-707)
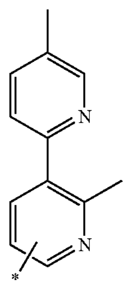
[Chemical Formula 115]
(ar-708)
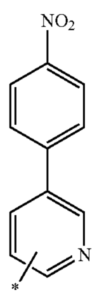
(ar-709)
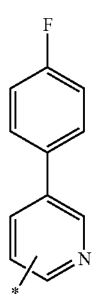
(ar-710)
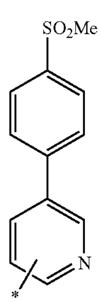
(ar-711)
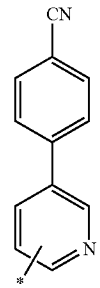
(ar-712)
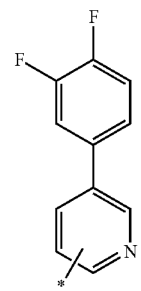
(ar-713)
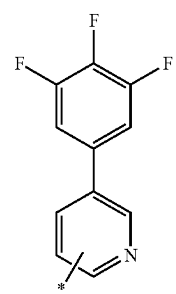
(ar-714)
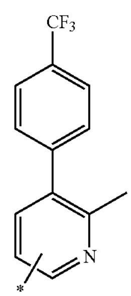
[Chemical Formula 116]
(ar-715)
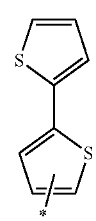

-continued
(ar-716)
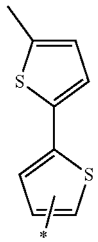
(ar-717)
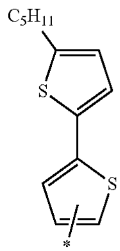
(ar-718)
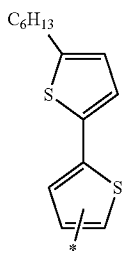
(ar-719)
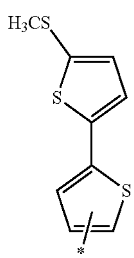
(ar-720)
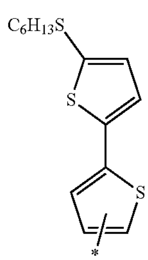
(ar-721)
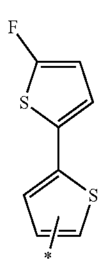
-continued
[Chemical Formula 117]
(ar-722)
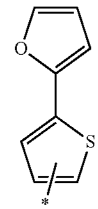
(ar-723)
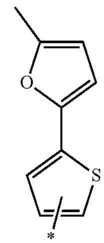
(ar-724)
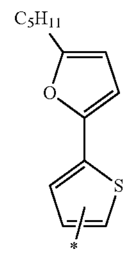
(ar-725)
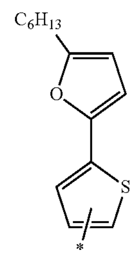
(ar-726)
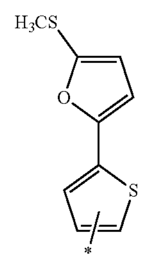
(ar-727)
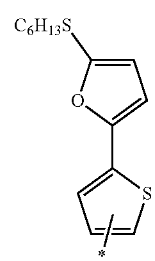

-continued
(ar-728)
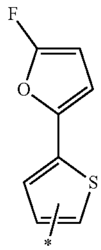
[Chemical Formula 118]
(ar-729)
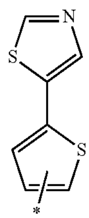
(ar-730)
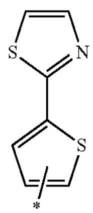
(ar-731)
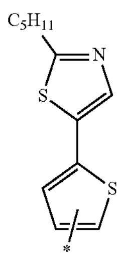
(ar-732)
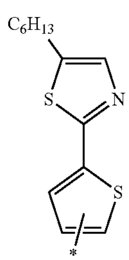
(ar-733)
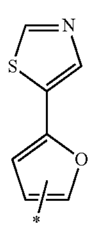
-continued
(ar-734)
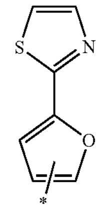
(ar-735)
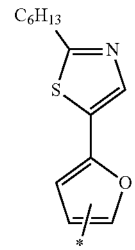
[Chemical Formula 119]
(ar-736)
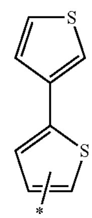
(ar-737)
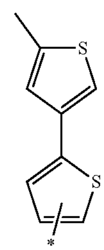
(ar-738)
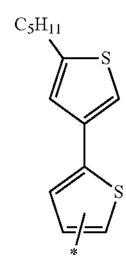
(ar-739)
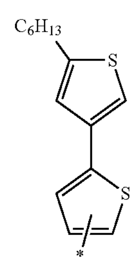

(ar-740)
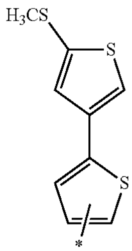
(ar-741)
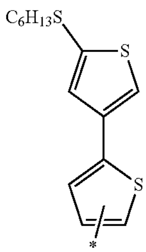
(ar-742)
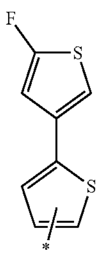
[Chemical Formula 120]
(ar-743)
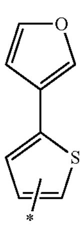
(ar-744)
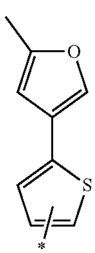
(ar-745)
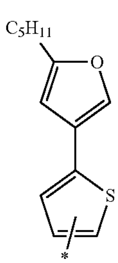
(ar-746)
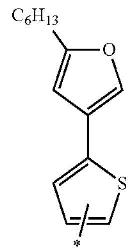
(ar-747)
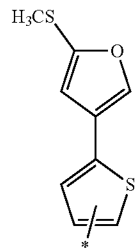
(ar-748)
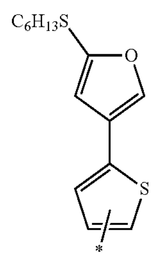
(ar-749)
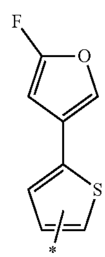
[Chemical Formula 121]
(ar-750)
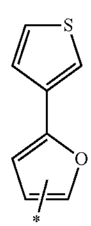
(ar-751)
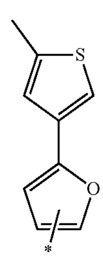

-continued
(ar-752)
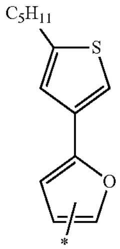
(ar-753)
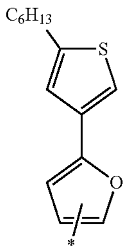
(ar-754)
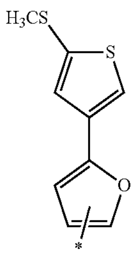
(ar-755)
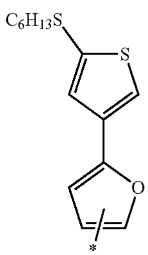
(ar-756)
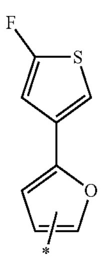
[Chemical Formula 122]
(ar-757)
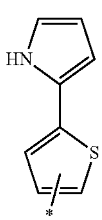
-continued
(ar-758)
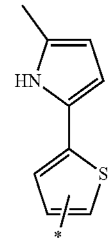
(ar-759)
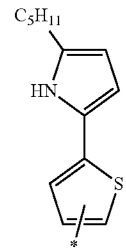
(ar-760)
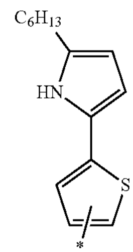
(ar-761)
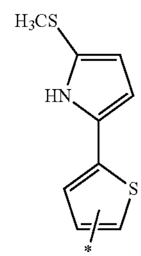
(ar-762)
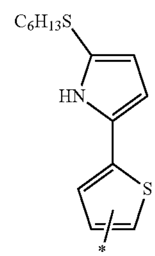
(ar-763)
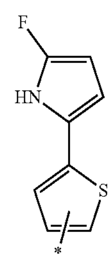

-continued
[Chemical Formula 123]
(ar-764)
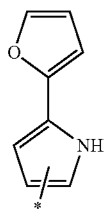
(ar-765)
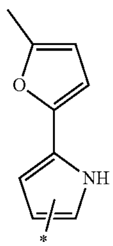
(ar-766)
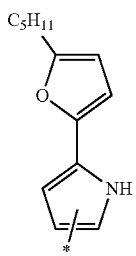
(ar-767)
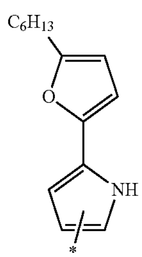
(ar-768)
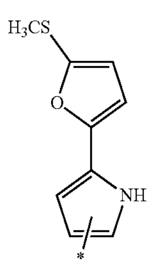
(ar-769)
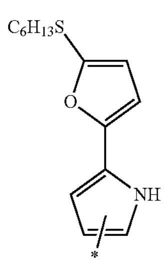
-continued
(ar-770)
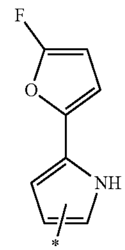
[Chemical Formula 124]
(ar-771)
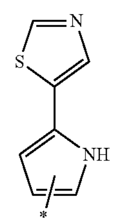
(ar-772)
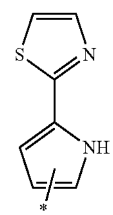
(ar-773)
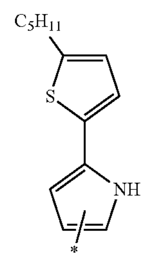
(ar-774)
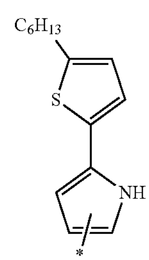
(ar-775)
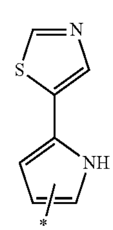

-continued
(ar-776)
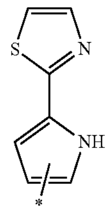
(ar-777)
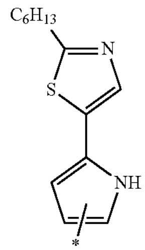
[Chemical Formula 125]
(ar-778)
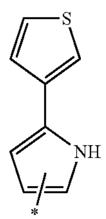
(ar-779)
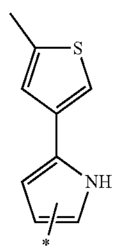
(ar-780)
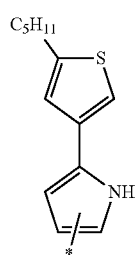
(ar-781)
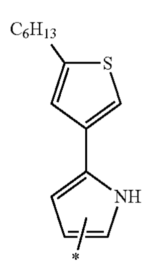
-continued
(ar-782)
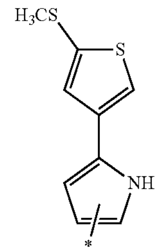
(ar-783)
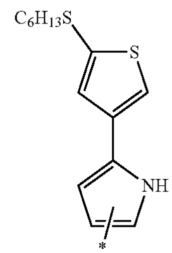
(ar-784)
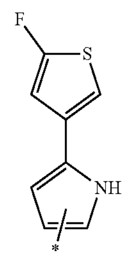
[Chemical Formula 126]
(ar-785)
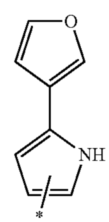
(ar-786)
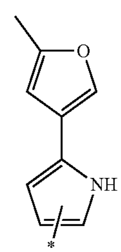
(ar-787)
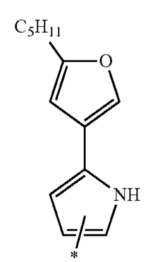

(ar-788)
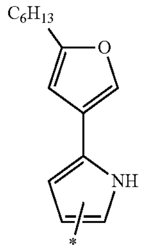
(ar-789)
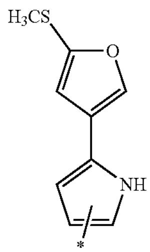
(ar-790)
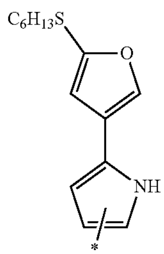
(ar-791)
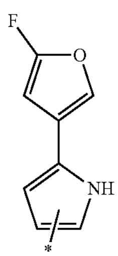
[Chemical Formula 127]
(ar-792)
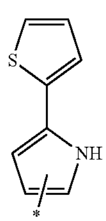
(ar-793)
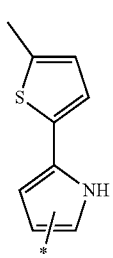
(ar-794)
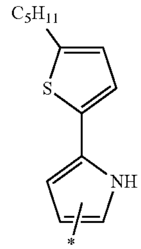
(ar-795)
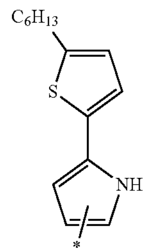
(ar-796)
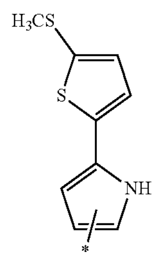
(ar-797)
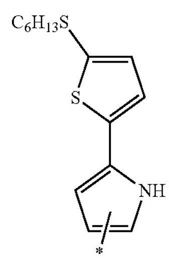
(ar-798)
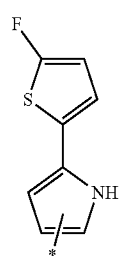
[Chemical Formula 128]
(ar-799)
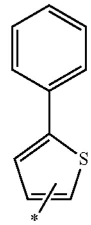

-continued
(ar-800)
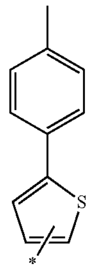
(ar-801)
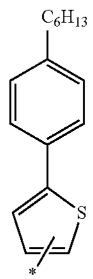
(ar-802)
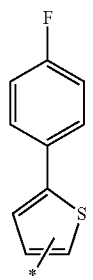
(ar-803)
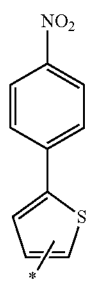
(ar-804)
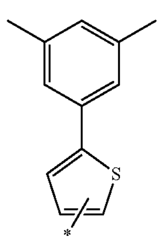
(ar-805)
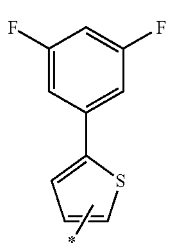
-continued
[Chemical Formula 129]
(ar-806)
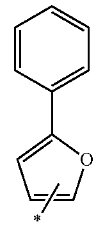
(ar-807)
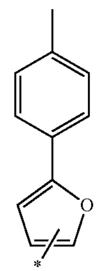
(ar-808)
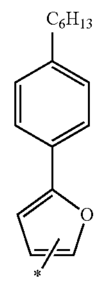
(ar-809)
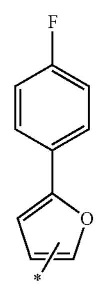
(ar-810)
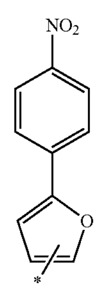
(ar-811)
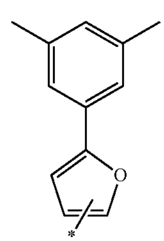

-continued
(ar-812)
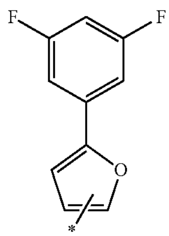
[Chemical Formula 130]
(ar-813)
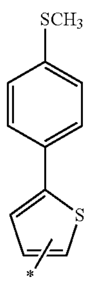
(ar-814)
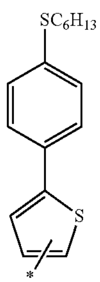
(ar-815)
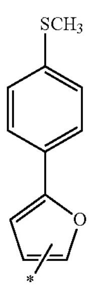
(ar-816)
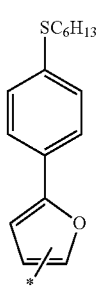
-continued
(ar-817)
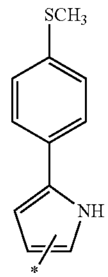
(ar-818)
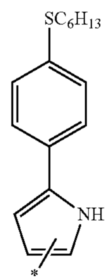
(ar-819)
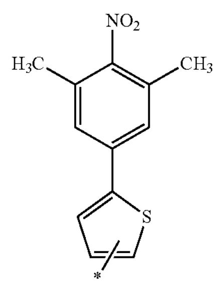
[Chemical Formula 131]
(ar-820)
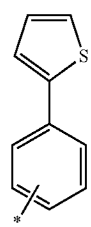
(ar-821)
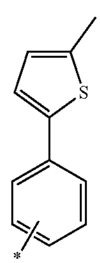
(ar-822)
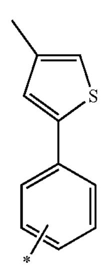

-continued
(ar-823)
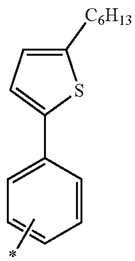
(ar-824)
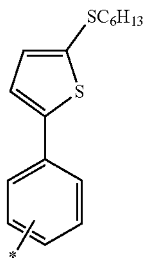
(ar-825)
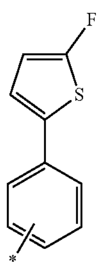
(ar-826)
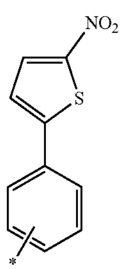
[Chemical Formula 132]
(ar-827)
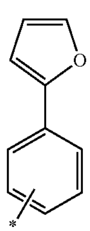
(ar-828)
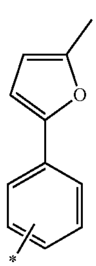
-continued
(ar-829)
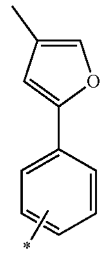
(ar-830)
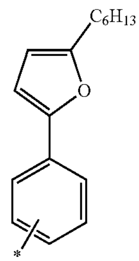
(ar-831)
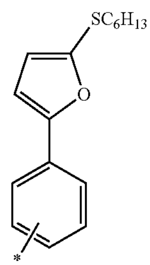
(ar-832)
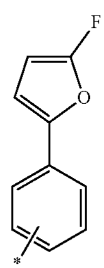
(ar-833)
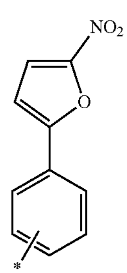
[Chemical Formula 133]
(ar-834)
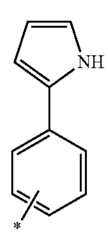

-continued (ar-835)

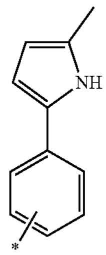

(ar-836)

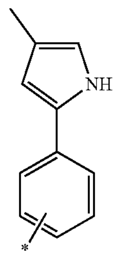

(ar-837)

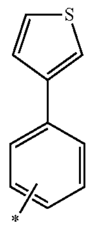

(ar-838)

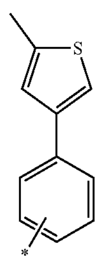

(ar-839)

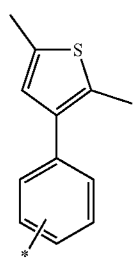

(ar-840)

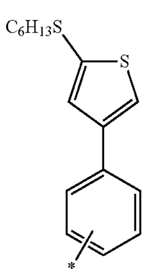

Examples of the aromatic group represented by $Ar^a$ include groups represented by the following formula (Ar-23).

[Chemical Formula 134]

(Ar-23)

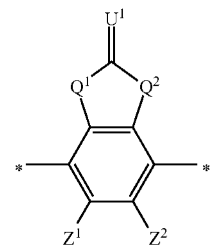

In formula (Ar-23), *, $Z^1$, $Z^2$, $Q^1$ and $Q^2$ have the same meaning as described above, and $U^1$ represents a non-metal atom of Groups 14 to 16 to which a substituent may be bonded. Examples of the non-metal atom of Groups 14 to 16 include carbon atoms, nitrogen atoms, oxygen atoms and sulfur atoms, and preferable examples include =O, =S, =NR' and =C(R')R'. Examples of the substituent R' include a hydrogen atom, a halogen atom, an alkyl group, a halogenated alkyl group, an alkenyl group, an aryl group, a cyano group, an amino group, a nitro group, a nitroso group, a carboxy group, an alkylsulfinyl group having 1 to 6 carbon atoms, an alkylsulfonyl group having 1 to 6 carbon atoms, a fluoroalkyl group having 1 to 6 carbon atoms, an alkoxy group having 1 to 6 carbon atoms, an alkylsulfanyl group having 1 to 6 carbon atoms, an N-alkylamino group having 1 to 6 carbon atoms, an N,N-dialkylamino group having 2 to 12 carbon atoms, an N-alkylsulfamoyl group having 1 to 6 carbon atoms, and a dialkylsulfamoyl group having 2 to 12 carbon atoms. When the non-metal atom is a carbon atom (C), two R's may be the same as or different from each other.

In the present invention, specific examples of the polymerizable liquid crystal compound represented by formula (1) include the following compounds.

[Chemical Formula 135]

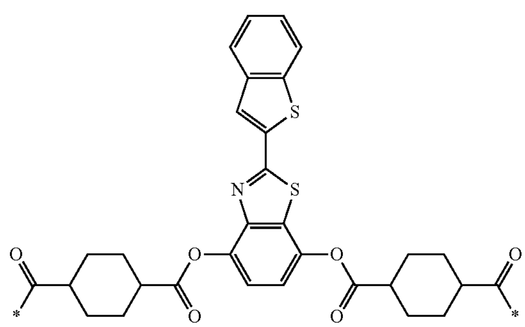

(A1-1)

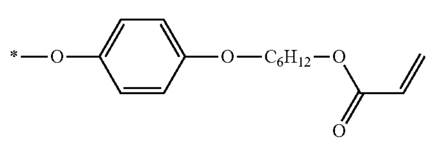

(A1-2)

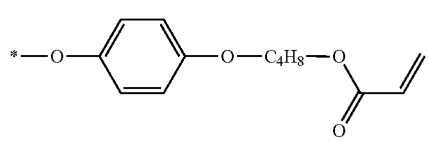

-continued
(A1-3)
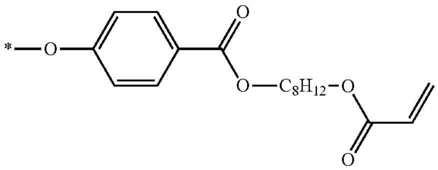
(A1-4)
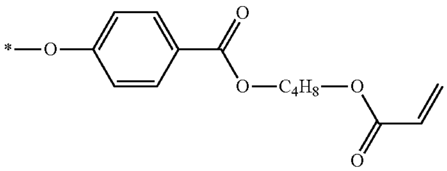
(A1-5)
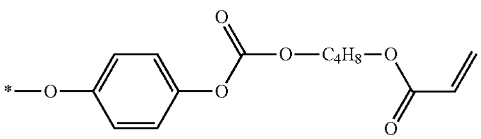
(A1-6)
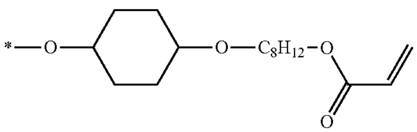
(A1-7)
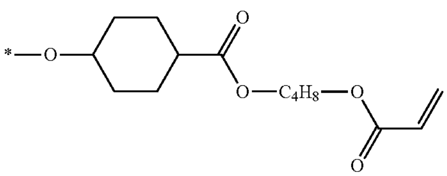
(A1-8)
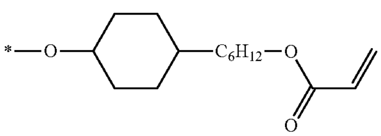
[Chemical Formula 136]
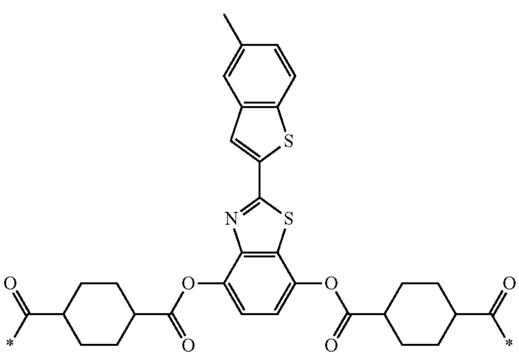
(A2-1)
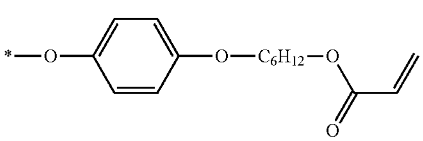
(A2-2)
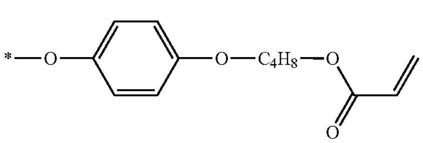
-continued
(A2-3)
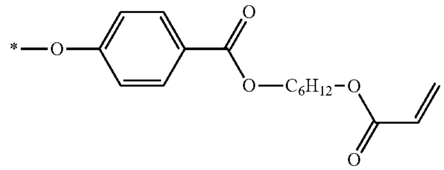
(A2-4)
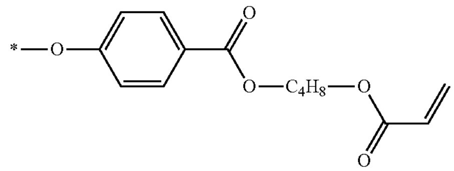
(A2-5)
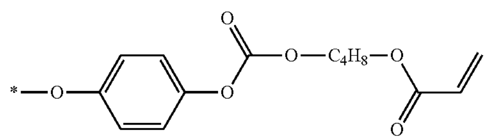
(A2-6)
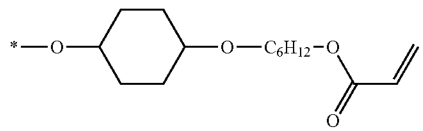
(A2-7)
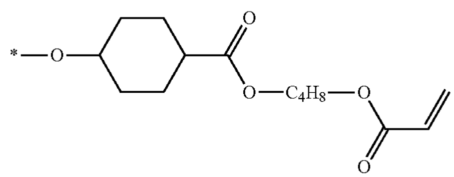
(A2-8)
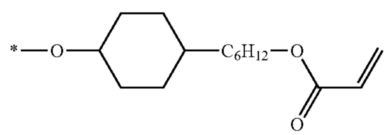
[Chemical Formula 137]
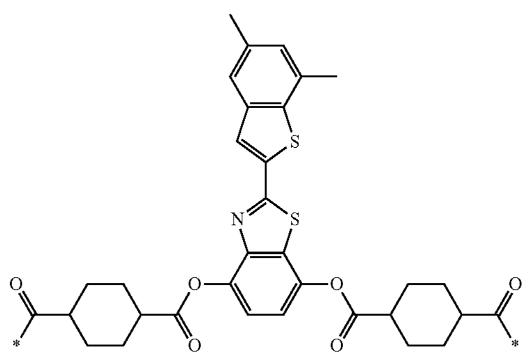
(A3-1)
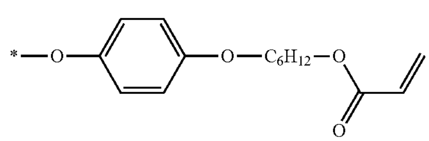
(A3-2)
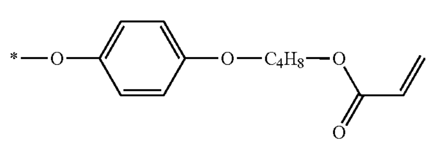

-continued
(A3-3)
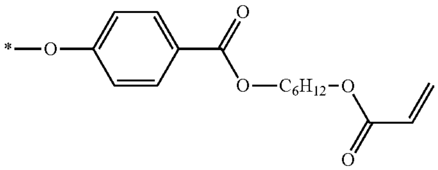
(A3-4)
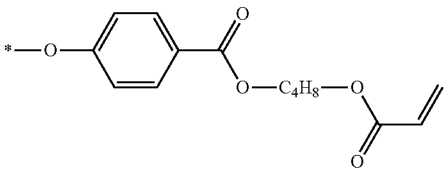
(A3-5)
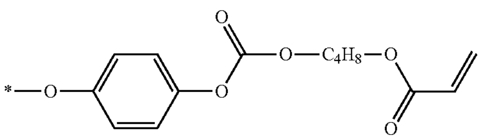
(A3-6)
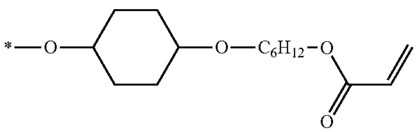
(A3-7)
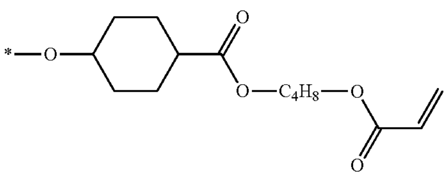
(A3-8)
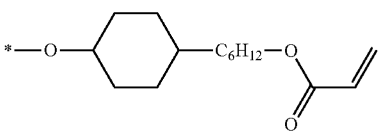
[Chemical Formula 138]
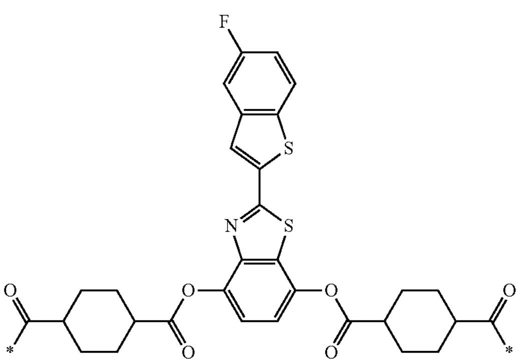
(A4-1)
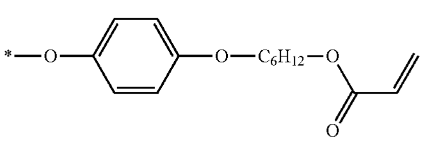
(A4-2)
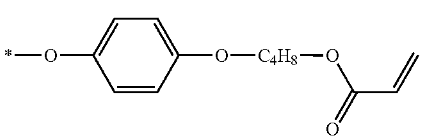
-continued
(A4-3)
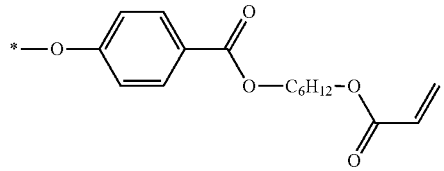
(A4-4)
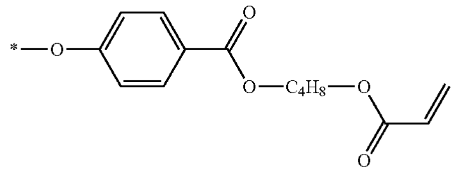
(A4-5)
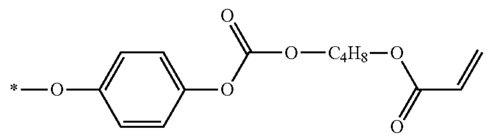
(A4-6)
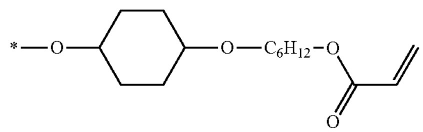
(A4-7)
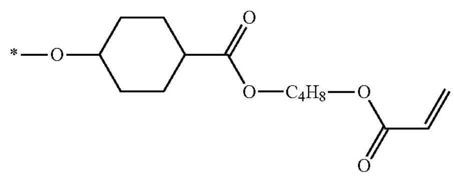
(A4-8)
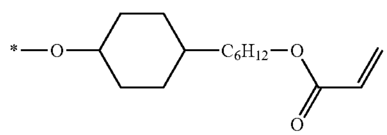
[Chemical Formula 139]
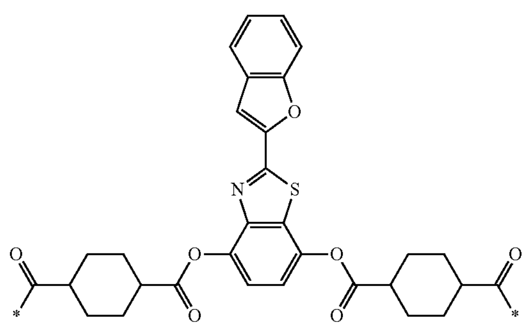
(A5-1)
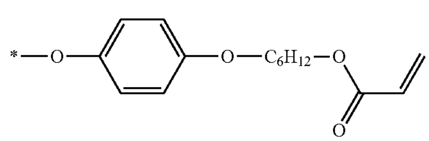
(A5-2)
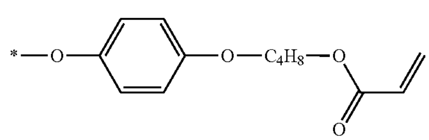

-continued
(A5-3)
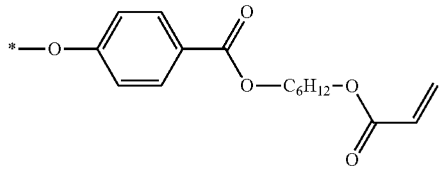
(A5-4)
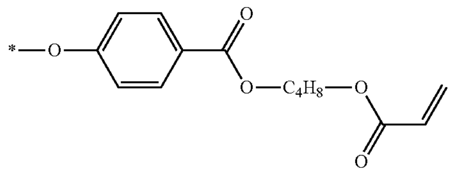
(A5-5)
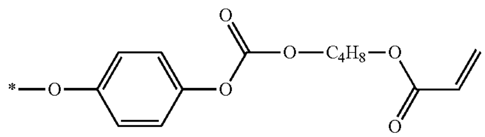
(A5-6)
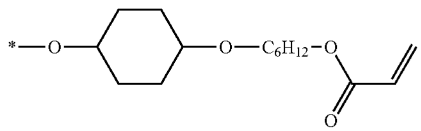
(A5-7)
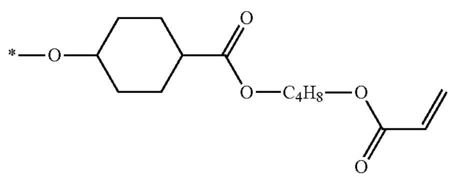
(A5-8)
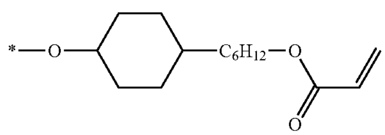
[Chemical Formula 140]
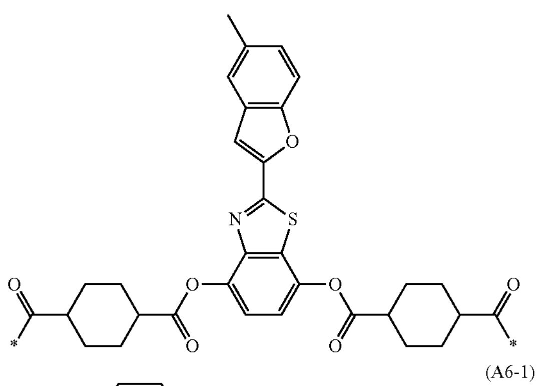
(A6-1)
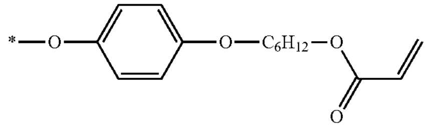
(A6-2)
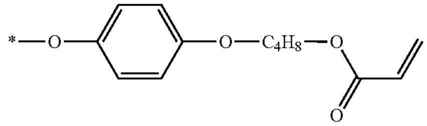
-continued
(A6-3)
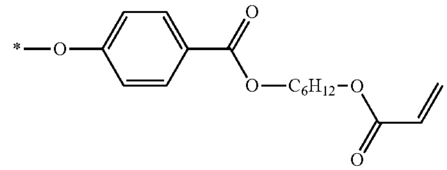
(A6-4)
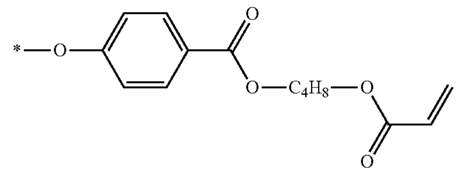
(A6-5)
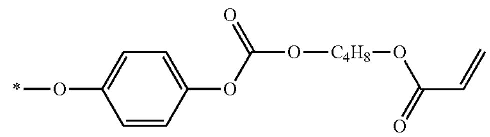
(A6-6)
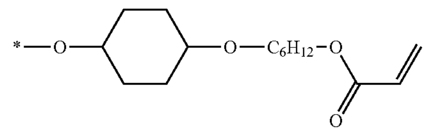
(A6-7)
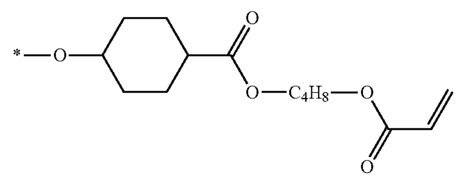
(A6-8)
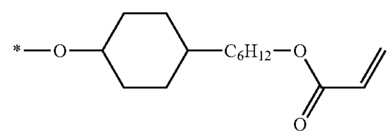
[Chemical Formula 141]
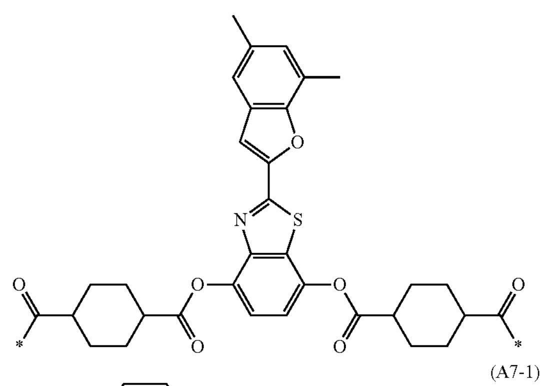
(A7-1)
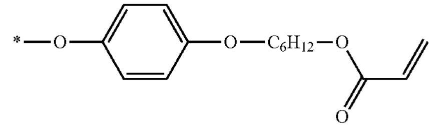
(A7-2)
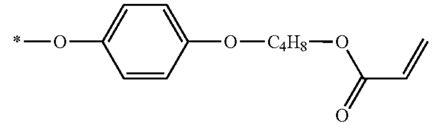

-continued
(A7-3)
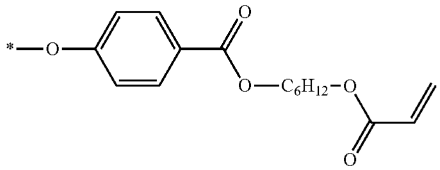
(A7-4)
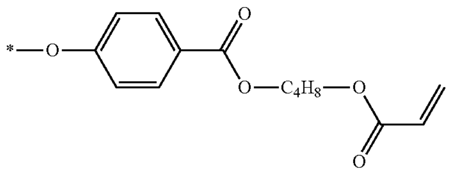
(A7-5)
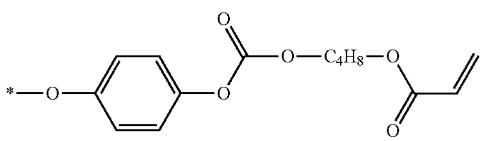
(A7-6)
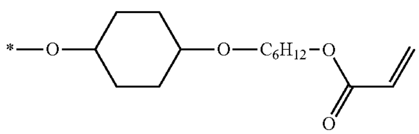
(A7-7)
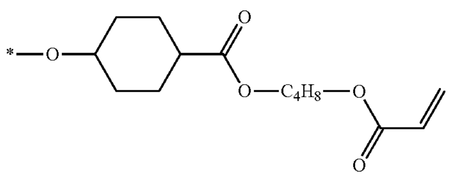
(A7-8)
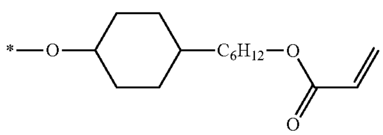
[Chemical Formula 142]
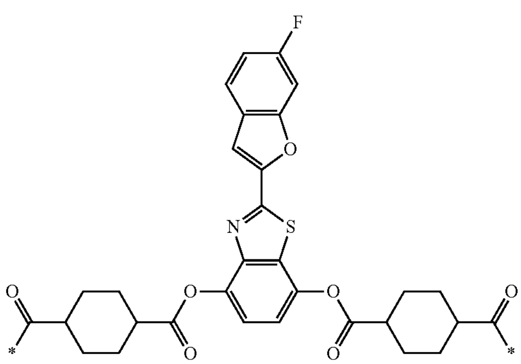
(A8-1)
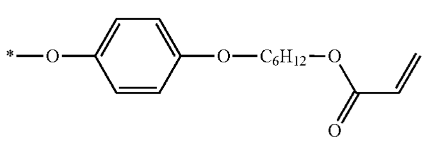
(A8-2)
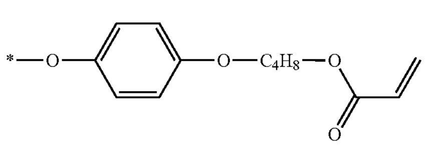
-continued
(A8-3)
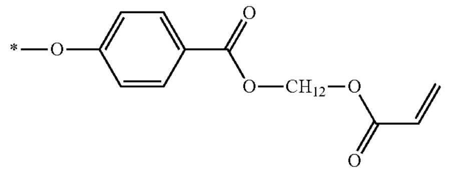
(A8-4)
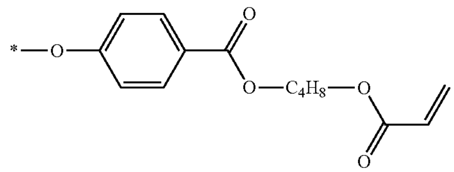
(A8-5)
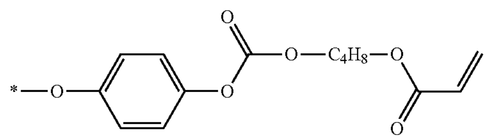
(A8-6)
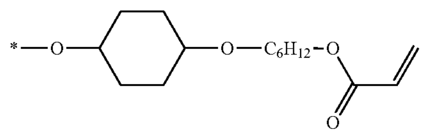
(A8-7)
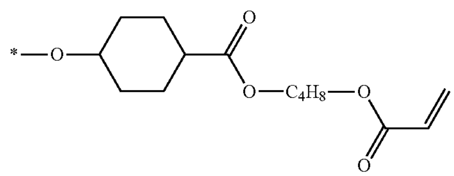
(A8-8)
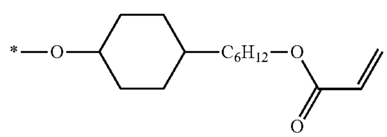
[Chemical Formula 143]
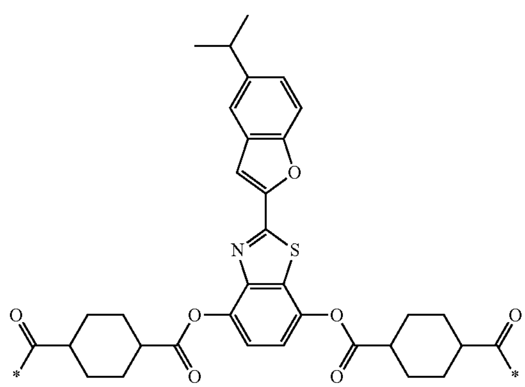
(A9-1)
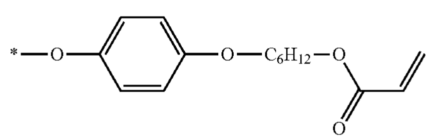

-continued
(A9-2)
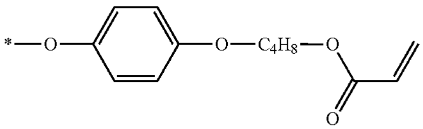
(A9-3)
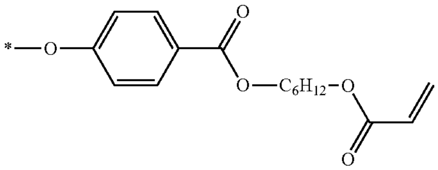
(A9-4)
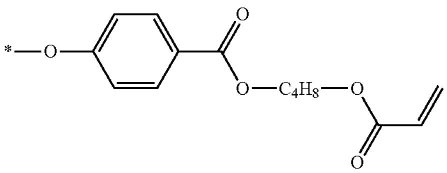
(A9-5)
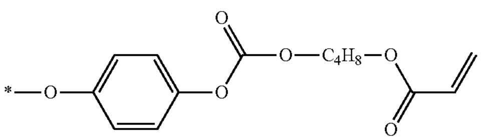
(A9-6)
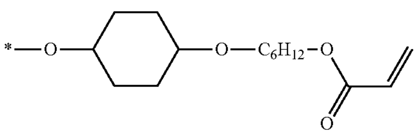
(A9-7)
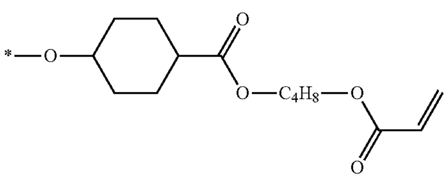
(A9-8)
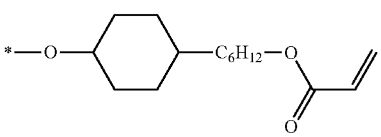
[Chemical Formula 144]
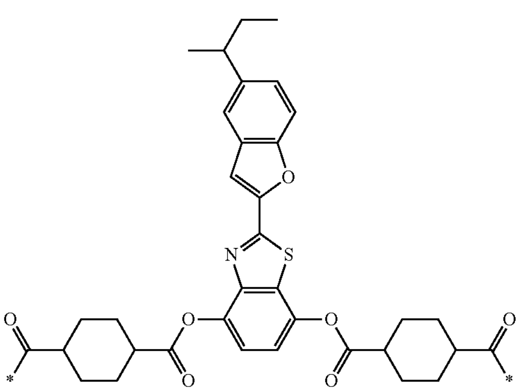
-continued
(A10-1)
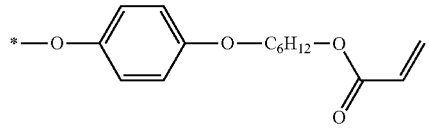
(A10-2)
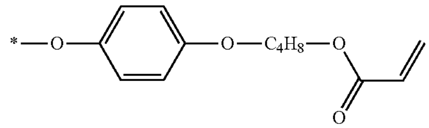
(A10-3)
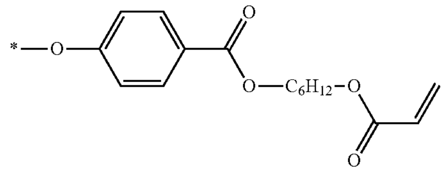
(A10-4)
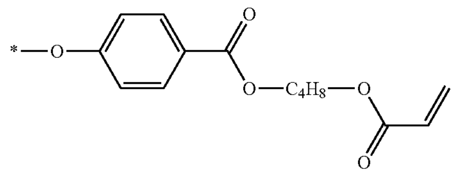
(A10-5)
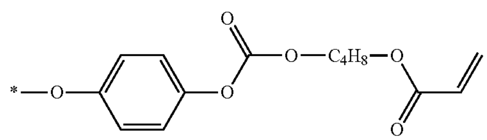
(A10-6)
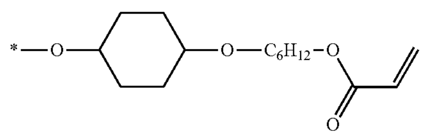
(A10-7)
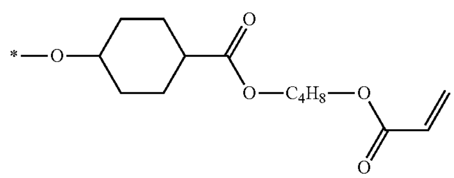
(A10-8)
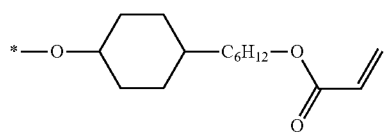
[Chemical Formula 145]
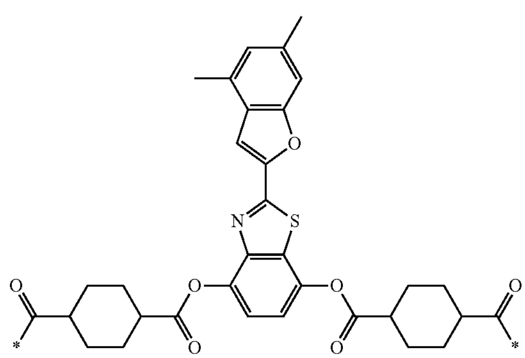

-continued
(A11-1)
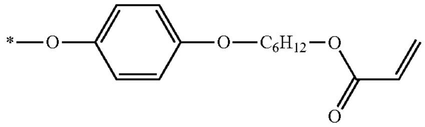
(A11-2)
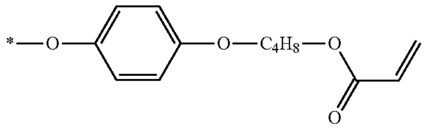
(A11-3)
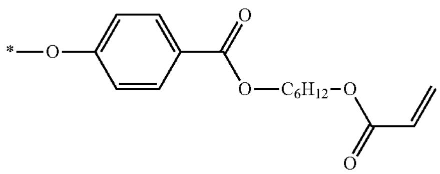
(A11-4)
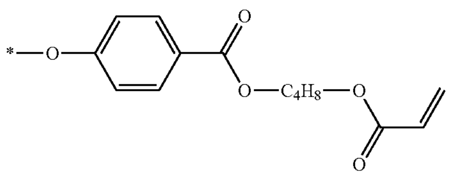
(A11-5)
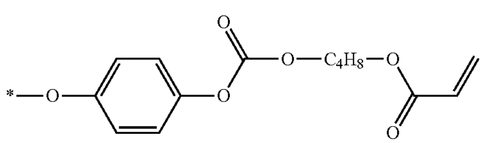
(A11-6)
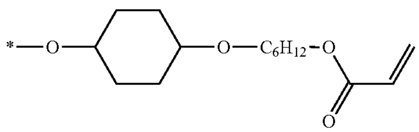
(A11-7)
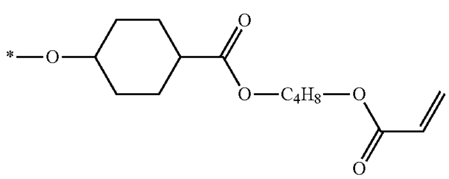
(A11-8)
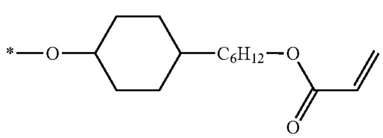
[Chemical Formula 146]
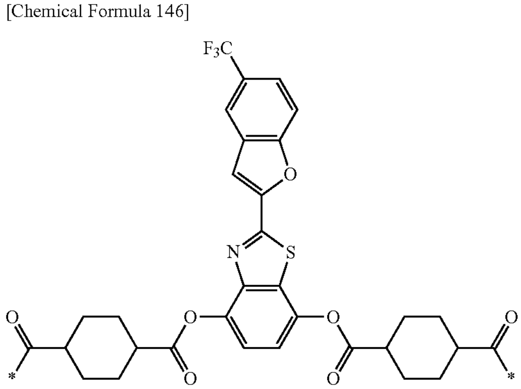
-continued
(A12-1)
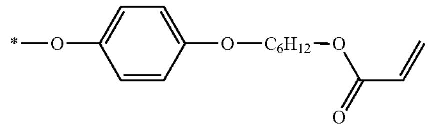
(A12-2)
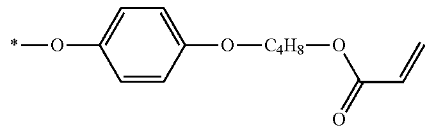
(A12-3)
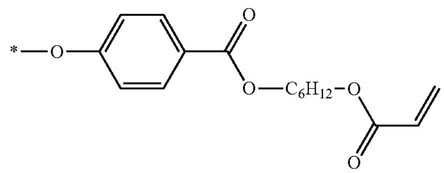
(A12-4)
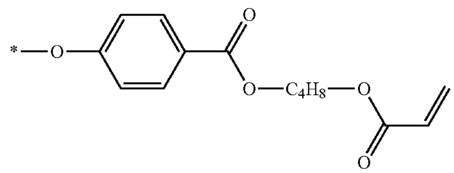
(A12-5)
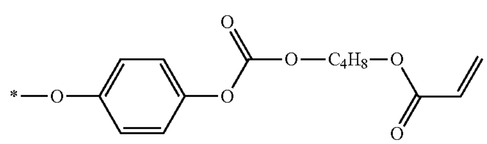
(A12-6)
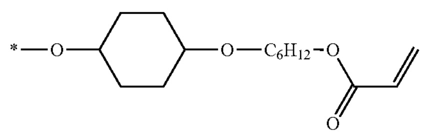
(A12-7)
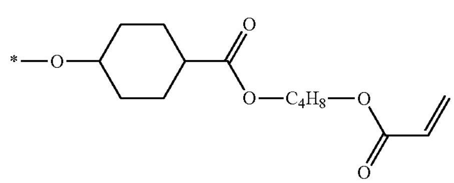
(A12-8)
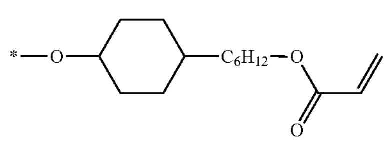

-continued
[Chemical Formula 147]
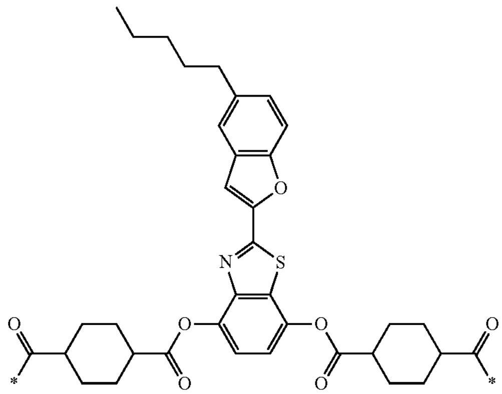
(A13-1)
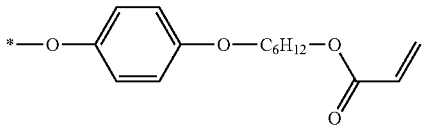
(A13-2)
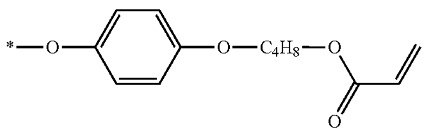
(A13-3)
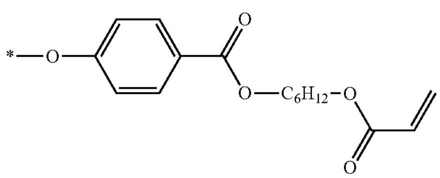
(A13-4)
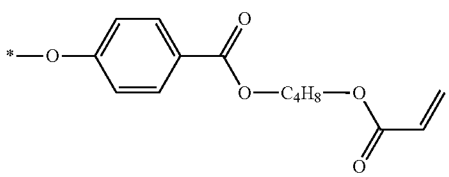
(A13-5)
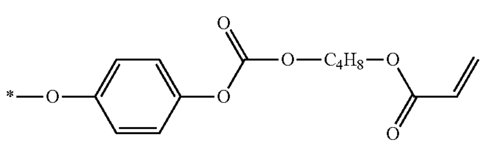
(A13-6)
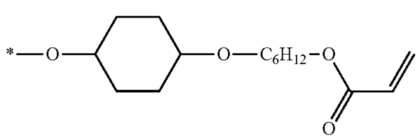
(A13-7)
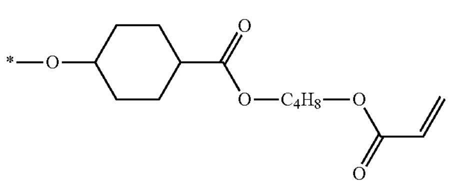
-continued
(A13-8)
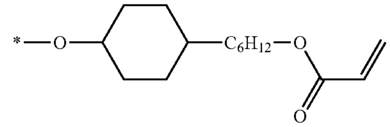
[Chemical Formula 148]
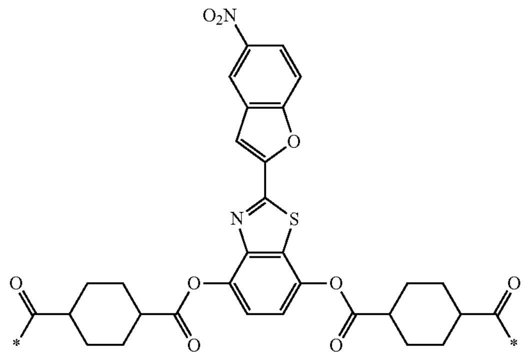
(A14-1)
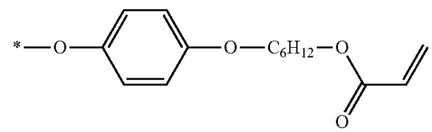
(A14-2)
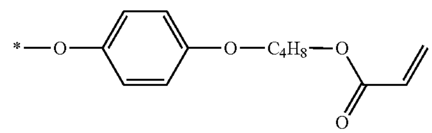
(A14-3)
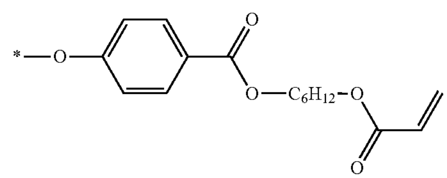
(A14-4)
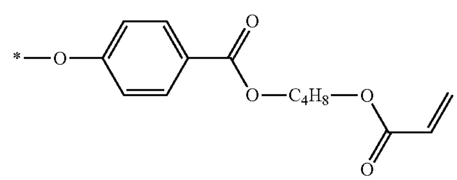
(A14-5)
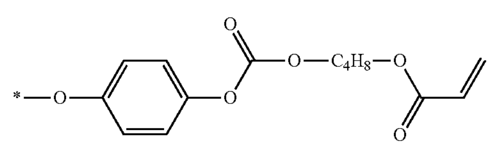
(A14-6)
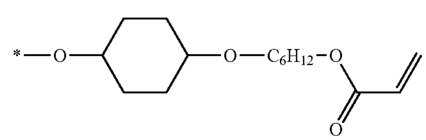
(A14-7)
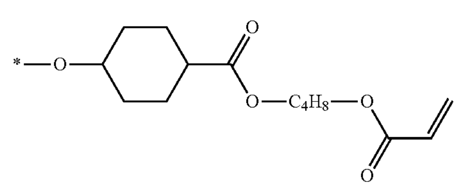

-continued
(A14-8)
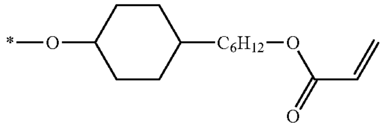
[Chemical Formula 149]
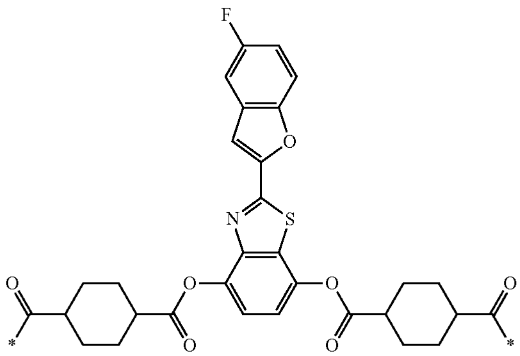
(A15-1)
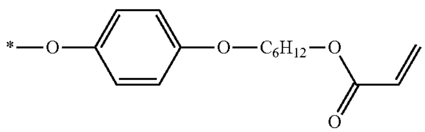
(A15-2)
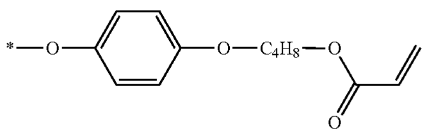
(A15-3)
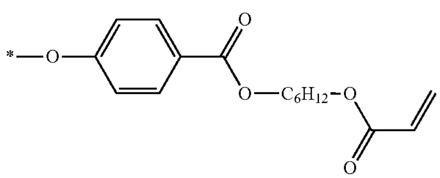
(A15-4)
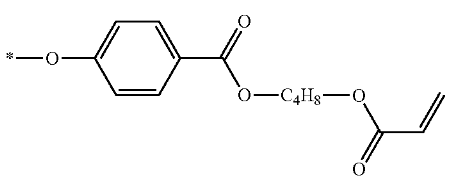
(A15-5)
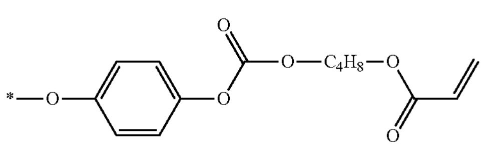
(A15-6)
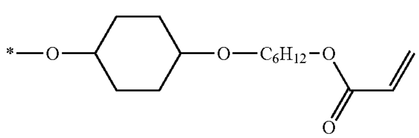
(A15-7)
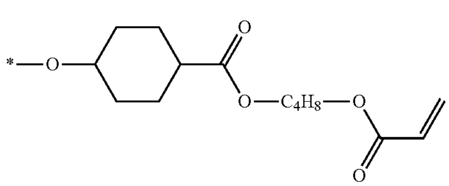
-continued
(A15-8)
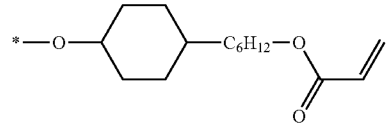
[Chemical Formula 150]
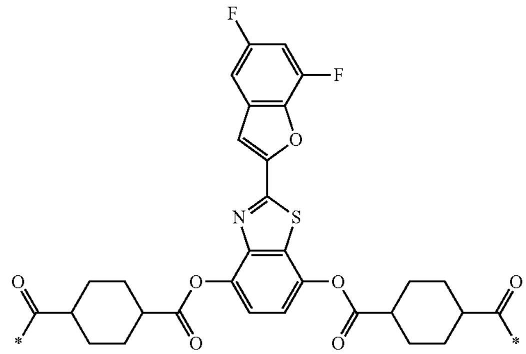
(A16-1)
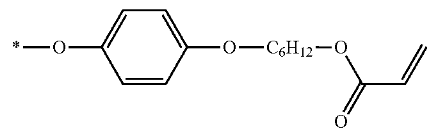
(A16-2)
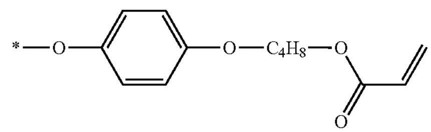
(A16-3)
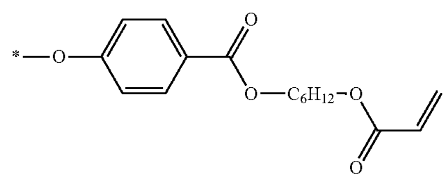
(A16-4)
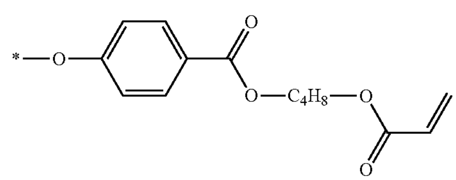
(A16-5)
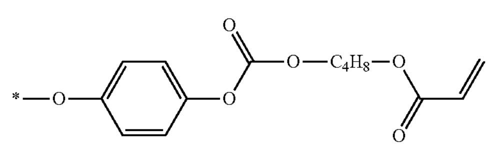
(A16-6)
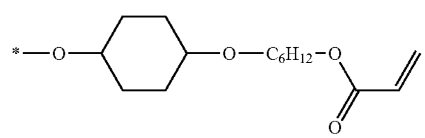
(A16-7)
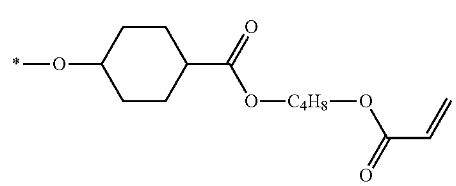

-continued
(A16-8)
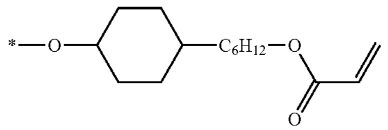
[Chemical Formula 151]
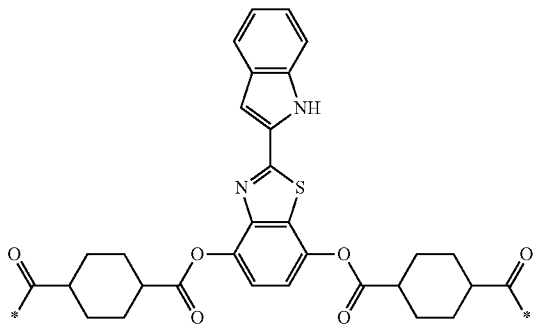
(A17-1)
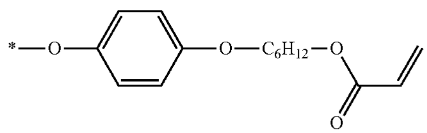
(A17-2)
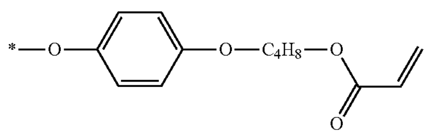
(A17-3)
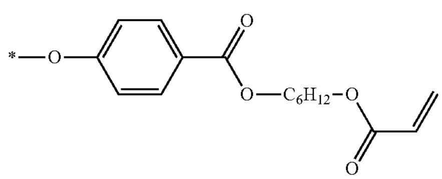
(A17-4)
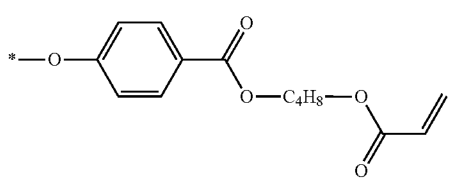
(A17-5)
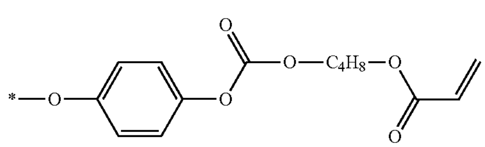
(A17-6)
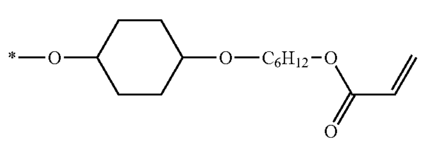
(A17-7)
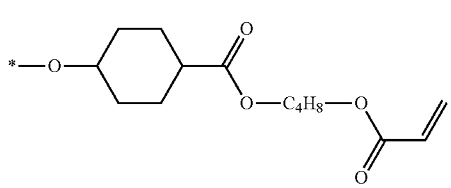
-continued
(A17-8)
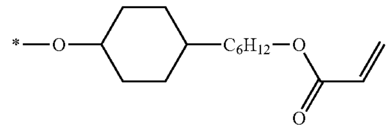
[Chemical Formula 152]
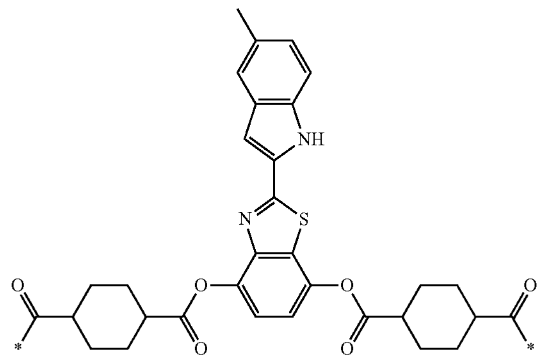
(A18-1)
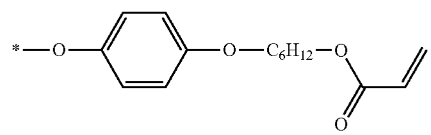
(A18-2)
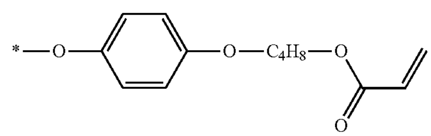
(A18-3)
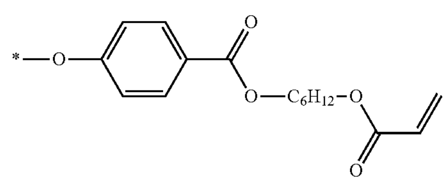
(A18-4)
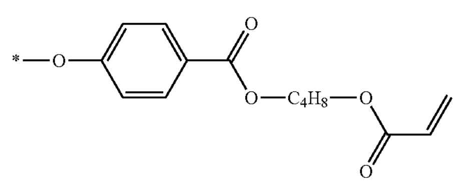
(A18-5)
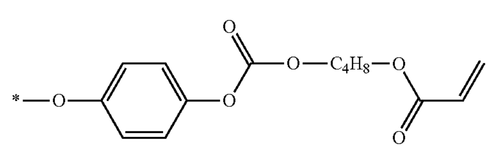
(A18-6)
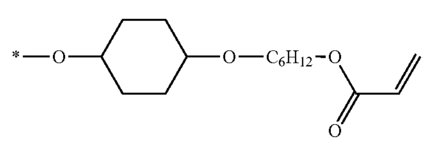
(A18-7)
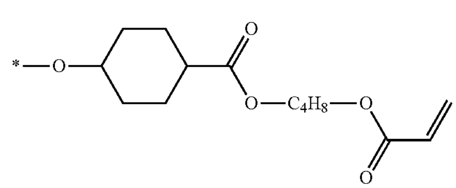

-continued
(A18-8)
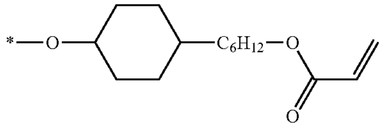
[Chemical Formula 153]
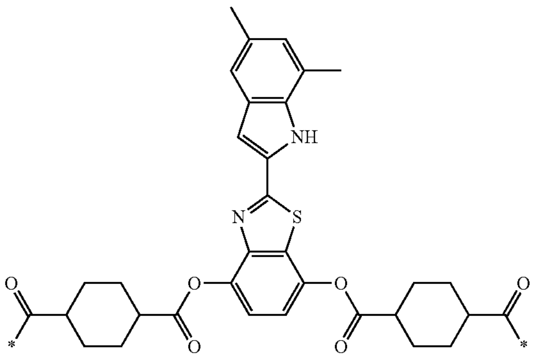
(A19-1)
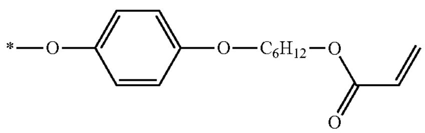
(A19-2)
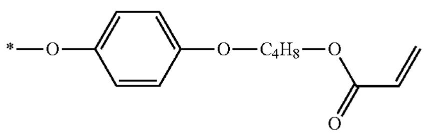
(A19-3)
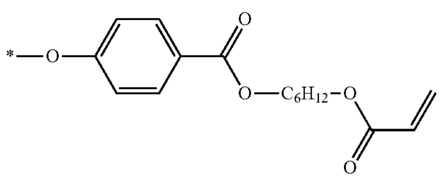
(A19-4)
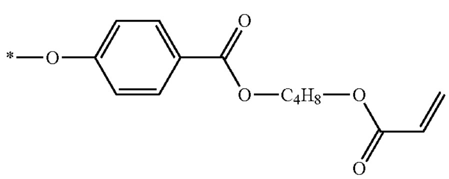
(A19-5)
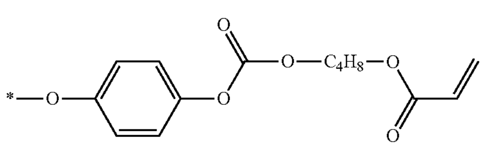
(A19-6)
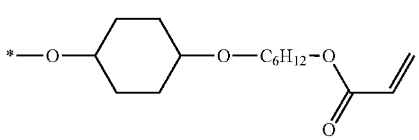
(A19-7)
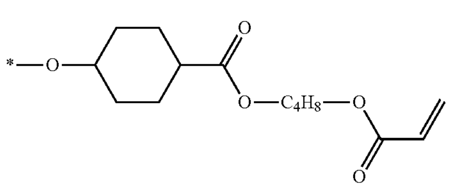
-continued
(A19-8)
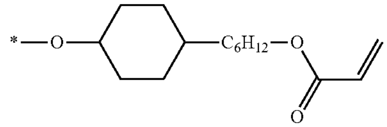
[Chemical Formula 154]
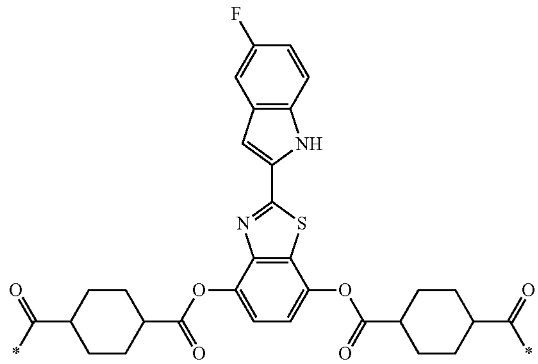
(A20-1)
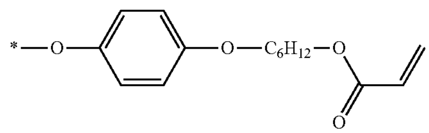
(A20-2)
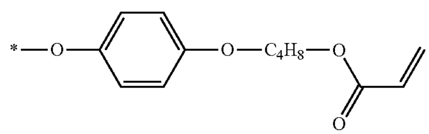
(A20-3)
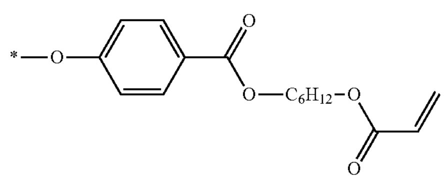
(A20-4)
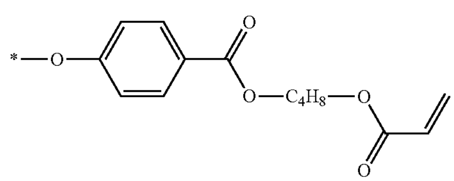
(A20-5)
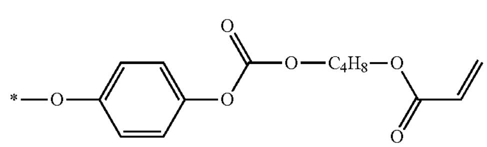
(A20-6)
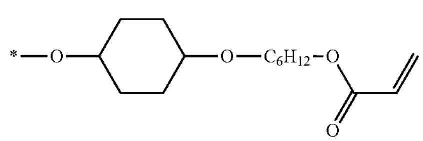

-continued
(A20-7)
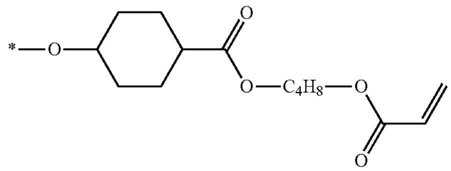
(A20-8)
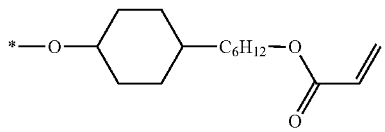
[Chemical Formula 155]
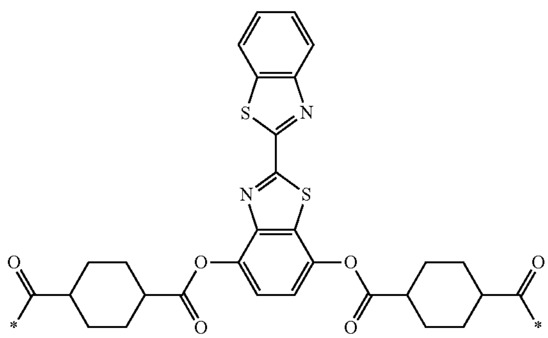
(A21-1)
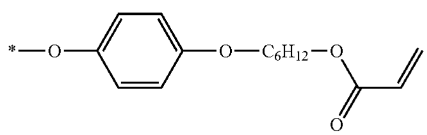
(A21-2)
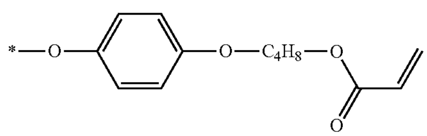
(A21-3)
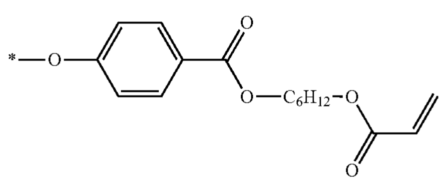
(A21-4)
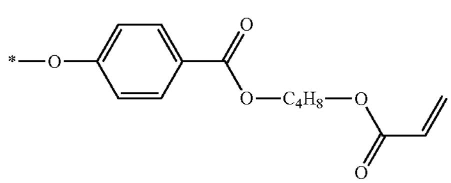
(A21-5)
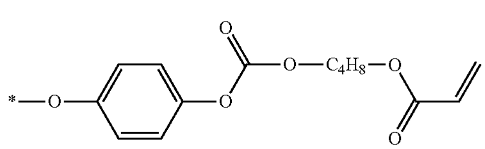
(A21-6)
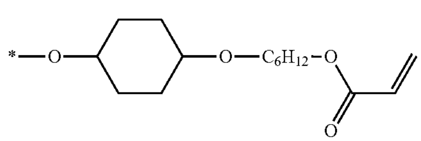
-continued
(A21-7)
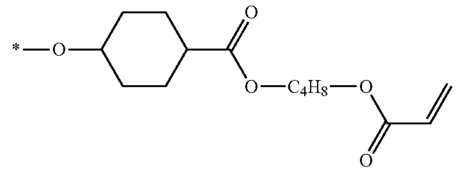
(A21-8)
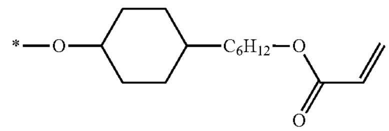
[Chemical Formula 156]
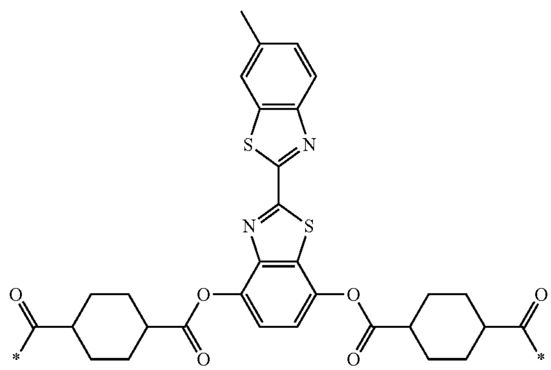
(A22-1)
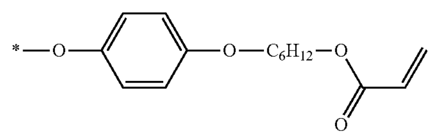
(A22-2)
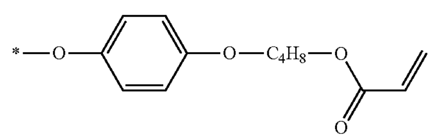
(A22-3)
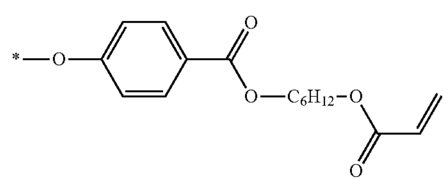
(A22-4)
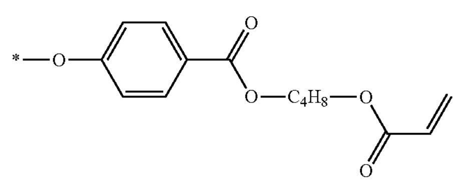
(A22-5)
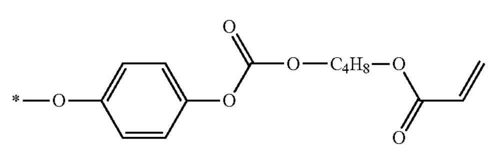

-continued
(A22-6)
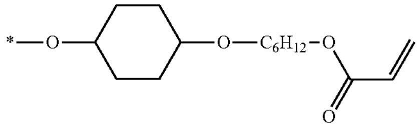
(A22-7)
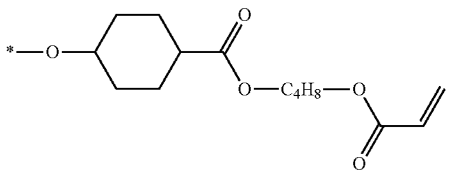
(A22-8)
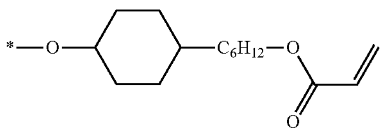
[Chemical Formula 157]
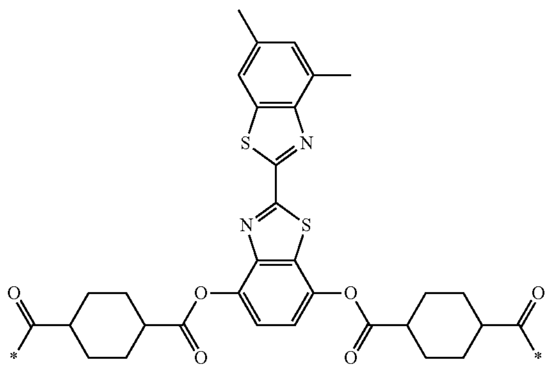
(A23-1)
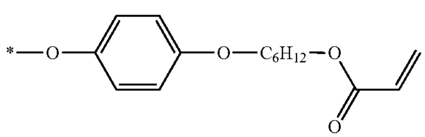
(A23-2)
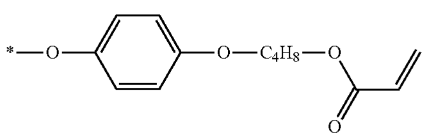
(A23-3)
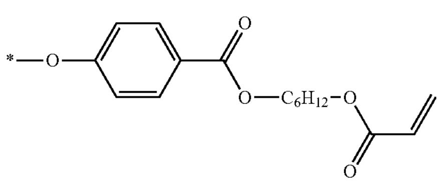
(A23-4)
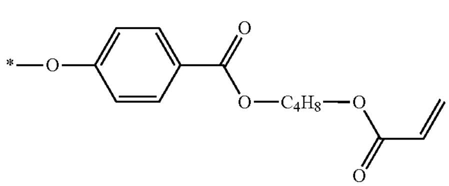
-continued
(A23-5)
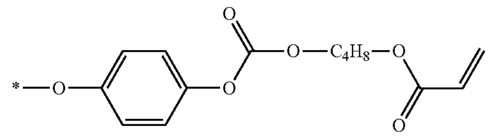
(A23-6)
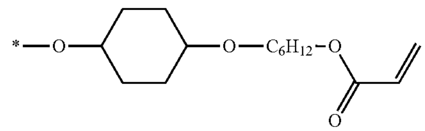
(A23-7)
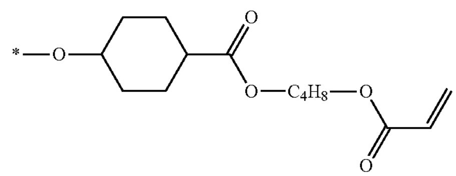
(A23-8)
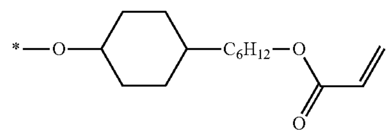
[Chemical Formula 158]
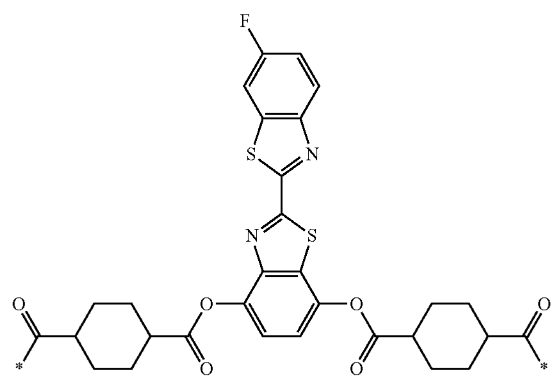
(A24-1)
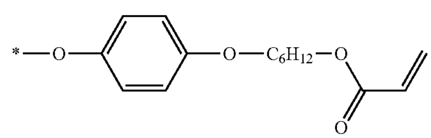
(A24-2)
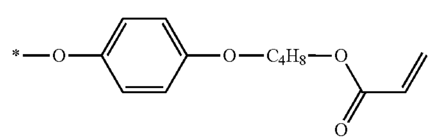
(A24-3)
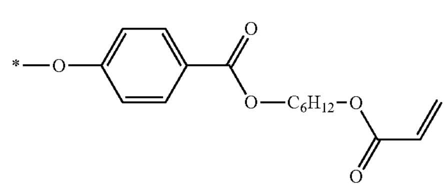

-continued
(A24-4)
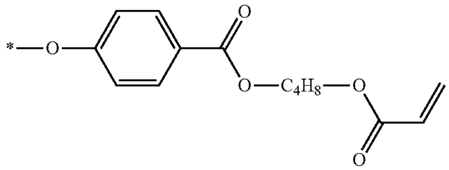
(A24-5)
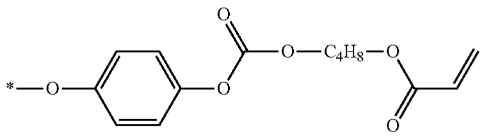
(A24-6)
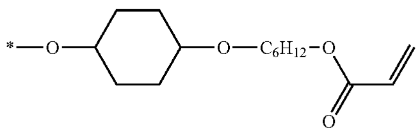
(A24-7)
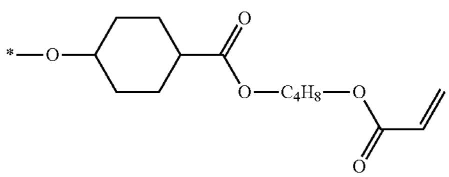
(A24-8)
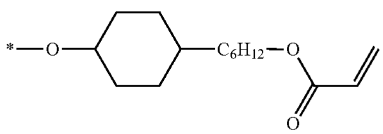
[Chemical Formula 159]
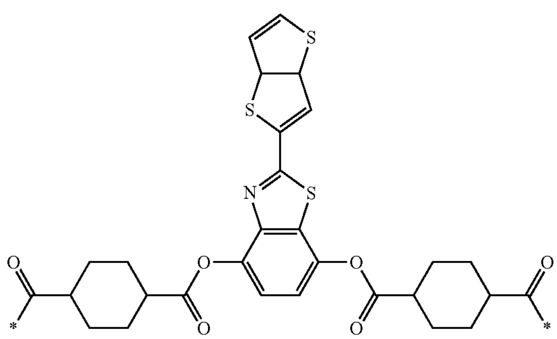
(A25-1)
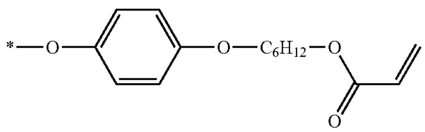
(A25-2)
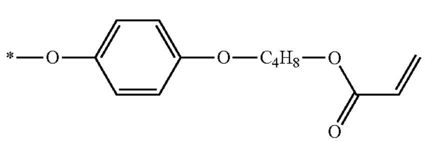
(A25-3)
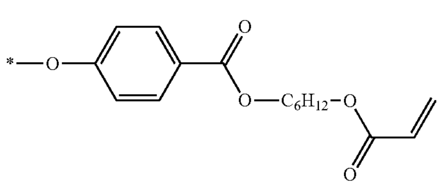
-continued
(A25-4)
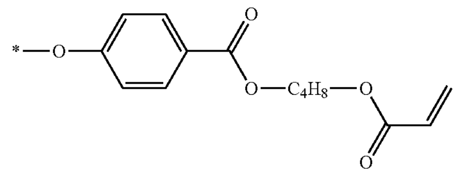
(A25-5)
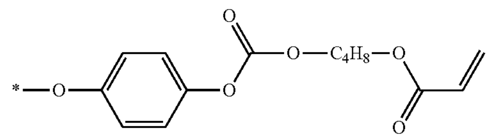
(A25-6)
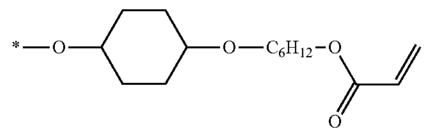
(A25-7)
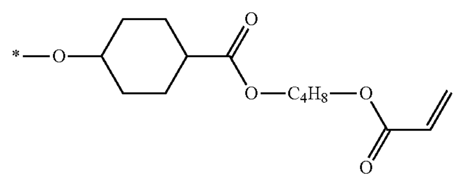
(A25-8)
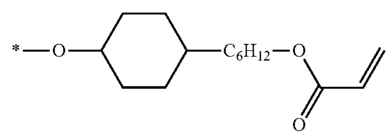
[Chemical Formula 160]
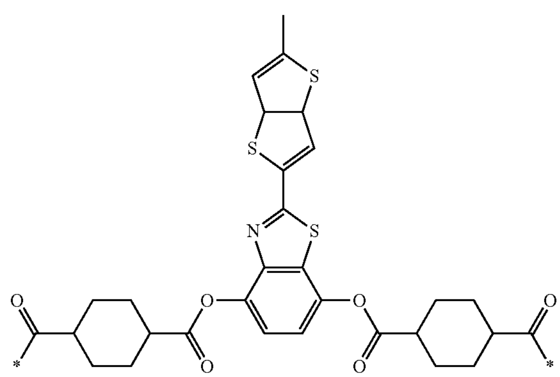
(A26-1)
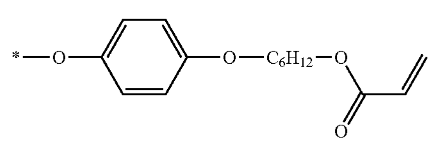
(A26-2)
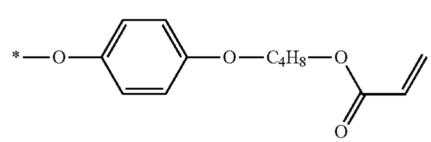

-continued
(A26-3)
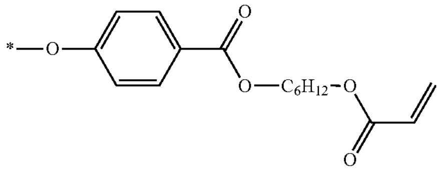
(A26-4)
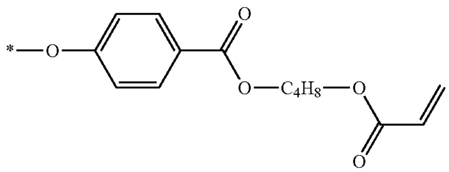
(A26-5)
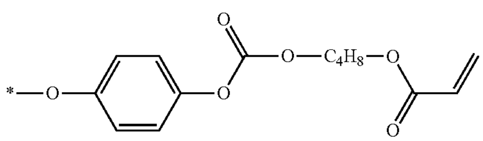
(A26-6)
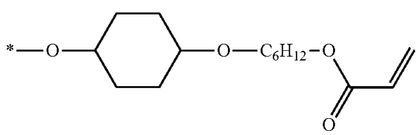
(A26-7)
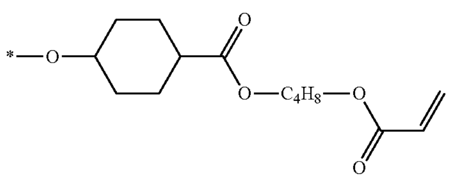
(A26-8)
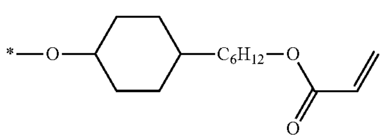
[Chemical Formula 161]
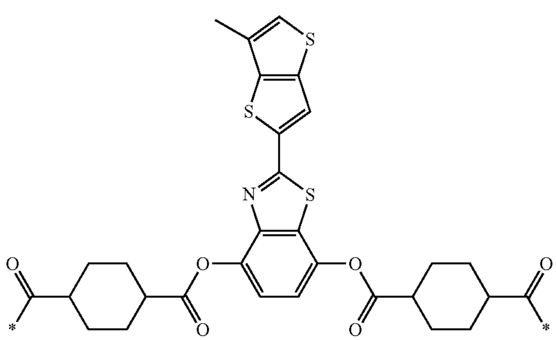
(A27-1)
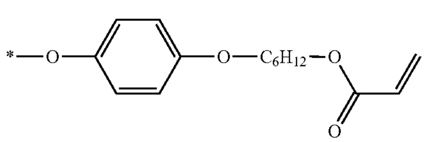
(A27-2)
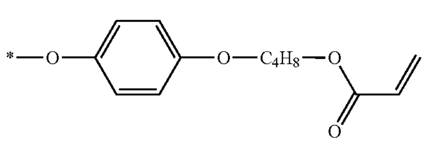
-continued
(A27-3)
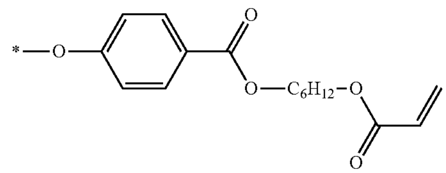
(A27-4)
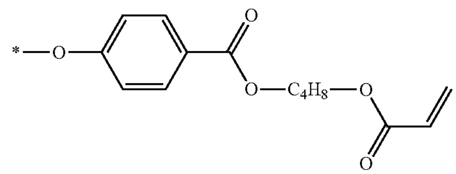
(A27-5)
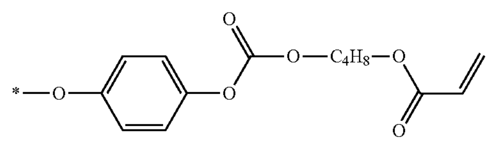
(A27-6)
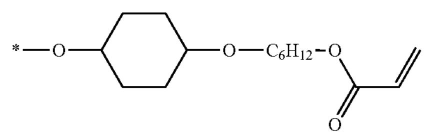
(A27-7)
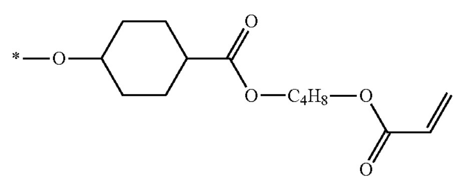
(A27-8)
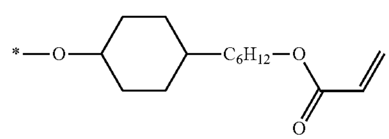
[Chemical Formula 162]
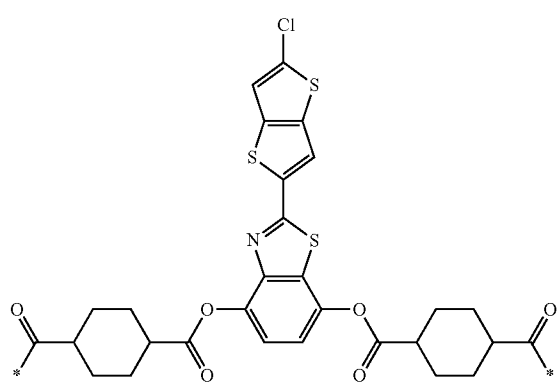
(A28-1)
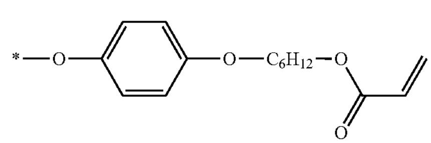

-continued
(A28-2)
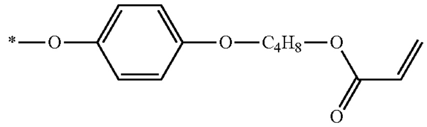
(A28-3)
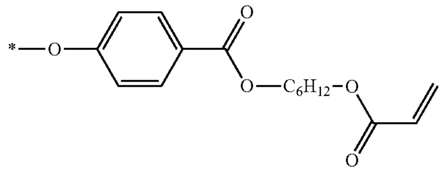
(A28-4)
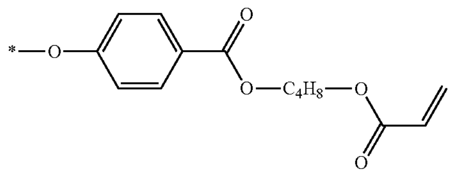
(A28-5)
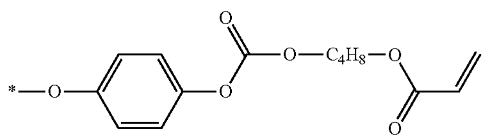
(A28-6)
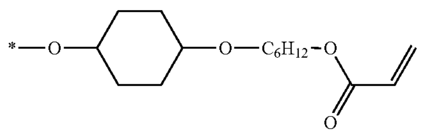
(A28-7)
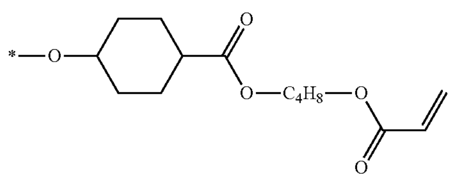
(A28-8)
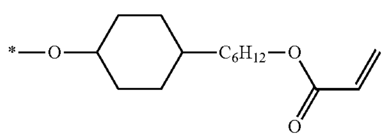
[Chemical Formula 163]
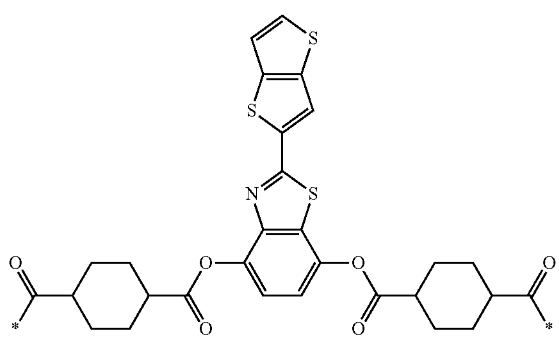
(A29-1)
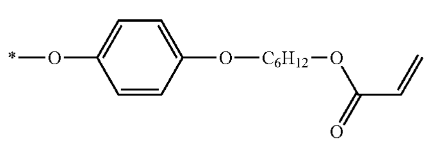
-continued
(A29-2)
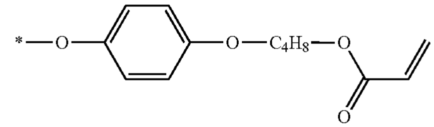
(A29-3)
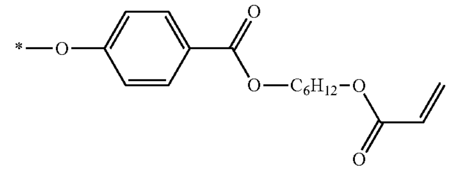
(A29-4)
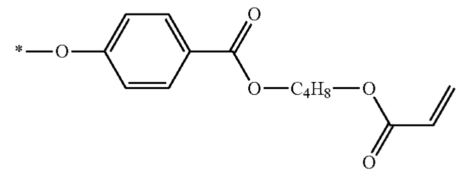
(A29-5)
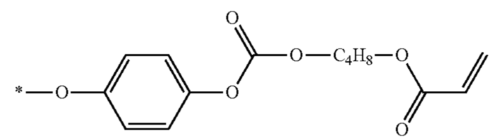
(A29-6)
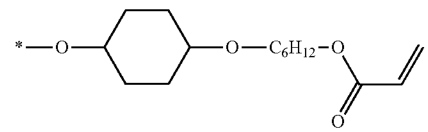
(A29-7)
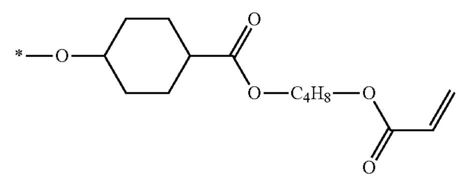
(A29-8)
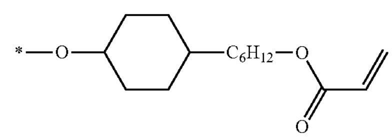
[Chemical Formula 164]
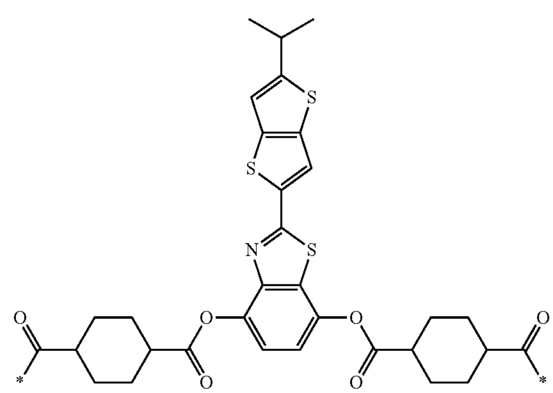

-continued
(A30-1)
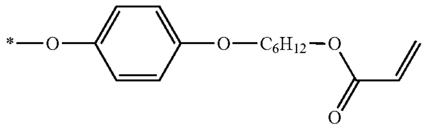
(A30-2)
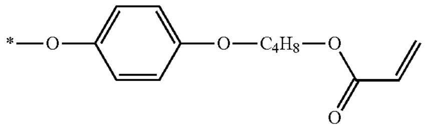
(A30-3)
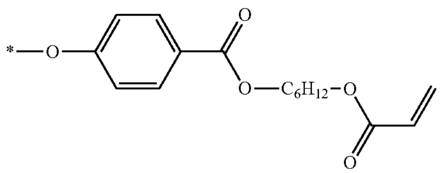
(A30-4)
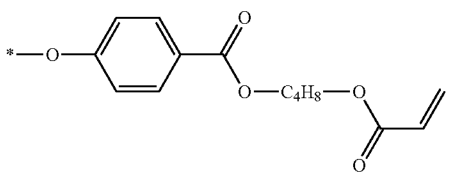
(A30-5)
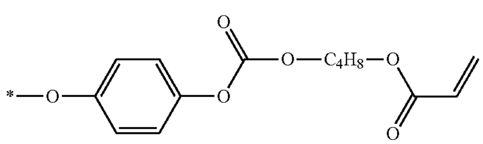
(A30-6)
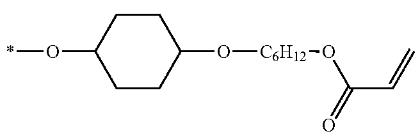
(A30-7)
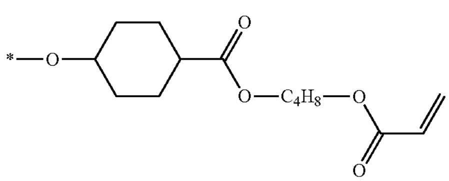
(A30-8)
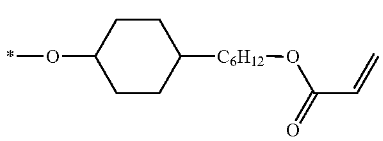
-continued
[Chemical Formula 165]
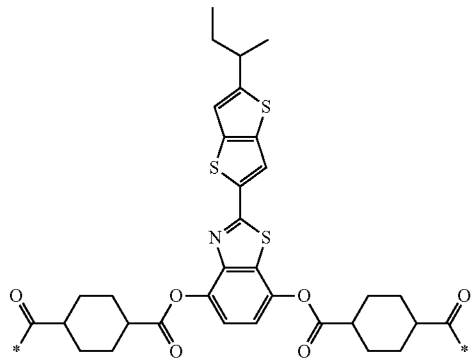
(A31-1)
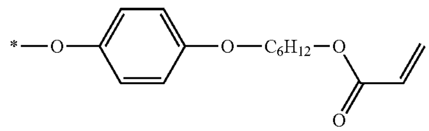
(A31-2)
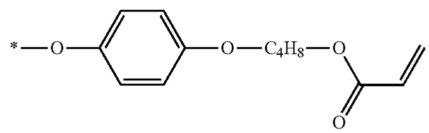
(A31-3)
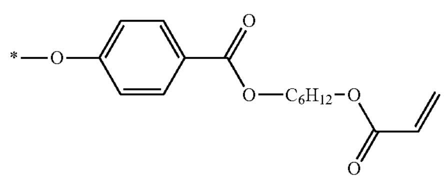
(A31-4)
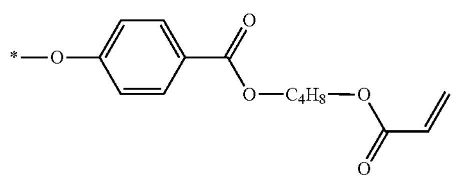
(A31-5)
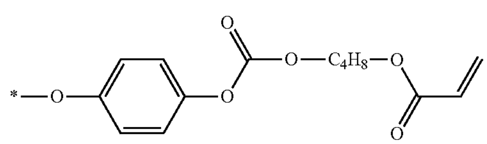
(A31-6)
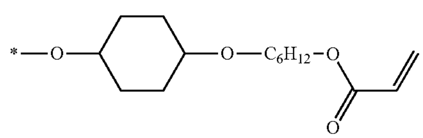
(A31-7)
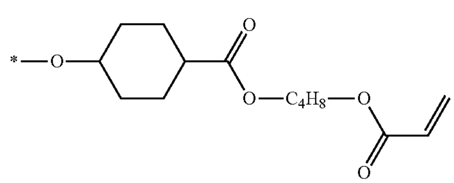

-continued
(A31-8)
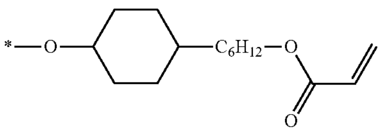
[Chemical Formula 166]
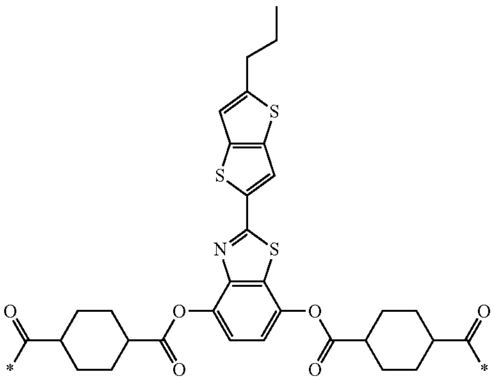
(A32-1)
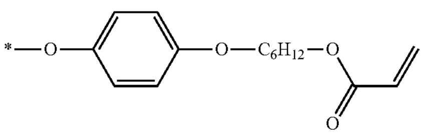
(A32-2)
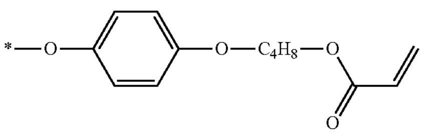
(A32-3)
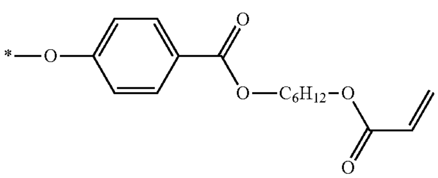
(A32-4)
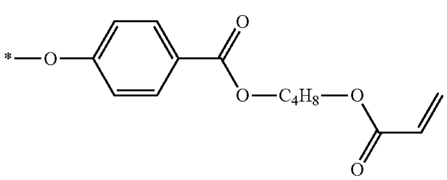
(A32-5)
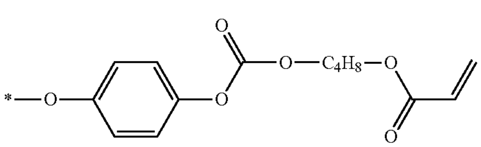
(A32-6)
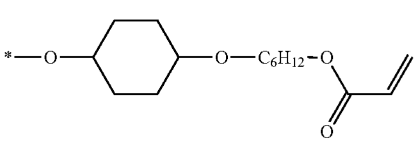
-continued
(A32-7)
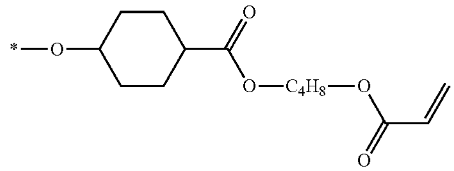
(A32-8)
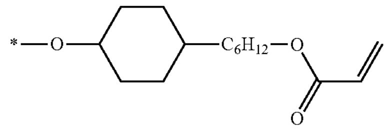
[Chemical Formula 167]
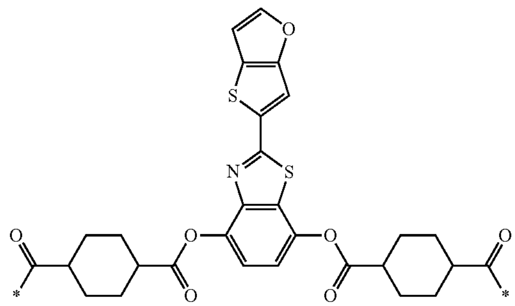
(A33-1)
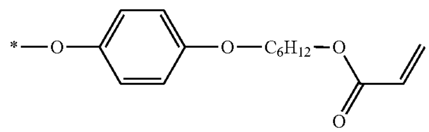
(A33-2)
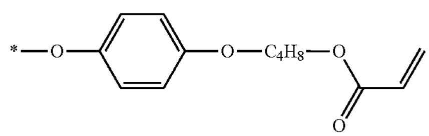
(A33-3)
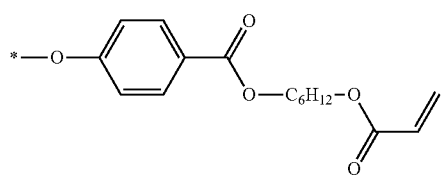
(A33-4)
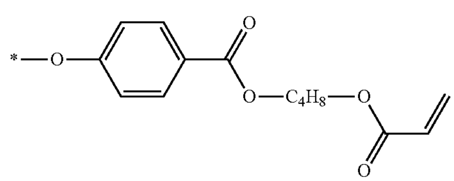
(A33-5)
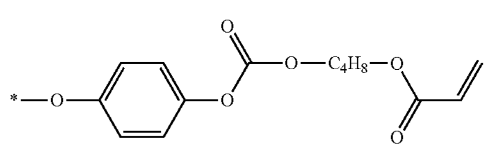
(A33-6)
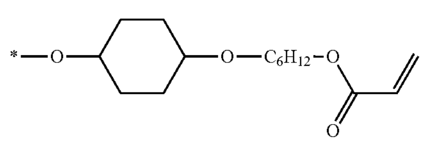

-continued
(A33-7)
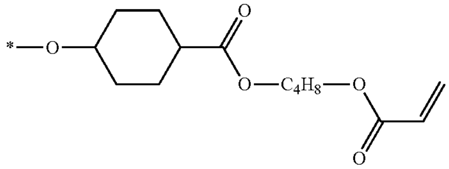
(A33-8)
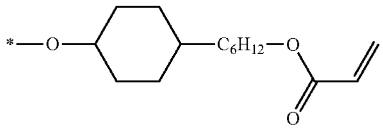
[Chemical Formula 168]
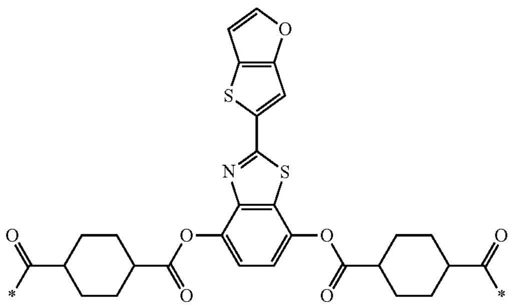
(A34-1)
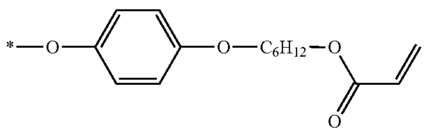
(A34-2)
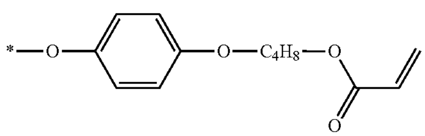
(A34-3)
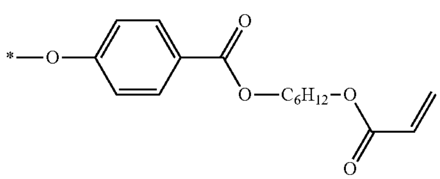
(A34-4)
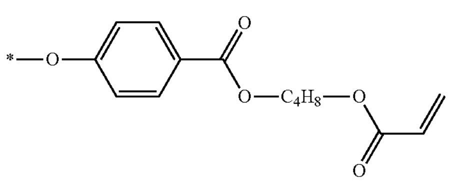
(A34-5)
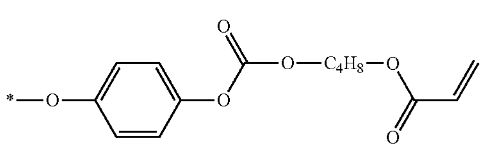
(A34-6)
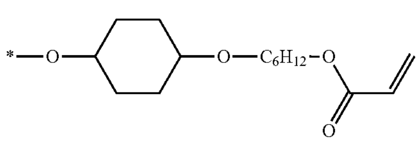
-continued
(A34-7)
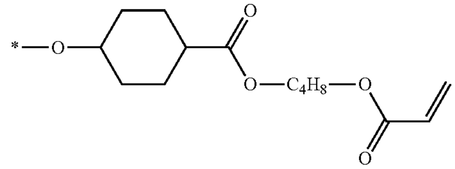
(A34-8)
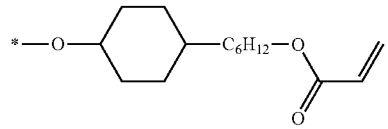
[Chemical Formula 169]
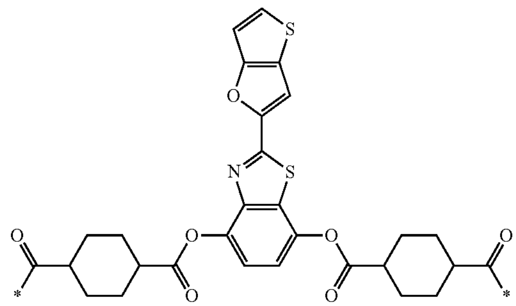
(A35-1)
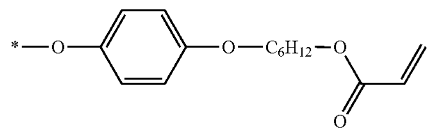
(A35-2)
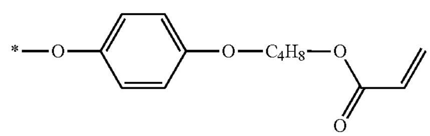
(A35-3)
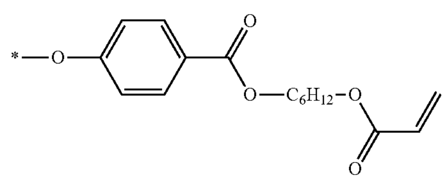
(A35-4)
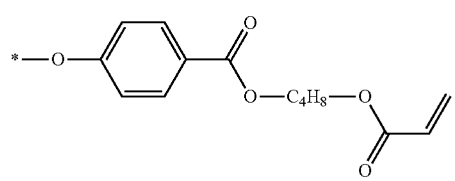
(A35-5)
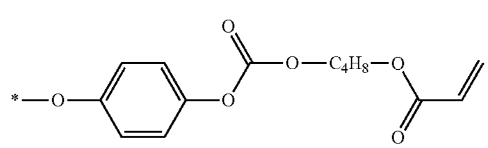
(A35-6)
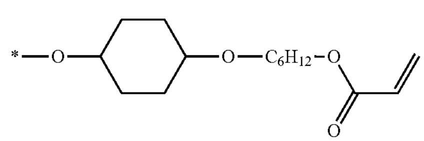

-continued
(A35-7)
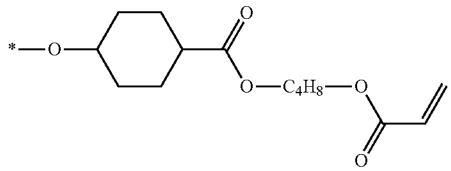
(A35-8)
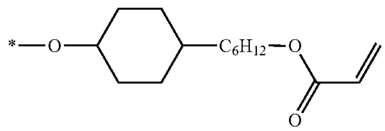
[Chemical Formula 170]
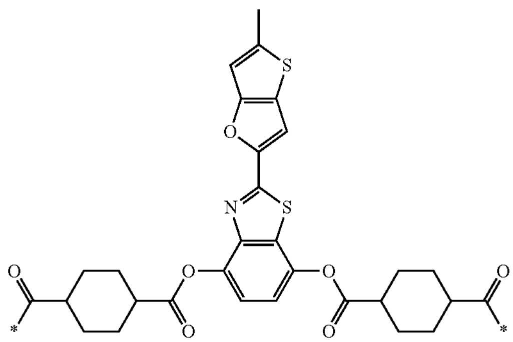
(A36-1)
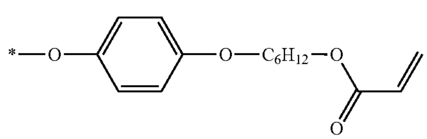
(A36-2)
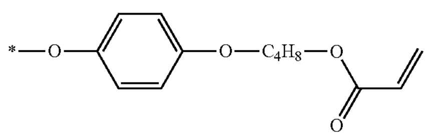
(A36-3)
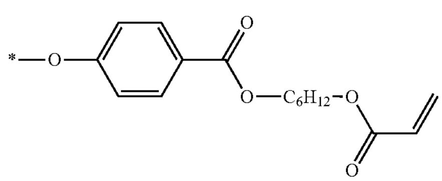
(A36-4)
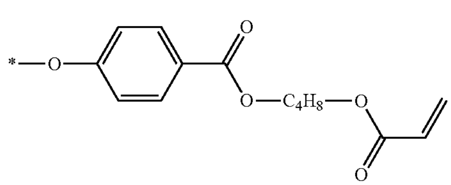
(A36-5)
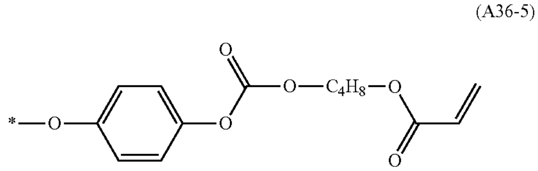
(A36-6)
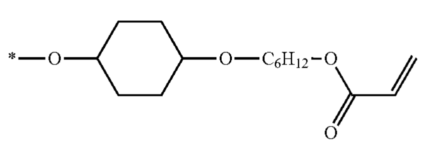
-continued
(A36-7)
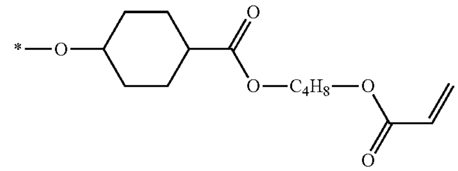
(A36-8)
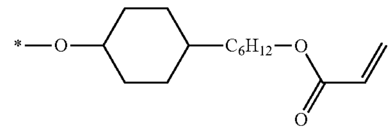
[Chemical Formula 171]
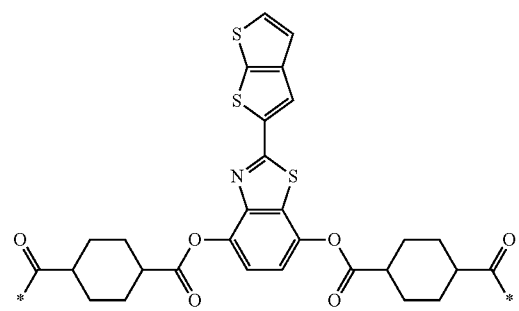
(A37-1)
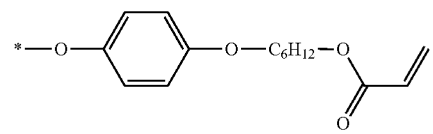
(A37-2)
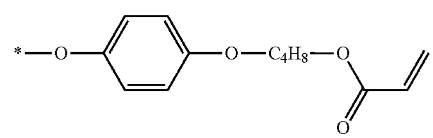
(A37-3)
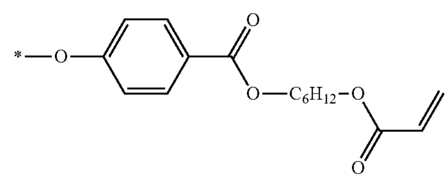
(A37-4)
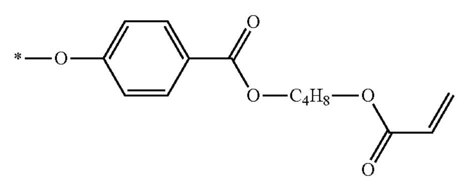
(A37-5)
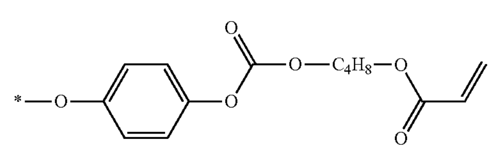
(A37-6)
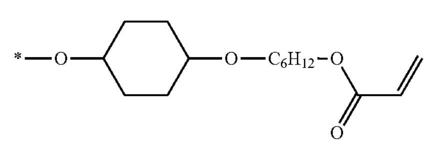

-continued
(A37-7)
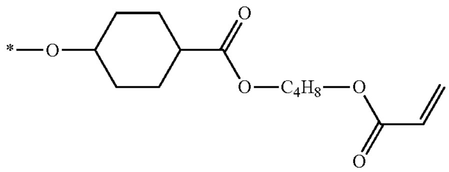
(A37-8)
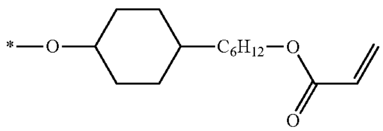
[Chemical Formula 172]
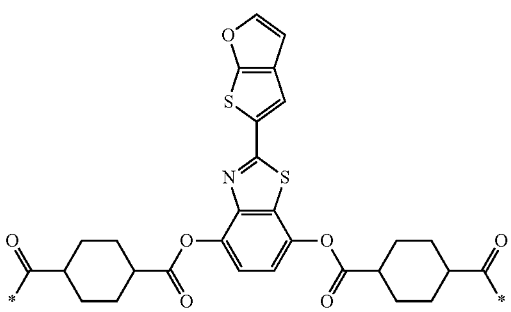
(A38-1)
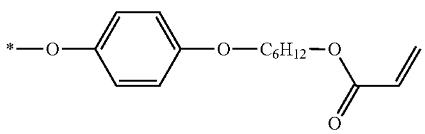
(A38-2)
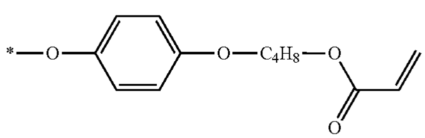
(A38-3)
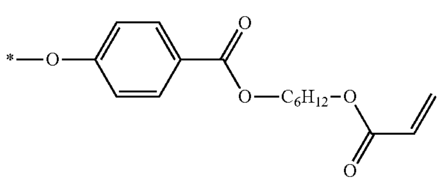
(A38-4)
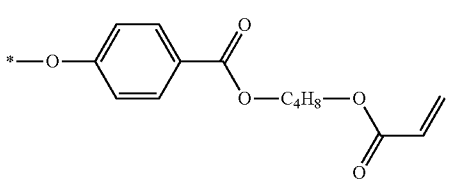
(A38-5)
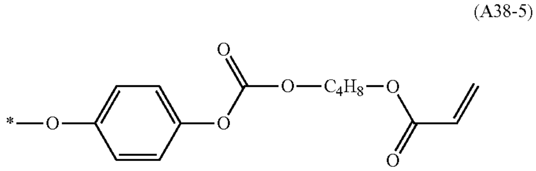
(A38-6)
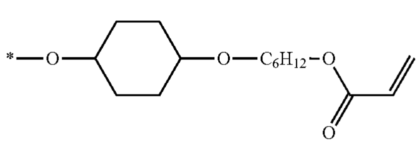
-continued
(A38-7)
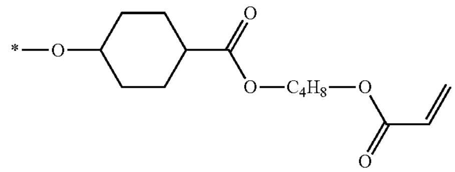
(A38-8)
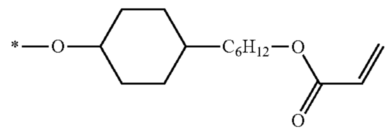
[Chemical Formula 173]
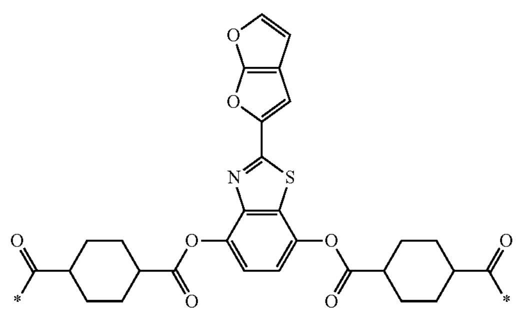
(A39-1)
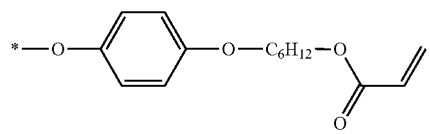
(A39-2)
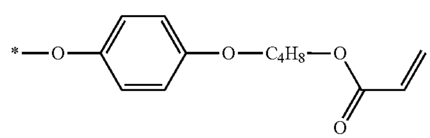
(A39-3)
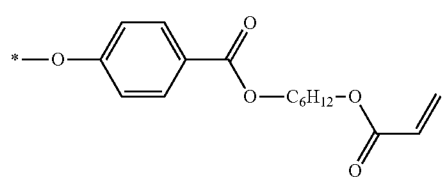
(A39-4)
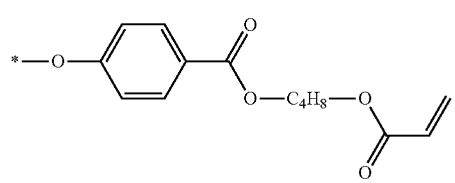
(A39-5)
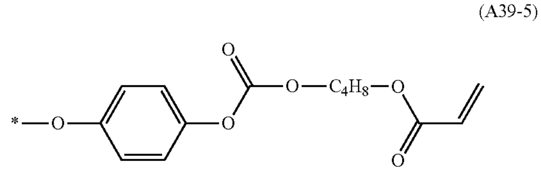
(A39-6)
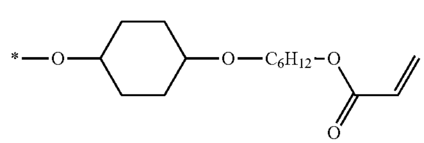

-continued
(A39-7)
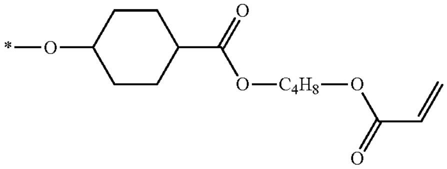
(A39-8)
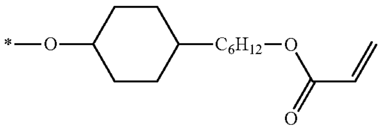
[Chemical Formula 174]
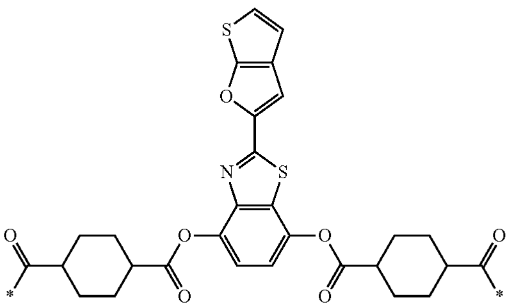
(A40-1)
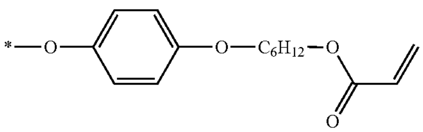
(A40-2)
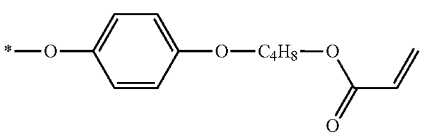
(A40-3)
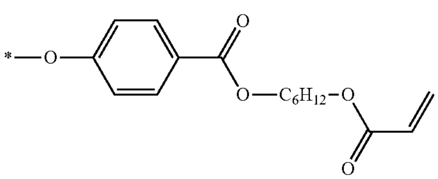
(A40-4)
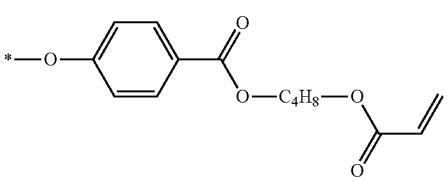
(A40-5)
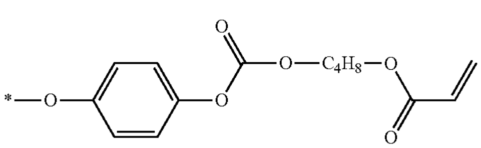
(A40-6)
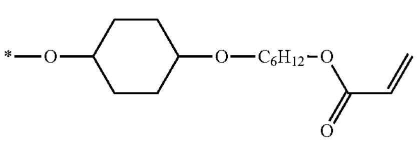
-continued
(A40-7)
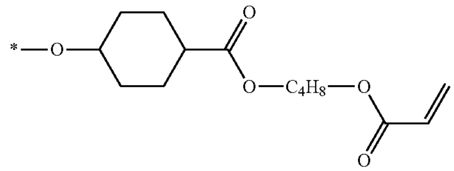
(A40-8)
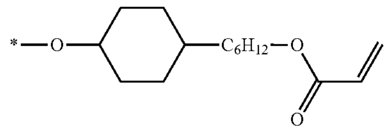
[Chemical Formula 175]
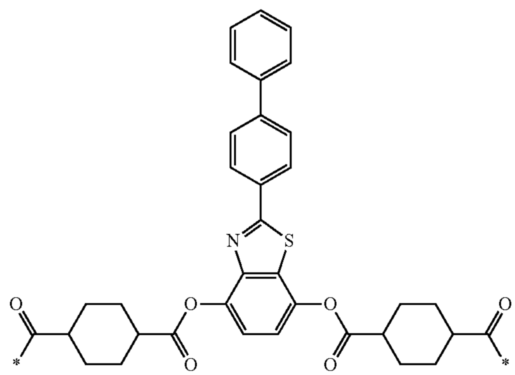
(A41-1)
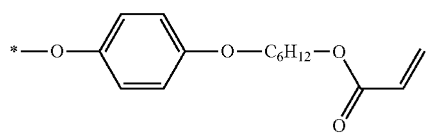
(A41-2)
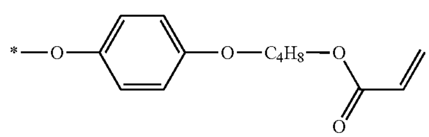
(A41-3)
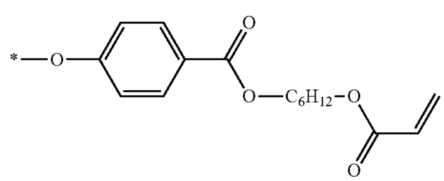
(A41-4)
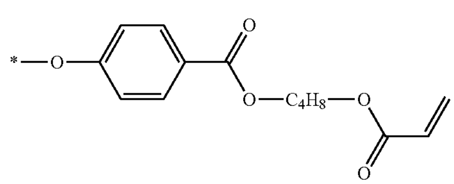
(A41-5)
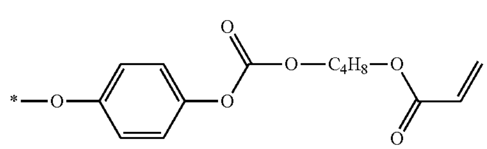

-continued
(A41-6)
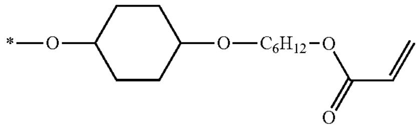
(A41-7)
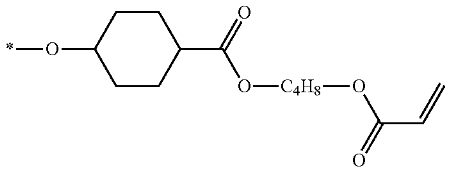
(A41-8)
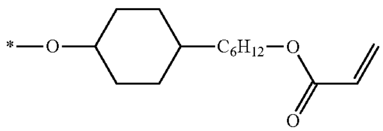
[Chemical Formula 176]
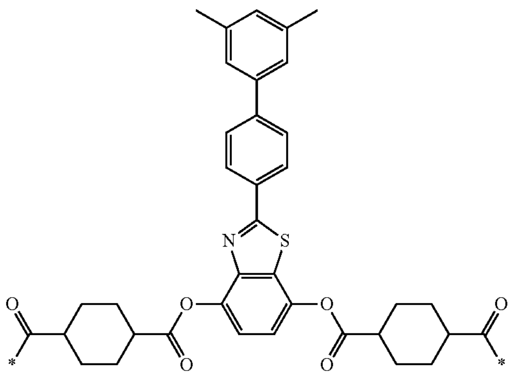
(A42-1)
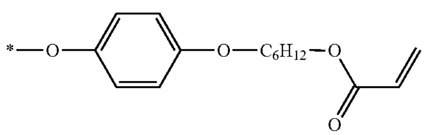
(A422)
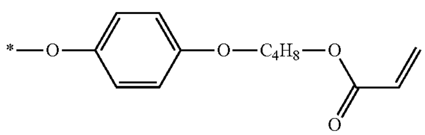
(A41-3)
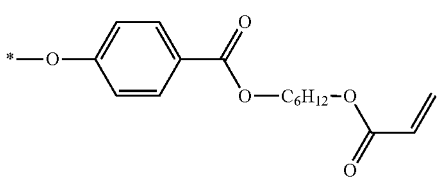
(A42-4)
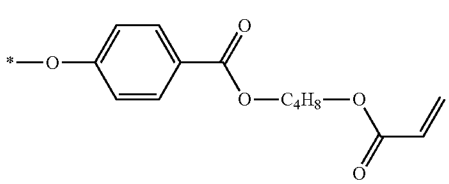
-continued
(A42-5)
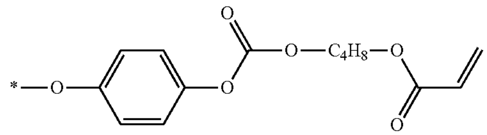
(A42-6)
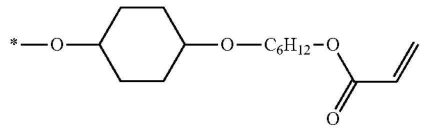
(A42-7)
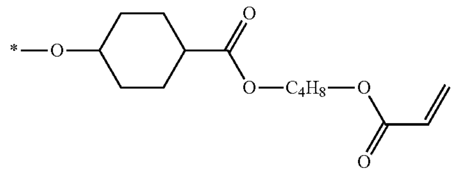
(A42-8)
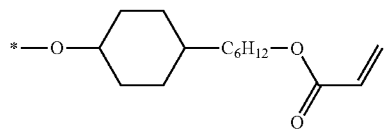
[Chemical Formula 177]
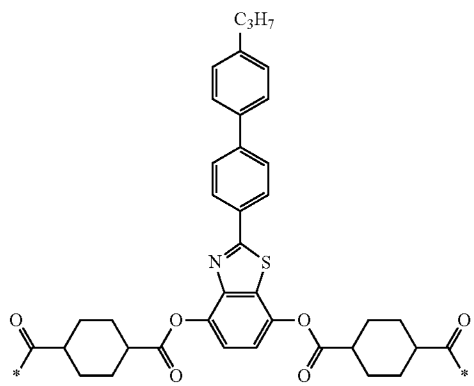
(A43-1)
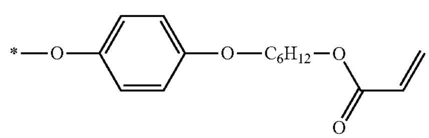
(A43-2)
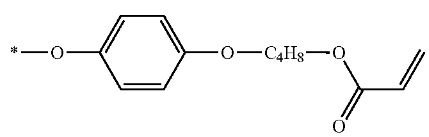
(A43-3)
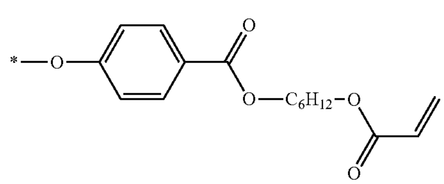

-continued
(A43-4)
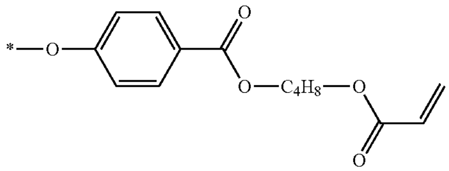
(A43-5)
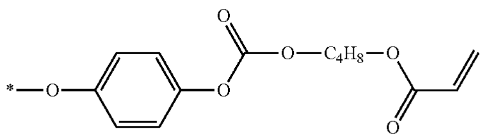
(A43-6)
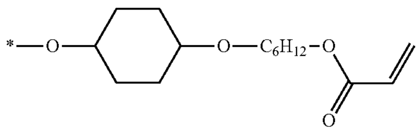
(A43-7)
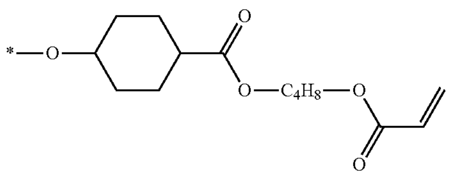
(A43-8)
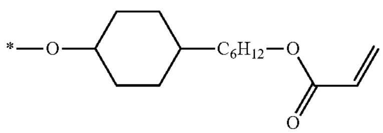
[Chemical Formula 178]
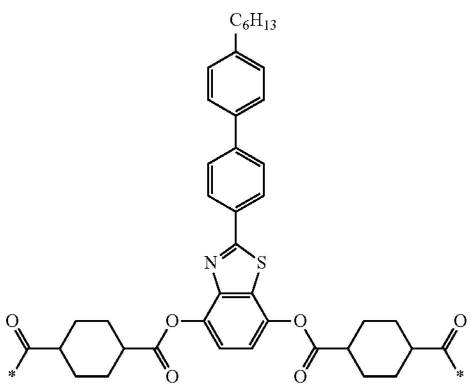
(A44-1)
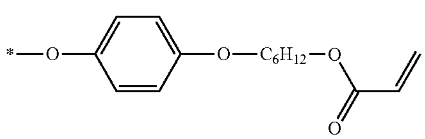
(A44-2)
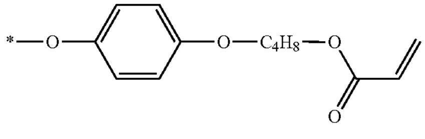
-continued
(A44-3)
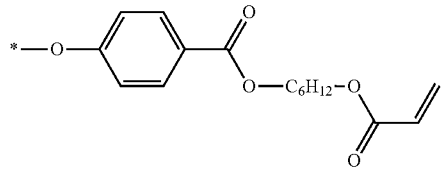
(A44-4)
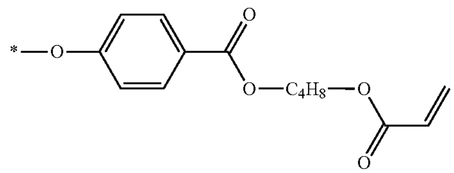
(A44-5)
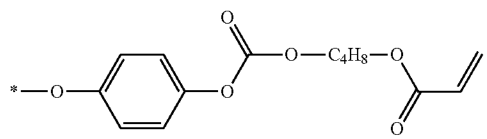
(A44-6)
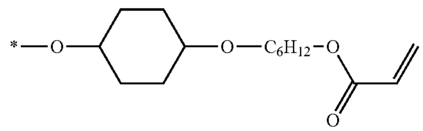
(A44-7)
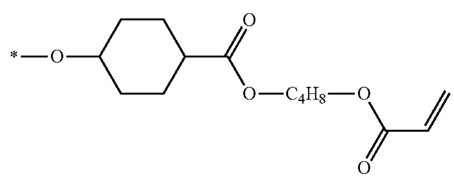
(A44-8)
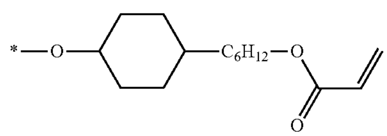
[Chemical Formula 179]
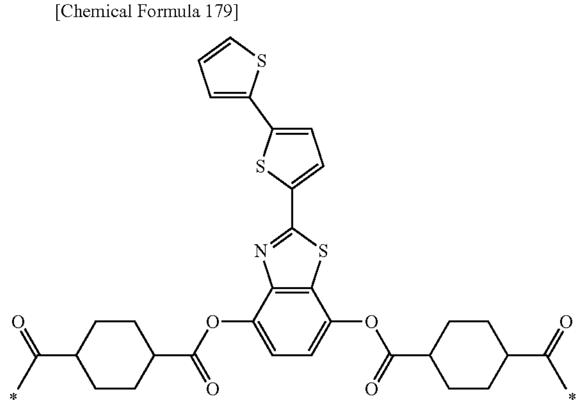
(A45-1)
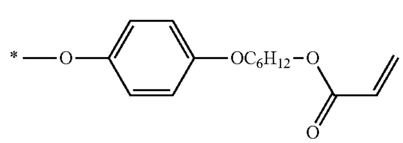

-continued
(A45-2)
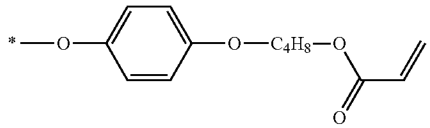
(A45-3)
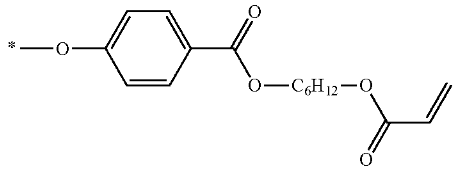
(A45-4)
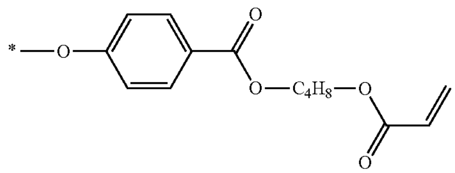
(A45-5)
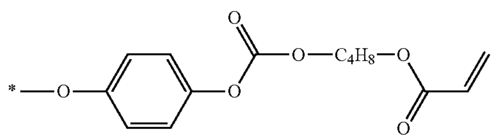
(A45-6)
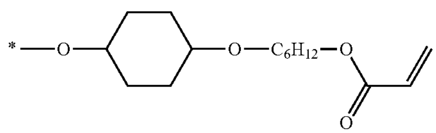
(A45-7)
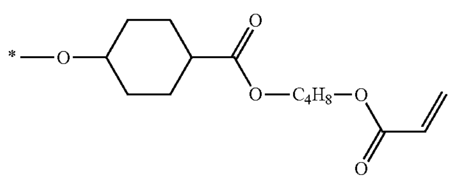
(A45-8)
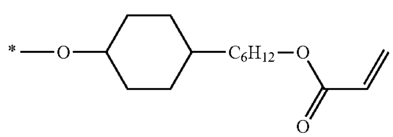
[Chemical Formula 180]
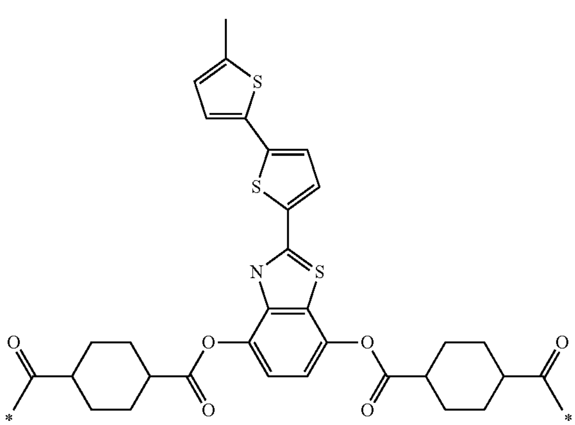
-continued
(A46-1)
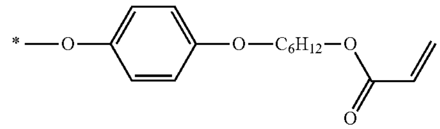
(A46-2)
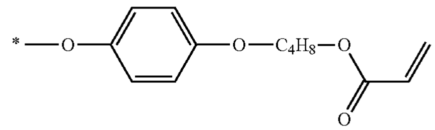
(A46-3)
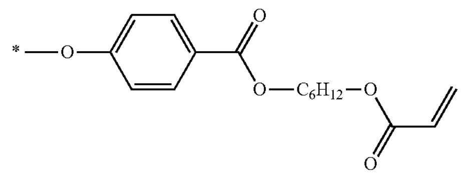
(A46-4)
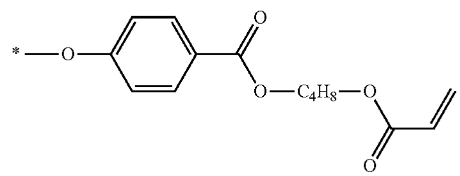
(A46-5)
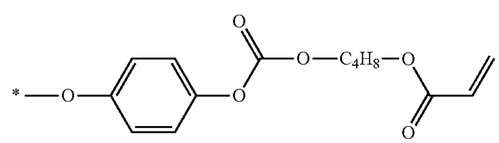
(A46-6)
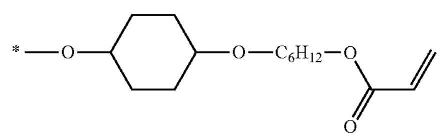
(A46-7)
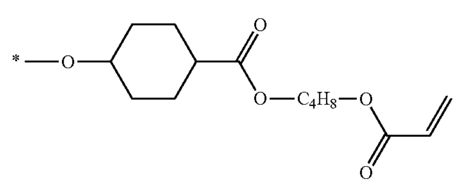
(A46-8)
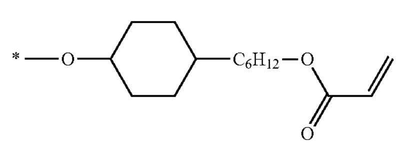

-continued
[Chemical Formula 181]
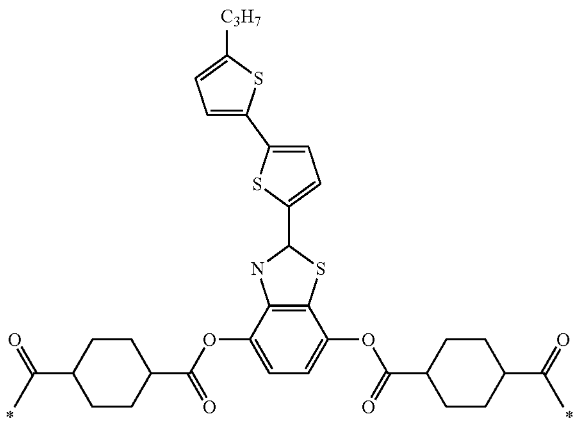
(A47-1)
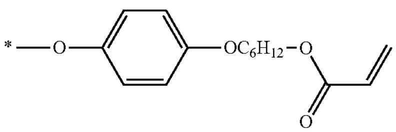
(A47-2)
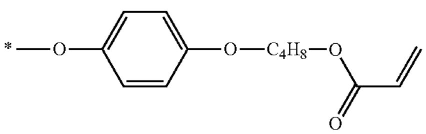
(A47-3)
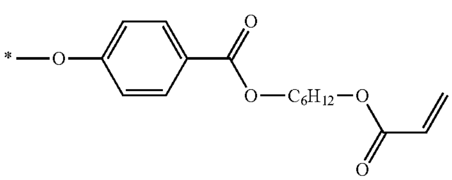
(A47-4)
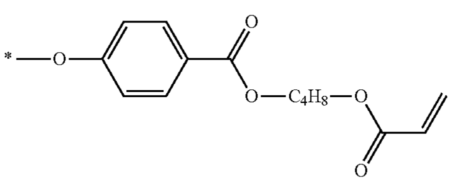
(A47-5)
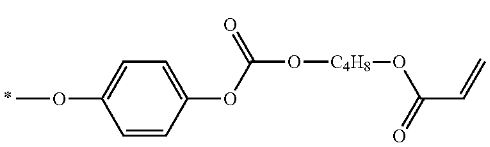
(A47-6)
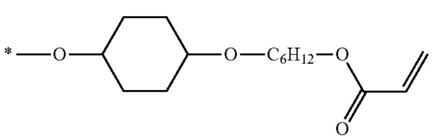
(A47-7)
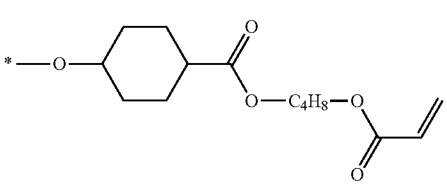
-continued
(A47-8)
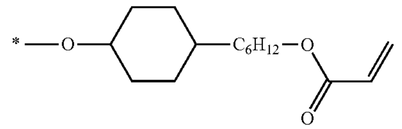
[Chemical Formula 182]
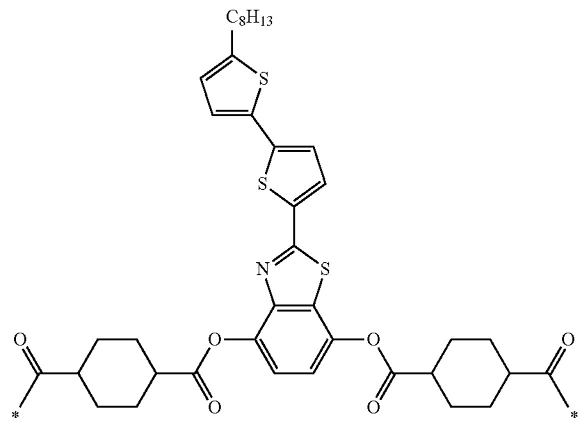
(A48-1)
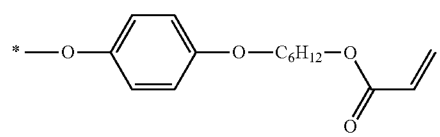
(A48-2)
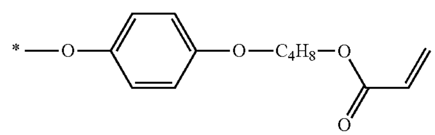
(A48-3)
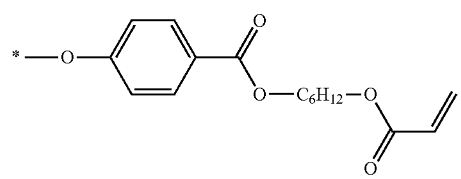
(A48-4)
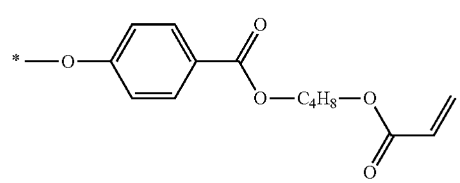
(A48-5)
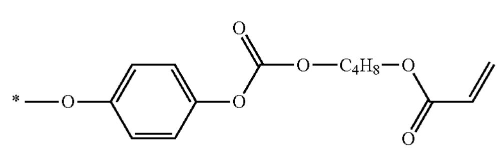
(A48-6)
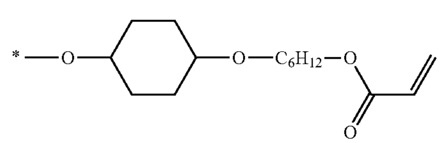

-continued
(A48-7)
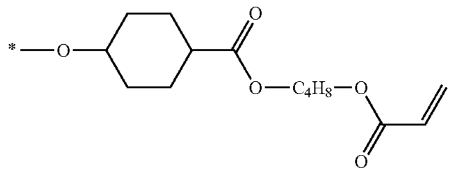
(A48-8)
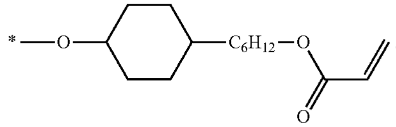
[Chemical Formula 183]
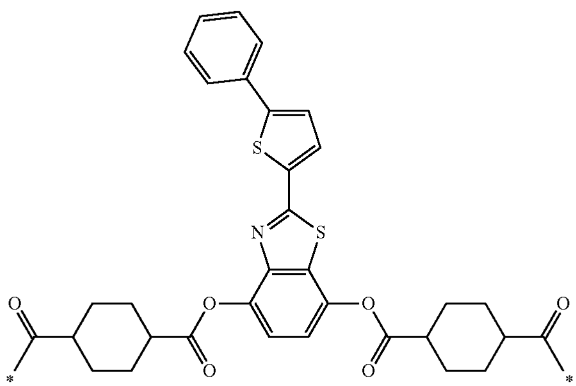
(A49-1)
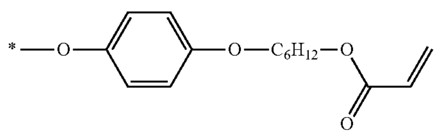
(A49-2)
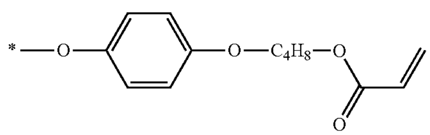
(A49-3)
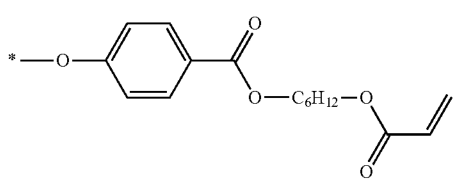
(A49-4)
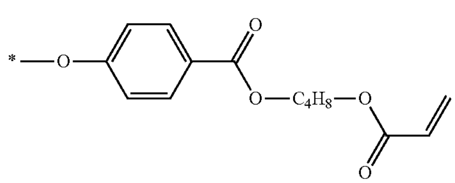
(A49-5)
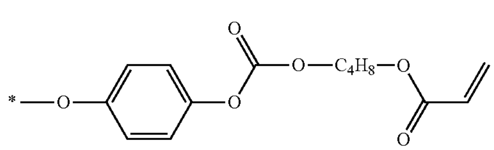
-continued
(A49-6)
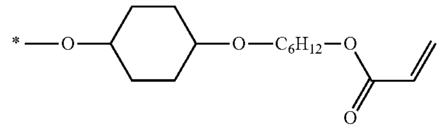
(A49-7)
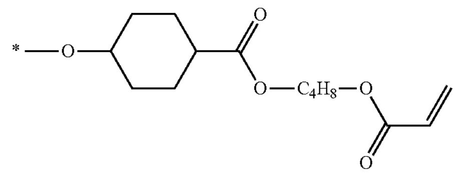
(A49-8)
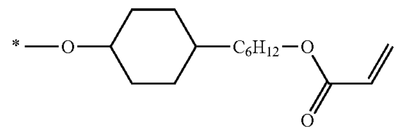
[Chemical Formula 184]
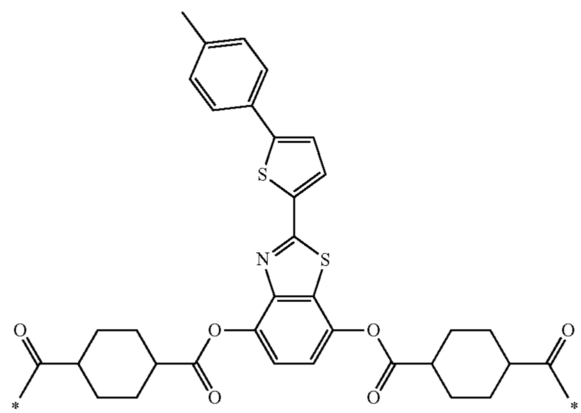
(A50-1)
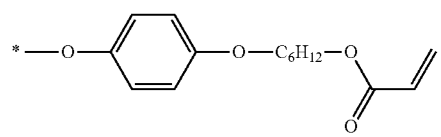
(A50-2)
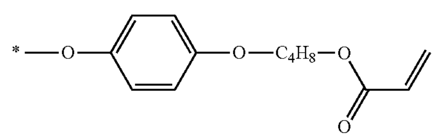
(A50-3)
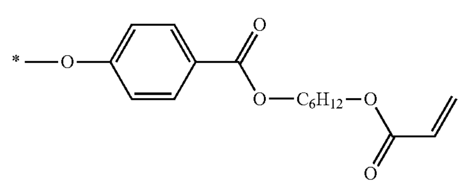
(A50-4)
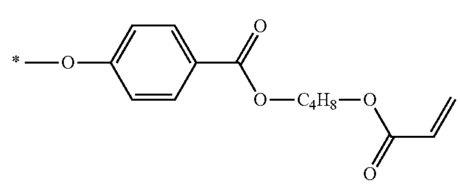

-continued
(A50-5)
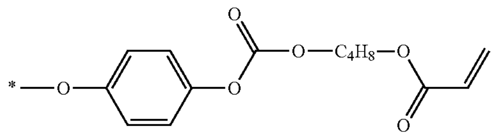
(A50-6)
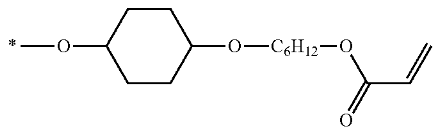
(A50-7)
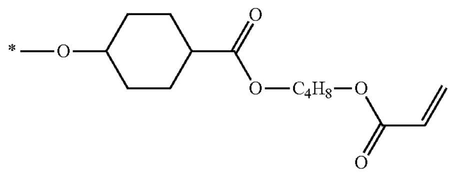
(A50-8)
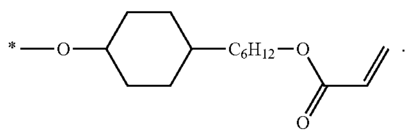
[Chemical Formula 185]
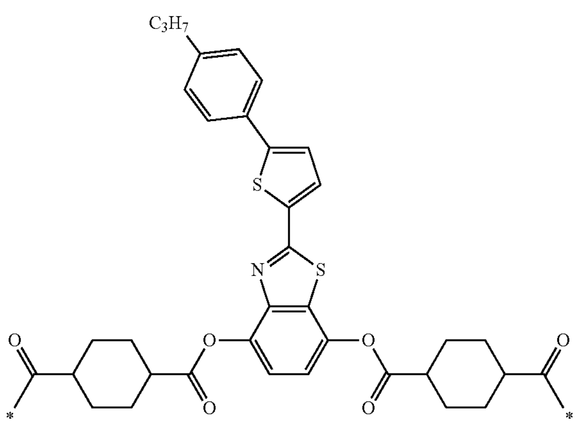
(A51-1)
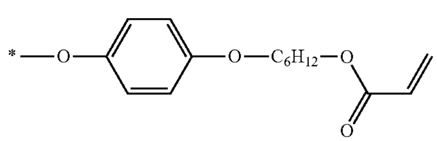
(A51-2)
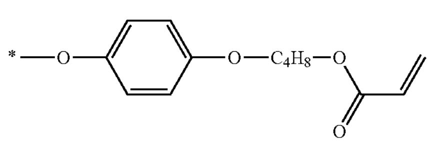
(A51-3)
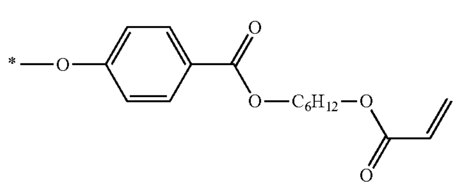
-continued
(A51-4)
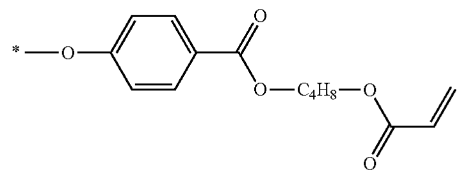
(A51-5)
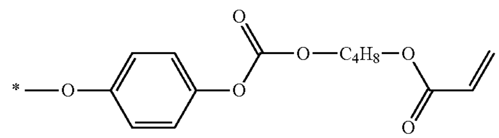
(A51-6)
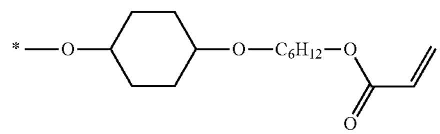
(A51-7)
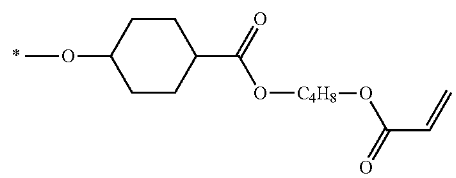
(A51-8)
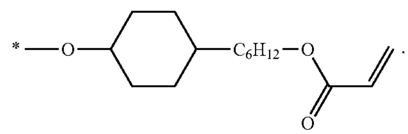
[Chemical Formula 186]
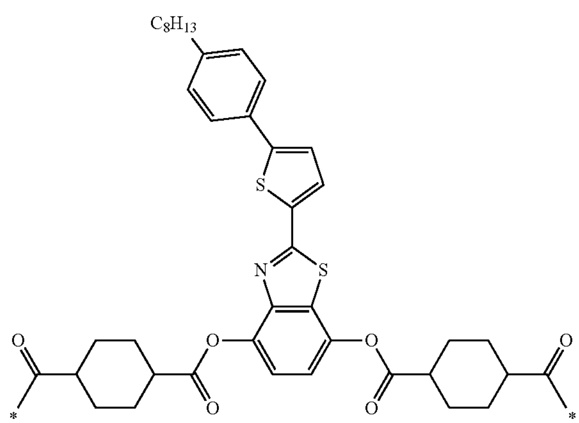
(A52-1)
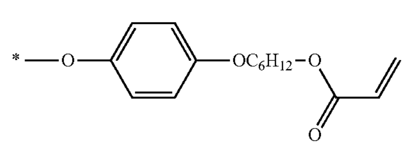
(A52-2)
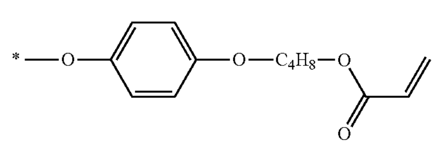

-continued
(A52-3)
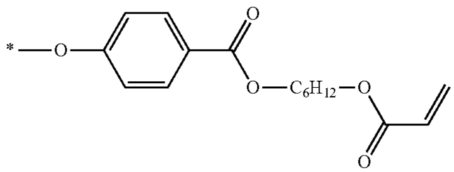
(A52-4)
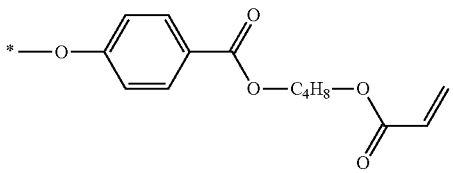
(A52-5)
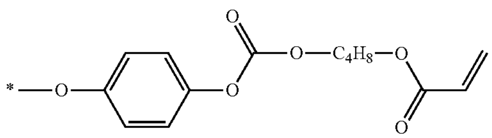
(A52-6)
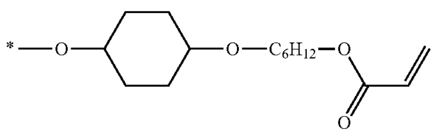
(A52-7)
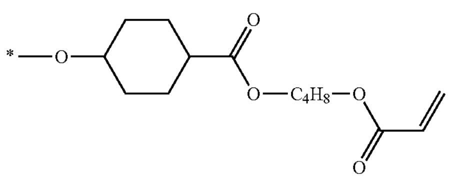
(A52-8)
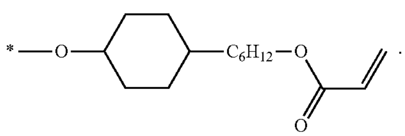
[Chemical Formula 187]
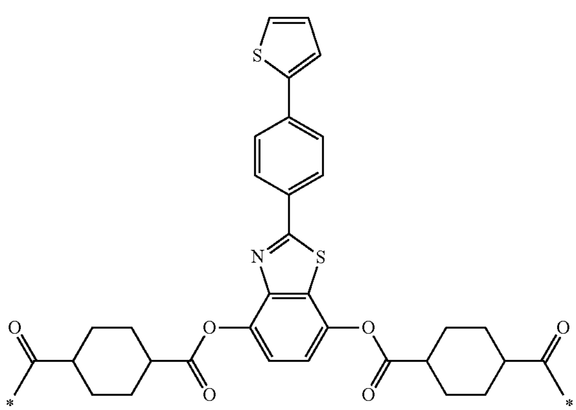
(A53-1)
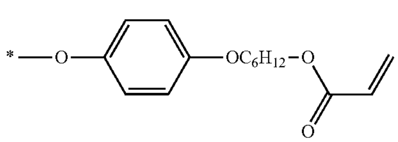
-continued
(A53-2)
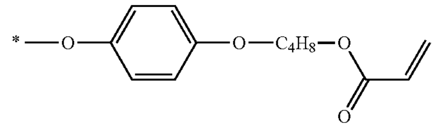
(A53-3)
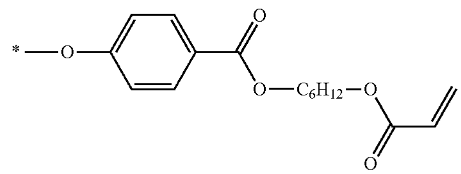
(A53-4)
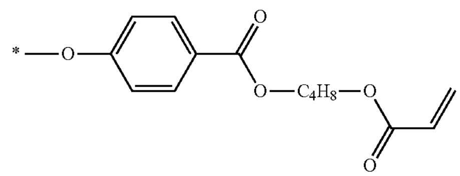
(A53-5)
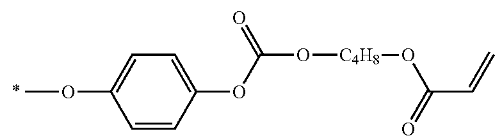
(A53-6)
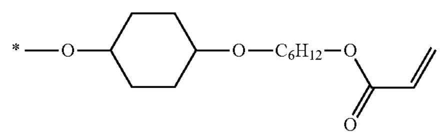
(A53-7)
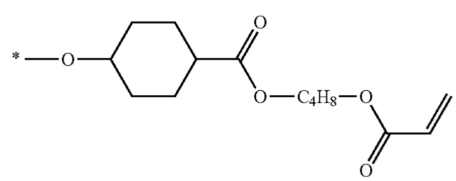
(A53-8)
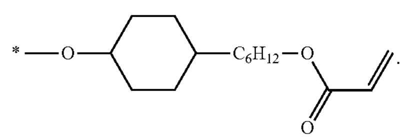
[Chemical Formula 188]
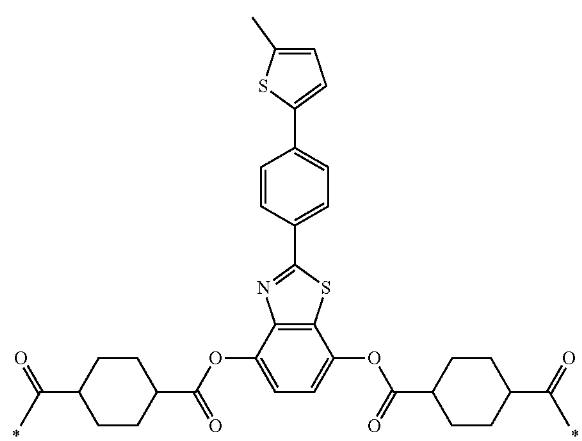

-continued
(A54-1)
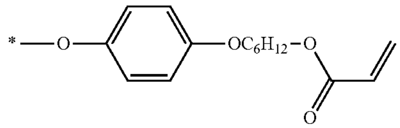
(A54-2)
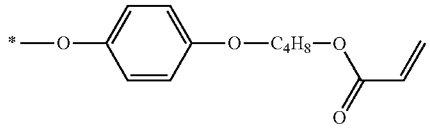
(A54-3)
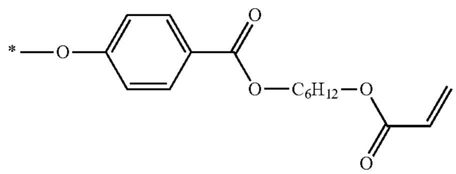
(A54-4)
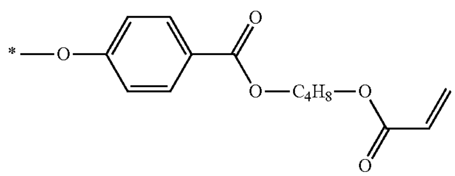
(A54-5)
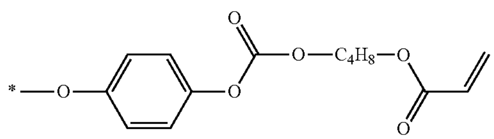
(A54-6)
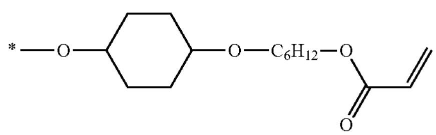
(A54-7)
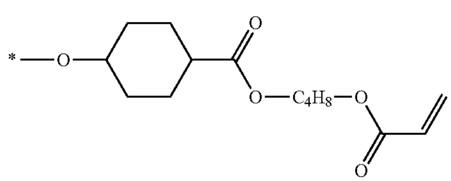
(A54-8)
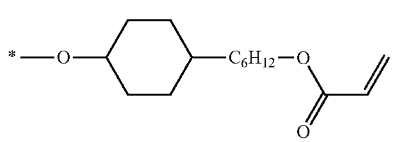
-continued
[Chemical Formula 189]
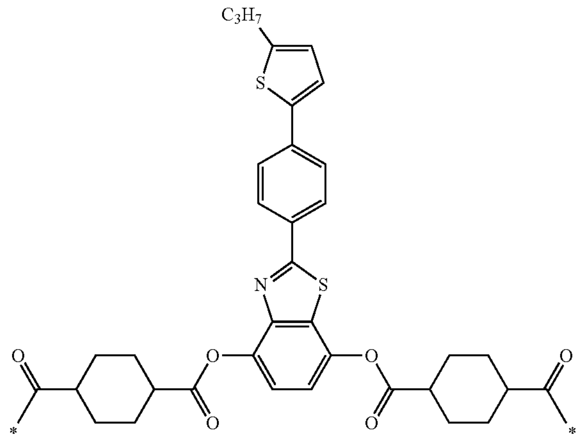
(A55-1)
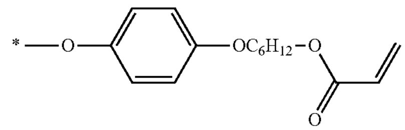
(A55-2)
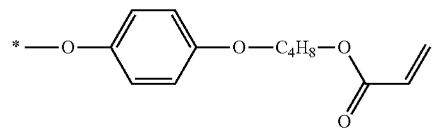
(A55-3)
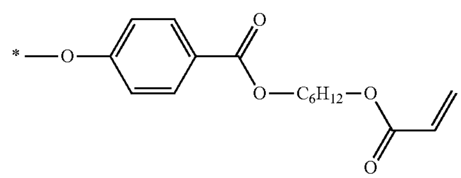
(A55-4)
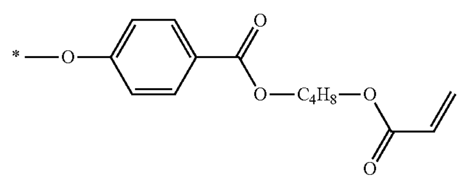
(A55-5)
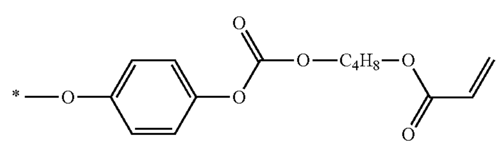
(A55-6)
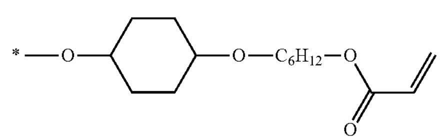
(A55-7)
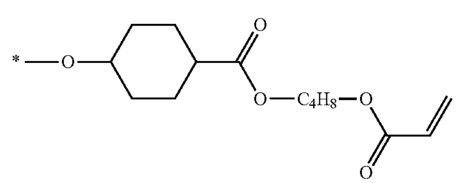

-continued
(A55-8)
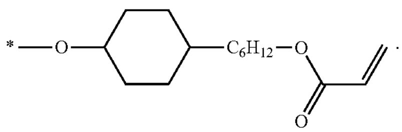
[Chemical Formula 190]
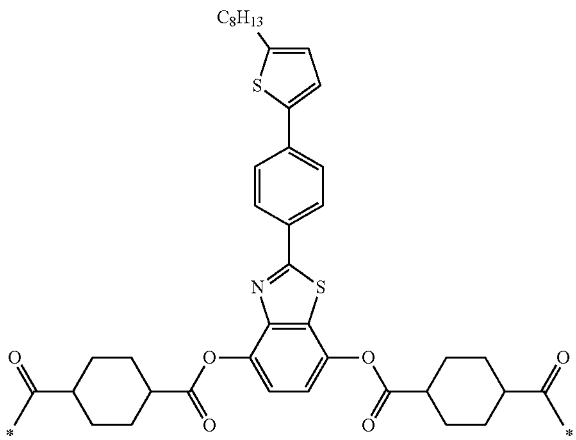
(A56-1)
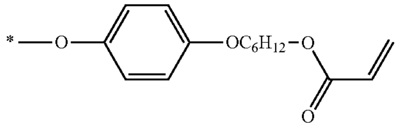
(A56-2)
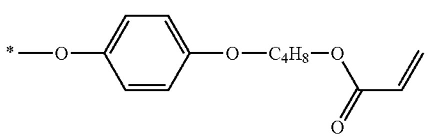
(A56-3)
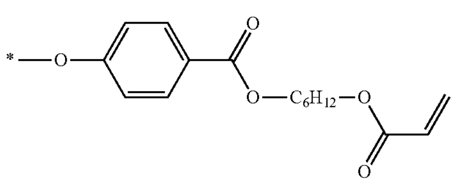
(A56-4)
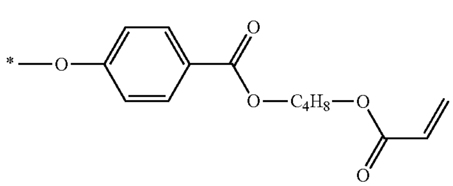
(A56-5)
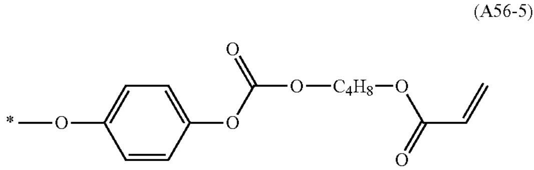
(A56-6)
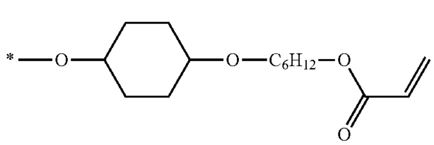
-continued
(A56-7)
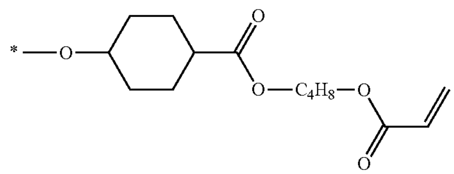
(A56-8)
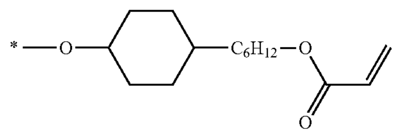
[Chemical Formula 191]
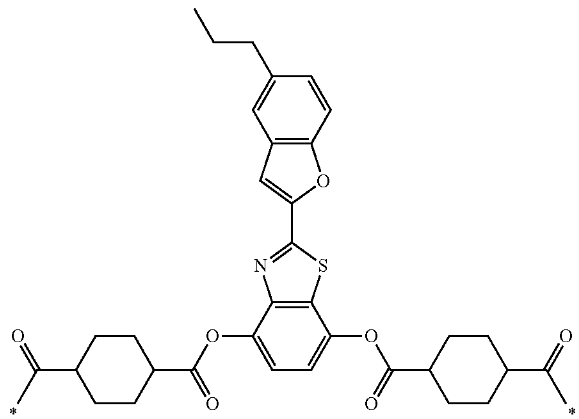
(A57-1)
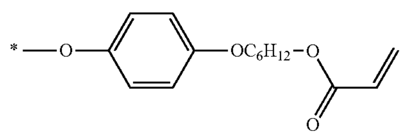
(A57-2)
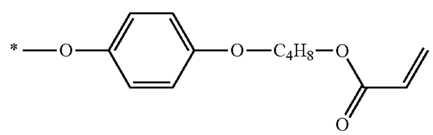
(A57-3)
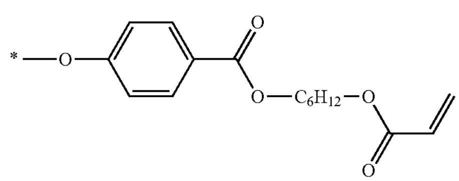
(A57-4)
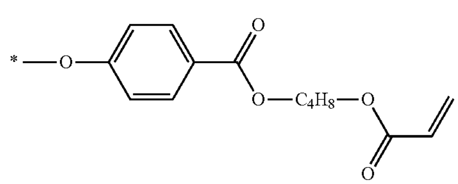
(A57-5)
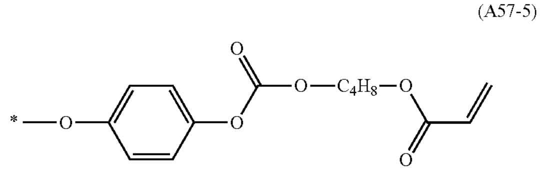

-continued
(A57-6)
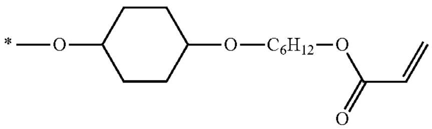
(A57-7)
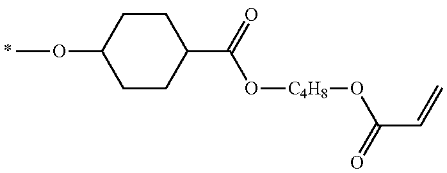
(A57-8)
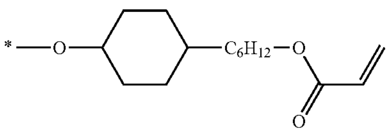
[Chemical Formula 192]
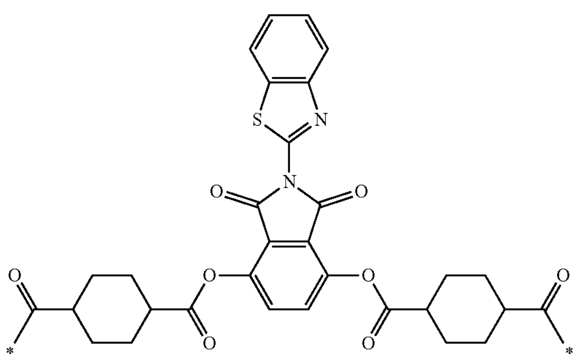
(A58-1)
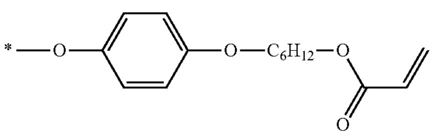
(A58-2)
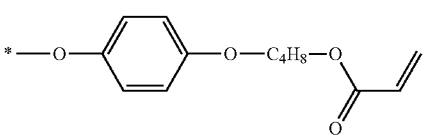
(A58-3)
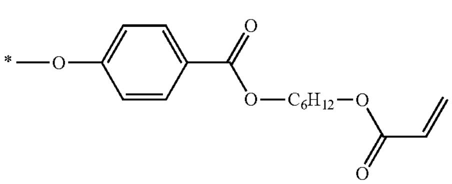
(A58-4)
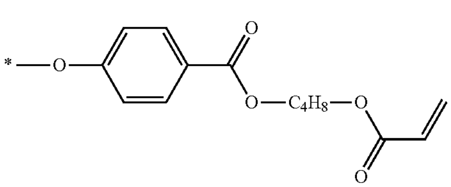
-continued
(A58-5)
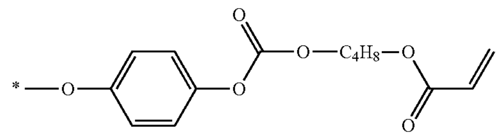
(A58-6)
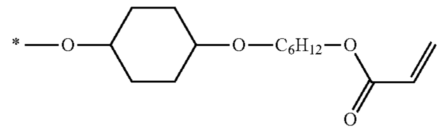
(A58-7)
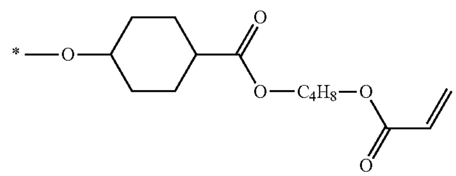
(A58-8)
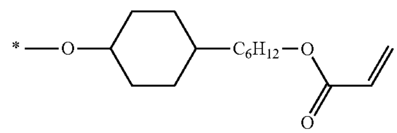
[Chemical Formula 193]
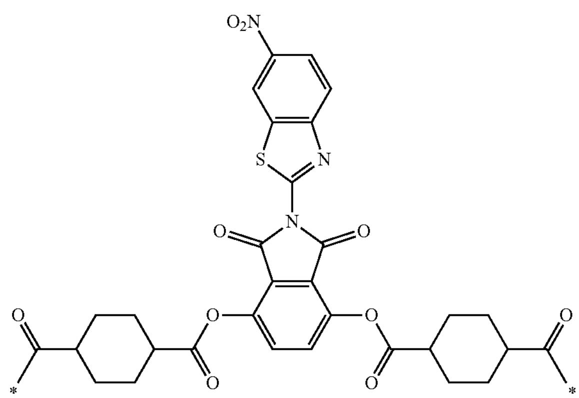
(A59-1)
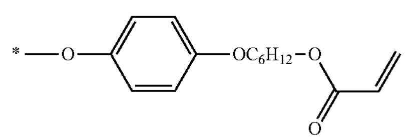
(A59-2)
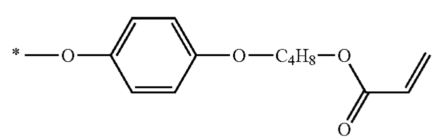
(A59-3)
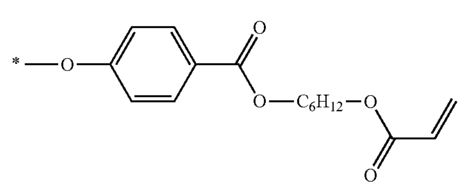

-continued
(A59-4)
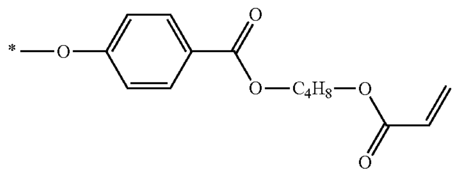
(A59-5)
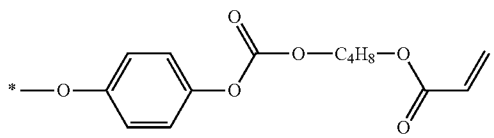
(A59-6)
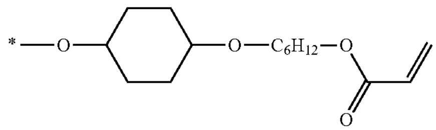
(A59-7)
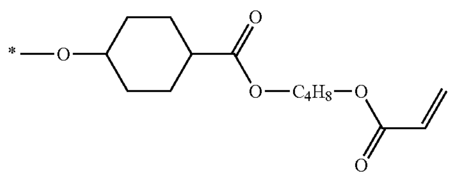
(A59-8)
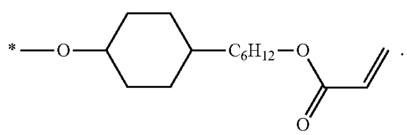
[Chemical Formula 194]
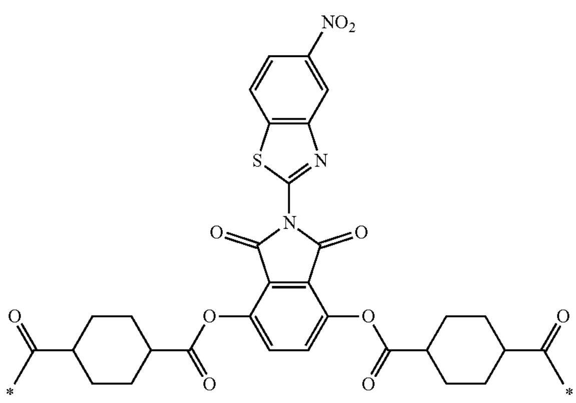
(A60-1)
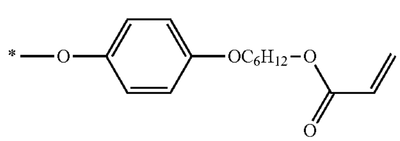
(A60-2)
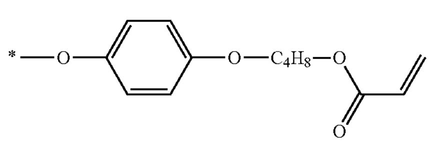
-continued
(A60-3)
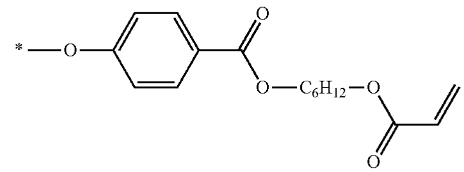
(A60-4)
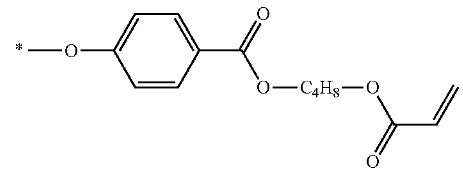
(A60-5)
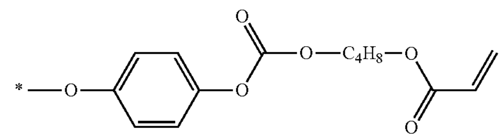
(A60-6)
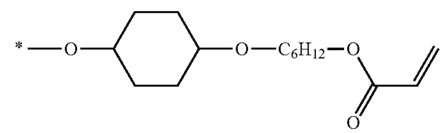
(A60-7)
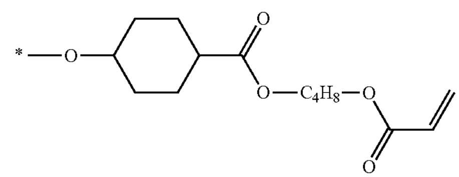
(A60-8)
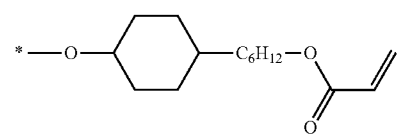
[Chemical Formula 195]
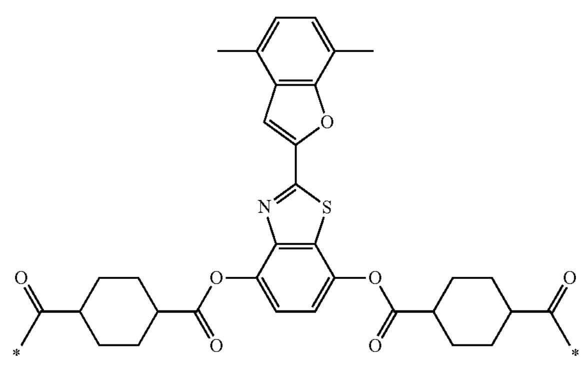
(A61-1)
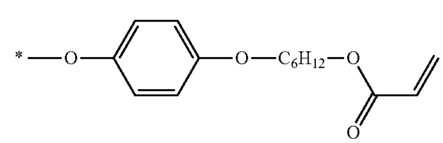

-continued
(A61-2)
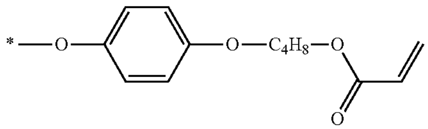
(A61-3)
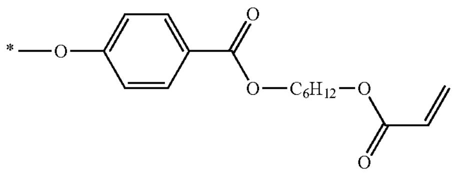
(A61-4)
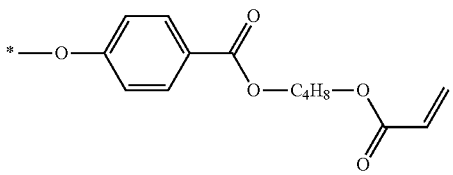
(A61-5)
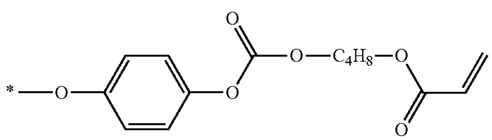
(A61-6)
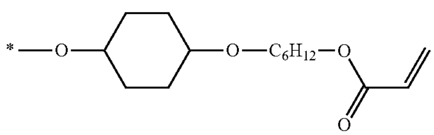
(A61-7)
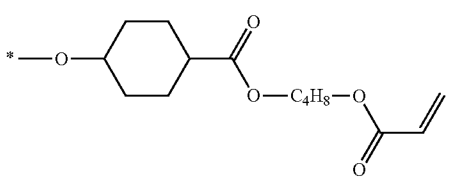
(A61-8)
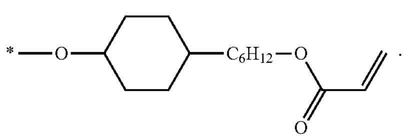
[Chemical Formula 196]
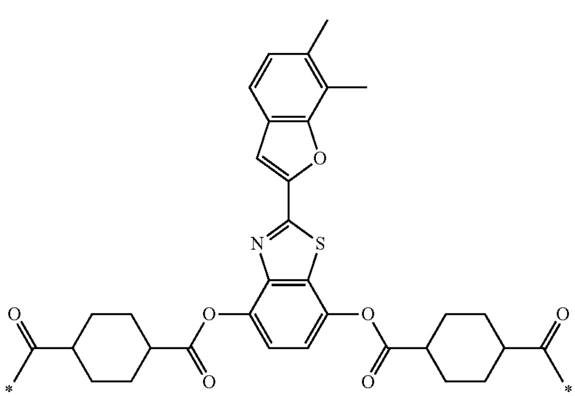
-continued
(A62-1)
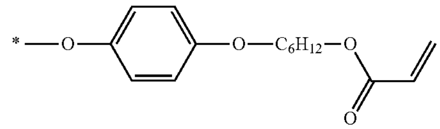
(A62-2)
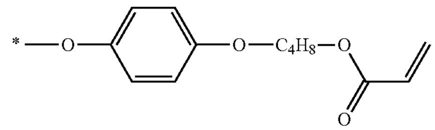
(A62-3)
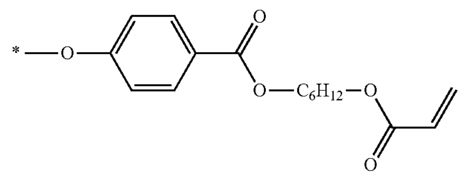
(A62-4)
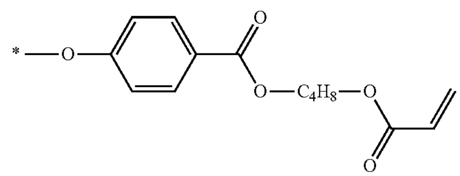
(A62-5)
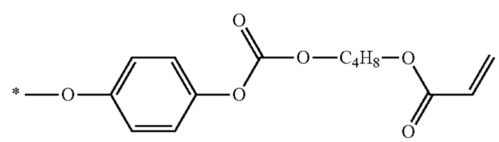
(A62-6)
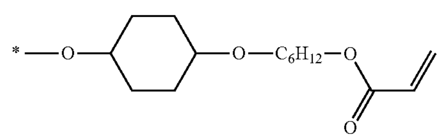
(A62-7)
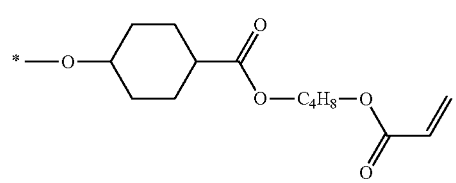
(A62-8)
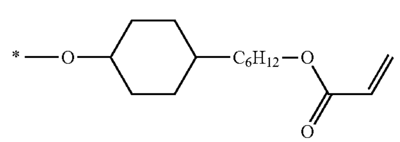

[Chemical Formula 197]
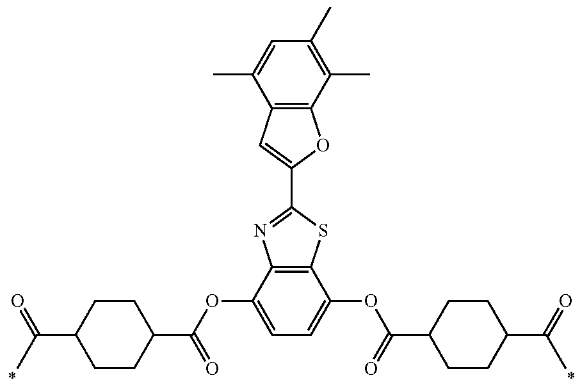
(A63-1)
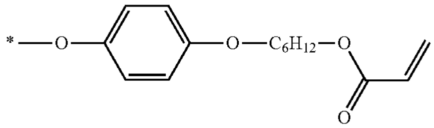
(A63-2)
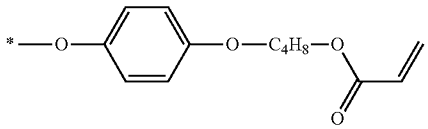
(A63-3)
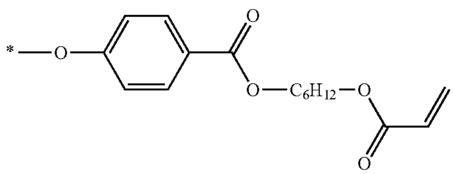
(A63-4)
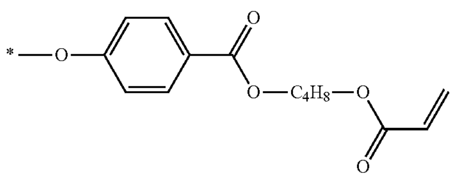
(A63-5)
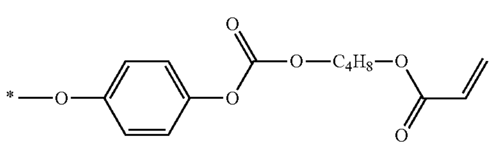
(A63-6)
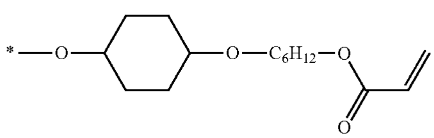
(A63-7)
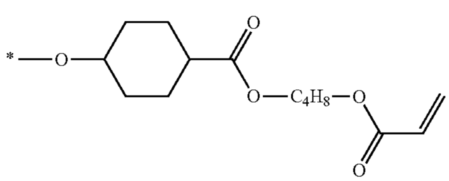
(A63-8)
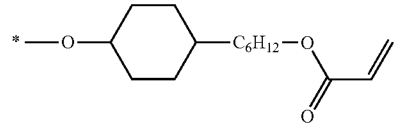
[Chemical Formula 198]
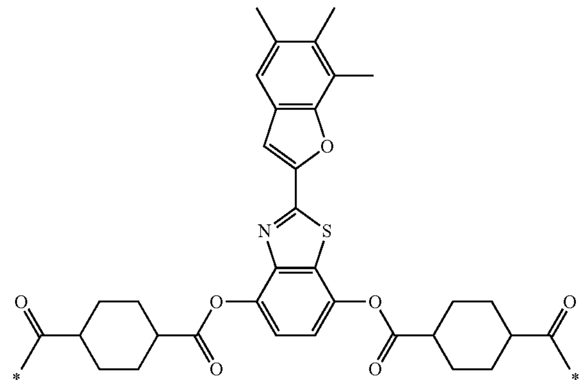
(A64-1)
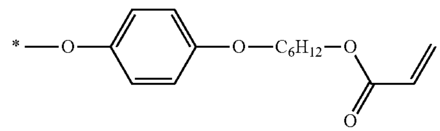
(A64-2)
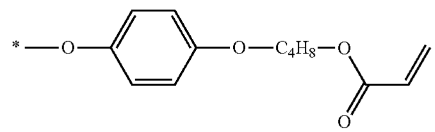
(A64-3)
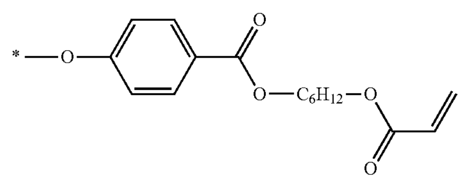
(A64-4)
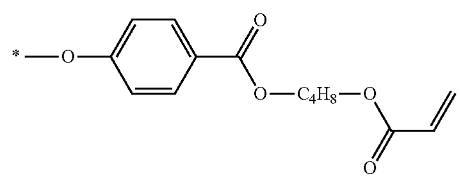
(A64-5)
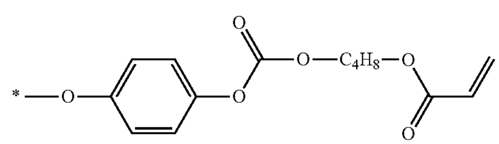
(A64-6)
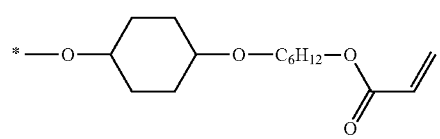

-continued
(A64-7)
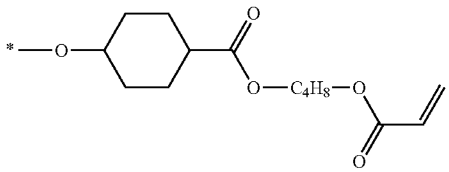
(A64-8)
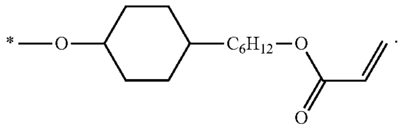
[Chemical Formula 199]
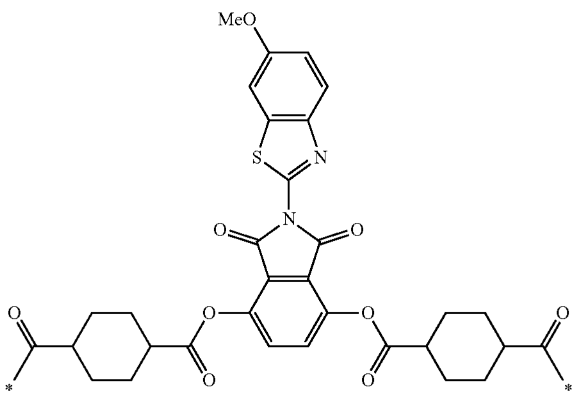
(A66-1)
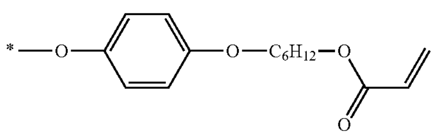
(A66-2)
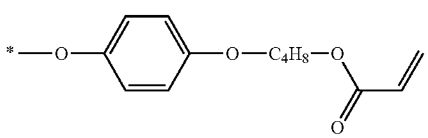
(A66-3)
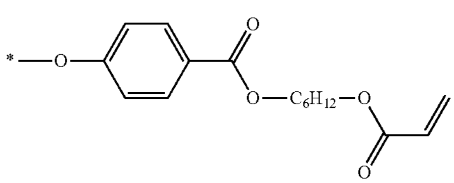
(A66-4)
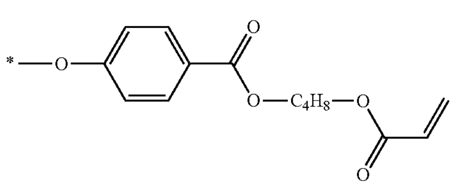
(A66-5)
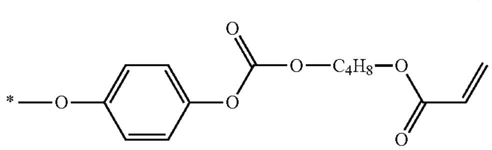
-continued
(A66-6)
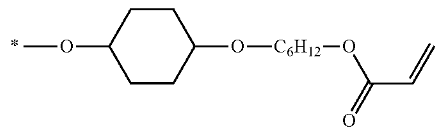
(A66-7)
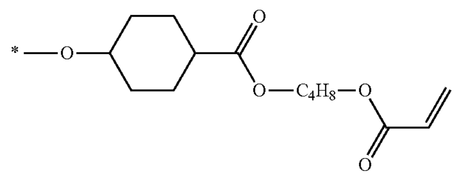
(A66-8)
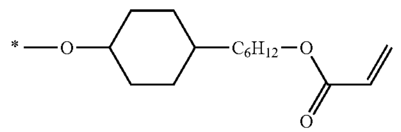
[Chemical Formula 200]
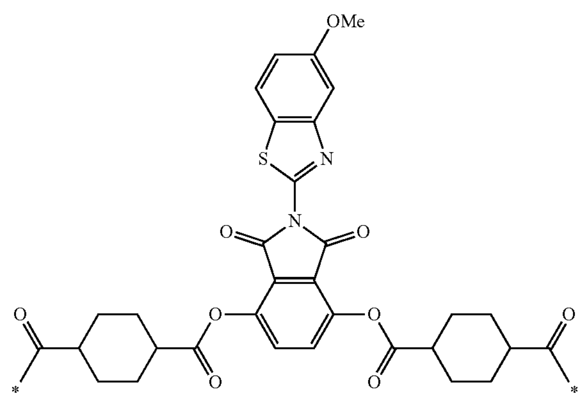
(A67-1)
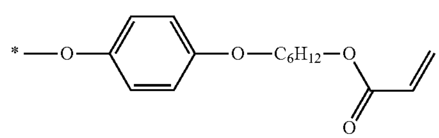
(A67-2)
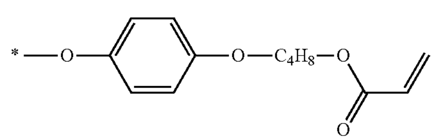
(A67-3)
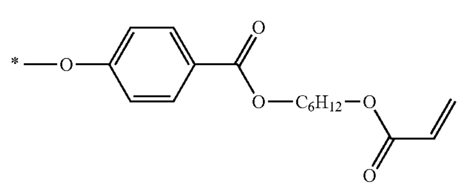
(A67-4)
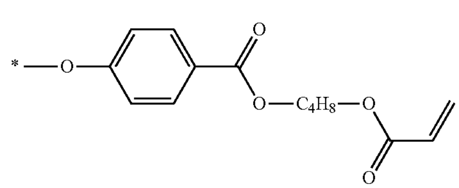

-continued
(A67-5)
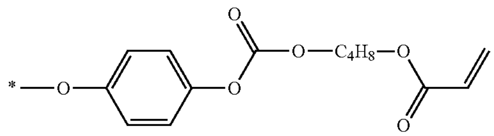
(A67-6)
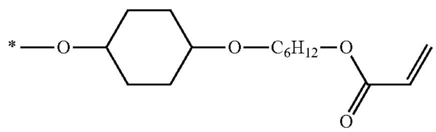
(A67-7)
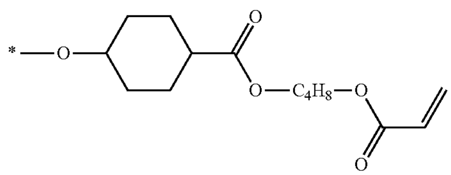
(A67-8)
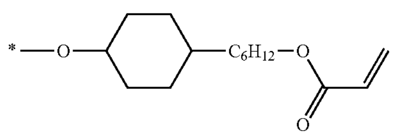
[Chemical Formula 201]
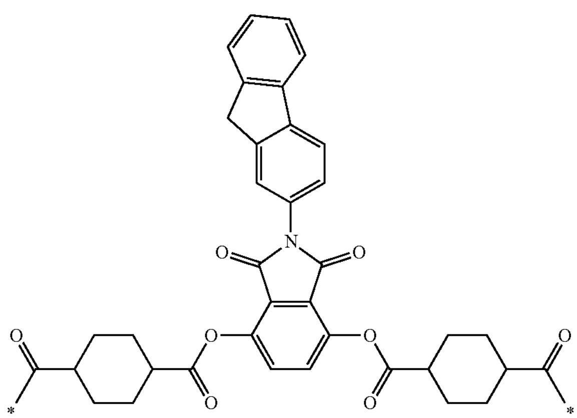
(A68-1)
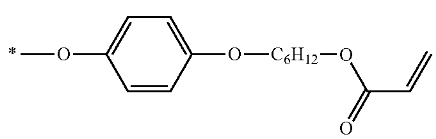
(A68-2)
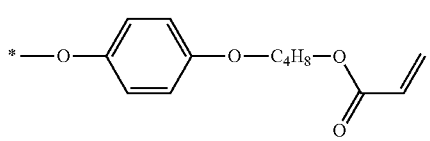
(A68-3)
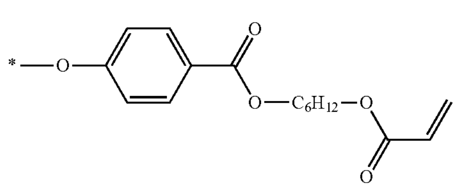
-continued
(A68-4)
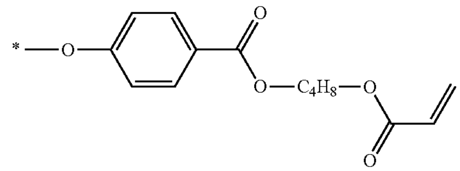
(A68-5)
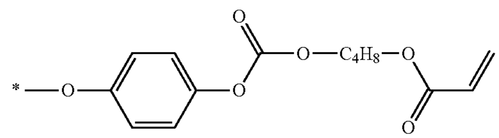
(A68-6)
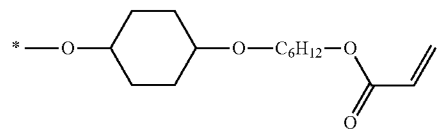
(A68-7)
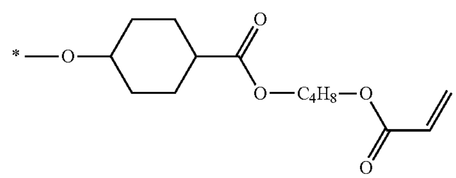
(A68-8)
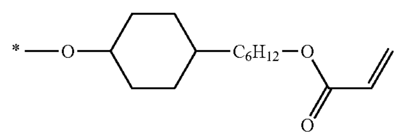
[Chemical Formula 202]
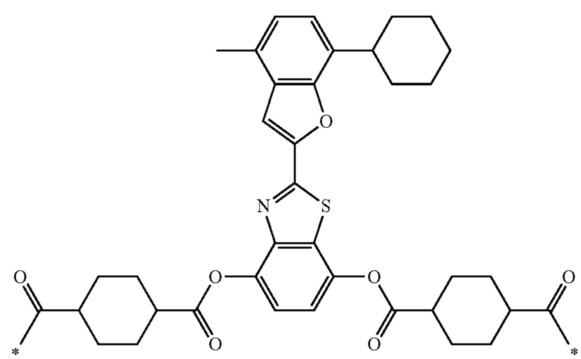
(A69-1)
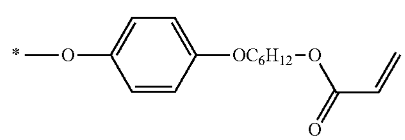
(A69-2)
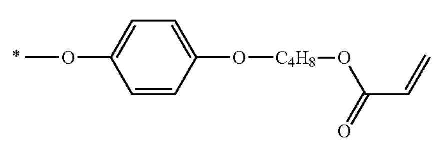

-continued
(A69-3)
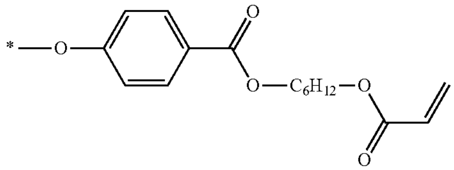
(A69-4)
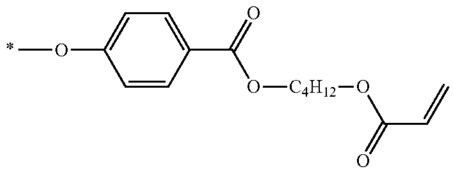
(A69-5)
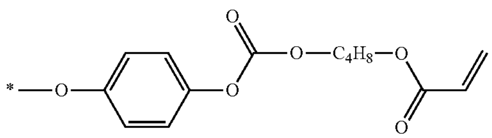
(A69-6)
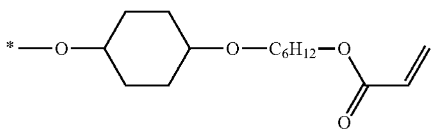
(A69-7)
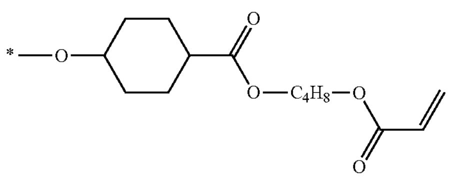
(A69-8)
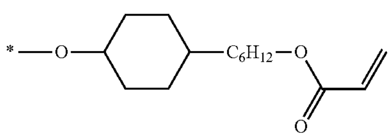
[Chemical Formula 203]
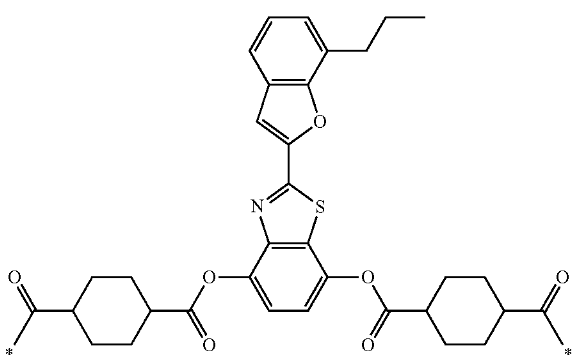
(A70-1)
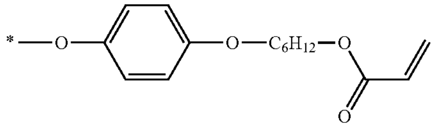
-continued
(A70-2)
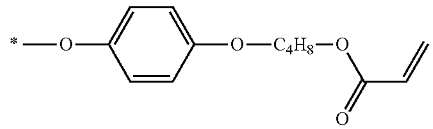
(A70-3)
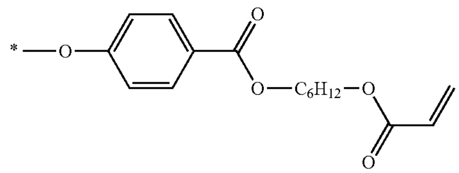
(A70-4)
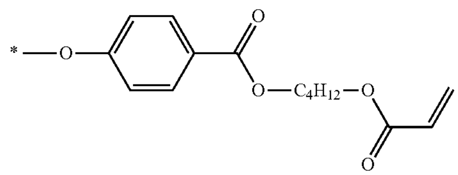
(A70-5)
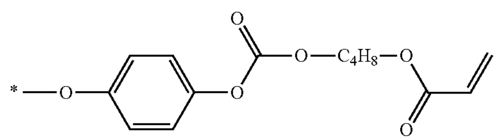
(A70-6)
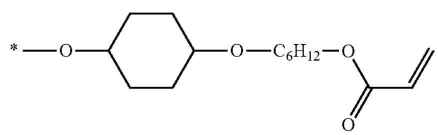
(A70-7)
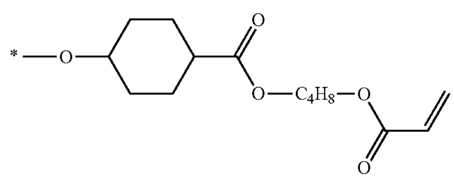
(A70-8)
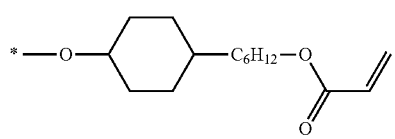
[Chemical Formula 204]
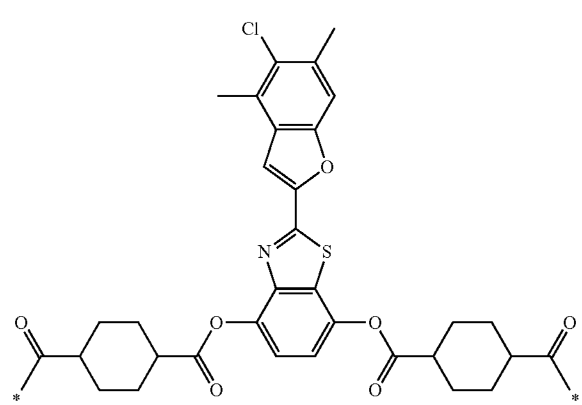

-continued
(A71-1)
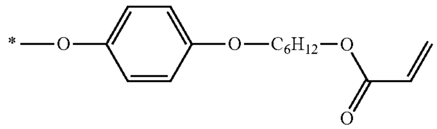
(A71-2)
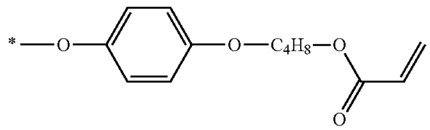
(A71-3)
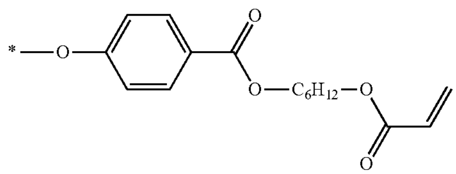
(A71-4)
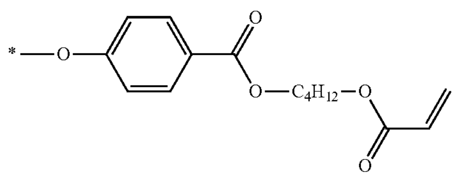
(A71-5)
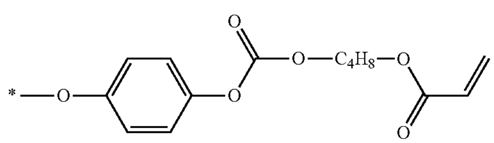
(A71-6)
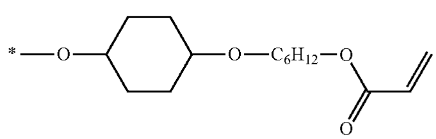
(A71-7)
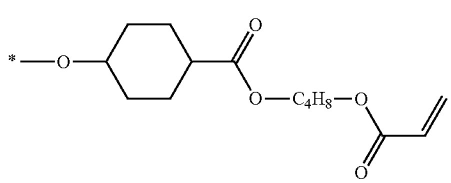
(A71-8)
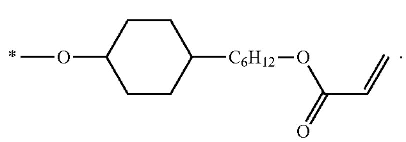
-continued
[Chemical Formula 205]
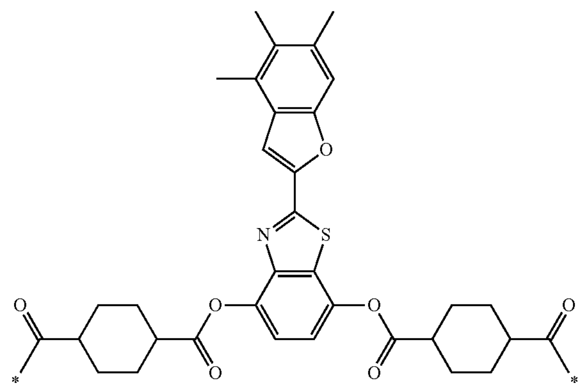
(A72-1)
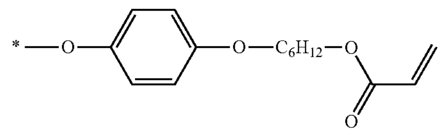
(A72-2)
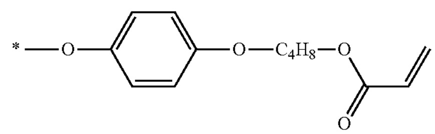
(A72-3)
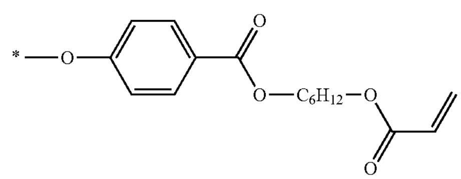
(A72-4)
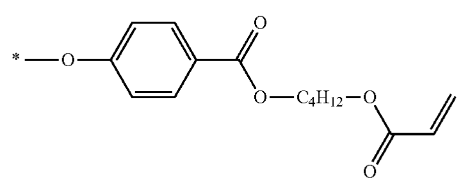
(A72-5)
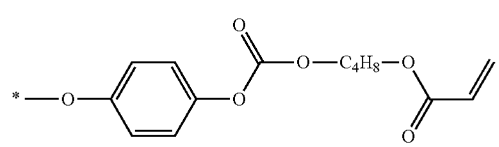
(A72-6)
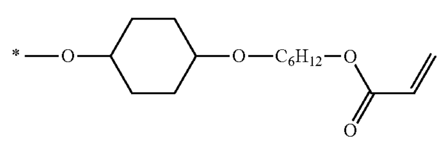
(A72-7)
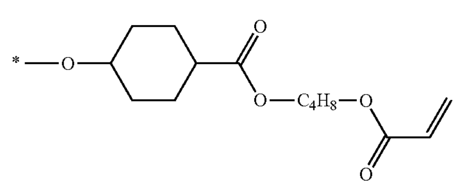

(A72-8)
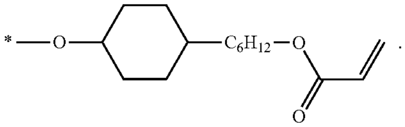
[Chemical Formula 206]
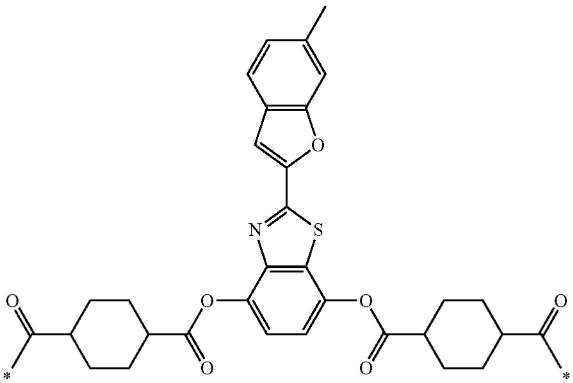
(A73-1)
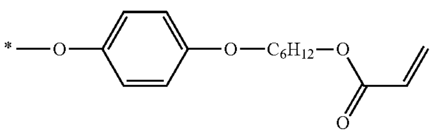
(A73-2)
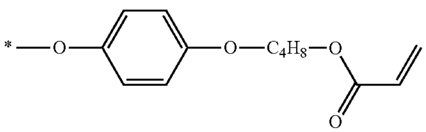
(A73-3)
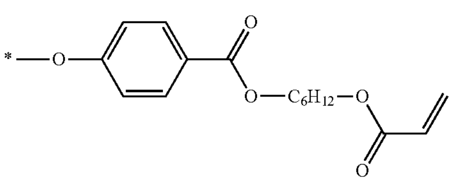
(A73-4)
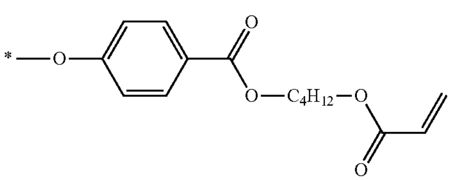
(A73-5)
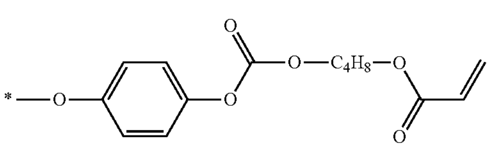
(A73-6)
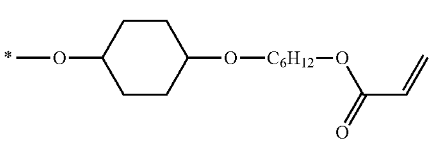
(A73-7)
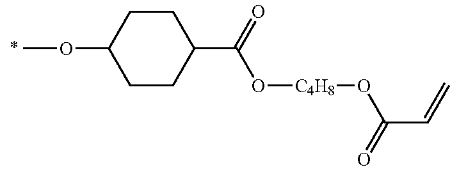
(A73-8)
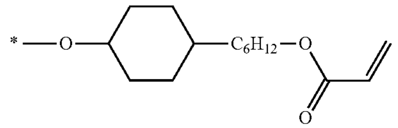
[Chemical Formula 207]
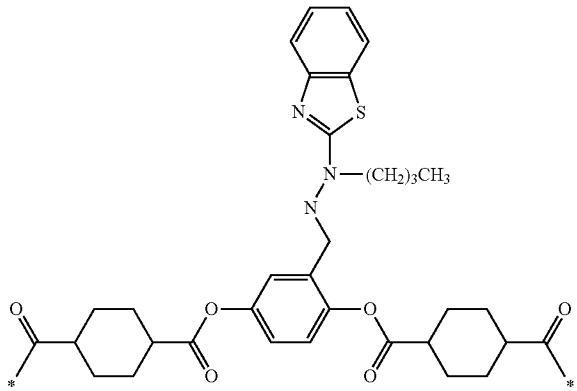
(A74-1)
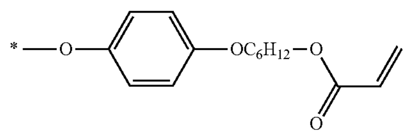
(A74-2)
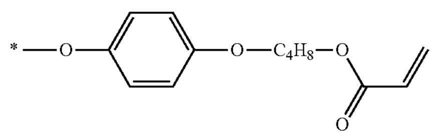
(A74-3)
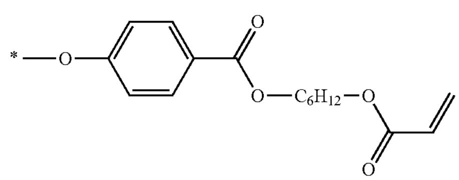
(A74-4)
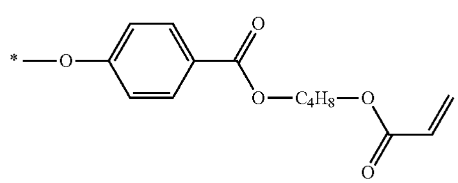
(A74-5)
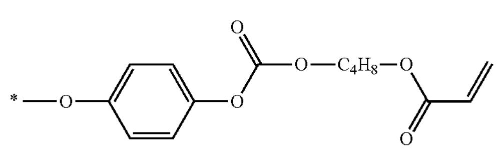

-continued
(A74-6)
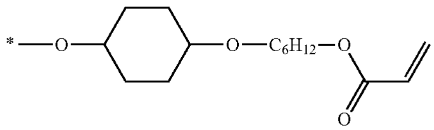
(A74-7)
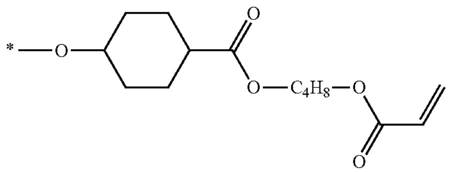
(A74-8)
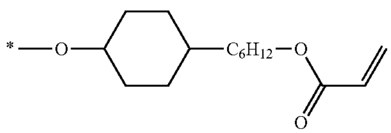
[Chemical Formula 208]
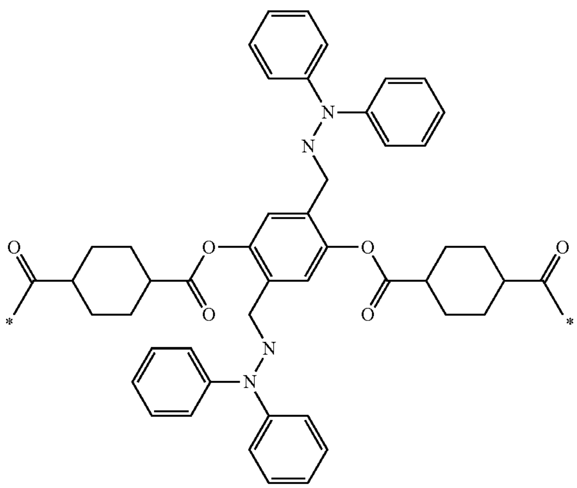
(A75-1)
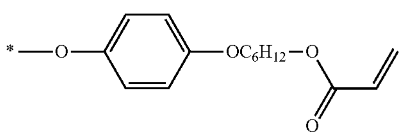
(A75-2)
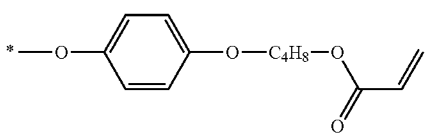
(A75-3)
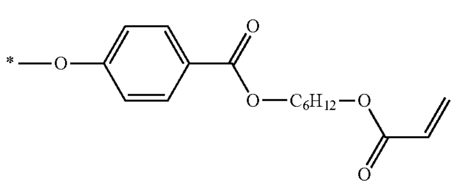
(A75-4)
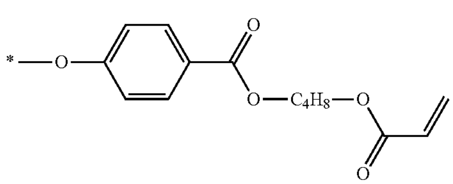
-continued
(A75-5)
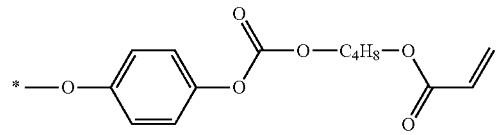
(A75-6)
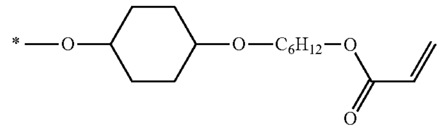
(A75-7)
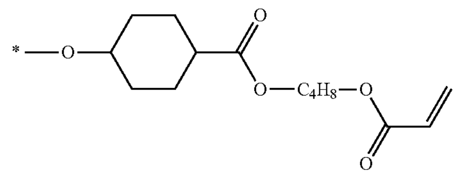
(A75-8)
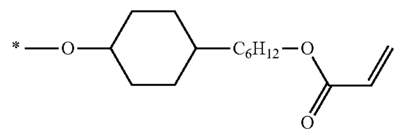
[Chemical Formula 209]
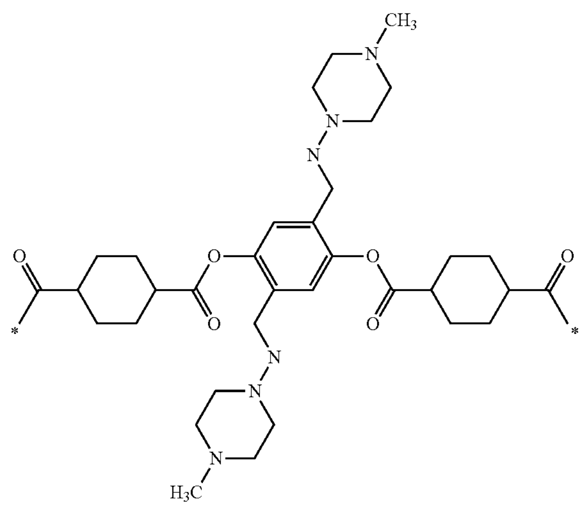
(A76-1)
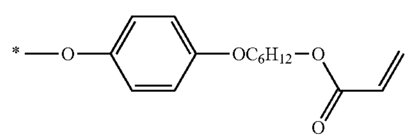
(A76-2)
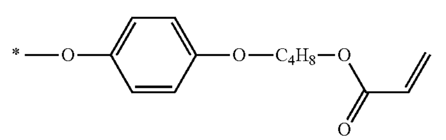
(A76-3)
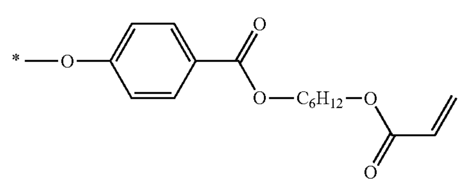

-continued
(A76-4)
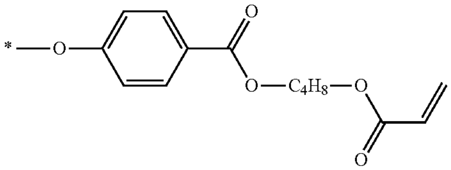
(A76-5)
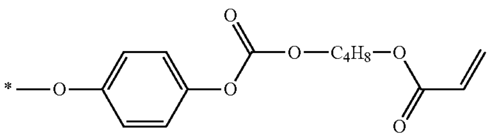
(A76-6)
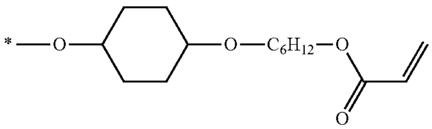
(A76-7)
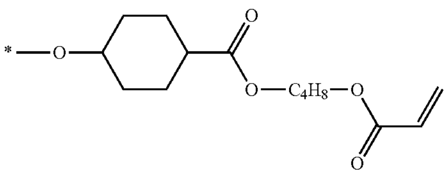
(A76-8)
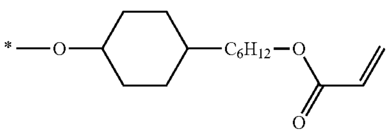
[Chemical Formula 210]
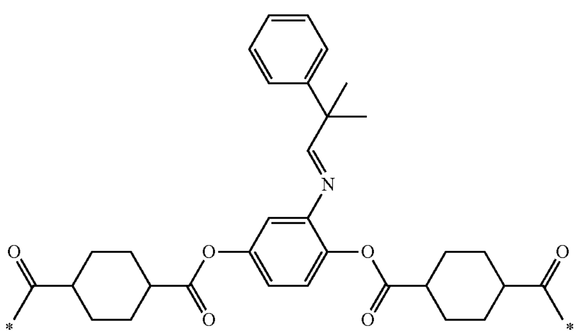
(A80-1)
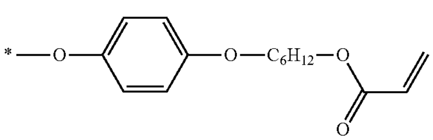
(A80-2)
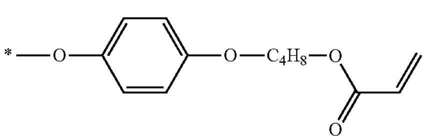
(A80-3)
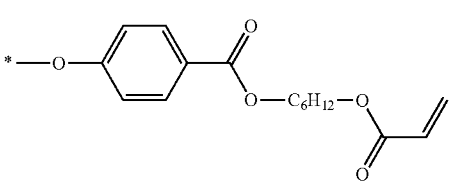
-continued
(A80-4)
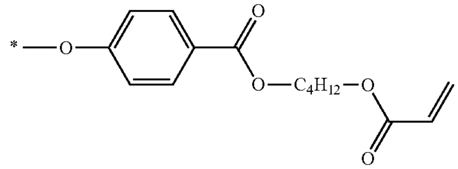
(A80-5)
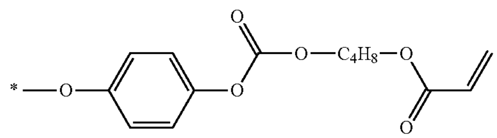
(A80-6)
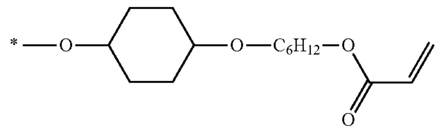
(A80-7)
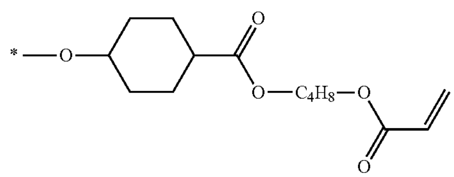
(A80-8)
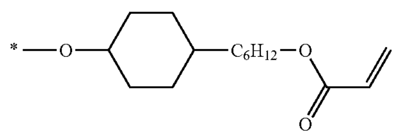
[Chemical Formula 211]
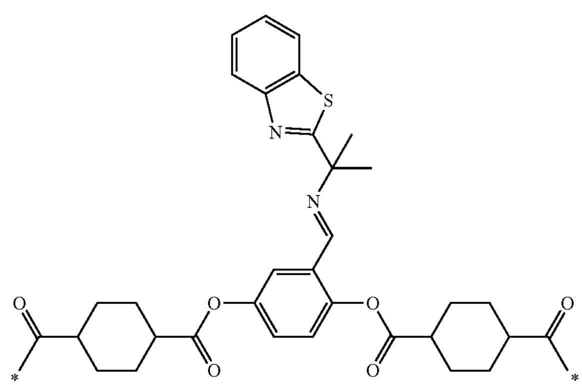
(A81-1)
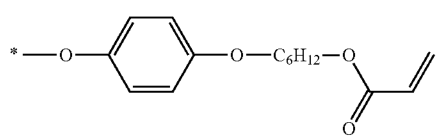
(A81-2)
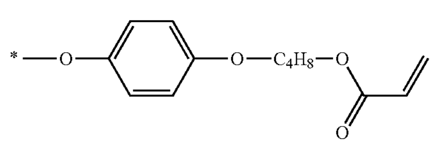

-continued
(A81-3)
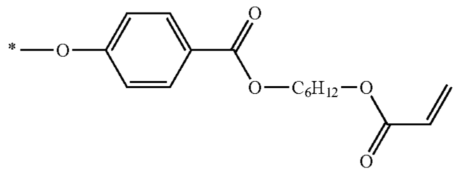
(A81-4)
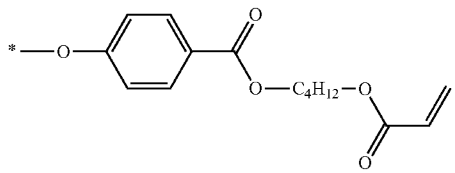
(A81-5)
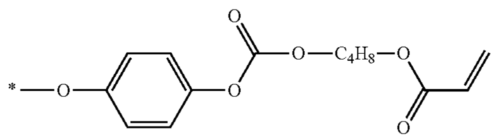
(A81-6)
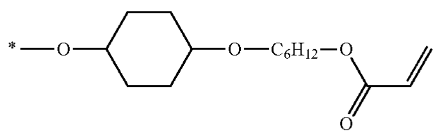
(A81-7)
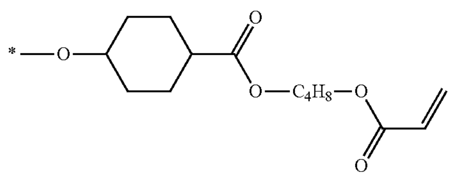
(A81-8)
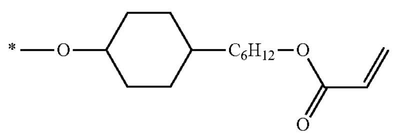
[Chemical Formula 212]
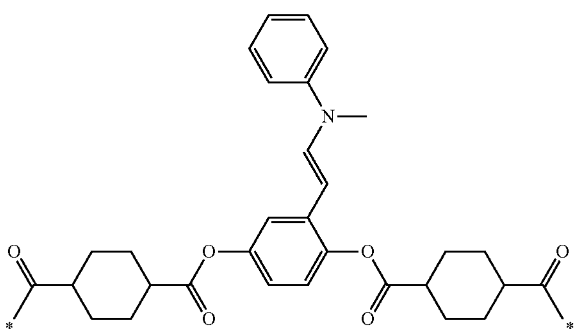
(A82-1)
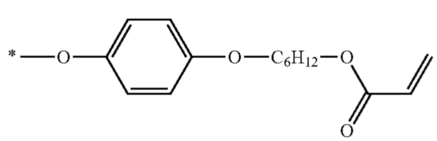
(A82-2)
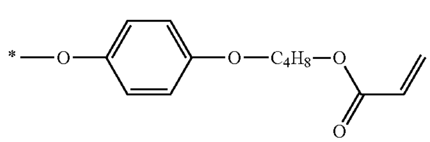
-continued
(A82-3)
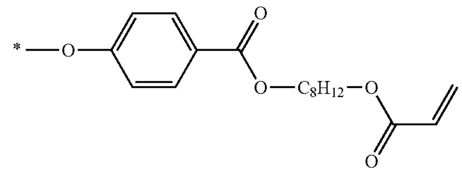
(A82-4)
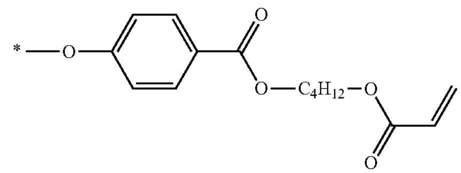
(A82-5)
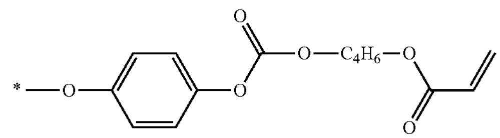
(A82-6)
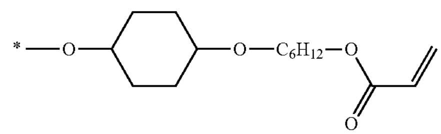
(A82-7)
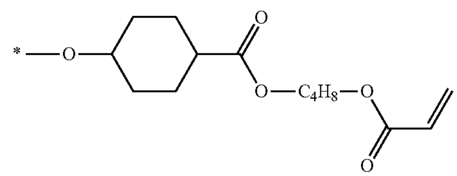
(A82-8)
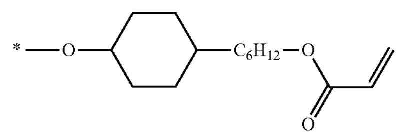
[Chemical Formula 213]
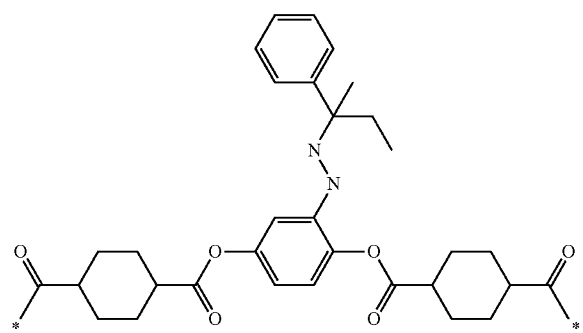
(A83-1)
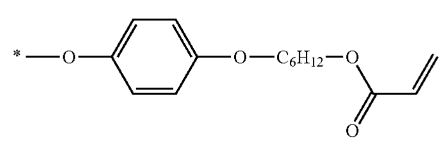
(A83-2)
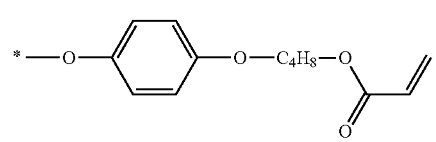

-continued
(A83-3)
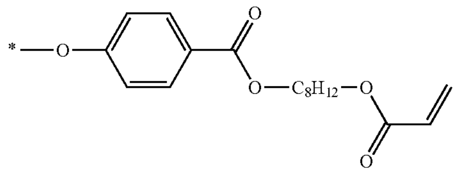
(A83-4)
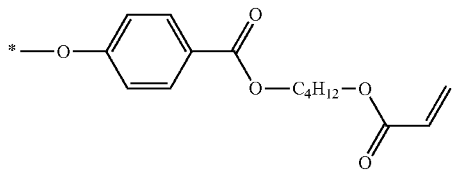
(A83-5)
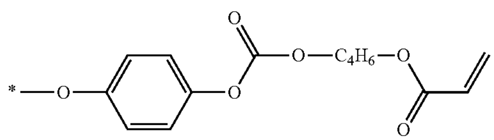
(A83-6)
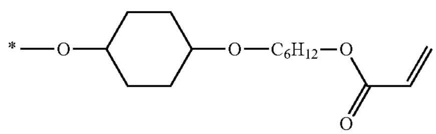
(A83-7)
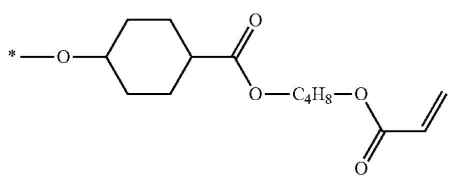
(A83-8)
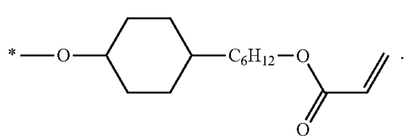
[Chemical Formula 214]
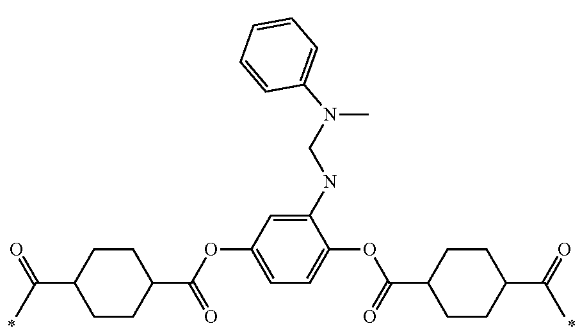
(A84-1)
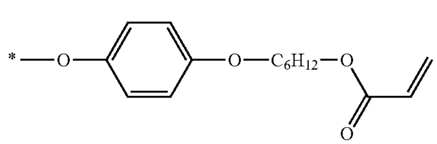
(A84-2)
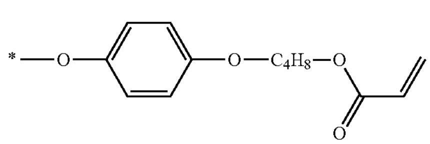
-continued
(A84-3)
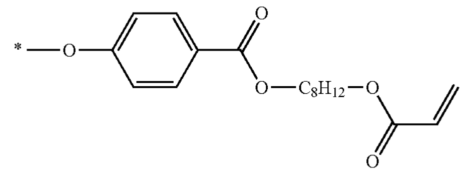
(A84-4)
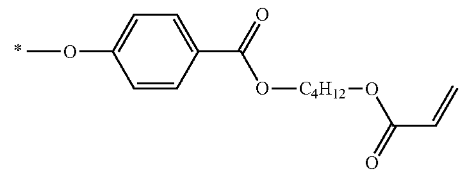
(A84-5)
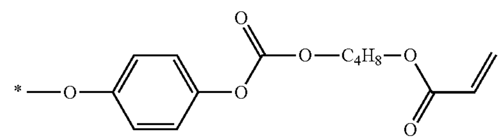
(A84-6)
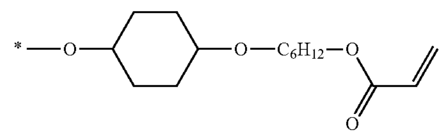
(A84-7)
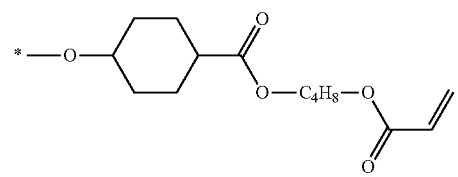
(A84-8)
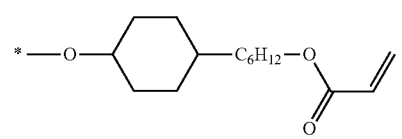
[Chemical Formula 215]
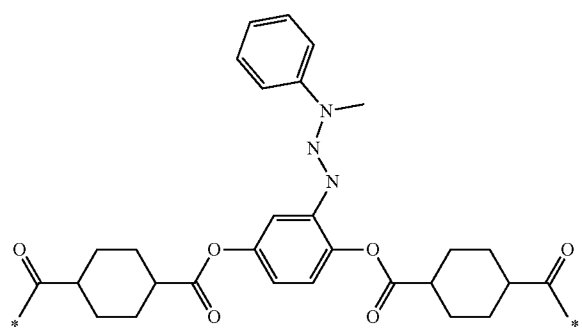
(A85-1)
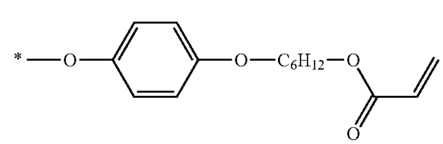
(A85-2)
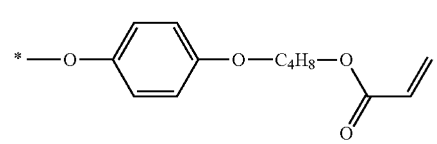

-continued (A85-3)

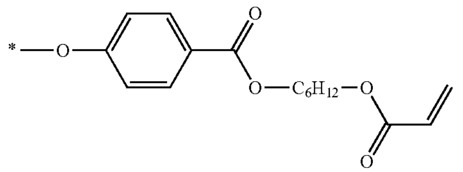

(A85-4)

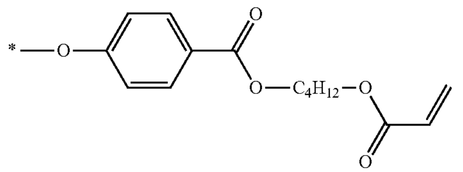

(A85-5)

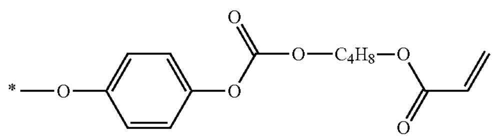

(A85-6)

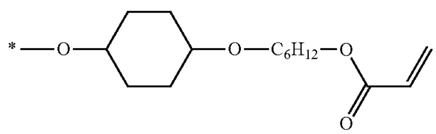

(A85-7)

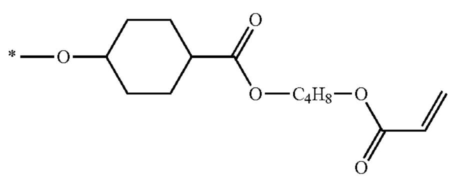

(A85-8)

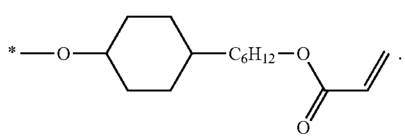

In the present invention, the polymerizable liquid crystal compound (B) is a polymerizable liquid crystal compound that has light absorption with respect to light in an ultraviolet region with a wavelength of 250 nm to 400 nm and in which with respect to the retardation value [R(A, 500, 450)] at a wavelength of 450 nm measured after irradiation of the polymerizable liquid crystal compound in an alignment state with ultraviolet rays of 500 mJ/cm$^2$, the retardation value [R(A, 3000, 450)] at a wavelength of 450 nm measured after irradiation with ultraviolet rays of 3000 mJ/cm$^2$ changes in the negative direction. The polymerizable liquid crystal compound (B) is preferably a compound represented by the following formula (2):

[Chemical Formula 216]

$$P^{1b}-E^{1b}-\left(B^{1b}-G^{1b}\right)_{k^b}-L^{1b}-Ar^{b}-L^{2b}-\left(G^{2b}-B^{2b}\right)_{l^b}-E^{2b}-P^{2b} \quad (2)$$

When the polymerizable liquid crystal compound (B) is a compound having a structure represented by the above formula (1), the reverse wavelength dispersibility is exhibited, and uniform polarization conversion can be performed in a wide wavelength range. When the compound is used for a display device, a polymerizable liquid crystal composition capable of imparting good display characteristics can be obtained.

In formula (2), $Ar^b$ is a divalent aromatic group which may have a substituent, and $L^{1b}$, $L^{2b}$, $B^{1b}$, $B^{2b}$, $G^{1b}$, $G^{2b}$, $E^{1b}$, $E^{2b}$, $P^{1b}$, $P^{2b}$, $k^b$ and $l^b$ each represent the same meaning as $L^{1a}$, $L^{2a}$, $B^{1a}$, $B^{2a}$, $G^{1a}$, $G^{2a}$, $E^{1a}$, $E^{2a}$, $P^{1a}$, $P^{2a}$, $k^a$ and $l^a$ in the above formula (1).

Examples of suitable substituents for $L^{1b}$, $L^{2b}$, $B^{1b}$, $B^{2b}$, $G^{1b}$, $G^{2b}$, $E^{1b}$, $E^{2b}$, $P^{1b}$, $P^{2b}$, $k^b$ and $l^b$ in the above formula (2) include the same groups in $L^{1a}$, $L^{2a}$, $B^{1a}$, $B^{2a}$, $G^{1a}$, $G^{2a}$, $E^{1a}$, $E^{2a}$, $P^{1a}$, $P^{2a}$, $k^a$ and $l^a$ in the above formula (1), respectively. When the polymerizable liquid crystal composition of the present invention contains a polymerizable liquid crystal compound (A) represented by formula (1) and the polymerizable liquid crystal compound (B) represented by formula (2), $L^{1a}$, $L^{2a}$, $B^{e}a$, $B^{2a}$, $G^{1a}$, $G^{2a}$, $E^{1a}$, $E^{2a}$, $P^{1a}$, $P^{2a}$, $k^a$ and $l^a$ in formula (1) may be respectively the same as or different from $L^{1b}$, $L^{2b}$, $B^{1b}$, $B^{2b}$, $G^{1b}$, $G^{2b}$, $E^{1b}$, $E^{2b}$, $P^{1b}$, $P^{2b}$, $k^b$ and $l^b$ in formula (2). However, since it is thereby easy to selectively produce a polymerizable liquid crystal compound, and they are easily compatible with each other, and a uniform polymerizable composition can be easily obtained, so that a uniform retardation plate can be formed. Therefore, $L^{1a}$, $L^{2a}$, $B^{1a}$, $B^{2a}$, $G^{1a}$, $G^{2a}$, $E^{1a}$, $E^{2a}$, $P^{1a}$, $P^{2a}$, $k^a$ and $l^a$ in formula (1) is preferably the same as $L^{1b}$, $L^{2b}$, $B^{1b}$, $B^{2b}$, $G^{1b}$, $G^{2b}$, $E^{1b}$, $E^{2b}$, $P^{1b}$, $P^{2b}$, $k^b$ and $l^b$ in formula (2).

Examples of the divalent aromatic group which may have a substituent represented by $Ar^b$ in formula (2) include the same groups as those exemplified as $Ar^a$ in the above formula (1).

As the polymerizable liquid crystal compounds (A) and (B), with respect to the retardation value [R(A, 500, 450)] at a wavelength of 450 nm measured after irradiation of the polymerizable liquid crystal compound in the alignment state with ultraviolet rays of 500 mJ/cm$^2$, whether the retardation value [R(A, 3000, 450)] at a wavelength of 450 nm measured after irradiation with ultraviolet rays of 3000 mJ/cm$^2$ changes in the positive or negative direction is usually determined depending on the molecular structure of the polymerizable liquid crystal compound. In particular, in the polymerizable liquid crystal compound represented by the above formula (1) or (2), the change is considered to be determined depending on the molecular structure of $Ar^a$ or $Ar^b$. Thus, when the polymerizable liquid crystal composition of the present invention includes the polymerizable liquid crystal compound represented by the above formula (1) and the polymerizable liquid crystal compound represented by the above formula (2), the divalent aromatic group represented by $Ar^b$ in the above formula (2) usually has a structure different from the divalent aromatic group represented by $Ar^a$ in the above formula (1).

Although not necessarily limited, when the aromatic group represented by $Ar^a$ in formula (1) is composed of a nitrogen atom, a sulfur atom, an oxygen atom, a carbon atom and a hydrogen atom, the retardation value under the above-described ultraviolet irradiation conditions tends to change in the positive direction. Therefore, in the polymerizable liquid crystal composition of the present invention, the aromatic group represented by $Ar^a$ in formula (1) is preferably a divalent aromatic group composed of a nitrogen atom, a sulfur atom, an oxygen atom, a carbon atom and a hydrogen atom. In formula (1-1-A), $Q^1$ is —S—, and $Y^1$ is more preferably an aromatic group having a polycyclic aromatic heterocycle having an alkenyl structure. When $Y^1$ has the alkenyl structure, the alkenyl moiety is oxidized by a photo-oxidation reaction, whereby the retardation value tends to increase (changes in the positive direction).

On the other hand, although not necessarily limited, when the aromatic group represented by $Ar^b$ in formula (2) is composed of a nitrogen atom, a sulfur atom, a carbon atom and a hydrogen atom, the retardation value under the above-described ultraviolet irradiation conditions tends to change in the negative direction. Therefore, in the polymerizable liquid crystal composition of the present invention, the aromatic group represented by $Ar^b$ in formula (2) is preferably a divalent aromatic group composed of a nitrogen atom, a sulfur atom, a carbon atom and a hydrogen atom. In the above formula (1-1-A), $Q^1$ is —S—, and $Y^1$ is more preferably an aromatic group having a polycyclic aromatic heterocycle having no alkenyl structure. It is further preferable that $Y^1$ be an aromatic group having no alkenyl structure and be an aromatic group having a polycyclic aromatic heterocycle having two heteroatoms. It is particularly preferable that $Y^1$ have no alkenyl structure and be an aromatic group which is a condensed 5- or 6-membered ring and has a polycyclic aromatic heterocycle containing two heteroatoms in the 5-membered ring portion.

The method for producing the polymerizable liquid crystal compound (A) or (B) represented by formula (1) or (2) is not particularly limited, and polymerizable liquid crystal compound (A) or (B) can be produced by appropriately combining known organic synthesis reactions described in Methoden der Organischen Chemie, Organic Reactions, Organic Syntheses, Comprehensive Organic Synthesis, Shin Jikken Kagaku Koza, etc. (e.g., a condensation reaction, an esterification reaction, Williamson reaction, Ullmann reaction, Wittig reaction, Schiff base formation reaction, benzylation reaction, Sonogashira reaction, Suzuki-Miyaura reaction, Negishi reaction, Kumada reaction, Hiyama reaction, Buchwald-Hartwig reaction, Friedel-Crafts reaction, Heck reaction, aldol reaction, etc.) depending on its structure.

For example, a polymerizable liquid crystal compound (in the case of satisfying the relation of $k^a$=$l^a$ in the formula) represented by the following formula (A-1):

[Chemical Formula 217]

(A-1)

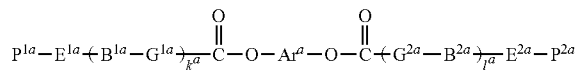

in which $L^1$ and $L^{1b}$ in formula (1) are —COO— can be produced by conducting an esterification reaction of an alcohol compound (B) represented by formula (B):

$$HO—Ar^a—OH \quad (B)$$

and a carboxylic acid compound (C) represented by formula (C):

[Chemical Formula 218]

(C)

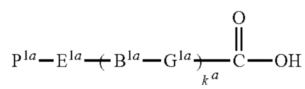

$Ar^a$, $B^{1a}$, $B^{2a}$, $G^{1a}$, $G^{2a}$, $E^{1a}$, $E^{2a}$, $P^{1a}$, $P^{2a}$, $k^a$ and $l^a$ in the above formulae (A-1), (B), and (C) are the same as those defined in the above formula (1).

The alcohol compound (B) may be a compound in which two hydroxyl groups are bonded to an aromatic group of $Ar^a$ corresponding to an aromatic group $Ar^a$ in a desired polymerizable liquid crystal compound represented by formula (1). The aromatic group of $Ar^a$ is the same as defined above, and examples thereof include compounds in which two * portions each refer to a hydroxyl group in the above formulae (Ar-1) to (Ar-22).

Examples of the carboxylic acid compound (C) include the following compounds.

[Chemical Formula 219]

(R-1)

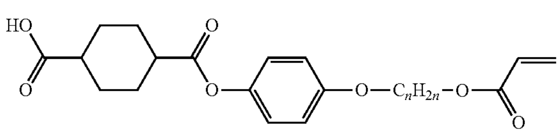

(R-2)

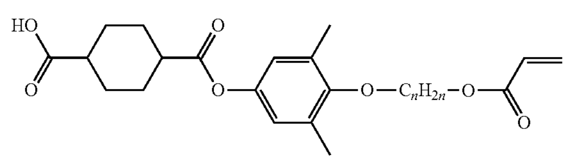

(R-3)

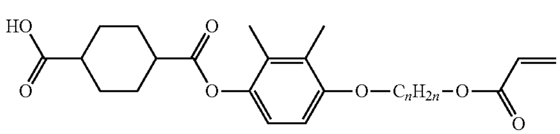

(R-4)

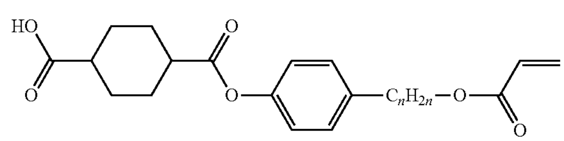

(R-5)

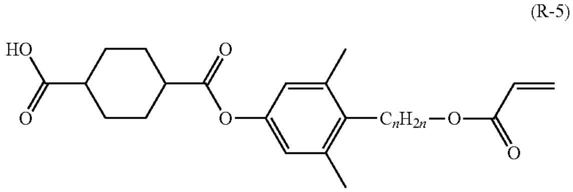

(R-6)

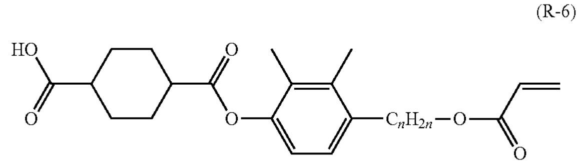

-continued
(R-7)
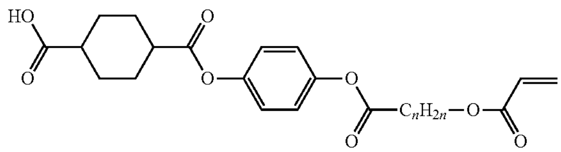
(R-8)
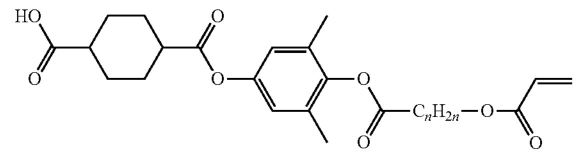
(R-9)
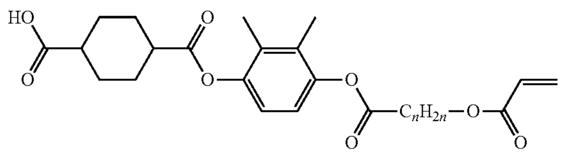
(R-10)
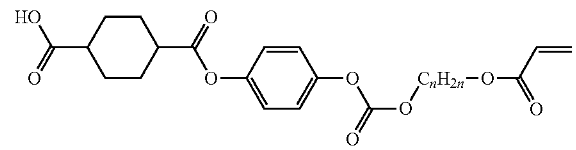
(R-11)
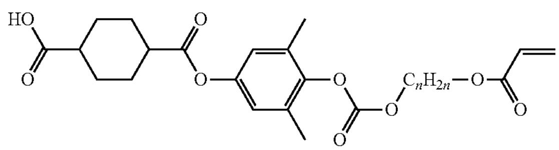
(R-12)
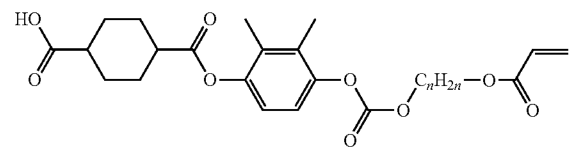
(R-13)
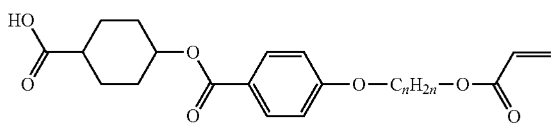
(R-14)
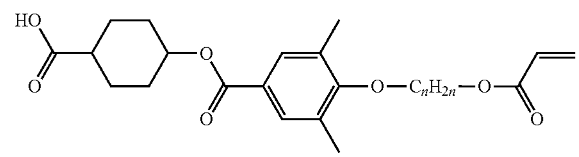
(R-15)
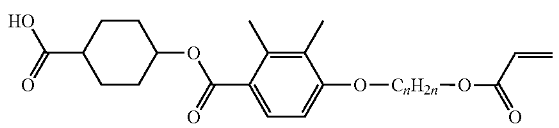
(R-16)
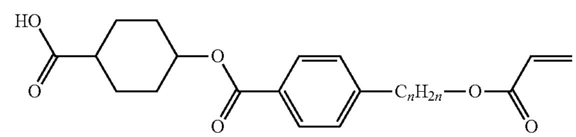
(R-17)
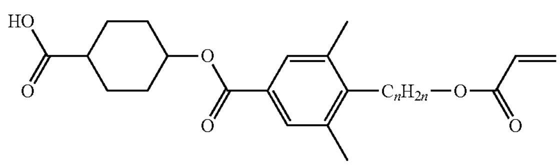
(R-18)
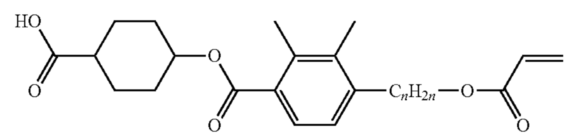
(R-19)
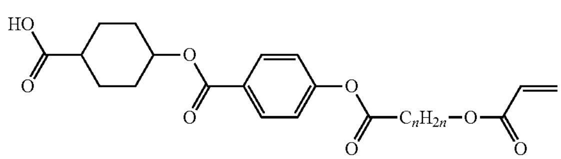
(R-20)
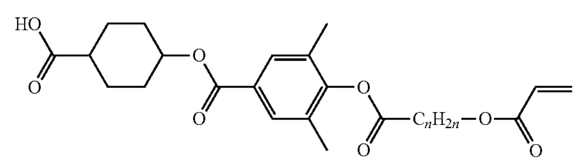
(R-21)
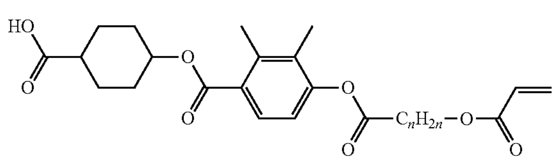
(R-22)
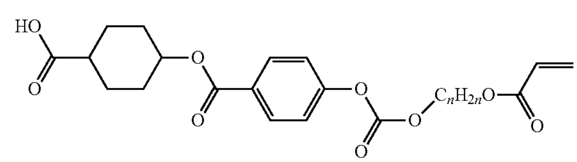
(R-23)
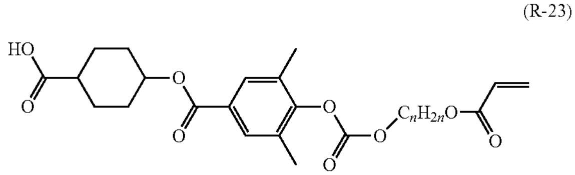
(R-24)
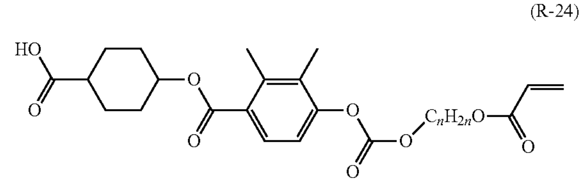

-continued
[Chemical Formula 220]
(R-25)
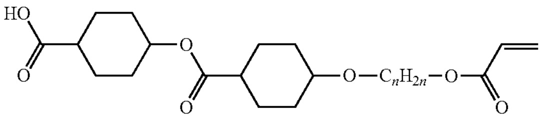
(R-26)
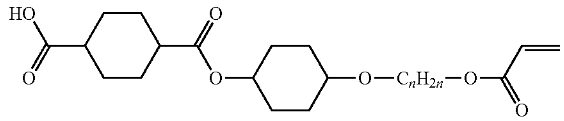
(R-27)
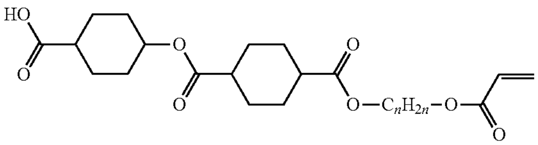
(R-28)
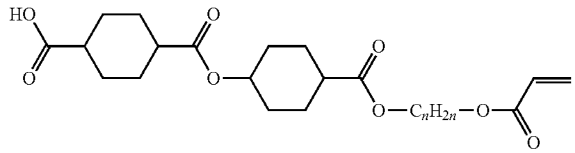
(R-29)
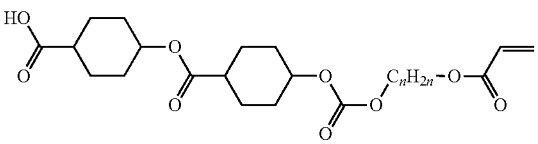
(R-30)
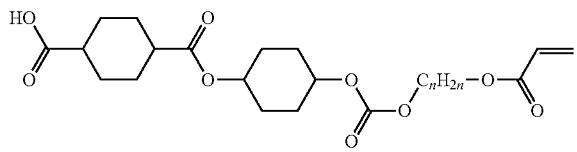
(R-31)
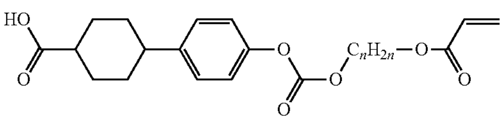
(R-32)
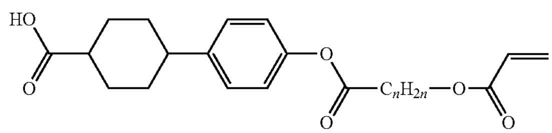
(R-33)
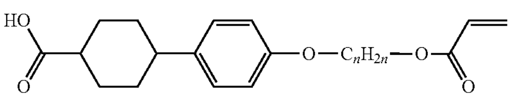
(R-34)
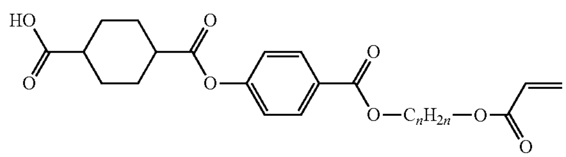
(R-35)
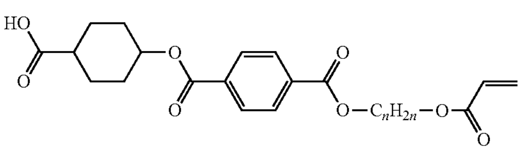
(R-36)
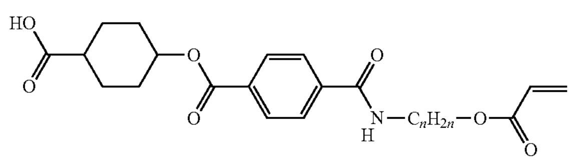
(R-37)
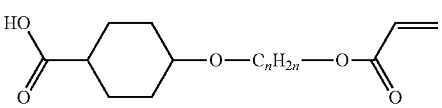
(R-38)
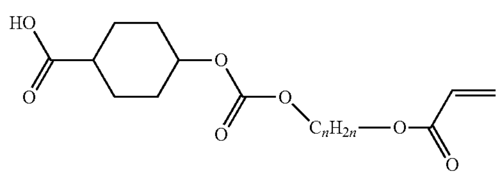
(R-39)
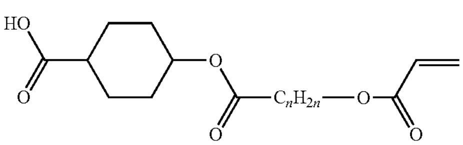
(R-40)
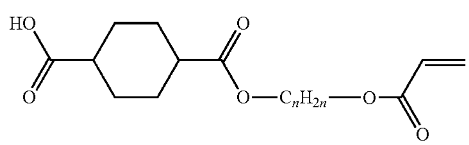
[Chemical Formula 221]
(R-41)
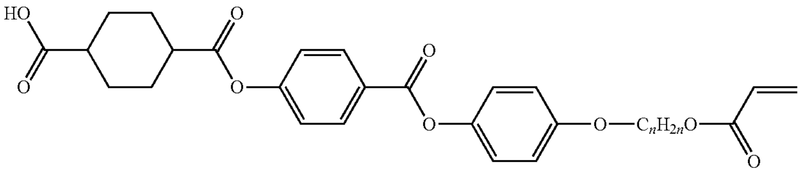

-continued
(R-42)
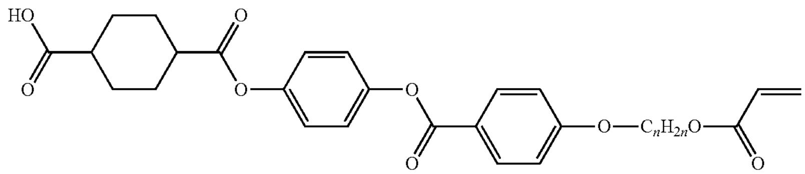
(R-43)
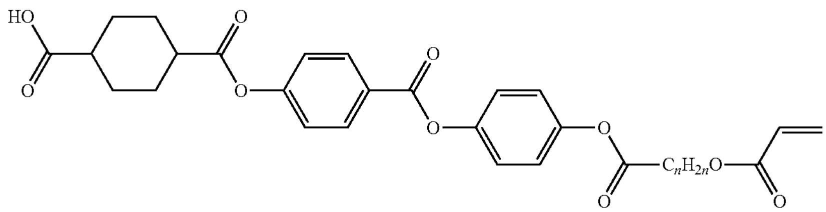
(R-44)
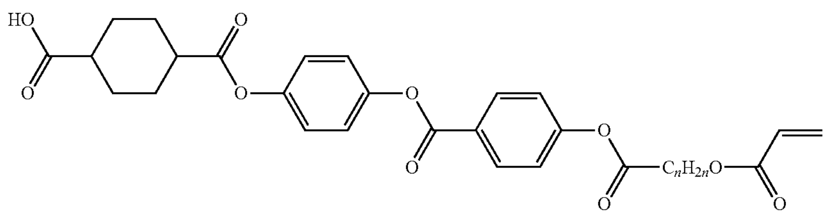
(R-45)
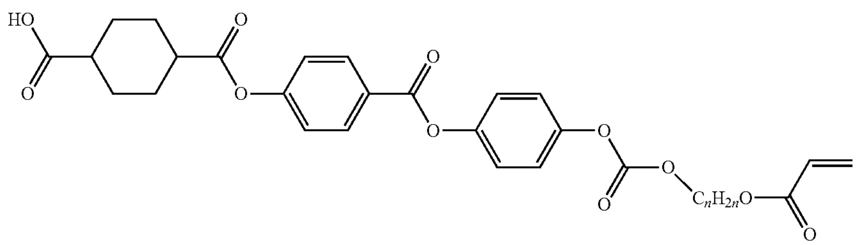
(R-46)
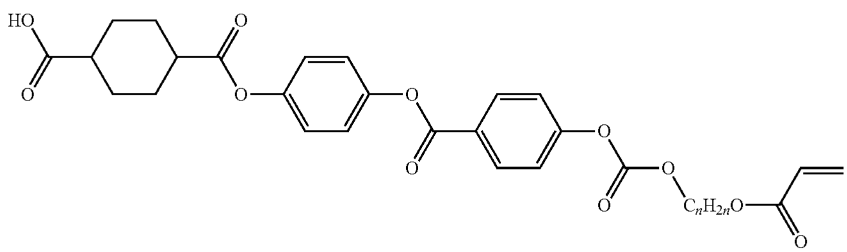
(R-47)
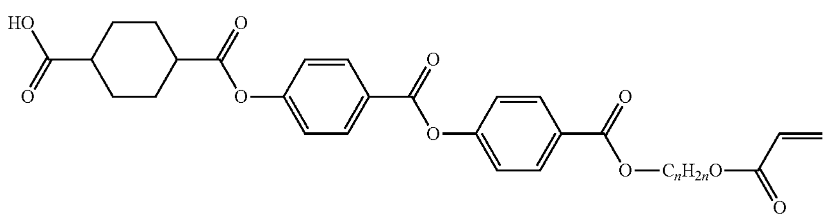
(R-48)
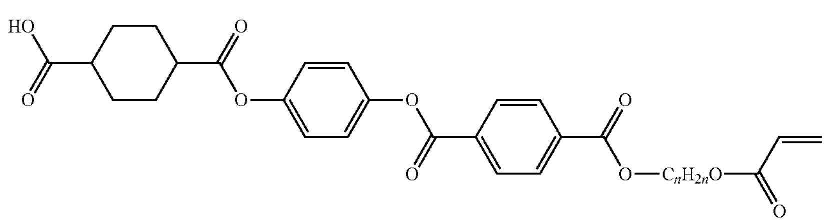

-continued
(R-49)
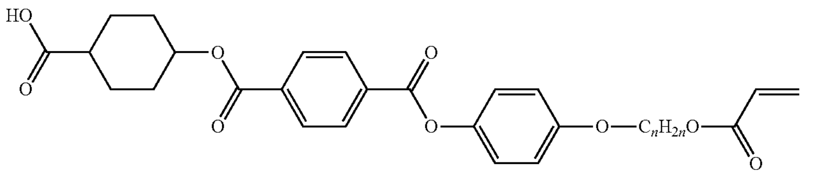
(R-50)
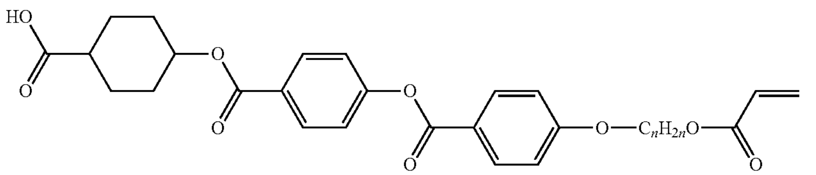
(R-51)
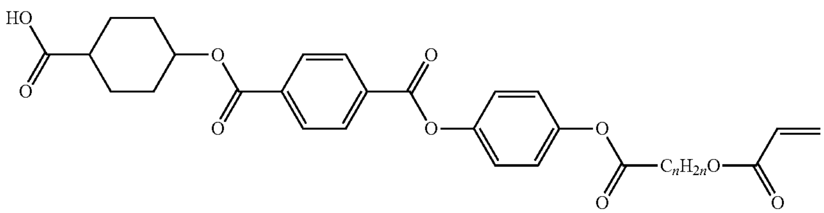
(R-52)
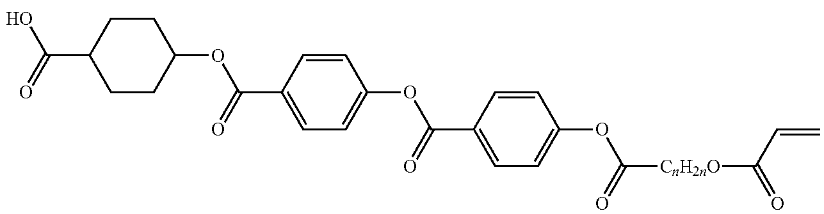
[Chemical Formula 222]
(R-53)
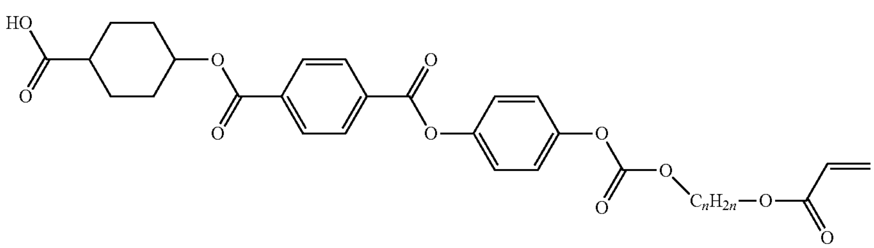
(R-54)
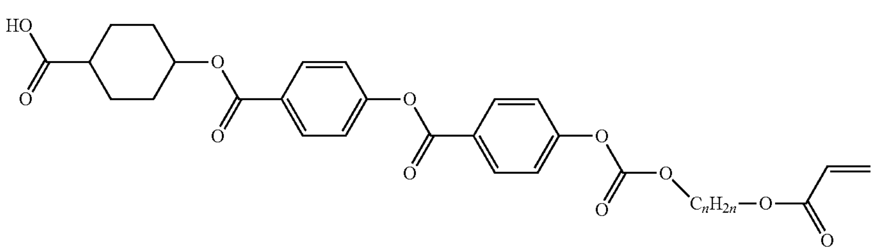
(R-55)
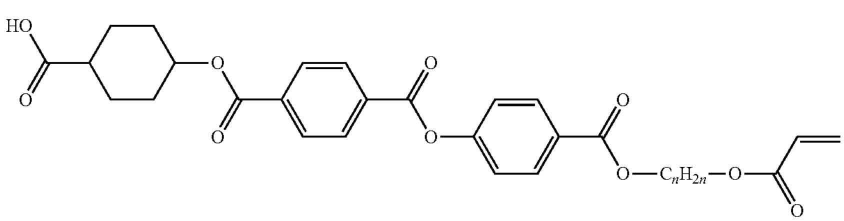

-continued
(R-56)
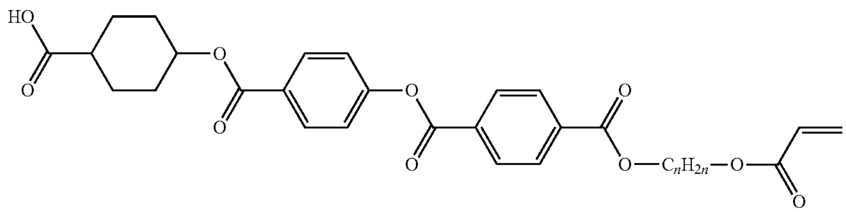
(R-57)
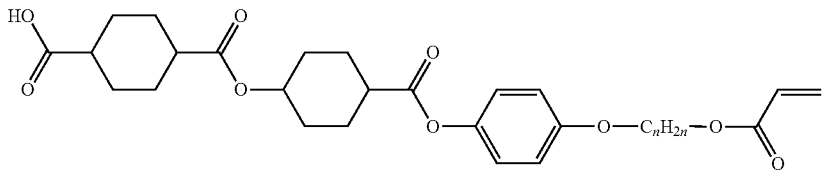
(R-58)
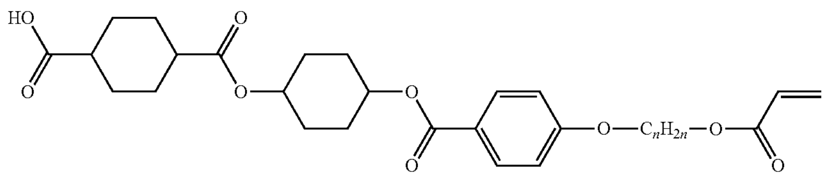
(R-59)
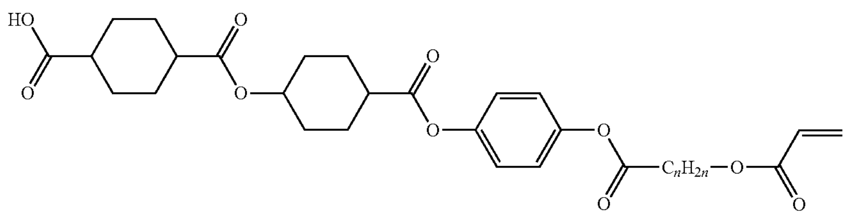
(R-60)
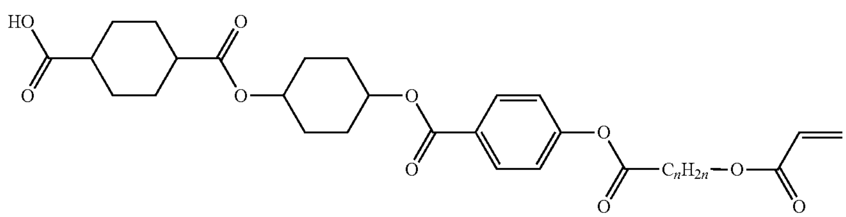
(R-61)
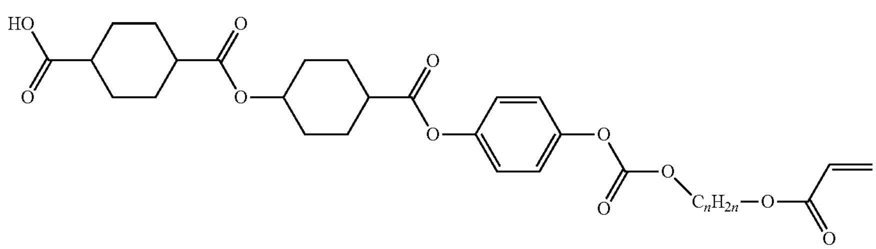
(R-62)
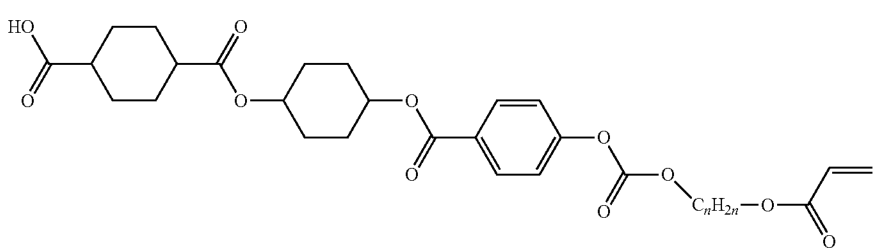

-continued
(R-63)
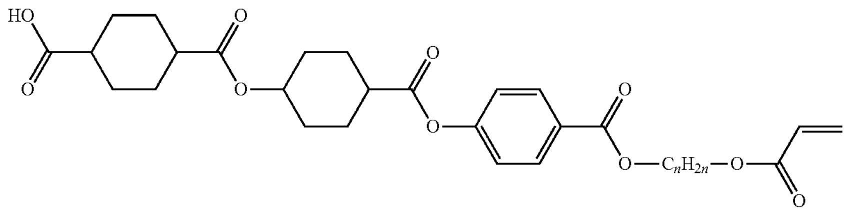
(R-64)
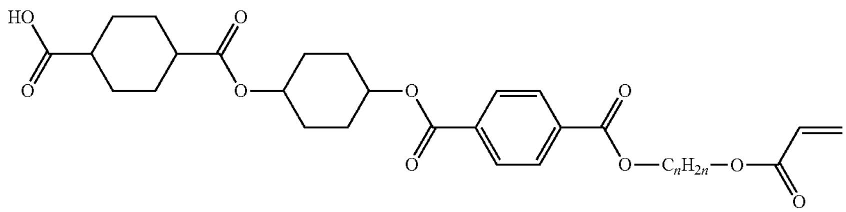
[Chemical Formula 223]
(R-65)
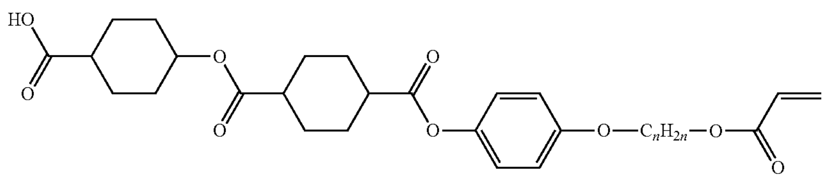
(R-66)
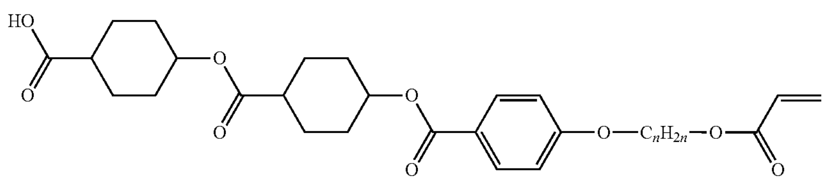
(R-67)
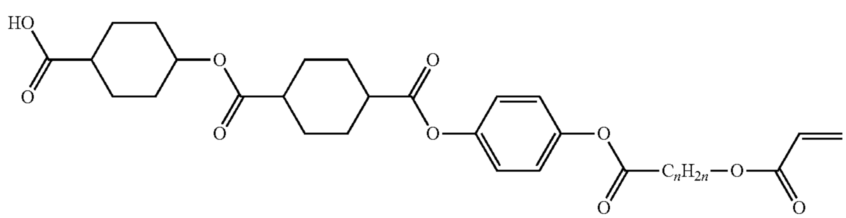
(R-68)
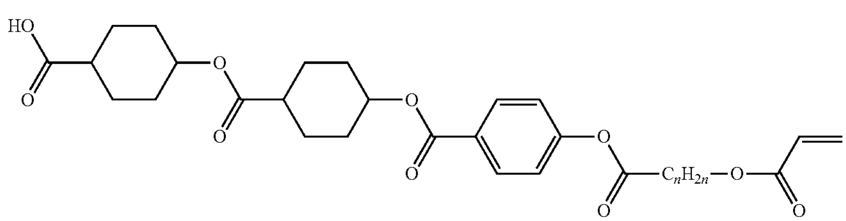
(R-69)
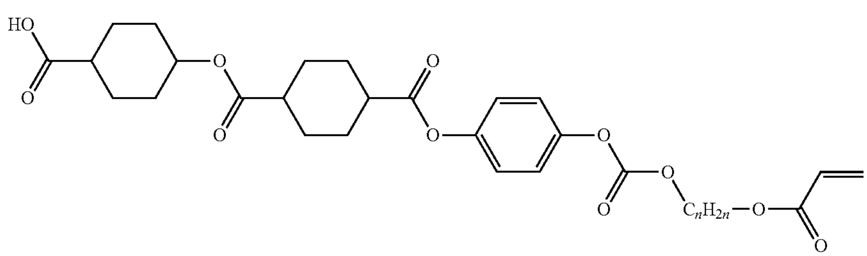

-continued
(R-70)
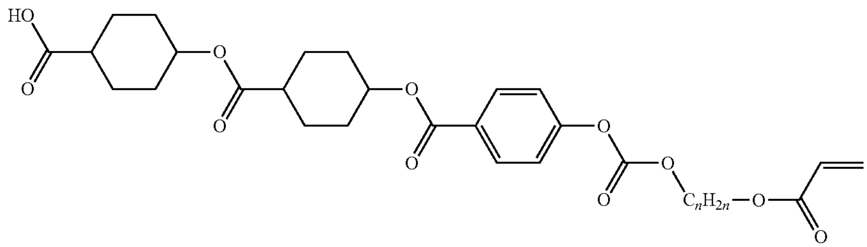
(R-71)
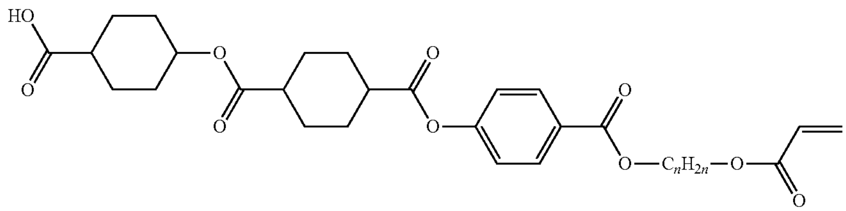
(R-72)
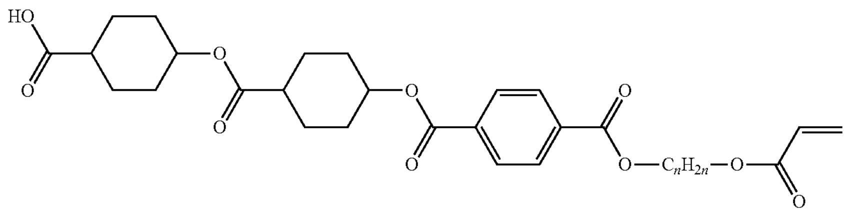
(R-73)
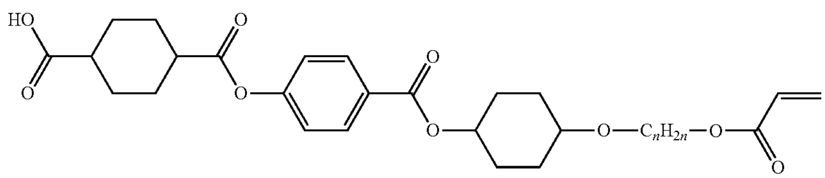
(R-74)
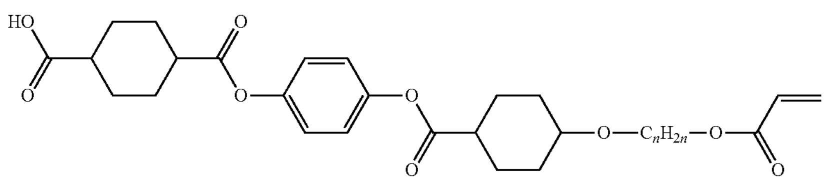
(R-75)
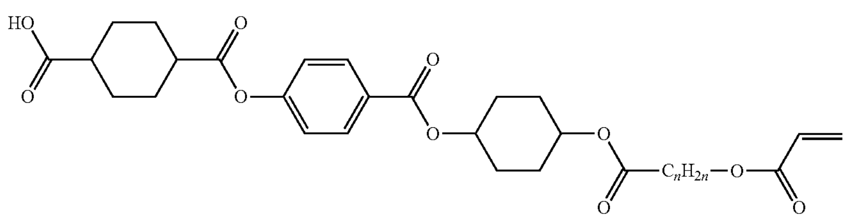
(R-76)
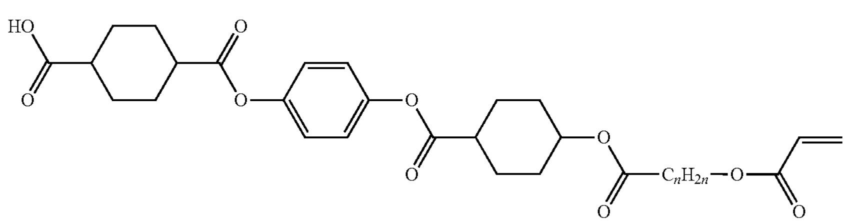

-continued
Chemical Formula 224]
(R-77)
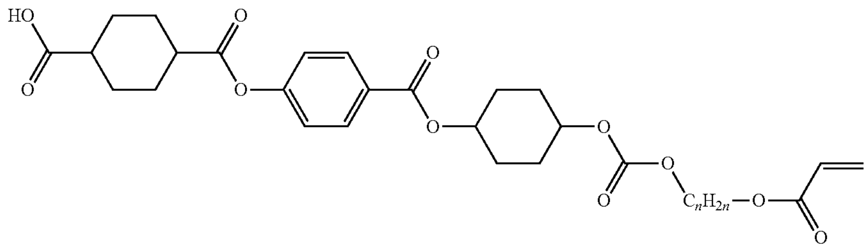
(R-78)
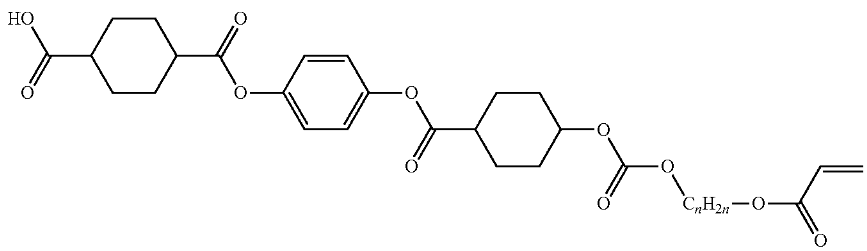
(R-79)
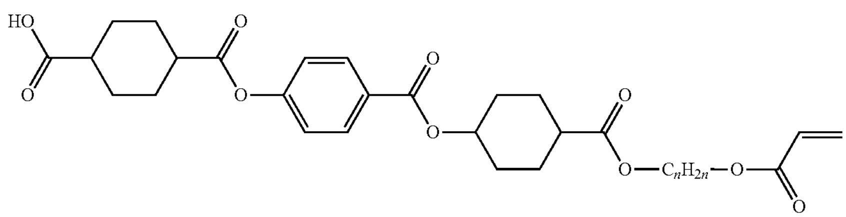
(R-80)
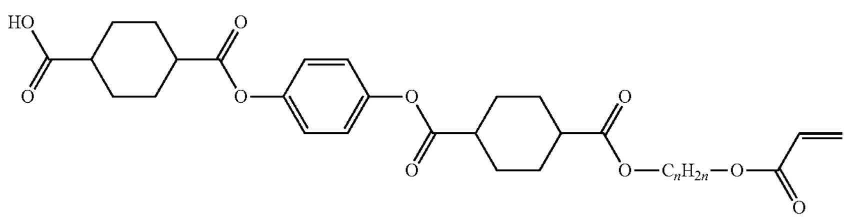
(R-81)
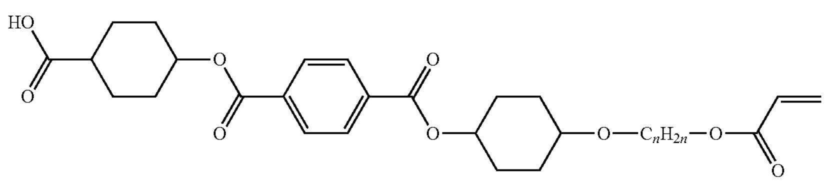
(R-82)
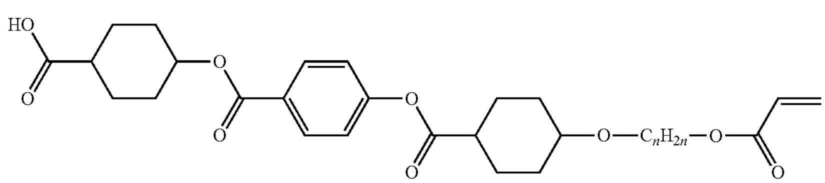
(R-83)
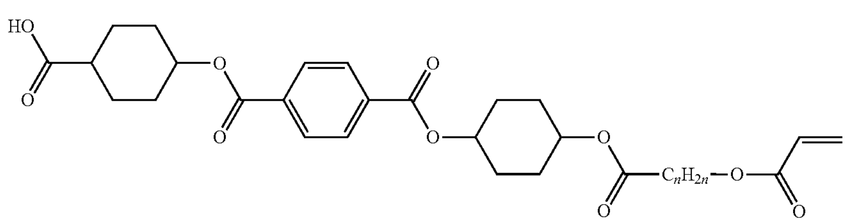

-continued
(R-84)
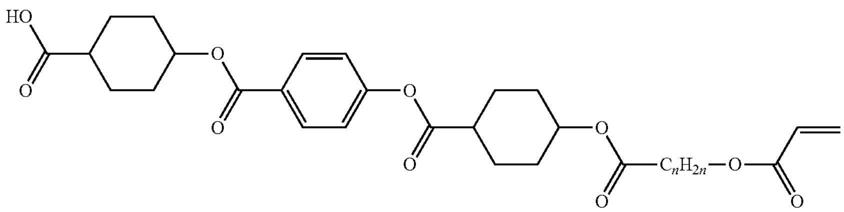
(R-85)
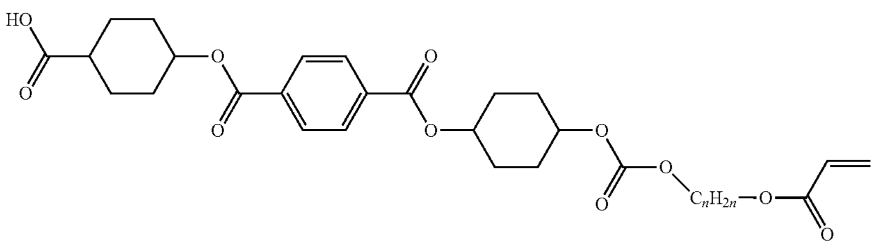
(R-86)
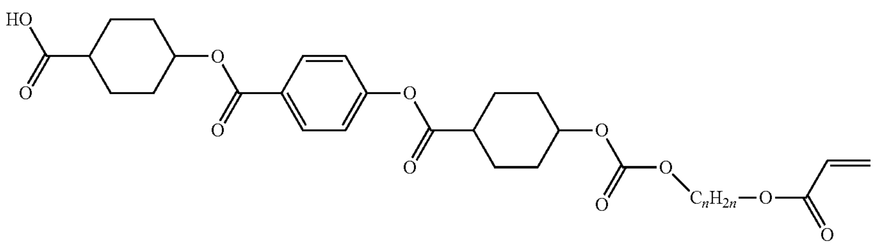
(R-87)
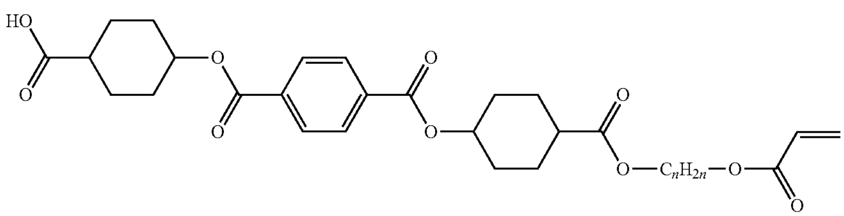
(R-88)
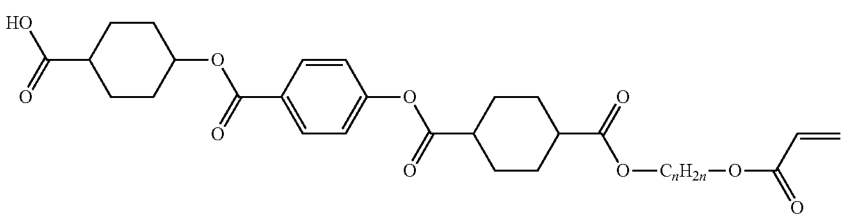
[Chemical Formula 225]
(R-89)
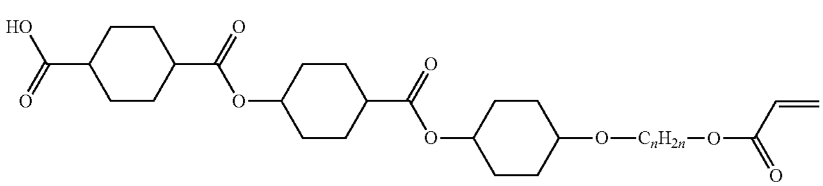
(R-90)
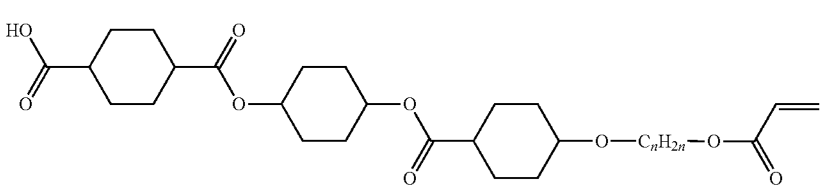

-continued
(R-91)
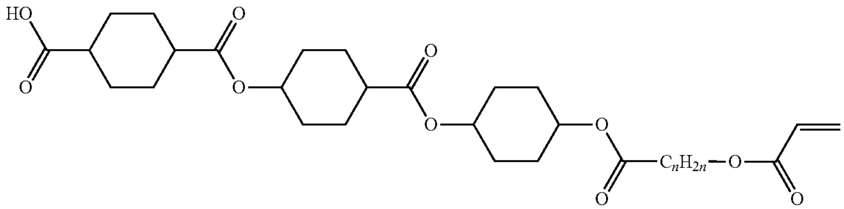
(R-92)
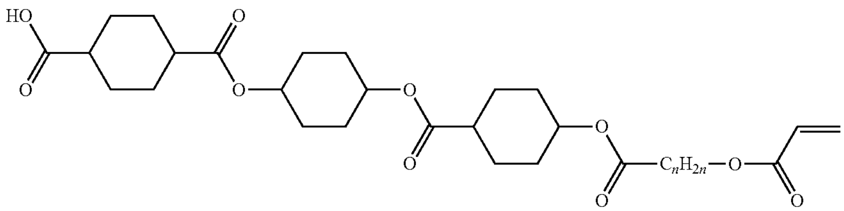
(R-93)
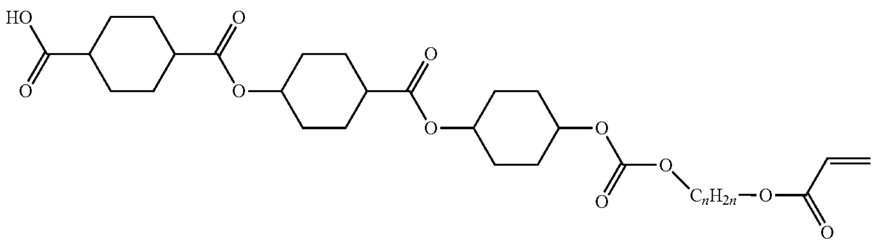
(R-94)
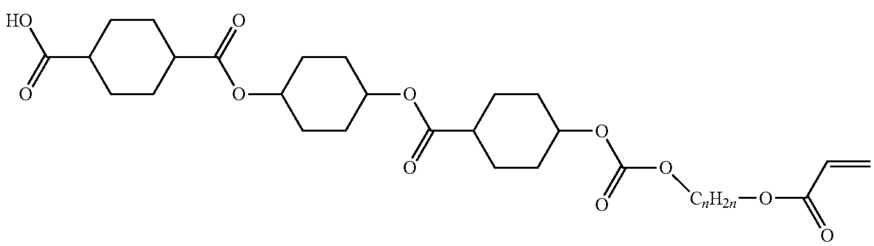
(R-95)
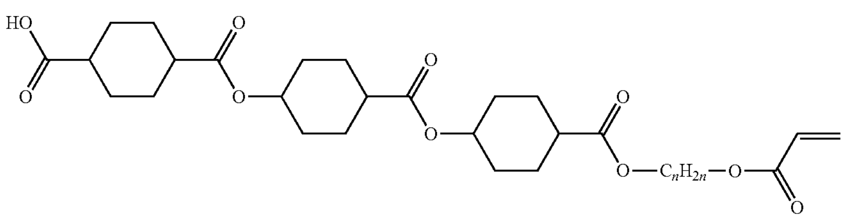
(R-96)
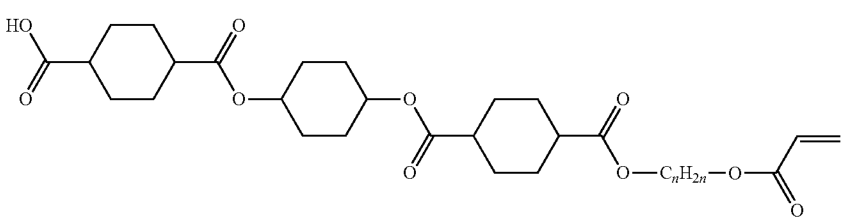
(R-97)
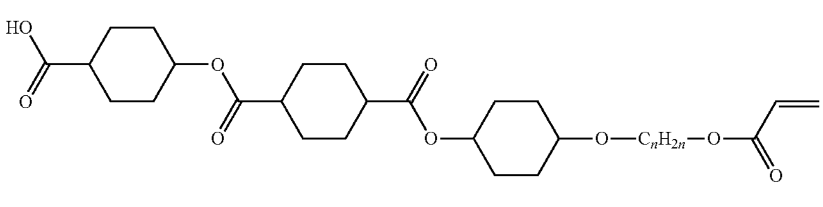

-continued
(R-98)
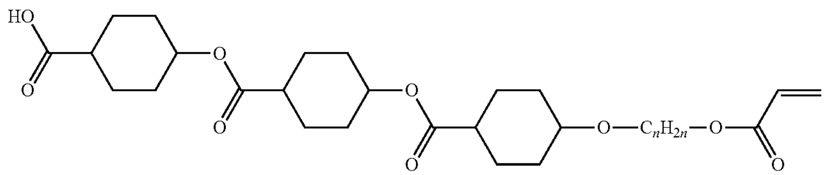
(R-99)
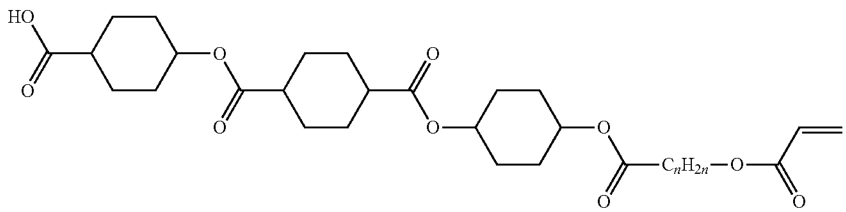
(R-100)
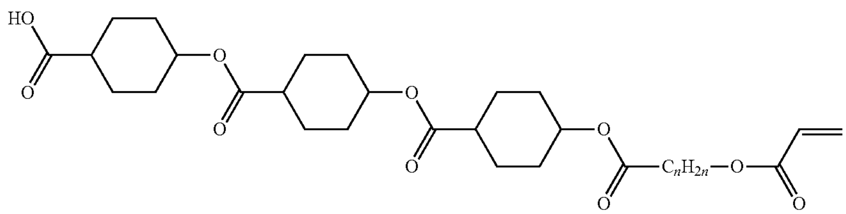
[Chemical Formula 226]
(R-101)
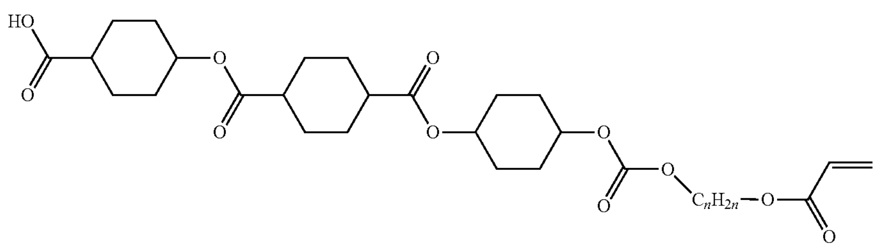
(R-102)
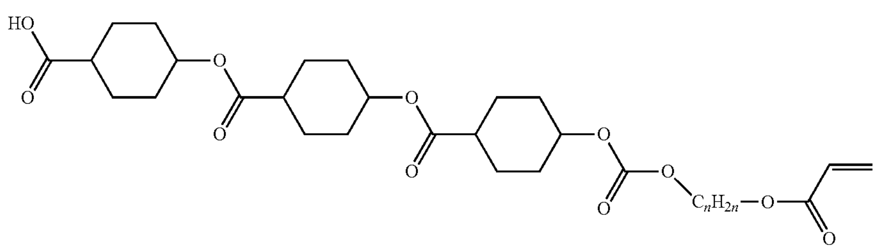
(R-103)
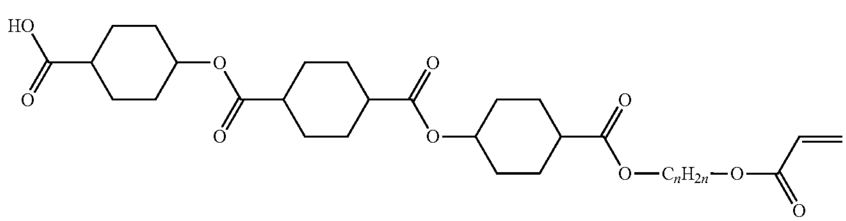
(R-104)
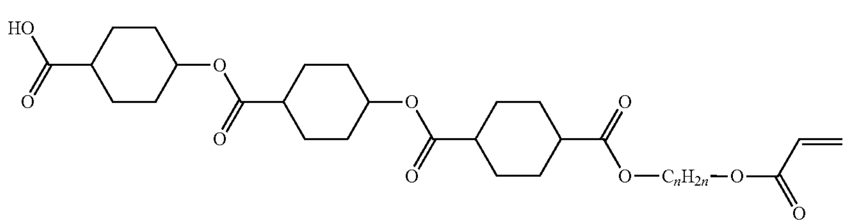

The esterification reaction between the alcohol compound (B) and the carboxylic acid compound (C) is preferably performed in the presence of a condensing agent. By carrying out the esterification reaction in the presence of a condensing agent, the esterification reaction can be carried out efficiently and quickly.

Examples of the condensing agent include carbodiimide compounds such as 1-cyclohexyl-3-(2-morpholinoethyl) carbodiimide meth-para-toluenesulfonate, dicyclohexylcarbodiimide, diisopropylcarbodiimide, 1-ethyl-3-(3-dimethylaminopropyl)carbodiimide, 1-ethyl-3-(3-dimethylaminopropyl) carbodiimide hydrochloride (water-soluble carbodiimide: commercially available as WSC), bis(2,6-diisopropylphenyl)carbodiimide and bis(trimethylsilyl)carbodiimide; 2-methyl-6-nitrobenzoic anhydride, 2,2'-carbonylbis-1H-imidazole, 1,1'-oxalyldimidazole, diphenylphosphoryl azide, 1(4-nitrobenzenesulfonyl)-1H-1,2,4-triazole, 1H-benzotriazol-1-yloxytripyrrolidinophosphonium hexafluorophosphate, 1H-benzotriazol-1-yloxytris(dimethylamino)phosphonium hexafluorophosphate, N,N,N',N'-tetramethyl-O—(N-succinimidyl)uronium tetrafluoroborate, N-(1,2,2,2-tetrachloroethoxycarbonyloxy)succinimide, N-carbobenzoxysuccinimide, O-(6-chlorobenzotriazol-1-yl)-N,N,N',N'-tetramethyluronium tetrafluoroborate, 0-(6-chlorobenzotriazol-1-yl)-N,N,N',N'-tetramethyluronium hexafluorophosphate, 2-bromo-1-ethylpyridinium tetrafluoroborate, 2-chloro-1,3-dimethylimidazolinium chloride, 2-chloro-1,3-dimethylimidazolinium hexafluorophosphate, 2-chloro-1-methylpyridinium iodide, 2-chloro-1-methylpyridinium p-toluenesulfonate, 2-fluoro-1-methylpyridinium p-toluenesulfonate and trichloroacetic acid pentachlorophenyl ester.

Of these, preferable are carbodiimide compounds, 2,2'-carbonylbis-1H-imidazole, 1,1'-oxalyldimidazole, diphenylphosphoryl azide, 1H-benzotriazol-1-yloxytripyrrolidinophosphonium hexafluorophosphate, 1H-benzotriazol-1-yloxytris(dimethylamino)phosphonium hexafluorophosphate, N,N,N',N'-tetramethyl-O—(N-succinimidyl)uronium tetrafluoroborate, N-(1,2,2,2-tetrachloroethoxycarbonyloxy)succinimide, 0-(6-chlorobenzotriazol-1-yl)-N,N,N',N'-tetramethyluronium hexafluorophosphate, 2-chloro-1,3-dimethylimidazolinium chloride, 2-chloro-1,3-dimethylimidazolinium hexafluorophosphate, 2-chloro-1-methylpyridinium iodide, and 2-chloro-1-methylpyridinium p-toluenesulfonate.

More preferable are carbodiimide compounds, 2,2'-carbonylbis-1H-imidazole, 1H-benzotriazol-1-yloxytripyrrolidinophosphonium hexafluorophosphate, 1H-benzotriazol-1-yloxytris(dimethylamino)phosphonium hexafluorophosphate, N,N,N',N'-tetramethyl-O—(N-succinimidyl)uronium tetrafluoroborate, 0-(6-chlorobenzotriazol-1-yl)-N,N,N',N'-tetramethyluronium hexafluorophosphate, 2-chloro-1,3-dimethylimidazolinium chloride, and 2-chloro-1-methylpyridinium iodide; and even more preferable are carbodiimide compounds from the viewpoint of economic advantages.

Of the carbodiimide compounds, preferable are dicyclohexylcarbodiimide, diisopropylcarbodiimide, 1-ethyl-3-(3-dimethylaminopropyl)carbodiimide, 1-ethyl-3-(3-dimethylaminopropyl)carbodiimide hydrochloric acid salt (water-soluble carbodiimide: commercially available as WSC), and bis(2,6-diisopropylphenyl)carbodiimide.

The amount of the condensing agent to be used is usually 2 to 4 mole per 1 mole of the alcohol compound (B).

In the esterification reaction, N-hydroxysuccinimide, benzotriazole, paranitrophenol, 3,5-dibutyl-4-hydroxytoluene and the like may be further added as an additive and mixed. The amount of the additive to be used is preferably 0.01 to 1.5 mole per 1 mole of the alcohol compound (B).

The esterification reaction may be performed in the presence of a catalyst. Examples of the catalyst include N,N-dimethylaminopyridine, N,N-dimethylaniline, and dimethylammonium pentafluorobenzenesulfonate. Among these, N,N-dimethylaminopyridine and N,N-dimethylaniline are preferable, and N,N-dimethylaminopyridine is more preferable. The amount of the catalyst to be used is preferably 0.01 to 0.5 mole per 1 mole of the alcohol compound (B).

The esterification reaction is usually performed in a solvent. Examples of the solvent include ketone solvents such as acetone, methyl ethyl ketone, cyclopentanone, cyclohexanone, methyl amyl ketone, and methyl isobutyl ketone; aliphatic hydrocarbon solvents such as pentane, hexane, and heptane; aromatic hydrocarbon solvents such as toluene, xylene, benzene, and chlorobenzene; nitrile solvents such as acetonitrile; ether solvents such as tetrahydrofuran and dimethoxyethane; ester solvents such as ethyl lactate; halogenated hydrocarbon solvents such as chloroform and dichloromethane; and nonprotic polar solvents such as dimethyl sulfoxide, N-methyl-2-pyrrolidone, N,N-dimethylformamide, N,N-dimethylacetamide, and hexamethylphosphoric triamide. These organic solvents may be used alone or in combination.

Of these, from the viewpoints of reaction yield and productivity, the solvent is preferably non-polar organic solvents such as pentane, hexane, heptane, toluene, xylene, benzene, chlorobenzene, chloroform, and dichloromethane, and more preferably toluene, xylene, benzene, chlorobenzene, chloroform, and dichloromethane. These organic solvents may be used alone or in combination.

The amount of the carboxylic acid compound (C) to be used is preferably 2 to 10 mole, more preferably 2 to 5 mole, further preferably 2 to 3 mole, per 1 mole of the alcohol compound (B).

The amount of the solvent to be used is preferably 0.5 to 50 parts by mass, more preferably 1 to 20 parts by mass, further preferably 2 to 10 parts by mass relative to 1 part by mass in total of the alcohol compound (B) and the carboxylic acid compound (C).

The temperature of the esterification reaction is preferably −20 to 120° C., more preferably −20 to 60° C., and further preferably −10 to 20° C. from the viewpoint of reaction yield and productivity. The esterification reaction time is preferably from 1 minute to 72 hours, more preferably from 1 to 48 hours, and even more preferably from 1 to 24 hours, from the viewpoints of reaction yield and productivity. A polymerizable liquid crystal compound can be obtained from the resulting suspension by a method such as filtration or decantation.

In the polymerizable liquid crystal composition of the present invention, a blending ratio of the polymerizable liquid crystal compound (A) and the polymerizable liquid crystal compound (B) can be appropriately determined so as to cancel an in-plane retardation change in a positive direction and an in-plane retardation change in a negative direction, based on the above-described optical characteristics exhibited by the individual polymerizable liquid crystal compounds to be used, that is, the value of ΔRe (450) obtained when the polymerizable liquid crystal compound is irradiated with ultraviolet rays under the above specific conditions. Since it is possible to effectively suppress the change in optical characteristics of the polymerizable liquid crystal composition during ultraviolet irradiation, the polymerizable liquid crystal composition of the present invention preferably contains the polymerizable liquid crystal compound (A) represented by the above formula (1) in an amount of preferably 5 to 80 mole, more preferably 7.5 to 70 mole, further preferably 10 to 70 mole, in particular with respect to 100 mole of the polymerizable liquid crystal compound (B) represented by the above formula (2).

In the polymerizable liquid crystal composition of the present invention, each of the polymerizable liquid crystal compounds (A) and (B) may be used alone or in combination of two or more. Furthermore, the polymerizable liquid crystal composition of the present invention may contain a polymerizable liquid crystal compound other than the polymerizable liquid crystal compounds (A) and (B). Examples of such a polymerizable liquid crystal compound include a polymerizable liquid crystal compound which does not have light absorption in the ultraviolet region and in which the retardation value does not change under the above-described ultraviolet irradiation conditions. Specific examples thereof include, but are not limited to, many polymerizable liquid crystal compounds exhibiting positive wavelength dispersibility. For example, it is possible to use compounds having a polymerizable group among the compounds described in "3.8.6 Network (Complete crosslink type)" and "6.5.1 Liquid crystal material b. Polymerizable nematic liquid crystal material" in "Liquid crystal handbook" (edited by editorial committee of Liquid crystal handbook, Maruzen Co., Ltd., Oct. 30, 2000). Commercially available products may be used as these polymerizable liquid crystal compounds.

When the polymerizable liquid crystal composition of the present invention contains a polymerizable liquid crystal compound other than the polymerizable liquid crystal compounds (A) and (B), the content of the polymerizable liquid crystal compound is preferably 40 parts by mass or less, more preferably 30 parts by mass or less, further preferably 20 parts by mass or less, relative to the total amount 100 parts by mass of the polymerizable liquid crystal compounds (A) and (B). If such a liquid crystal compound having a different molecular structure is included exceeding this range, a phase separation may occur, and an appearance may be remarkably impaired, thus it is not preferable. In one embodiment, the polymerizable liquid crystal composition of the present invention does not contain a polymerizable liquid crystal compound other than the polymerizable liquid crystal compounds (A) and (B).

The polymerizable liquid crystal composition of the present invention preferably contains a polymerization initiator. The polymerization initiator is a compound capable of generating a reactive species due to contribution of heat or light and initiating a polymerization reaction of a polymerizable liquid crystal or the like. Examples of the reactive species include active species such as radicals, cations or anions. Among these, from the viewpoint of ease of reaction control, a photopolymerization initiator that generates radicals by light irradiation is preferable.

Examples of the photo-polymerization initiator include benzoin compounds, benzophenone compounds, benzyl ketal compounds, α-hydroxyketone compounds, α-aminoketone compounds, triazine compounds, iodonium salts, and sulfonium salts. Specific examples thereof include IRGACURE (registered trademark) 907, IRGACURE 184, IRGACURE 651, IRGACURE 819, IRGACURE 250, IRGACURE 369, IRGACURE 379, IRGACURE 127, IRGACURE 2959, IRGACURE 754, IRGACURE 379EG (all manufactured by BASF Japan Ltd.); SEIKUOL BZ, SEIKUOL Z, and SEIKUOL BEE (all manufactured by Seiko Chemical Co., Ltd.); KAYACURE BP100 (manufactured by Nippon Kayaku Co., Ltd.); KAYACURE UVI-6992 (manufactured by the Dow Chemical Company); ADEKA OPTOMER SP-152, ADEKA OPTOMER SP-170, ADEKA OPTOMER N-1717, ADEKA OPTOMER N-1919, ADEKA ARKLS NCI-831, and ADEKA ARKLS NCI-930 (all manufactured by Adeka Corporation); and TAZ-A and TAZ-PP (all manufactured by Nihon Siber Hegner K.K.), and TAZ-104 (manufactured by Sanwa Chemical Co., Ltd.).

In the present invention, the polymerizable liquid crystal composition preferably contains at least one type of photopolymerization initiator, and more preferably contains one or two types of photopolymerization initiators.

The photopolymerization initiator can fully utilize energy emitted from a light source and is excellent in productivity. Therefore, a maximum absorption wavelength is preferably 300 nm to 400 nm, more preferably 300 nm to 380 nm, and particularly, α-acetophenone-based polymerization initiator and an oxime-based photopolymerization initiator are preferable.

Examples of α-acetophenone compounds include 2-methyl-2-morpholino-1-(4-methylsulfanylphenyl)propane-1-one, 2-dimethylamino-1-(4-morpholinophenyl)-2-benzylbutane-1-one and 2-dimethylamino-1-(4-morpholinophenyl)-2-(4-methylphenylmethyl)butan-1-one. More preferable examples include 2-methyl-2-morpholino-1-(4-methylsulfanylphenyl)propan-1-one and 2-dimethylamino-1-(4-morpholinophenyl)-2-benzylbutan-1-one. Examples of commercially available products of α-acetophenone compounds include IRGACURE 369, 379EG, 907 (all manufactured by BASF Japan Ltd.), and SEIKUOL BEE (manufactured by Seiko Chemical Co., Ltd.).

The oxime-based photopolymerization initiator generates a methyl radical by light irradiation. Polymerization of a polymerizable liquid crystal compound in a deep part of a liquid crystal cured layer to be formed suitably proceeds by the methyl radical. From the viewpoint of more efficiently proceeding the polymerization reaction in the deep part of the liquid crystal cured layer to be formed, it is preferable to use a photopolymerization initiator that can efficiently use ultraviolet rays having a wavelength of 350 nm or more. As the photopolymerization initiator that can efficiently use an ultraviolet ray having a wavelength of 350 nm or more, a triazine compound or an oxime ester carbazole compound is preferable, and an oxime ester carbazole compound is more preferable from the viewpoint of sensitivity. Example of the oxime ester carbazole compound include 1,2-octanedione, 1-[4-(phenylthio)-2-(O-benzoyloxime)], ethanone, and 1-[9-ethyl-6-(2-methylbenzoyl)-9H-carbazole-3-yl]-1-(O-acetyloxime). Examples of commercially available products of the oxime ester carbazole compound include IRGACURE OXE-01, IRGACURE OXE-02, and IRGACURE OXE-03 (all manufactured by BASF Japan Ltd.), and ADEKA OPTOMER N-1919 and ADEKA ARKLS NCI-831 (all manufactured by Adeka Corporation).

The addition amount of the photopolymerization initiator is usually 0.1 parts by mass to 30 parts by mass, preferably 1 part by mass to 20 parts by mass, more preferably 1 part by mass to 15 parts by mass based on 100 parts by mass of the polymerizable liquid crystal compound. If the amount is in the above range, reaction of a polymeric group will fully proceed, and alignment of a polymerizable liquid crystal compound is hardly disturbed.

When a polymerization inhibitor is added, the polymerization reaction of the polymerizable liquid crystal compound can be controlled. Examples of the polymerization inhibitor include hydroquinone or hydroquinones having a substituent such as alkyl ether; catechols having a substituent including alkyl ether such as butyl catechol; pyrogallols;

a radical scavenger such as 2,2,6,6-tetramethyl-1-piperidinyloxy radical; thiophenols; R-naphthylamines and R-naphthols. In order to polymerize the polymerizable liquid crystal compound without disturbing the alignment of the polymerizable liquid crystal compound, the content of the polymerization inhibitor, the content of the polymerization inhibitor is 0.01 to 10 parts by mass, preferably 0.1 to 5 parts by mass, more preferably 0.1 to 3 parts by mass based on 100 parts by mass of the polymerizable liquid crystal compound.

In addition, the sensitivity of the photopolymerization initiator can be increased by using a sensitizer. Examples of the photosensitizer include xanthones such as xanthone and thioxanthone; anthracene and anthracenes having a substituent such as alkyl ether; phenothiazine; and rubrene. Examples of the photosensitizer include xanthones such as xanthone and thioxanthone; anthracene and anthracenes having a substituent such as alkyl ether; phenothiazine; and rubrene. The content of the photosensitizer is usually 0.01 to 10 parts by mass, preferably 0.05 to 5 parts by mass, more preferably 0.1 to 3 parts by mass based on 100 parts by mass of the polymerizable liquid crystal compound.

The polymerizable liquid crystal composition of the present invention may further contain a leveling agent. The leveling agent is an additive having a function of adjusting fluidity of a polymerizable liquid crystal composition so as to further level a film to be obtained by application of the composition, and examples include silicone-based, polyacrylate-based and perfluoroalkyl-based leveling agents. Specific examples include DC3PA, SH7PA, DC11PA, SH28PA, SH29PA, SH30PA, ST80PA, ST86PA, SH8400, SH8700 and FZ2123 (all manufactured by Dow Corning Toray Co., Ltd.); KP321, KP323, KP324, KP326, KP340, KP341, X22-161A and KF6001 (all manufactured by Shin-Etsu Chemical Co., Ltd.); TSF400, TSF401, TSF410, TSF4300, TSF4440, TSF4445, TSF-4446, TSF4452 and TSF4460 (all manufactured by Momentive Performance Materials Inc.), FLUORINERTs (registered trademark) FC-72, FC-40, FC-43 and FC-3283 (all manufactured by Sumitomo 3M Limited); MEGAFACs (registered trademark) R-08, R-30, R-90, F-410, F-411, F-443, F-445, F-470, F-477, F-479, F-482 and F-483 (all manufactured by DIC Corporation); EFTOPs (trade name) EF301, EF303, EF351 and EF352 (all manufactured by Mitsubishi Materials Electronic Chemicals Co., Ltd.); SURFLONs (registered trademark)S-381, S-382, S-383, S-393, SC-101, SC-105, KH-40 and SA-100 (all manufactured by AGC Seimi Chemical Co., Ltd.); E1830 and E5844 (trade names) (manufactured by Daikin Fine Chemical Laboratory Co., Ltd.); and BM-1000, BM-1100, BYK-352, BYK-353 and BYK-361N (trade names) (manufactured by BM Chemie GmbH). Among these, polyacrylate-based leveling agent and perfluoroalkyl-based leveling agent are preferable.

The content of the leveling agent in the polymerizable liquid crystal composition is preferably 0.01 parts by mass to 5 parts by mass, more preferably 0.05 parts by mass to 3 parts by mass, based on 100 parts by mass of the polymerizable liquid crystal compound. When the content of the leveling agent is within the above range, it is made easy to horizontally orientate the polymerizable liquid crystal compound, and a liquid crystal cured layer to be obtained tends to be smoother, thus it is preferable. The polymerizable liquid crystal composition may contain two or more types of leveling agents.

<Retardation Plate>

As described above, by containing a polymerizable liquid crystal compound in which the retardation value changes in the positive direction by ultraviolet irradiation under specific conditions and at least two types of polymerizable liquid crystal compounds in which the retardation value changes in the negative direction, the changes in optical characteristics of individual polymerizable liquid crystal compounds at the time of ultraviolet irradiation can be canceled to suppress the changes in optical characteristics as a polymerizable liquid crystal composition at the time of ultraviolet irradiation. Thus, such a polymerizable liquid crystal composition can give a highly polymerized liquid crystal cured layer that hardly changes in optical performance even when irradiated with high-intensity ultraviolet rays. Therefore, the present invention is a retardation plate composed of a liquid crystal cured layer containing monomer units derived from two or more types of polymerizable liquid crystal compounds. In this retardation plate, at least one type of the polymerizable liquid crystal compounds is the polymerizable liquid crystal compound (A) in which a polymer of the polymerizable liquid crystal compound exhibits the reverse wavelength dispersibility in an alignment state, and with respect to the retardation value [R(A, 500, 450)] at a wavelength of 450 nm measured after irradiation of the polymerizable liquid crystal compound in the alignment state with ultraviolet rays of 500 mJ, the retardation value [R(A, 3000, 450)] at a wavelength of 450 nm measured after irradiation with ultraviolet rays of 3000 mJ changes in the positive direction. At least one type of the polymerizable liquid crystal compounds is the polymerizable liquid crystal compound (B) in which a polymer of the polymerizable liquid crystal compound exhibits the reverse wavelength dispersibility in an alignment state, and with respect to a retardation value [R(B, 500, 450)] at a wavelength of 450 nm measured after irradiation of the polymerizable liquid crystal compound in the alignment state with ultraviolet rays of 500 mJ, a retardation value [R(B, 3000, 450)] at a wavelength of 450 nm measured after irradiation with ultraviolet rays of 3000 mJ changes in the negative direction. The retardation plate composed of the liquid crystal cured layer has a high optical performance and serves as a retardation plate that hardly changes in performance even under a severe environment.

The liquid crystal cured layer constituting the retardation plate of the present invention may be composed of a homopolymer of the polymerizable liquid crystal compound (A) in the alignment state and a homopolymer of the polymerizable liquid crystal compound (B), or may be composed of a copolymer in the alignment state of the mixture of the polymerizable liquid crystal compounds (A) and (B). The polymerization reaction is easy, and it is easy to obtain a uniform liquid crystal cured layer; therefore, the liquid crystal cured layer containing monomer units derived from two or more types of polymerizable liquid crystal compounds constituting the retardation plate of the present invention is preferably composed of the copolymer in the alignment state of the mixture of the polymerizable liquid crystal compounds (A) and (B).

In the retardation plate of the present invention, examples of the polymerizable liquid crystal compounds (A) and (B) used for forming the liquid crystal cured layer include similar ones to the polymerizable liquid crystal compounds (A) and (B) constituting the polymerizable liquid crystal composition of the present invention described above. In the present invention, to the polymerizable liquid crystal compounds (A) and (B), as necessary, an additive such as a polymerization initiator, a polymerization inhibitor, a photosensitizer, or a leveling agent was added to prepare a polymerizable liquid crystal composition. The polymerizable liquid crystal composition is cured in the alignment state, whereby a liquid crystal cured layer containing monomer units derived from the two or more types of polymerizable liquid crystal compounds can be formed. As additives such as a polymerization initiator, a polymerization inhibitor, a photosensitizer and a leveling agent, the same ones as described above in the description of the polymerizable composition of the present invention can be used. Therefore, in the retardation plate of the present invention, the liquid crystal cured layer containing monomer units derived from the two or more types of polymerizable liquid crystal compounds is preferably composed of a polymer in an alignment state of the polymerizable liquid crystal composition of the present invention.

In the retardation plate of the present invention, a three-dimensional refractive index ellipsoid formed by the liquid crystal cured layer preferably has uniaxiality. The three-dimensional refractive index ellipsoid having uniaxiality means that, for example, when refractive indexes in biaxial directions perpendicular to each other in a liquid crystal cured layer surface are nx and ny and a refractive index in the thickness direction is nz, a relationship of the refractive indexes in the respective axial directions satisfies a relationship of $nx<ny\approx nz$ or $nx>ny\approx nz$. Usually, by using a polymerizable liquid crystal compound having a rod-like molecular shape, a liquid crystal cured layer in which a three-dimensional refractive index ellipsoid has uniaxiality can be obtained.

In the uniaxial three-dimensional refractive index ellipsoid, when a main refractive index in the axial direction is ne and a refractive index in an arbitrary direction in a plane perpendicular to the main refractive index is no, it is preferable that the direction of ne be a direction parallel to a plane of the liquid crystal cured layer (so-called positive A layer), or the direction of ne be a direction perpendicular to the plane of the liquid crystal cured layer (so-called positive C layer). A liquid crystal cured layer having a desired alignment can be easily obtained by selecting a type of alignment film used for curing the polymerizable liquid crystal composition, rubbing conditions, irradiation conditions, and the like.

The retardation plate of the present invention preferably has optical characteristics represented by the following formulas (I) and (II):

$$Re(450)/Re(550)\leq 1.00 \quad (I)$$

$$1.00\leq Re(650)/Re(550) \quad (II)$$

[wherein Re(λ) represents a retardation value at a wavelength λ, and is represented by $Re=(ne(\lambda)-no(\lambda))\times d$, and d represents the thickness of the liquid crystal cured layer.]

When the above formulas (I) and (II) are satisfied, this means that the liquid crystal cured layer has reverse wavelength dispersibility in which an in-plane retardation value at a short wavelength is larger than an in-plane retardation value at a long wavelength.

In the present invention, a theoretical value of Re (450)/Re (550) is 0.82 (=450/550), and if Re (450)/Re (550) is a value close to the theoretical value, circularly polarized light conversion is possible in a short wavelength range around 450 nm. Since light omission in the short wavelength range can be suppressed, the value is usually 0.78 or more and 0.87 or less, preferably 0.78 or more and 0.86 or less, more preferably 0.78 or more and 0.85 or less.

For example, by using the polymerizable liquid crystal compound (A) and the polymerizable liquid crystal compound (B), both of which are compounds exhibiting reverse wavelength dispersibility, a liquid crystal cured layer satisfying the above formulas (I) and (II) can be obtained. Preferably, all of the two or more types of polymerizable liquid crystal compounds contained in the polymerizable liquid crystal composition of the present invention may be polymerizable liquid crystal compounds exhibiting reverse wavelength dispersibility. The reverse wavelength dispersibility of the polymerizable liquid crystal compound can be confirmed by mixing the polymerizable liquid crystal compound and a polymerization initiator with a solvent to prepare a coating liquid, applying the coating liquid onto a substrate to obtain a coating film, polymerizing the coating film to obtain a liquid crystal cured layer, and evaluating wavelength dispersibility of the obtained liquid crystal cured layer. If this liquid crystal cured film satisfies formulas (I) and (II), reverse wavelength dispersibility is exhibited.

When the retardation plate has the above-described optical characteristics, that is, when a three-dimensional refractive index ellipsoid formed by a liquid crystal cured layer has uniaxiality and when the main refractive index in the axial direction is ne and the refractive index in an arbitrary direction in the plane perpendicular to the main refractive index is no, the direction of ne is a direction parallel or perpendicular to a plane of the liquid crystal cured layer. The retardation plate of the present invention having the optical characteristics represented by the above formulas (I) and (II) can be produced by, for example, using the polymerizable liquid crystal compound (A) represented by the above formula (1) and the polymerizable liquid crystal compound (B) represented by the above formula (2).

The retardation plate of the present invention can be manufactured by the following method, for example.

First, as necessary, additives such as a polymerization initiator, a polymerization inhibitor, a photosensitizer, or a leveling agent are added to the polymerizable liquid crystal compounds (A) and (B) to prepare a polymerizable liquid crystal composition.

The viscosity of the polymerizable liquid crystal composition is preferably adjusted to, for example, 10 Pa·s or less, preferably about 0.1 to 7 Pa·s so that the polymerizable liquid crystal composition can be easily applied. The viscosity of the polymerizable liquid crystal composition can be adjusted by the content of a solvent.

The solvent is preferably a solvent which can dissolve the polymerizable liquid crystal compound and is preferably a solvent which is inactive on the polymerization reaction of the polymerizable liquid crystal compound.

Examples of the solvent include water, alcohol solvents such as methanol, ethanol, ethylene glycol, isopropyl alcohol, propylene glycol, ethylene glycol methyl ether, ethylene glycol butyl ether, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, 2-heptanone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; chlorine-containing solvents such as chloroform and chlorobenzene; and an amide type solvent such as dimethylacetamide, dimethylformamide or N-methyl-2-pyrrolidone, and 1,3-dimethyl-2-imidazolidinone. These solvents may be used alone, or two or more types of them may be used in combination. Among these, alcohol solvents, ester solvents, ketone solvents, chlorine-containing solvents, amide type solvents, and aromatic hydrocarbon solvents are preferable.

The content of the solvent in 100 parts by weight of the coating liquid obtained by adding the solvent to the polymerizable liquid crystal composition is preferably 50 to 98 parts by mass, more preferably 70 to 95 parts by weight. Accordingly, a solid content concentration in the coating liquid of the polymerizable liquid crystal composition is preferably 2 to 50% by mass, more preferably 5 to 30%, and further preferably 5 to 15%. When the solid matter of the coating liquid is equal to or less than the above upper limit, the viscosity of the coating liquid of the polymerizable liquid crystal composition becomes low, so that the thickness of the liquid crystal cured layer obtained by applying the coating liquid becomes substantially uniform, and there is a tendency that unevenness hardly occurs in the liquid crystal cured layer. When the solid matter is equal to or more than the above lower limit, the retardation plate does not become too thin, and a birefringence index necessary for optical compensation of a liquid crystal panel tends to be provided. The solid matter can be appropriately determined in consideration of the thickness of the liquid crystal cured layer to be produced. The "solid matter" used herein refers to a component obtained by removing a solvent from a polymerizable liquid crystal composition.

Subsequently, an unpolymerized liquid crystal layer is obtained by applying the coating liquid of the polymerizable liquid crystal composition on a support substrate and drying the coating liquid. When the unpolymerized liquid crystal layer exhibits a liquid crystal phase such as a nematic phase, a retardation plate to be obtained has birefringence due to monodomain alignment.

By appropriately adjusting the content of the polymerizable liquid crystal compounds (A) and (B) in the polymerizable liquid crystal composition, the coating amount on the support substrate, and the concentration, the film thickness can be adjusted to give a desired retardation. When the amount of the polymerizable liquid crystal compounds (A) and (B) is constant, a retardation value (Re(λ)) of a retardation plate to be obtained is determined as in formula (III); therefore, a film thickness d may be adjusted in order to obtain a desired Re(λ).

$$Re(\lambda)=d\times\Delta n(\lambda) \qquad \text{(III)}$$

(wherein Re(λ) represents a retardation value at a wavelength λnm, d represents a film thickness, and Δn(A) represents a birefringence at a wavelength λnm.)

Examples of the support substrate include a glass substrate and a film substrate. From the viewpoint of workability, a film substrate is preferable, and a long-roll film is more preferable in that it can be continuously produced.

Examples of the resin constituting the film substrate include polyolefins such as polyethylene, polypropylene, and norbornene-based polymer; a cycloolefin-based resin; polyvinyl alcohol; polyethylene terephthalate; a polymethacrylic acid ester; a polyacrylic acid ester; cellulose esters such as triacetyl cellulose, diacetyl cellulose, and cellulose acetate propionate; and plastics such as polyethylene naphthalate; polycarbonate; polysulfone; polyether sulfone; polyether ketone; polyphenylenesulfide and polyphenylene oxide.

A commercially available product may be used as the support substrate. Examples of commercially available cellulose ester substrates include "Fujitac film" (manufactured by FUJIFILM Corporation), "KC8UX2M", "KC8UY", and "KC4UY" (all manufactured by Konica Minolta Opto Products Co., Ltd.).

Examples of the commercially available cycloolefin-based resin include "Topas" (registered trademark) (manufactured by Ticona), "ARTON" (registered trademark) (manufactured by JSR Corporation), "ZEONOR" (registered trademark) and "ZEONEX" (registered trademark) (all manufactured by Zeon Corporation), and "APEL" (registered trademark) (manufactured by Mitsui Chemicals, Inc.). Such a cycloolefin-based resin can be formed into a film by a conventional means such as a solvent casting method or a melt extrusion method to obtain a substrate. Commercially available cycloolefin-based resin substrates can also be used. Examples of the commercially available cycloolefin-based resin substrate include "Escena" (registered trademark), "SCA40" (registered trademark) (all manufactured by Sekisui Chemical Co., Ltd), "ZEONOR film" (registered trademark) (manufactured by Optes Co., Ltd.), and "ARTON film" (registered trademark) (manufactured by JSR Corporation).

The thickness of the substrate is preferable as it is thinner in terms of the mass adequate for practical handling, but if it is too thin, the strength tends to be low and the processability tends to be inferior. The thickness of the substrate is usually 5 μm to 300 μm, and preferably 20 μm to 200 μm. A further film-thinning effect is obtained by peeling a substrate and transferring only a polymer in the alignment state of a polymerizable liquid crystal compound.

For example, even in a process that requires the strength of the retardation plate, such as a retardation plate attachment process, a transportation process, and a storage process in the present invention, by using the support substrate, breakage and the like can be prevented, and the retardation plate can be easily handled.

It is preferable to form an alignment film on the support substrate and apply a coating liquid of a polymerizable liquid crystal composition on the alignment film. The polymerizable liquid crystal compound can be aligned in a desired direction by using an alignment film, and various controls can be performed on vertical alignment, horizontal alignment, hybrid alignment, tilt alignment, etc. by selecting the type of the alignment film, rubbing conditions, and light irradiation conditions. When the polymerizable liquid crystal composition of the present invention is applied, the alignment film preferably has solvent resistance that the composition is not dissolved in a coating liquid of the polymerizable liquid crystal composition. Further, the alignment film preferably has heat resistance when a solvent is removed or during heat treatment of alignment. Further, it is preferable that the alignment film is not peeled by friction or the like during rubbing. Furthermore, the alignment film is preferably composed of an orientational polymer or a composition containing an orientational polymer.

In order to obtain a liquid crystal cured layer that is a positive A layer, an alignment film (hereinafter, also referred to as "horizontal alignment film") that exhibits an alignment regulating force in the horizontal direction is applied. Examples of such a horizontal alignment film include a rubbing alignment film, a photo-alignment film, and a groove alignment film having irregular patterns or a plurality of grooves on the surface. When the alignment film is applied to a long-roll film, a photo-alignment film is preferable in that the alignment direction can be easily controlled.

An alignment polymer can be used for the rubbing alignment film. Examples of the orientational polymer include polyamide and gelatins having an amide bond, polyimide having an imide bond and a polyamic acid which is a hydrolyzed product of the polyimide, polyvinyl alcohol, alkyl-modified polyvinyl alcohol, polyacrylamide, polyoxazole, polyethyleneimine, polystyrene, polyvinyl pyrrolidone, polyacrylic acid, and a polyacrylic acid esters. Two or more types of the orientational polymers may be combined.

In a rubbing alignment film, usually, a composition (hereinafter, also referred to as an orientational polymer composition) in which an orientational polymer is dissolved in a solvent is applied to a substrate, the solvent is removed to form a coating film, and the coating film is rubbed, so that alignment regulating force can be applied.

The concentration of the orientational polymer in the orientational polymer composition may be in a range where the orientational polymer is completely dissolved in the solvent. The content of the orientational polymer with respect to the orientational polymer composition is preferably 0.1 to 20% by mass, more preferably 0.1 to 10% by mass.

The orientational polymer composition can also be obtained from the market. Examples of the commercially available orientational polymer composition include SUNEVER (registered trademark, manufactured by Nissan Chemical Industries, Ltd.) and OPTOMER (registered trademark, manufactured by JSR Corporation).

Examples of methods of application of the orientational polymer composition to the substrate include the same method as the above-described method of applying the polymerizable liquid crystal composition onto the support substrate. Examples of the method of removing the solvent contained in the orientational polymer composition include a natural drying method, a ventilation drying method, heat drying, and a reduced-pressure drying method.

Examples of a rubbing treatment method include a method in which the coating film is brought into contact with a rolling rubbing roll wrapped with a rubbing cloth. In the rubbing treatment, it is also possible to form an alignment film having multiple areas (patterns) with different alignment directions by a masking treatment.

The photo-alignment film is usually obtained by applying a composition for forming a photo-alignment film containing a photo-reactive group-containing polymer or monomer and a solvent to a substrate, removing a solvent, and then irradiating the composition with polarized light (preferably, polarized UV). In the photo-alignment film, the direction of the alignment regulating force can be arbitrarily controlled by selecting the polarization direction of polarized light to be irradiated.

The photo-reactive group refers to a group which generates orientating ability by light irradiation. Specific examples thereof include a group involved in a photoreaction as a source of the orientating force such as orientation-induced reaction, isomerization reaction, photodimerization reaction, photocrosslinking reaction or photodegradation reaction. The photo-reactive group preferably has an unsaturated bond, particularly a double bond, and particularly preferably at least one bond selected from the group consisting of a carbon-carbon double bond (C═C bond), a carbon-nitrogen double bond (C═N bond), a nitrogen-nitrogen double bond (N═N bond), and a carbon-oxygen double bond (C═O bond).

Examples of the photo-reactive group having a C═C bond include a vinyl group, a polyene group, a stilbene group, a stilbazole group, a stilbazolium group, a chalcone group, and a cinnamoyl group. Examples of the photo-reactive group having a C═N bond include groups having a structure of an aromatic Schiff base, an aromatic hydrazone, etc. Examples of the photo-reactive group having a N═N bond include an azobenzene group, an azonaphthalene group, an aromatic heterocyclic azo group, a bisazo group, a formazan group, and a group having a structure of azoxybenzene. Examples of the photo-reactive group having a C═O bond include a benzophenone group, a coumarin group, an anthraquinone group, and a maleimide group. These groups may have a substituent group such as an alkyl group, an alkoxy group, an aryl group, an allyloxy group, a cyano group, an alkoxycarbonyl group, a hydroxyl group, a sulfonic acid group, or a halogenated alkyl group.

A photo-reactive group involved in photodimerization reaction or photo-crosslinking reaction is preferable because it is excellent in orientation. Among them, a photo-reactive group involved in photo-dimerization reaction is preferable, and a cinnamonyl group and a chalcone group are preferable in that the polarized light irradiation dose necessary for orientation is relatively low and a photo-alignment film excellent in heat stability and stability with lapse of time is easily obtained. The photo-reactive group-containing polymer particularly preferably has a cinnamonyl group so that a cinnamic acid structure or a cinnamic acid ester structure is formed at a terminal portion of the polymer side chain.

The content of the photo-reactive group-containing polymer or monomer in the composition for forming a photo-alignment film can be adjusted depending on the type of the polymer or monomer and the thickness of an objective photo-alignment film; however, it is preferably at least 0.2% by mass or more and more preferably in a range of 0.3 to 10% by mass.

Examples of methods of application of the composition for forming a photo-alignment film to the substrate include the same method as the above-described method of applying the polymerizable liquid crystal composition onto the support substrate. Examples of the method of removing the solvent from the composition for forming a photo-alignment film to be applied include the same method as that of removing the solvent from the orientational polymer composition.

The manner of polarized light irradiation may be a manner of directly irradiating the composition for forming a photo-alignment film, from which the solvent has been removed, applied onto a substrate with polarized light, or a manner of irradiating a substrate side with polarized light, thereby transmitting the polarized light to the substrate. The polarized light is preferably substantially parallel light. The wavelength of the polarized light for irradiation preferably falls within a wavelength range in which the photo-reactive group of the photo-reactive group-containing polymer or monomer can absorb light energy. Specifically, UV (ultraviolet rays) falling within a wavelength range of 250 nm to 400 nm is particularly preferable. Examples of a light source for radiating the polarization light include a xenon lamp, a high-pressure mercury lamp, an extra high-pressure mercury lamp, a metal halide lamp, and ultraviolet laser such as KrF and ArF. Among them, a high-pressure mercury lamp, an extra high-pressure mercury lamp and a metal halide lamp are preferable, since an emission intensity of ultraviolet rays at a wavelength of 313 nm is high. Light from the light source may be radiated through a proper polarizer to carry out polarized UV irradiation. Examples of the polarizer include a polarization prism such as a polarized filter, a Glan-Thomson and a Glan-Taylor, and also a wire grid-type polarizer. Among these, a wire grid-type polarizer is preferable from the viewpoint of an increase in area and resistance to heat.

When rubbing or polarized light irradiation is carried out with masking, a plurality of regions (patterns) having different liquid crystal orientation directions (patterns) can also be formed.

A groove alignment film is a film having an unevenness pattern or multiple grooves on its surface. When a polymerizable liquid crystal compound is applied on a film having multiple liner grooves at equal intervals, the liquid crystal molecules are aligned in the direction along the grooves.

Examples of a method for obtaining the groove alignment film include a method in which after exposure on a surface of a photoreactive polyimide film through an exposure mask having a slit in a pattern form, development and rinsing treatments are carried out to form an evenness pattern; a method in which a UV-curable resin layer before cured is formed on a plate-shaped base board having grooves on its surface, and the resin layer is transmitted onto a substrate and then cured; and a method in which a film of a UV-curable resin before cured, which is formed on a substrate, is pressed onto a roll-shaped base board having multiple grooves to form unevenness and then cured.

In order to obtain a liquid crystal cured layer that is a positive C layer, an alignment film (hereinafter, also referred to as "vertical alignment film") having an alignment regulating force in the vertical direction is applied. As the vertical alignment film, it is preferable to apply a material that lowers surface tension of the substrate surface. Examples of such materials include the above-described orientational polymers and fluorine-based polymers such as perfluoroalkyl, polyimide compounds, silane compounds, and polysiloxane compounds obtained by a condensation reaction thereof. Silane compounds are preferable in that they easily reduce the surface tension.

As the silane compound, silicones such as the above-described silane coupling agents can be suitably applied. Examples include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloyloxypropyltrimethoxysilane, 3-mercaptopropyltrimethoxysilane, 3-glycidoxypropyltrimethoxysilane, 3-glycidoxypropyltriethoxysilane, 3-glycidoxypropyldimethoxymethylsilane, and 3-glycidoxypropylethoxydimethylsilane. Two or more types of silane compounds may be used.

The silane compound may be of the silicone monomer type or of the type silicone oligomer (polymer) type. When silicone oligomer is shown in the form of (monomer)-(monomer) copolymer, for example, the following can be mentioned:

A copolymer containing a mercaptopropyl group such as 3-mercaptopropyltrimethoxysilane-tetramethoxysilane copolymer, 3-mercaptopropyltrimethoxysilane-tetraethoxysilane copolymer, 3-mercaptopropyltriethoxysilane-tetramethoxysilane copolymer and 3-mercaptopropyltriethoxysilane-tetraethoxysilane copolymer, and 3-mercaptopropyltriethoxysilane-tetraethoxysilane copolymer;

a copolymer containing a mercaptomethyl group such as mercaptomethyltrimethoxysilane-tetramethoxysilane copolymer, mercaptomethyltrimethoxysilane-tetraethoxysilane copolymer, mercaptomethyltriethoxysilane-tetramethoxysilane copolymer and mercaptomethyltriethoxysilane-tetraethoxysilane copolymer;

a copolymer containing a methacryloyloxypropyl group such as 3-methacryloyloxypropyltrimethoxysilane-tetramethoxysilane copolymer, 3-methacryloyloxypropyltrimethoxysilane-tetraethoxysilane copolymer, 3-methacryloyloxypropyltriethoxysilane-tetramethoxysilane copolymer, 3-methacryloyloxypropyltriethoxysilane-tetraethoxysilane copolymer, 3-methacryloyloxypropylmethyldimethoxysilane-tetramethoxysilane copolymer, 3-methacryloyloxypropylmethyldimethoxysilane-tetraethoxysilane copolymer, 3-methacryloyloxypropylmethyldiethoxysilane-tetramethoxysilane copolymer and 3-methacryloyloxypropylmethyldiethoxysilane-tetraethoxysilane copolymer;

a copolymer containing an acryloyloxypropyl group such as 3-acryloyloxypropyltrimethoxysilane-tetramethoxysilane copolymer, 3-acryloyloxypropyltrimethoxysilane-tetraethoxysilane copolymer, 3-acryloyloxypropyltriethoxysilane-tetramethoxysilane copolymer, 3-acryloyloxypropyltriethoxysilane-tetraethoxysilane copolymer, 3-acryloyloxypropylmethyldimethoxysilane-tetramethoxysilane copolymer, 3-acryloyloxypropylmethyldimethoxysilane-tetraethoxysilane copolymer, 3-acryloyloxypropylmethyldiethoxysilane-tetramethoxysilane copolymer and 3-acryloyloxypropylmethyldiethoxysilane-tetraethoxysilane copolymer;

a copolymer containing a vinyl group such as vinyltrimethoxysilane-tetramethoxysilane copolymer, vinyltrimethoxysilane-tetraethoxysilane copolymer, vinyltriethoxysilane-tetramethoxysilane copolymer, vinyltriethoxysilane-tetraethoxysilane copolymer, vinylmethyldimethoxysilane-tetramethoxysilane copolymer, vinylmethyldimethoxysilane-tetraethoxysilane copolymer, vinylmethyldiethoxysilane-tetramethoxysilane copolymer and vinylmethyldiethoxysilane-tetraethoxysilane copolymer;

a copolymer containing an amino group such as 3-aminopropyltrimethoxysilane-tetramethoxysilane copolymer, 3-aminopropyltrimethoxysilane-tetraethoxysilane copolymer, 3-aminopropyltriethoxysilane-tetramethoxysilane copolymer, 3-aminopropyltriethoxysilane-tetraethoxysilane copolymer, 3-aminopropylmethyldimethoxysilane-tetramethoxysilane copolymer, 3-aminopropylmethyldimethoxysilane-tetraethoxysilane copolymer, 3-aminopropylmethyldiethoxysilane-tetramethoxysilane copolymer and 3-aminopropylmethyldiethoxysilane-tetraethoxysilane copolymer; and the like.

Among them, a silane compound having an alkyl group at the molecular end is preferable, and a silane compound having an alkyl group having 6 to 20 carbon atoms is more preferable. Since these silane compounds are often liquids, they may be applied to the substrate as they are, or may be dissolved in a solvent and applied to the substrate. Moreover, these silane compounds may be dissolved as binders in a solvent with various polymers and applied to the substrate. Examples of methods of application to the substrate include the same method as the above-described method of applying the polymerizable liquid crystal composition onto the support substrate.

The thickness of an alignment film thus obtained is, for example, 10 nm to 10000 nm, preferably 10 nm to 1000 nm, more preferably 50 nm to 300 nm. Within the above range, the polymerizable liquid crystal compounds (A) and (B), etc. can be aligned at a desired angle on the alignment film.

As described above, in a step of preparing an unpolymerized liquid crystal layer, an unpolymerized liquid crystal layer may be stacked on an alignment film stacked on an arbitrary support substrate. In this case, the production cost can be reduced as compared with a method of producing a liquid crystal cell and injecting a liquid crystal composition into the liquid crystal cell. Furthermore, it is possible to produce a film in a roll film.

A liquid crystal cured layer can be formed by applying and polymerizing a polymerizable liquid crystal composition on the substrate or the alignment film. Examples of methods of applying a polymerizable liquid crystal composition (coating liquid) onto a substrate include extrusion coating, direct gravure coating, reverse gravure coating, CAP coating, slit coating, micro gravure coating, die coating, and inkjet coating. The examples further include a method of application using a coater such as a dip coater, a bar coater, or a spin coater. Among them, when the composition is applied continuously in the roll-to-roll method, application methods according to a microgravure method, an ink jet method, a slit coating method, and a die coating method are preferable. When the composition is applied to a sheet-like substrate such as glass, a highly uniform spin coating method is preferable. When the composition is applied in the roll-to-roll method, a composition for forming a photo-alignment film or the like is applied to a substrate to form an alignment film, and a polymerizable liquid crystal composition can be further continuously applied onto the obtained alignment film.

Examples of drying methods for removing the solvent contained in the coating liquid of the polymerizable liquid crystal composition include natural drying, ventilation drying, heat drying, reduced pressure drying, and a combination thereof. Among them, natural drying or heat drying is preferable. The drying temperature is preferably in a range of 0 to 200° C., more preferably in a range of 20 to 150° C., further preferably in a range of 50 to 130° C. The drying time is preferably 10 seconds to 20 minutes, more preferably 30 seconds to 10 minutes. The composition for forming a photo-alignment film and the orientational polymer composition can be similarly dried.

Photopolymerization is preferable as a method for polymerizing a polymerizable liquid crystal compound. Photopolymerization is carried out by applying active energy rays to a laminate in which a polymerizable liquid crystal composition containing a polymerizable liquid crystal compound is applied on a substrate or an alignment film. The active energy rays to be irradiated is appropriately selected according to the type of polymerizable liquid crystal compound contained in a dry film (particularly, the type of photopolymerizable functional group possessed by the polymerizable liquid crystal compound), and, if a photopolymerization initiator is contained, the type of photopolymerization initiator, and the amounts thereof. Specific examples include one or more kinds of light selected from the group consisting of visible light, ultraviolet light, infrared light, X-rays, α-rays, β-rays, and γ-rays. Among them, ultraviolet light is preferable in that it is easy to control the progress of the polymerization reaction and that a photopolymerization apparatus widely used in this field can be used. It is preferable to select the type of polymerizable liquid crystal compound so that it can be photopolymerized by ultraviolet light.

Examples of light sources of the active energy rays include a low pressure mercury lamp, a medium pressure mercury lamp, a high pressure mercury lamp, an ultrahigh pressure mercury lamp, a xenon lamp, a halogen lamp, a carbon arc lamp, a tungsten lamp, a gallium lamp, an excimer laser, an LED light source emitting light in a wavelength range of 380 nm to 440 nm, a chemical lamp, a black light lamp, a microwave-excited mercury lamp, and a metal halide lamp.

The ultraviolet irradiation intensity is usually 10 mW/cm$^2$ to 3,000 mW/cm$^2$. The ultraviolet irradiation intensity is preferably an intensity in a wavelength region effective for activation of a cationic polymerization initiator or a radical polymerization initiator. The light irradiation time is usually 0.1 seconds to 10 minutes, preferably 0.1 seconds to 5 minutes, more preferably 0.1 seconds to 3 minutes, and further preferably 0.1 seconds to 1 minute. When ultraviolet rays are irradiated once or a plurality of times with such an ultraviolet irradiation intensity, the integrated light quantity is 10 mJ/cm$^2$ to 5,000 mJ/cm$^2$, preferably 50 mJ/cm$^2$ to 4,000 mJ/cm$^2$, more preferably 100 mJ/cm$^2$ to 3,000 mJ/cm$^2$. When the integrated light quantity is in the above range, the polymerizable liquid crystal compound can be sufficiently cured, and a liquid crystal cured layer composed of a highly polymerized polymer can be obtained. Conversely, when the integrated light quantity greatly exceeds the above range, the retardation plate including the liquid crystal cured layer may be colored.

Moreover, the retardation plate of the present invention is thinner than a stretched film that gives a retardation by stretching a polymer.

The support substrate is peeled to obtain a laminate including the alignment film and the liquid crystal cured layer. Moreover, in addition to peeling of the support substrate, the alignment film is peeled, whereby a retardation plate can be obtained.

The retardation plate of the present invention can be used for various optical displays because the retardation plate can perform good polarization conversion in a wide wavelength range and has excellent transparency. The thickness of the retardation plate is preferably 0.1 μm to 10 μm, and from the viewpoint of reducing photoelasticity, the thickness of the retardation plate is more preferably 0.2 μm to 5 μm, further preferably 0.5 μm to 3 μm.

For example, the retardation plate of the present invention can be used as a λ/4 plate or a λ/2 plate. When the retardation plate is used as the λ/4 plate, the film thickness of the retardation plate may be adjusted so that the retardation value (Re (550 nm)) at a wavelength of 550 nm of the retardation plate obtained is preferably 113 nm to 163 nm, more preferably 130 nm to 150 nm, particularly preferably about 135 nm to 150 nm. When the retardation plate is used as the λ/2 plate, the film thickness of the retardation plate may be adjusted so that the retardation value (Re (550 nm)) at a wavelength of 550 nm of the retardation plate obtained is preferably 250 nm to 300 nm, more preferably 260 nm to 290 nm, particularly preferably about 270 nm to 280 nm.

In order to use the retardation plate of the present invention as an optical film for VA (Vertical Alignment) mode, the film thickness of a retardation film may be adjusted so that Re (550 nm) is preferably 40 to 100 nm, more preferably about 60 to 80 nm.

By combining the retardation plate of the present invention with a polarizing plate, an elliptically polarizing plate and a circularly polarizing plate (hereinafter also referred to as "the elliptically polarizing plate of the present invention" and/or "the circularly polarizing plate of the present invention") are provided. In these elliptically polarizing plates and circularly polarizing plates, the retardation plate of the present invention is attached to the polarizing plate. The present invention can further provide a broadband circularly polarizing plate in which the retardation plate of the present invention as a broadband λ/4 plate is further attached to the elliptically polarizing plate or the circularly polarizing plate.

The present invention can provide a display device including the retardation plate of the present invention as one embodiment. The display device may include the elliptically polarizing plate according to the above embodiment.

The display device refers to a device comprising a display mechanism and includes a luminescent element or luminescent device as a luminescent source. Examples of the display device include a liquid crystal display device, an organic electroluminescence (EL) display device, an inorganic electroluminescence (EL) display device, a touch panel display device, an electron emission display device (a field emission display device (FED, etc.) and surface-conduction electron-emitter display (SED)), an electronic paper (a display device with an electronic ink or an electrophoresis element, a plasma display device, a projection type-display device (such as a grating light valve (GLV) display device, a display device comprising a digital micromirror device (DMD)) and a piezoceramic display. The liquid crystal display device may be a transmissive liquid crystal display, a semi-transmissive liquid crystal display, a reflective liquid crystal display, a direct viewing liquid crystal display or a projection liquid crystal display. These display devices may also be display devices displaying a two-dimensional image or stereoscopic display devices displaying a three-dimensional image. In particular, an organic EL display device and a touch panel display device are preferable as a display device including the retardation plate and the polarizing plate according to the present invention.

EXAMPLES

Hereinafter, the present invention will be described in more detail by examples. "%" and "part(s)" in the examples refer to % by mass and part(s) by mass, unless otherwise described.

The polymer film, apparatus, and measurement method used in the examples are as follows.

- ZF-14 manufactured by Zeon Corporation was used as a cycloolefin polymer (COP) film.
- AGF-B10 manufactured by KASUGA DENKI, Inc. was used as a corona treatment device.
- Corona treatment was performed once using the above corona treatment device under conditions of an output of 0.3 kW and a treatment speed of 3 m/min.
- SPOT CURE SP-7 with a polarizer unit manufactured by USHIO INC. was used as a polarized UV irradiation apparatus.
- LEXT manufactured by Olympus Corporation was used as a laser microscope.
- Unicura VB-15201BY-A manufactured by USHIO INC. was used as a high pressure mercury lamp.
- The in-plane retardation value was measured using KOBRA-WR manufactured by Oji Scientific Instruments. The in-plane retardation values for light with wavelengths of 450 nm, 550 nm, and 650 nm were calculated from Cauchy's dispersion formula obtained from measurement results of in-plane retardation values for light with wavelengths of 448.2 nm, 498.6 nm, 548.4 nm, 587.3 nm, 628.7 nm, and 748.6 nm.
- Film thickness was measured using an ellipsometer M-220 manufactured by JASCO Corporation.
- Infrared total reflection absorption spectrum was measured using Model 670-IR manufactured by Agilent.

Example 1

[Preparation of Composition for Forming Photo-Alignment Film]

5 parts of a photo-alignment material having the following structure and 95 parts of cyclopentanone (solvent) were mixed as components, and the resulting mixture was stirred at 80° C. for 1 hour to obtain a composition (1) for forming a photo-alignment film.

Photo-Alignment Material:

[Chemical Formula 227]

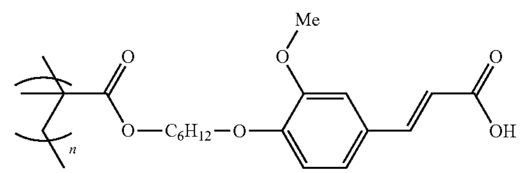

[Preparation of Polymerizable Liquid Crystal Composition]

A polymerizable liquid crystal compound (A1) having the following structure, a polymerizable liquid crystal compound (B), a polyacrylate compound (leveling agent) (BYK-361N; manufactured by BYK-Chemie), and the following photopolymerization initiator were mixed according to the composition shown in Table 1 to obtain a polymerizable liquid crystal composition (1) containing the polymerizable liquid crystal compounds (A) and (B).

Polymerizable Liquid Crystal Compound (A1):

[Chemical Formula 228]

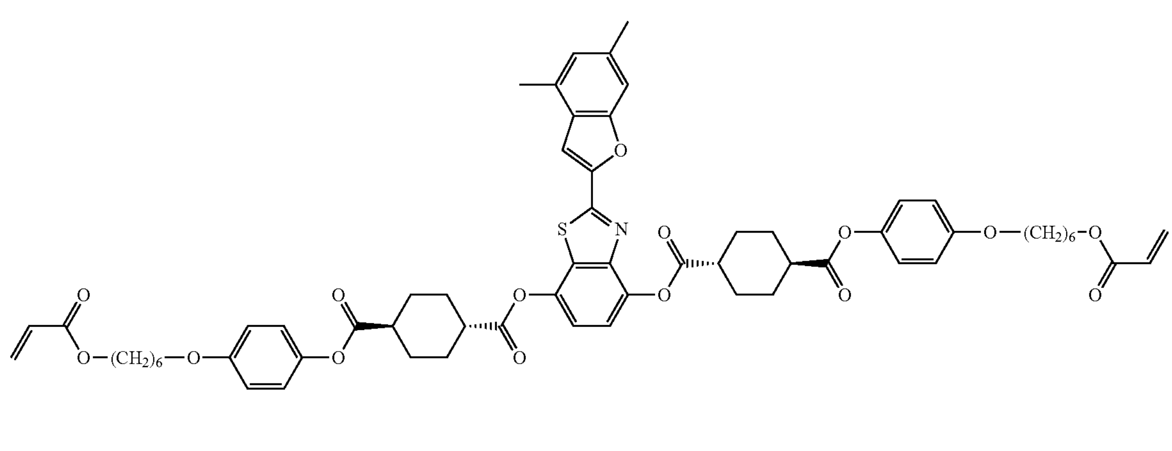

Polymerizable Liquid Crystal Compound (B1):

[Chemical Formula 229]

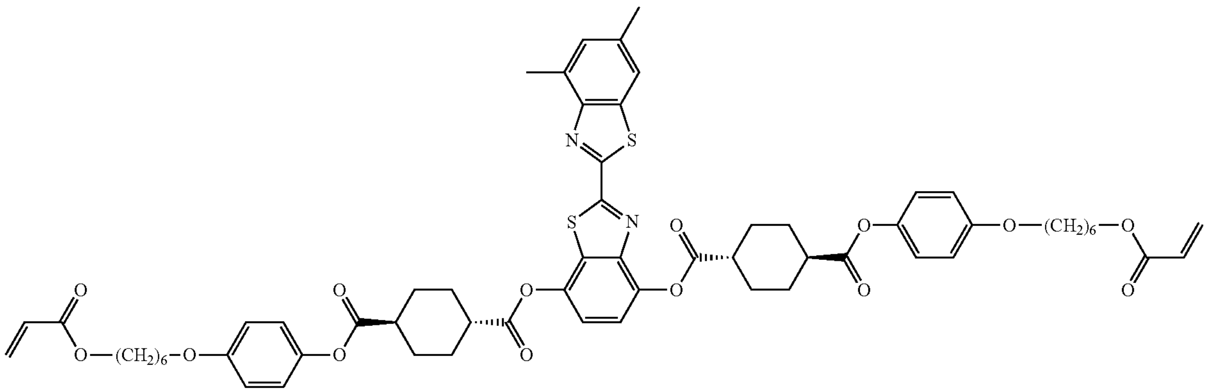

The polymerizable liquid crystal compound (A1) and the polymerizable liquid crystal compound (B1) can be synthesized by the methods described in JP-A-2010-31223, JP-A-2011-207765, and the like. A maximum absorption wavelength $\lambda_{max}$ (LC) of the polymerizable liquid crystal compound (A1) is 350 nm, and the maximum absorption wavelength $\lambda_{max}$ (LC) of the polymerizable liquid crystal compound (B1) is 350 nm.

The amount of the polyacrylate compound was set to 0.01 part based on 100 parts of the total mass of the polymerizable liquid crystal compound (A1) and the polymerizable liquid crystal compound (B1).

The following two types of photopolymerization initiators were used, and for each of the examples, the photopolymerization initiator shown in Table 1 below was added in the amount shown in Table 1 based on 100 parts of the total mass of the polymerizable liquid crystal compound (A1) and the polymerizable liquid crystal compound (B1). IRGACURE OXE-03 (manufactured by BASF Japan Ltd.) 2-dimethylamino-2-benzyl-1-(4-morpholinophenyl)butan-1-one (Irgacure 369 (Irg369); manufactured by BASF Japan Ltd.)

[Production of Liquid Crystal Cured Layer]

N-methyl-2-pyrrolidone (NMP) was added to the above-described polymerizable liquid crystal composition (1) so that the solid content concentration was 13%, and the resulting mixture was stirred at 80° C. for 1 hour to obtain a coating liquid.

On the other hand, a cycloolefin polymer (COP) film as a substrate was subjected to corona treatment using a corona treatment apparatus. Next, the above-described composition (1) for forming a photo-alignment film was applied to the surface of a corona-treated COP film (substrate) using a bar coater, and dried at 80° C. for 1 minute. Thereafter, using a polarized UV irradiation apparatus, polarized UV exposure was performed with an integrated light quantity of 100 mJ/cm$^2$ to obtain an alignment film. The thickness of the obtained alignment film was 100 nm.

Subsequently, the above-described coating liquid was applied onto the alignment film using a bar coater, dried at 120° C. for 90 seconds, and then irradiated with ultraviolet rays from the coating liquid-applied surface side using a high-pressure mercury lamp (under a nitrogen atmosphere, wavelength: 365 nm, the integrated light quantity at a wavelength of 365 nm was 500 mJ/cm$^2$, which is equivalent to 250 mJ/cm$^2$ when converted on the basis of a wavelength of 313 nm, to form a liquid crystal cured layer. An optical film provided with the liquid crystal cured layer was formed. The maximum absorption wavelength of the obtained liquid crystal cured layer was 350 nm.

The in-plane retardation value with respect to light of wavelengths of 450 nm, 550 nm, and 650 nm of the obtained liquid crystal cured layer was measured. As a result, the in-plane retardation values were Re(450)=122 nm, Re(550)=144 nm, and Re(650)=148 nm, and the relationship between the in-plane retardation values at each wavelength was as follows.

$$Re(450)/Re(550)=0.85$$

$$Re(650)/Re(550)=1.03$$

(wherein Re(450) represents the in-plane retardation value with respect to light of a wavelength of 450 nm, Re(550) represents the in-plane retardation value with respect to light of a wavelength of 550 nm, and Re(650) represents the in-plane retardation value with respect to light of a wavelength of 650 nm.)

That is, the liquid crystal cured layer had optical characteristics represented by the following formulas (I) and (II):

$$Re(450)/Re(550)\leq 1.00 \quad \text{(I)}$$

$$1.00\leq Re(650)/Re(550) \quad \text{(II)}$$

[Infrared Total Reflection Absorption Spectrum Measurement]

The obtained liquid crystal cured layer was subjected to infrared total reflection absorption spectrum measurement (angle of incidence: 45°), and P' (a P value of a surface irradiated with ultraviolet rays of surfaces which are perpendicular to a thickness direction of the liquid crystal cured layer) was calculated from obtained results of the measurement (respective values of a peak intensity I(1) derived from in-plane deformation vibration (1408 cm$^{-1}$) of an ethylenic unsaturated bond and a peak intensity 1(2) derived from stretching vibration (1504 cm$^{-1}$) of an unsaturated bond of an aromatic ring). The results are shown in Table 2.

Further, a solution obtained by dissolving a polymerizable liquid crystal compound (A1) in chloroform was dropped on germanium crystal and dried, so that a thin layer of the polymerizable liquid crystal compound (A1) was obtained. The obtained thin layer was subjected to the infrared total reflection absorption spectrum measurement, and P0 (P value of the polymerizable liquid crystal compound (A1)) was calculated from obtained results of the measurement (peak intensity I(1) derived from in-plane deformation vibration (1408 $cm^{-1}$) of an ethylenic unsaturated bond=0.0163, peak intensity 1(2) derived from stretching vibration (1504 $cm^{-1}$) of an unsaturated bond of an aromatic ring=0.0561), so that P0 was 0.291. A value of (1−P'/P0)×100 was calculated from the values of P' and P0. This shows that the larger this value, the higher the degree of cure of the liquid crystal cured layer.

[Additional UV Irradiation]

Using a high-pressure mercury lamp, ultraviolet rays were additionally irradiated from the surface applied with a coating liquid of a liquid crystal cured layer (under a nitrogen atmosphere, wavelength: 365 nm, the integrated light quantity at the time of irradiation at a wavelength of 365 nm was 2500 mJ/$cm^2$, and, when converted on the basis of a wavelength of 313 nm, 1250 mJ/$cm^2$) so that in total with the ultraviolet rays irradiated at the time of producing the liquid crystal cured layer, the integrated light quantity at the time of irradiation at a wavelength of 365 nm was 3000 mJ/$cm^2$ (1500 mJ/$cm^2$ when converted on the basis of a wavelength of 313 nm).

After the additional irradiation with ultraviolet rays, the in-plane retardation values with respect to light of wavelengths of 450 nm, 550 nm, and 650 nm of the liquid crystal cured layer were measured, and the amount of change in the in-plane retardation values before and after the additional irradiation with ultraviolet rays was calculated. For the liquid crystal cured layer after the additional irradiation with ultraviolet rays, the infrared total reflection absorption spectrum was measured by the method described above, and the P value after the additional irradiation with ultraviolet rays was calculated. The results are shown in Table 2.

Examples 2 to 4

The same operation as in Example 1 was performed except for changing the mixing ratio of the polymerizable liquid crystal compound (A1) and the polymerizable liquid crystal compound (B1) as described in Table 1, and polymerizable liquid crystal compositions (2) to (4) containing the polymerizable liquid crystal compounds (A1) and (B1) were prepared to obtain a liquid crystal cured layer. All the maximum absorption wavelengths of the obtained liquid crystal cured layer were 350 nm. In the same manner as in Example 1, the in-plane retardation values at wavelengths of 450 nm, 550 nm, and 650 nm of the liquid crystal cured layer and the infrared total reflection absorption spectrum were measured and calculated. Furthermore, after ultraviolet rays were additionally irradiated in the same manner as in Example 1, the in-plane retardation values at wavelengths of 450 nm, 550 nm, and 650 nm of the liquid crystal cured layer, the amount of change in the in-plane retardation values before and after the additional irradiation with ultraviolet rays and the infrared total reflection absorption spectrum were measured and calculated. The results are shown in Table 2.

Comparative Examples 1 and 2

The same operation as in Example 1 was performed except that, as described in Table 1, the polymerizable liquid crystal compound was changed to the polymerizable liquid crystal compound (A1) alone, or the polymerizable liquid crystal compound (A1) and the polymerizable liquid crystal compound (C1), and comparative polymerizable liquid crystal compositions (1) and (2) containing a polymerizable liquid crystal compound were prepared to obtain a liquid crystal cured layer. All the maximum absorption wavelengths of the obtained liquid crystal cured layer were 350 nm. In the same manner as in Example 1, the in-plane retardation values at wavelengths of 450 nm, 550 nm, and 650 nm of the comparative liquid crystal cured layer and the infrared total reflection absorption spectrum were measured and calculated. Furthermore, after ultraviolet rays were additionally irradiated in the same manner as in Example 1, the in-plane retardation values at wavelengths of 450 nm, 550 nm, and 650 nm of the liquid crystal cured layer, the amount of change in the in-plane retardation values before and after the additional irradiation with ultraviolet rays and the infrared total reflection absorption spectrum were measured and calculated. The results are shown in Table 2.

Polymerizable Liquid Crystal Compound (C1):

[Chemical Formula 230]

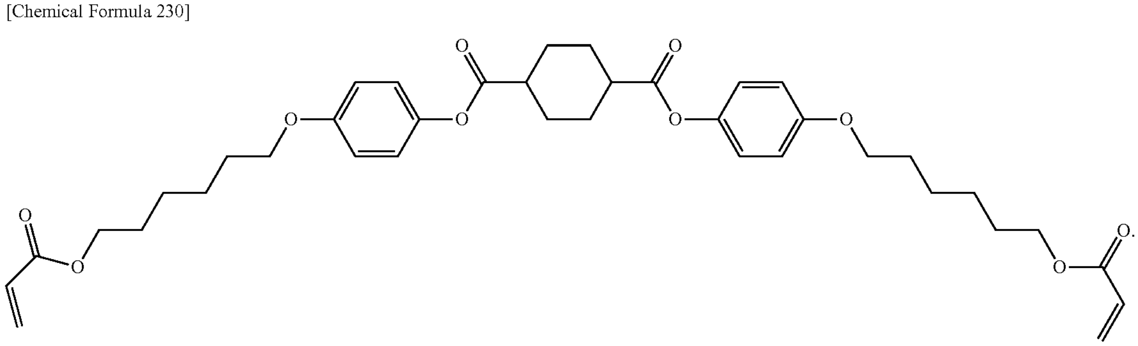

The polymerizable liquid crystal compound (C1) was prepared by the method described in JP-A-2010-24438. As to of the liquid crystal cured layer obtained by the operation similar to the method for producing a liquid crystal cured layer in Example 1 except for using the polymerizable liquid crystal compound (C1) alone instead of the polymerizable liquid crystal composition (1), the amount of change in the in-plane retardation value at a wavelength of 450 nm between the liquid crystal cured layer and the liquid crystal cured layer after irradiation of ultraviolet rays by the same method as in Example 1 is substantially 0 nm.

Comparative Example 3

Using the polymerizable liquid crystal compound (A1) and a polymerizable liquid crystal compound LC242 (manufactured by BASF Japan Ltd.), the same operation as in Example 1 was performed except for changing the type of the polymerizable liquid crystal compound and the mixing ratio of the polymerizable liquid crystal compound as described in Table 1, and a comparative polymerizable liquid crystal composition (3) containing a polymerizable liquid crystal compound was prepared to obtain a liquid crystal cured layer. The maximum absorption wavelength of the obtained liquid crystal cured layer was 350 nm. In the same manner as in Example 1, the in-plane retardation values at wavelengths of 450 nm, 550 nm, and 650 nm of the comparative liquid crystal cured layer and the infrared total reflection absorption spectrum were measured and calculated. Furthermore, after ultraviolet rays were additionally irradiated in the same manner as in Example 1, the in-plane retardation values at wavelengths of 450 nm, 550 nm, and 650 nm of the liquid crystal cured layer, the amount of change in the in-plane retardation values before and after the additional irradiation with ultraviolet rays and the infrared total reflection absorption spectrum were measured and calculated. The results are shown in Table 2. LC242 exhibits normal wavelength dispersibility.

Reference Example

The same operation as in Example 1 was performed except for changing the polymerizable liquid crystal compound to the polymerizable liquid crystal compound (B1) alone, and a reference composition containing a polymerizable liquid crystal compound was prepared to obtain a liquid crystal cured layer. The maximum absorption wavelength of the obtained liquid crystal cured layer was 350 nm. In the same manner as in Example 1, the in-plane retardation values at wavelengths of 450 nm, 550 nm, and 650 nm of the reference liquid crystal cured layer and the infrared total reflection absorption spectrum were measured and calculated. Furthermore, after ultraviolet rays were additionally irradiated in the same manner as in Example 1, the in-plane retardation values at wavelengths of 450 nm, 550 nm, and 650 nm of the liquid crystal cured layer, the amount of change in the in-plane retardation values before and after the additional irradiation with ultraviolet rays and the infrared total reflection absorption spectrum were measured and calculated. The results are shown in Table 2.

TABLE 1

| | Polymerizable liquid crystal compound (A1) [%] | Polymerizable liquid crystal compound (B1) [%] | Polymerizable liquid crystal compound (C1) [%] | LC242 [%] | OXE03 [%] | Irg369 [%] |
|---|---|---|---|---|---|---|
| Example 1 | 40 | 60 | 0 | 0 | 7.5 | 3.0 |
| Example 2 | 30 | 70 | 0 | 0 | 7.5 | 3.0 |
| Example 3 | 20 | 80 | 0 | 0 | 7.5 | 3.0 |
| Example 4 | 10 | 90 | 0 | 0 | 7.5 | 3.0 |
| Comparative Example 1 | 100 | 0 | 0 | 0 | 7.5 | 3.0 |
| Comparative Example 2 | 86 | 0 | 14 | 0 | 7.5 | 3.0 |
| Comparative Example 3 | 86 | 0 | 0 | 14 | 7.5 | 3.0 |
| Reference Example | 0 | 100 | 0 | 0 | 7.5 | 3.0 |

TABLE 2

| | 365 nm ultraviolet irradiation energy (integrated value) [mJ/cm$^2$] | Re (450) [nm] | Re (550) [nm] | Re (650) [nm] | Re (450)/ Re (550) | Re (650)/ Re (550) | ΔRe (450) [nm] | ΔRe (550) [nm] | ΔRe (650) [nm] | Δ (Re (450)/ Re (550) | P' | (1 − P'/ P0) × 100 | Appearance | Optical characteristics |
|---|---|---|---|---|---|---|---|---|---|---|---|---|---|---|
| Example 1 | 500 | 121.5 | 143.7 | 148.6 | 0.85 | 1.03 | −0.2 | −1.5 | −2.9 | 0.008 | 0.065 | 78 | ○ | Good wavelength dispersion |
| | 3000 | 121.3 | 142.2 | 145.7 | 0.85 | 1.02 | | | | | 0.021 | 93 | | Good wavelength dispersion |
| Example 2 | 500 | 126.8 | 149.9 | 154.8 | 0.85 | 1.03 | 0.0 | −1.1 | −1.6 | 0.006 | 0.059 | 80 | ○ | Good wavelength dispersion |
| | 3000 | 126.8 | 148.8 | 153.2 | 0.85 | 1.03 | | | | | 0.016 | 95 | | Good wavelength dispersion |
| Example 3 | 500 | 114.0 | 134.1 | 138.3 | 0.85 | 1.03 | 0.2 | −0.4 | −0.7 | 0.004 | 0.059 | 80 | ○ | Good wavelength dispersion |
| | 3000 | 114.2 | 133.7 | 137.6 | 0.85 | 1.03 | | | | | 0.017 | 94 | | Good wavelength dispersion |

TABLE 2-continued

| | 365 nm ultraviolet irradiation energy (integrated value) [mJ/cm²] | Re (450) [nm] | Re (550) [nm] | Re (650) [nm] | Re (450)/ Re (550) | Re (650)/ Re (550) | ΔRe (450) [nm] | ΔRe (550) [nm] | ΔRe (650) [nm] | Δ (Re (450)/ Re (550) | P' | (1 − P'/ P0) × 100 | Appear- ance | Optical character- istics |
|---|---|---|---|---|---|---|---|---|---|---|---|---|---|---|
| Example 4 | 500 | 127.9 | 150.1 | 154.7 | 0.85 | 1.03 | 0.0 | −0.3 | −1.1 | 0.002 | 0.061 | 79 | ○ | Good wavelength dispersion |
| | 3000 | 127.9 | 149.8 | 153.6 | 0.85 | 1.03 | | | | | 0.020 | 93 | | Good wavelength dispersion |
| Comparative Example 1 | 500 | 111.7 | 134.5 | 139.9 | 0.83 | 1.04 | 8.3 | 2.5 | −1.0 | 0.045 | 0.062 | 79 | ○ | Retardation change |
| | 3000 | 120.0 | 137.0 | 138.9 | 0.88 | 1.01 | | | | | 0.031 | 89 | | Large |
| Comparative Example 2 | 500 | 126.0 | 143.4 | 147.2 | 0.88 | 1.03 | 2.0 | −0.4 | −1.2 | 0.016 | 0.042 | 86 | ○ | Poor wavelength dispersion |
| | 3000 | 128.0 | 143.0 | 146.0 | 0.90 | 1.02 | | | | | 0.017 | 94 | | Poor wavelength dispersion |
| Comparative Example 3 | 500 | 139.7 | 156.5 | 159.6 | 0.89 | 1.02 | 2.4 | −0.7 | −1.6 | 0.019 | 0.058 | 80 | Phase separation | Poor wavelength dispersion |
| | 3000 | 142.1 | 155.8 | 158.0 | 0.91 | 1.01 | | | | | 0.023 | 92 | | Poor wavelength dispersion |
| Reference Example | 500 | 129.4 | 151.7 | 156.3 | 0.85 | 1.03 | −1.8 | −2.9 | −3.2 | 0.005 | 0.064 | 78 | ○ | Retardation change |
| | 3000 | 127.6 | 148.8 | 153.1 | 0.86 | 1.03 | | | | | 0.020 | 93 | | Intermediate degree |

Production Examples

Production Example of Compound (B1)

The compound (B1) can be produced according to the following scheme.

[Chemical Formula 231]

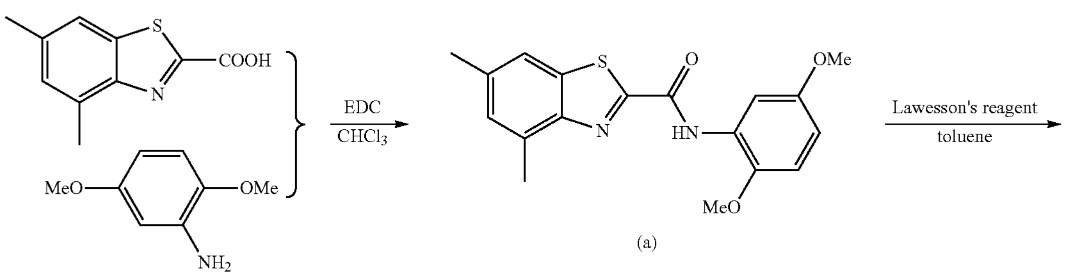

(a)

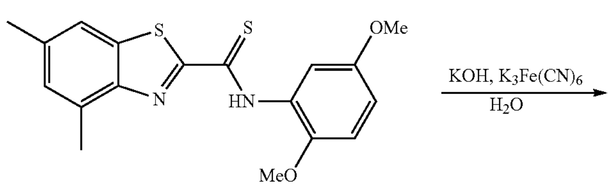

(b)

-continued

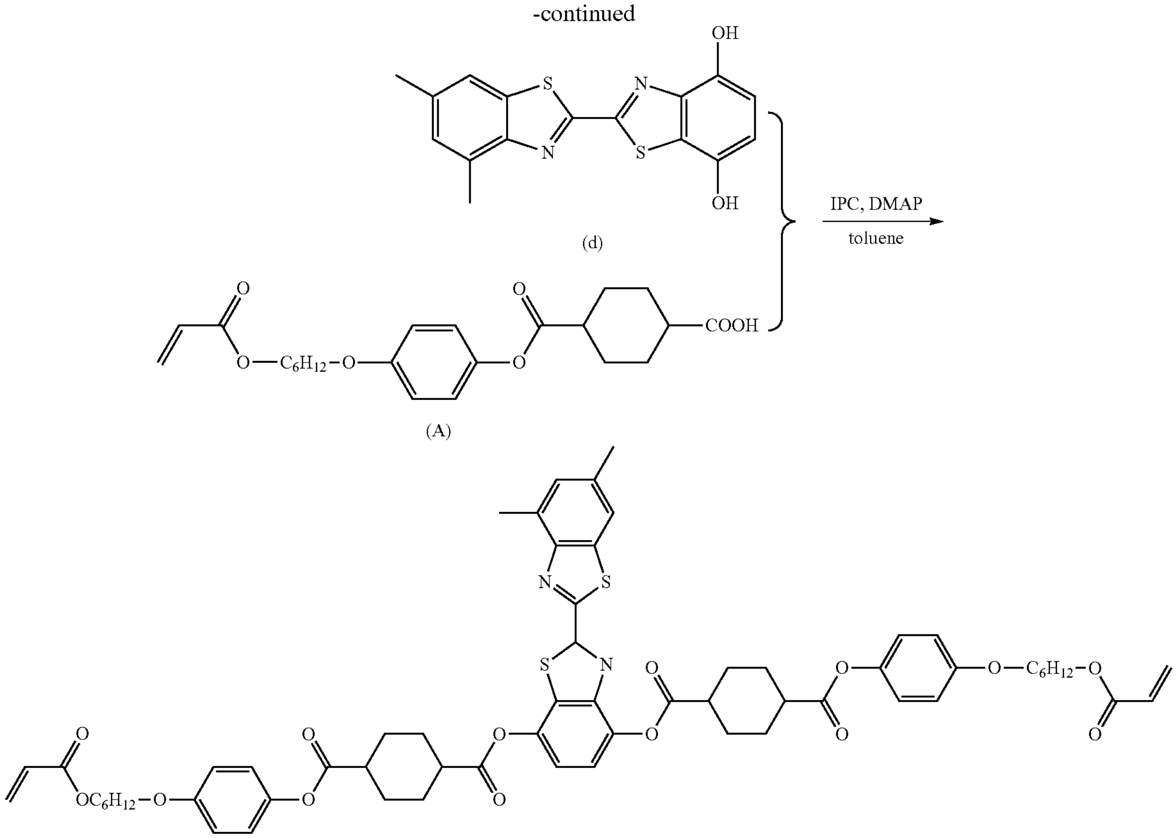

(B1)

Production Example of Compound (a)

4,6-benzothiazole-2-carboxylic acid and 2,5-dimethoxyaniline are dispersed in chloroform to obtain a suspension. After the obtained suspension is cooled in an ice bath, a mixture of 1-ethyl-3-(3-dimethylaminopropyl)carbodiimide hydrochloride and chloroform is added over 4 hours thereto, and the reaction is continued at room temperature for 24 hours. 2,5-dimethoxyaniline is further added to the reaction solution after the reaction, and the reaction is further continued for 48 hours. At this time, the total amount of 2,5-dimethoxyaniline to be used is 1 mole per 1 mole of 4,6-benzothiazole-2-carboxylic acid. The obtained mixture is concentrated, and a residue is crystallized by adding a mixed solution of hydrochloric acid aqueous solution-methanol and heptane. The resulting precipitate is collected by filtration, and added with the mixed solution of hydrochloric acid aqueous solution-methanol. The precipitated bright yellow precipitate is collected by filtration and further washed with a mixed solution of water-methanol. The bright yellow precipitate after washing is washed with a mixed solution of KOH aqueous solution-methanol, then washed with water and then dried under vacuum to obtain a compound (a) as a yellow powder.

Production Example of Compound (b)

The compound (a), 2,4-bis(4-methoxyphenyl)-1,3-dithia-2,4-diphosphetane-2,4-disulfide (Lawson reagent) and toluene are mixed, and the temperature of the resulting mixture is raised to 110° C. and reacted for 6 hours. The reaction mixture after the reaction is cooled to room temperature, an aqueous sodium hydroxide solution is added and separated into an organic layer and an aqueous layer, the organic layer is recovered by a liquid separation operation, and heptane is added to the recovered organic layer to precipitate crystals. The precipitated crystals (orange) are collected by filtration and dried under vacuum to obtain a compound (b) as a bright yellow powder.

Production Example of Compound (c)

The compound (b), potassium hydroxide and water are mixed, and the resulting mixture is reacted under ice cooling. Subsequently, potassium ferricyanide is added under ice cooling, and then reacted by adding methanol. After reaction at room temperature for 12 hours and at 50° C. for 12 hours, the precipitated light-yellow precipitate is collected by filtration. The precipitate collected by filtration is washed with water, then with methanol, and further with ethanol, and a pale yellow powder after washing is dried under vacuum to obtain a pale yellow solid mainly composed of a compound (c).

Production Example of Compound (d)

The compound (c) and pyridinium chloride (15 mass times with respect to the compound (c)) are mixed, heated to 190° C. and reacted for 3 hours. The reaction mixture is added to ice, and the resulting precipitate is collected by filtration, washed with water, washed with toluene, and then dried under vacuum to obtain a yellow solid mainly composed of a compound (d).

Production Example of Compound (B1)

The compound (d), the compound (A), dimethylaminopyridine and chloroform are mixed, and N, N'-diisopropylcarbodiimide is added to the resulting mixture under ice cooling to obtain a reaction solution. The resulting reaction solution is allowed to react at room temperature for 12 hours or more, and the reaction solution after the reaction is filtered through celite, followed by concentration under reduced pressure. The concentrated residue obtained by concentration under reduced pressure is crystallized by adding methanol, and the crystals are collected by filtration, redissolved in chloroform, added with activated carbon, and stirred at room temperature for 1 hour. The mixture after stirring is filtered to remove activated carbon, and the filtrate after filtration is concentrated under reduced pressure to ⅓ (volume) with an evaporator. Thereafter, methanol is added with vigorous stirring, and the resulting white precipitate is collected by filtration. The white precipitate collected by filtration is washed with heptane and then dried under vacuum to give a compound (B1) as an off-white (slightly yellow white) powder.

The invention claimed is:

1. A polymerizable liquid crystal composition comprising two or more types of polymerizable liquid crystal compounds, at least one type of the polymerizable liquid crystal compounds is a polymerizable liquid crystal compound (A) in which a polymer of the polymerizable liquid crystal compound exhibits reverse wavelength dispersibility in an alignment state, and with respect to a retardation value [R(A, 500, 450)] at a wavelength of 450 nm measured after irradiation of the polymerizable liquid crystal compound in an alignment state with ultraviolet rays of 500 mJ/cm$^2$, a retardation value [R(A, 3000, 450)] at a wavelength of 450 nm measured after irradiation with ultraviolet rays of 3000 mJ/cm$^2$ changes in a positive direction, at least one type of the polymerizable liquid crystal compounds is a polymerizable liquid crystal compound (B) in which a polymer of the polymerizable liquid crystal compound exhibits the reverse wavelength dispersibility in an alignment state, and with respect to a retardation value [R(B, 500, 450)] at a wavelength of 450 nm measured after irradiation of the polymerizable liquid crystal compound in the alignment state with ultraviolet rays of 500 mJ/cm$^2$, a retardation value [R(B, 3000, 450)] at a wavelength of 450 nm measured after irradiation with ultraviolet rays of 3000 mJ/cm$^2$ changes in a negative direction, wherein the polymerizable liquid crystal compound (A) is a compound represented by formula (1):

$$P^{1a}—E^{1a}—(B^{1a}—G^{1a})_{k^a}—L^{1a}—Ar^{a}—L^{2a}—(G^{2a}—B^{2a})_{l^a}—E^{2a}—P^{2a} \quad (1)$$

wherein $Ar^a$ is a divalent aromatic group optionally having a substituent, $L^{1a}$, $L^{2a}$, $B^{1a}$ and $B^{2a}$ are each independently a single bond or a divalent linking group, an alkylene group having 1 to 4 carbon atoms, —COO—, —OCO—, —O—, —S—, —ROR—, —RCOOR—, —ROCOR—, ROC═OOR—, —N═N—, —CR'═CR'—, or —C≡C—, provided that each R independently represents a single bond or an alkylene group having 1 to 4 carbon atoms, and each R' independently represents an alkyl group having 1 to 4 carbon atoms or a hydrogen atom, $G^{1a}$ and $G^{2a}$ each independently represent a 1,4-phenylenediyl group which may be substituted with at least one substituent selected from the group consisting of a halogen atom and an alkyl group having 1 to 4 carbon atoms or a 1,4-cyclohexanediyl group which may be substituted with at least one substituent selected from the group consisting of a halogen atom and an alkyl group having 1 to 4 carbon atoms, $E^{1a}$ and $E^{2a}$ each independently represent an alkanediyl group having 1 to 17 carbon atoms, provided that a hydrogen atom contained in the alkanediyl group is optionally substituted with a halogen atom, and —$CH_2$— contained in the alkanediyl group is optionally substituted with —O—, —S—, or —Si—, $P^{1a}$ and $P^{2a}$ each independently represent a hydrogen atom or a polymerizable group, provided that at least one of $P^{1a}$ and $P^{2a}$ is a polymerizable group, and $k^a$ and $l^a$ each independently represent an integer of 0 to 3 and satisfy a relation of $1 \leq k^a+l^a$, provided that when $2 \leq k^a+l^a$, $B^{1a}$ and $B^{2a}$ are optionally the same or different from each other, and $G^{1a}$ and $G^{2a}$ are optionally the same or different from each other;

wherein the polymerizable liquid crystal compound (B) is a compound represented by formula (2):

$$P^{1b}—E^{1b}—(B^{1b}—G^{1b})_{k^b}—L^{1b}—Ar^{b}—L^{2b}—(G^{2b}—B^{2b})_{l^b}—E^{2b}—P^{2b} \quad (2)$$

wherein $Ar^b$ is a divalent aromatic group optionally having a substituent, $L^{1a}$, $L^{2a}$, $B^{1a}$, $B^{2a}$, $G^{1a}$, $G^{2a}$, $E^{1a}$, $E^{2a}$, $P^{1a}$, $P^{2a}$, $k^a$ and $l^a$ in formula (1) are respectively the same as $L^{1b}$, $L^{2b}$, $B^{1b}$, $B^{2b}$, $G^{1b}$, $G^{2b}$, $E^{1b}$, $E^{2b}$, $P^{1b}$, $P^{2b}$, $k^b$ and $l^b$ in formula (2), and the divalent aromatic group represented by $Ar^a$ in the formula (1) and the divalent aromatic group represented by $Ar^b$ in the formula (2) have different structures, wherein the divalent aromatic group represented by $Ar^a$ in the formula (1) and the divalent aromatic group represented by $Ar^b$ in the formula (2) include groups represented by the following formulas (Ar-1) to (Ar-22):

(Ar-1)

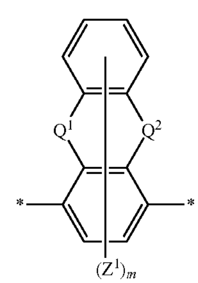

-continued
(Ar-2)
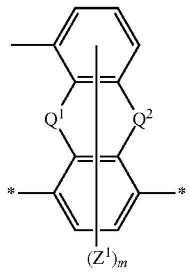
(Ar-3)
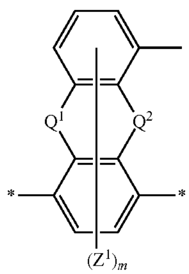
(Ar-4)
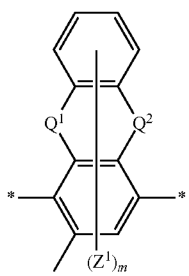
(Ar-5)
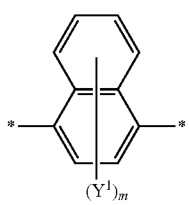
(Ar-6)
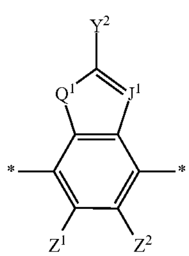
(Ar-7)
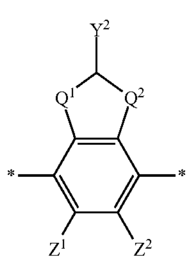
-continued
(Ar-8)
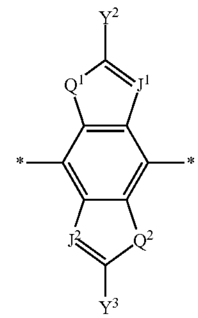
(Ar-9)
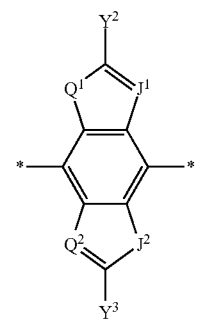
(Ar-10)
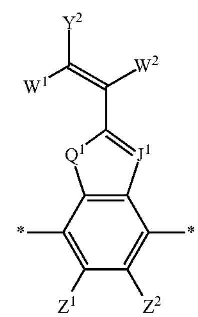
(Ar-11)
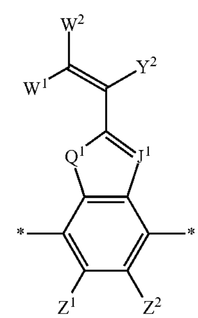
(Ar-12)
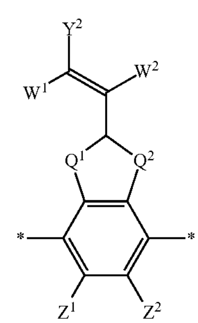

-continued (Ar-13)

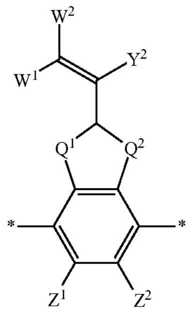

(Ar-14)

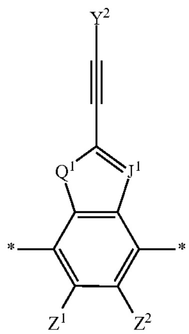

(Ar-15)

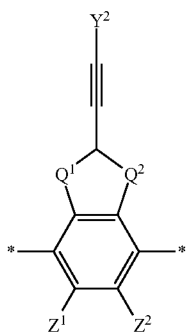

(Ar-16)

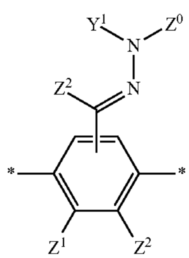

(Ar-17)

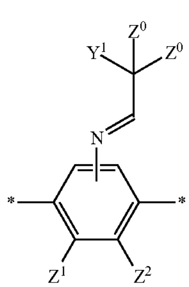

-continued (Ar-18)

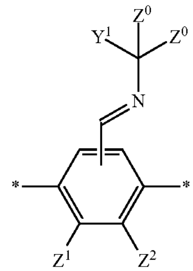

(Ar-19)

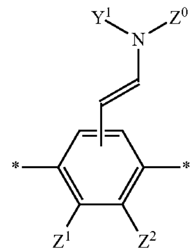

(Ar-20)

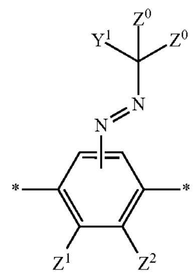

(Ar-21)

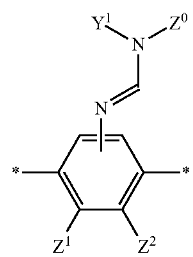

(Ar-22)

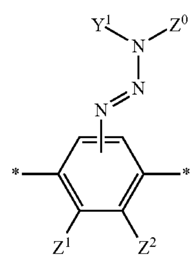

wherein in formulas (Ar-1) to (Ar-22):

* represents a linking site, and $Z^o$, $Z^1$, and $Z^2$ each independently represent a hydrogen atom, a halogen atom, an alkyl group having 1 to 12 carbon atoms, a cyano group, a nitro group, an alkylsulfinyl group having 1 to 12 carbon atoms, an alkylsulfonyl group having 1 to 12 carbon atoms, a carboxyl group, a fluoroalkyl group having 1 to 12 carbon atoms, an alkoxy group having 1 to 6 carbon atoms, an alkylthio group having 1 to 12 carbon atoms, an N-alkylamino group having 1 to 12 carbon atoms, an N,N-dialkylamino group having 2 to 12 carbon atoms, an N-alkylsulfamoyl group having 1 to 12 carbon atoms, and an N,N-dialkylsulfamoyl group having 2 to 12 carbon atoms, $Q^1$ and $Q^2$ each independently represent —$CR^{2'}R^{3'}$—, —S—, —NH—, —$NR^{2'}$—, —CO— or —O—, and $R^{2'}$ and $R^{3'}$ each independently represent a hydrogen atom or an alkyl group having 1 to 4 carbon atoms, $J^1$ and $J^2$ each independently represent a carbon atom or a nitrogen atom, $Y^1$, $Y^2$ and $Y^3$ each independently represent an optionally substituted aromatic hydrocarbon group or aromatic heterocyclic group, and $W^1$ and $W^2$ each independently represent a hydrogen atom, a cyano group, a methyl group or a halogen atom, and m represents an integer of 0 to 6, wherein the polymerizable liquid crystal composition contains the polymerizable liquid crystal compound (A) in an amount of 5 to 80 mole with respect to 100 mole of the polymerizable liquid crystal compound (B).

2. The polymerizable liquid crystal composition according to claim 1, wherein $Ar^a$ and $Ar^b$ in the formulas (1) and (2) are each a divalent aromatic group which optionally has a substituent, and which has an aromatic heterocyclic ring containing at least two heteroatoms selected from the group consisting of a nitrogen atom, an oxygen atom and a sulfur atom.

3. The polymerizable liquid crystal composition according to claim 1, wherein $Ar^a$ and $Ar^b$ in the formulas (1) and (2) are each an aromatic group in which a number $N^\pi$ of π electrons is from 12 to 22, each have an aromatic heterocyclic ring containing at least two heteroatoms selected from the group consisting of a nitrogen atom, an oxygen atoms and a sulfur atom, and are sterically arranged in a direction substantially perpendicular to a molecular orientation direction.

4. The polymerizable liquid crystal composition according to claim 1, wherein in the formula (1), $L^{1a}=L^{2a}$, $G^{1a}=G^{2a}$, $B^{1a}=B^{2a}$, $E^{1a}=E^{2a}$, $P^{1a}=P^{2a}$, and $k^a=l^a$, and in the formula (2), $L^{1b}=L^{2b}$, $G^{1b}=G^{2b}$, $B^{1b}=B^{2b}$, $E^{1b}=E^{2b}$, $P^{1b}=P^{2b}$, and $k^b=l^b$.

5. The polymerizable liquid crystal composition according to claim 1, wherein an aromatic group represented by $Ar^a$ in the formula (1) comprises a nitrogen atom, a sulfur atom, an oxygen atom, a carbon atom and a hydrogen atom, and an aromatic group represented by $Ar^b$ in the formula (2) comprises a nitrogen atom, a sulfur atom, a carbon atom and a hydrogen atom.

6. A retardation plate comprising a liquid crystal cured layer containing monomer units derived from two or more types of polymerizable liquid crystal compounds, at least one type of the polymerizable liquid crystal compounds is a polymerizable liquid crystal compound (A) in which a polymer of the polymerizable liquid crystal compound exhibits reverse wavelength dispersibility in an alignment state, and with respect to a retardation value [R(A, 500, 450)] at a wavelength of 450 nm measured after irradiation of the polymerizable liquid crystal compound in the alignment state with ultraviolet rays of 500 mJ/cm$^2$, a retardation value [R(A, 3000, 450)] at a wavelength of 450 nm measured after irradiation with ultraviolet rays of 3000 mJ/cm$^2$ changes in a positive direction, and at least one type of the polymerizable liquid crystal compounds is a polymerizable liquid crystal compound (B) in which a polymer of the polymerizable liquid crystal compound exhibits the reverse wavelength dispersibility in an alignment state, and with respect to a retardation value [R(B, 500, 450)] at a wavelength of 450 nm measured after irradiation of the polymerizable liquid crystal compound in the alignment state with ultraviolet rays of 500 mJ/cm$^2$, a retardation value [R(B, 3000, 450)] at a wavelength of 450 nm measured after irradiation with ultraviolet rays of 3000 mJ/cm$^2$ changes in a negative direction, wherein the polymerizable liquid crystal compound (A) is a compound represented by formula (1):

(1)

$$P^{1a}—E^{1a}—\left(B^{1a}—G^{1a}\right)_{k^a}—L^{1a}—Ar^a—L^{2a}—\left(G^{2a}—B^{2a}\right)_{l^a}—E^{2a}—P^{2a}$$

wherein $Ar^a$ is a divalent aromatic group optionally having a substituent, $L^{1a}$, $L^{2a}$, $B^{1a}$ and $B^{2a}$ are each independently a single bond or a divalent linking group, an alkylene group having 1 to 4 carbon atoms, —COO—, —OCO—, —O—, —S—, —ROR—, —RCOOR—, —ROCOR—, ROC═OOR—, —N═N—, —CR'═CR'—, or —C≡C—, provided that each R independently represents a single bond or an alkylene group having 1 to 4 carbon atoms, and each R' independently represents an alkyl group having 1 to 4 carbon atoms or a hydrogen atom, $G^{1a}$ and $G^{2a}$ each independently represent a 1,4-phenylenediyl group which may be substituted with at least one substituent selected from the group consisting of a halogen atom and an alkyl group having 1 to 4 carbon atoms or a 1,4-cyclohexanediyl group which may be substituted with at least one substituent selected from the group consisting of a halogen atom and an alkyl group having 1 to 4 carbon atoms, $E^{1a}$ and $E^{2a}$ each independently represent an alkanediyl group having 1 to 17 carbon atoms, provided that a hydrogen atom contained in the alkanediyl group is optionally substituted with a halogen atom, and —$CH_2$— contained in the alkanediyl group is optionally substituted with —O—, —S—, or —Si—, $P^{1a}$ and $P^{2a}$ each independently represent a hydrogen atom or a polymerizable group, provided that at least one of $P^{1a}$ and $P^{2a}$ is a polymerizable group, and $k^a$ and $l^a$ each independently represent an integer of 0 to 3 and satisfy a relation of $1 \le k^a + l^a$, provided that when $2 \le k^a + l^a$, $B^{1a}$ and $B^{2a}$ are optionally the same or different from each other, and $G^{1a}$ and $G^{2a}$ are optionally the same or different from each other;

wherein the polymerizable liquid crystal compound (B) is a compound represented by formula (2):

(2)

$$P^{1b}—E^{1b}—\left(B^{1b}—G^{1b}\right)_{k^b}—L^{1b}—Ar^b—L^{2b}—\left(G^{2b}—B^{2b}\right)_{l^b}—E^{2b}—P^{2b}$$

wherein $Ar^b$ is a divalent aromatic group optionally having a substituent, $L^{1a}$, $L^{2a}$, $B^{1a}$, $B^{2a}$, $G^{1a}$, $G^{2a}$, $E^{1a}$, $E^{2a}$, $P^{1a}$, $P^{2a}$, $k^a$ and $l^a$ in formula (1) are respectively the same as $L^{1b}$, $L^{2b}$, $B^{1b}$, $B^{2b}$, $G^{1b}$, $G^{2b}$, $E^{1b}$, $E^{2b}$, $P^{1b}$, $P^{2b}$, $k^b$ and $l^b$ in formula (2), and the divalent aromatic group represented by $Ar^a$ in the formula (1) and the divalent aromatic group represented by $Ar^b$ in the formula (2) have different structures, wherein the divalent aromatic group represented by $Ar^a$ in the formula (1) and the divalent aromatic group represented by $Ar^b$ in the formula (2) include groups represented by the following formulas (Ar-1) to (Ar-22):

(Ar-1)

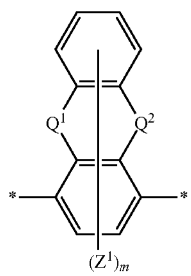

(Ar-2)

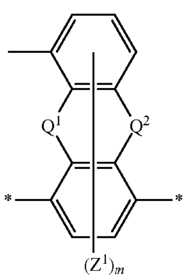

(Ar-3)

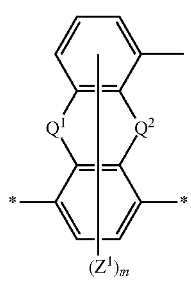

(Ar-4)

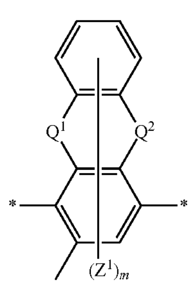

(Ar-5)

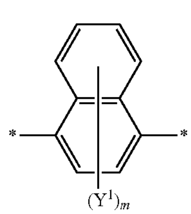

-continued (Ar-6)

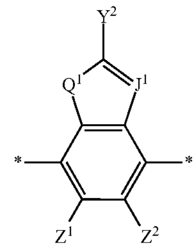

(Ar-7)

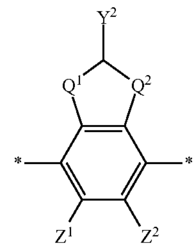

(Ar-8)

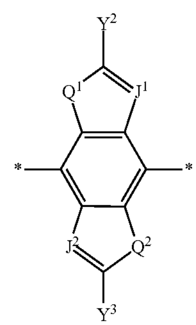

(Ar-9)

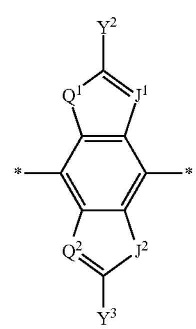

(Ar-10)

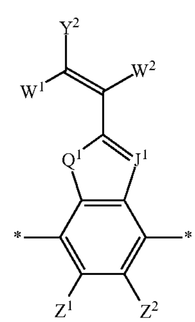

-continued
(Ar-11)
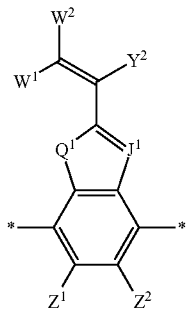
(Ar-12)
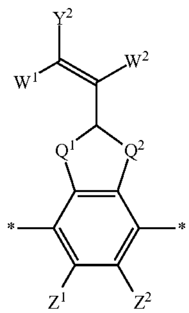
(Ar-13)
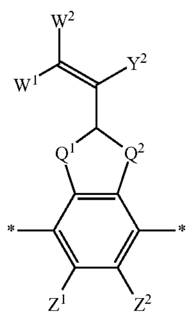
(Ar-14)
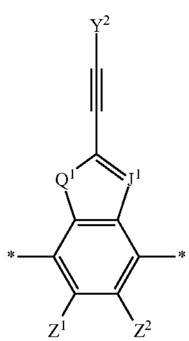
(Ar-15)
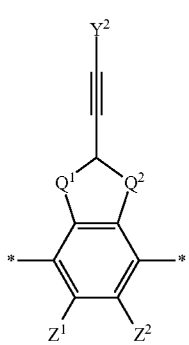
-continued
(Ar-16)
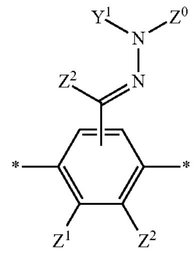
(Ar-17)
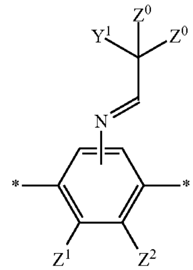
(Ar-18)
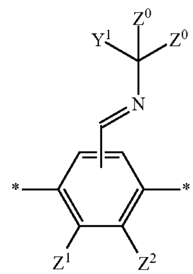
(Ar-19)
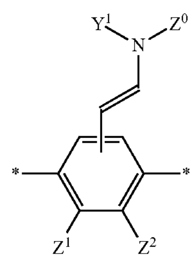
(Ar-20)
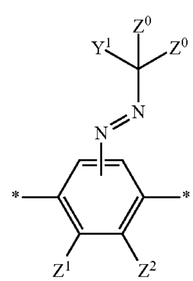
(Ar-21)
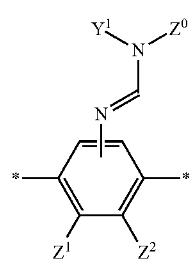

-continued (Ar-22)

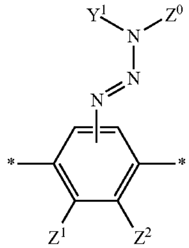

wherein in formulas (Ar-1) to (Ar-22):

* represents a linking site, and $Z^o$, $Z^1$, and $Z^2$ each independently represent a hydrogen atom, a halogen atom, an alkyl group having 1 to 12 carbon atoms, a cyano group, a nitro group, an alkylsulfinyl group having 1 to 12 carbon atoms, an alkylsulfonyl group having 1 to 12 carbon atoms, a carboxyl group, a fluoroalkyl group having 1 to 12 carbon atoms, an alkoxy group having 1 to 6 carbon atoms, an alkylthio group having 1 to 12 carbon atoms, an N-alkylamino group having 1 to 12 carbon atoms, an N,N-dialkylamino group having 2 to 12 carbon atoms, an N-alkylsulfamoyl group having 1 to 12 carbon atoms, and an N,N-dialkylsulfamoyl group having 2 to 12 carbon atoms, $Q^1$ and $Q^2$ each independently represent —$CR^{2'}R^{3'}$—, —S—, —NH—, —$NR^{2'}$—, —CO— or —O—, and $R^{2'}$ and $R^{3'}$ each independently represent a hydrogen atom or an alkyl group having 1 to 4 carbon atoms, $J^1$ and $J^2$ each independently represent a carbon atom or a nitrogen atom, $Y^1$, $Y^2$ and $Y^3$ each independently represent an optionally substituted aromatic hydrocarbon group or aromatic heterocyclic group, and $W^1$ and $W^2$ each independently represent a hydrogen atom, a cyano group, a methyl group or a halogen atom, and m represents an integer of 0 to 6, wherein a polymerizable liquid crystal composition contains the polymerizable liquid crystal compound (A) in an amount of 5 to 80 mole with respect to 100 mole of the polymerizable liquid crystal compound (B).

7. The retardation plate according to claim 6, wherein the liquid crystal cured layer containing monomer units derived from the two or more types of polymerizable liquid crystal compounds comprises a polymer of the polymerizable liquid crystal composition, said polymer being in an alignment state.

8. The retardation plate according to claim 6, wherein a three-dimensional refractive index ellipsoid formed by the liquid crystal cured layer has uniaxiality.

9. The retardation plate according to claim 6, wherein a three-dimensional refractive index ellipsoid formed by the liquid crystal cured layer has uniaxiality, and when a main refractive index in an axial direction is ne and a refractive index in an arbitrary direction in a plane perpendicular to the main refractive index is no, a direction of ne is a direction parallel or perpendicular to a plane of the liquid crystal cured layer.

10. The retardation plate according to claim 6, wherein a three-dimensional refractive index ellipsoid formed by the liquid crystal cured layer has uniaxiality; when the main refractive index in the axial direction is ne and the refractive index in an arbitrary direction in the plane perpendicular to the main refractive index is no, the direction of ne is the direction parallel or perpendicular to the plane of the liquid crystal cured layer; and the retardation plate has optical characteristics represented by formulas (I) and (II):

$$Re(450)/Re(550) \leq 1.00 \quad (I)$$

$$1.00 \leq Re(650)/Re(550) \quad (II)$$

[wherein Re(λ) represents a retardation value at a wavelength λ, and is represented by $Re=(ne(\lambda)-no(\lambda))\times d$, and d represents the thickness of the liquid crystal cured layer].

11. An elliptically polarizing plate comprising the retardation plate according to claim 6 and a polarizing plate.

12. An organic EL display device comprising the elliptically polarizing plate according to claim 11.

* * * * *